US011164612B2

(12) United States Patent
Nakamura et al.

(10) Patent No.: US 11,164,612 B2
(45) Date of Patent: Nov. 2, 2021

(54) MARCHING MEMORY, A BIDIRECTIONAL MARCHING MEMORY, A COMPLEX MARCHING MEMORY AND A COMPUTER SYSTEM, WITHOUT THE MEMORY BOTTLENECK

(71) Applicants: Tadao Nakamura, Maiyagi (JP); Michael J. Flynn, Palo Alto, CA (US)

(72) Inventors: Tadao Nakamura, Maiyagi (JP); Michael J. Flynn, Palo Alto, CA (US)

( * ) Notice: Subject to any disclaimer, the term of this patent is extended or adjusted under 35 U.S.C. 154(b) by 34 days.

(21) Appl. No.: 16/744,849

(22) Filed: Jan. 16, 2020

(65) Prior Publication Data

US 2020/0152247 A1 May 14, 2020

Related U.S. Application Data

(63) Continuation of application No. 14/450,705, filed on Aug. 4, 2014, now Pat. No. 10,573,359, which is a (Continued)

(51) Int. Cl.

| | |
|---|---|
| ***G11C 7/22*** | (2006.01) |
| ***G11C 19/28*** | (2006.01) |
| ***G11C 19/18*** | (2006.01) |

(52) U.S. Cl.

CPC .............. *G11C 7/22* (2013.01); *G11C 19/184* (2013.01); *G11C 19/186* (2013.01); (Continued)

(58) Field of Classification Search

CPC ....... G11C 7/22; G11C 19/184; G11C 19/186; G11C 19/188; G11C 19/28; G11C 19/187 (Continued)

(56) References Cited

U.S. PATENT DOCUMENTS

| | | | |
|---|---|---|---|
| 4,017,741 | A | 4/1977 | Briggs |
| 4,698,788 | A | 10/1987 | Flannagan et al. |

(Continued)

FOREIGN PATENT DOCUMENTS

| | | |
|---|---|---|
| EP | 0463721 A2 | 1/1992 |
| JP | 05-128898 | 5/1993 |

(Continued)

OTHER PUBLICATIONS

European Communication, dated Feb. 26, 2020, 6 pages.

(Continued)

*Primary Examiner* — Sung Il Cho
(74) *Attorney, Agent, or Firm* — Barley Snyder

(57) ABSTRACT

A marching memory is disclosed having an array of memory units. Each memory unit has a sequence of bit level cells. Each bit-level cell has a transfer-transistor having a first main-electrode connected to a clock signal supply line through a first delay element, and a control-electrode connected to an output terminal of a first neighboring bit-level cell positioned at an input side of the array of the memory units, through a second delay element. Each bit-level cell also has a reset-transistor having a first main-electrode connected to a second main-electrode of the transfer-transistor, a control-electrode connected to the clock signal supply line, and a second main-electrode connected to the ground potential. Each bit-level cell also has a capacitor connected in parallel with the reset-transistor.

18 Claims, 71 Drawing Sheets

Related U.S. Application Data continuation of application No. PCT/JP2013/000760, filed on Feb. 13, 2013.

(60) Provisional application No. 61/597,945, filed on Feb. 13, 2012.

(52) U.S. Cl.
CPC ............ *G11C 19/188* (2013.01); *G11C 19/28* (2013.01); *G11C 19/287* (2013.01)

(58) Field of Classification Search
USPC .......................................................... 711/167
See application file for complete search history.

(56) References Cited

U.S. PATENT DOCUMENTS

| | | | | |
|---|---|---|---|---|
| 4,745,393 | A | 5/1988 | Tsukada et al. | |
| 5,159,616 | A | 10/1992 | Douglas et al. | |
| 5,463,577 | A | 10/1995 | Oowaki et al. | |
| 5,517,543 | A * | 5/1996 | Schleupen | G09G 3/3674 377/74 |
| 5,917,770 | A | 6/1999 | Tanaka | |
| 6,310,815 | B1 | 10/2001 | Yamagata et al. | |
| 2004/0115879 | A1 | 6/2004 | Plessier et al. | |
| 2004/0128433 | A1 | 7/2004 | Bains | |
| 2005/0036363 | A1 | 2/2005 | Shau | |
| 2005/0199992 | A1 | 9/2005 | Baek et al. | |
| 2005/0212746 | A1 | 9/2005 | Iwasaki et al. | |
| 2005/0285862 | A1 | 12/2005 | Noda et al. | |
| 2009/0059711 | A1 | 3/2009 | Oh et al. | |
| 2010/0103747 | A1 | 4/2010 | Van Winkelhoff et al. | |
| 2012/0117412 | A1 * | 5/2012 | Nakamura | G06F 9/3889 713/400 |
| 2012/0249502 | A1 * | 10/2012 | Takahashi | H03K 19/01728 345/205 |
| 2014/0247673 | A1 * | 9/2014 | Muralimanohar | G11C 11/408 365/189.02 |

FOREIGN PATENT DOCUMENTS

| | | | | |
|---|---|---|---|---|
| JP | 07-245324 | | 9/1995 | |
| JP | 2007-189171 | | 7/2007 | |
| WO | 9957729 | A1 | 11/1999 | |
| WO | 2011010445 | A1 | 1/2011 | |
| WO | WO-2011010445 | A1 * | 1/2011 | G06F 5/08 |

OTHER PUBLICATIONS

PCT—Written Opinion for co-pending international application PCT/JP2013/000760, 4 pages, dated May 21, 2013.

Extended European Search Report, Application No. 18000889.8, dated Mar. 28, 2019, 10 pages.

Tadao Nakamura, "Marching Memory", EDA Express Co. ,Ltd., 35 pages, Sep. 30, 2011.

Tadao Nakamura, et al. "Marching Memory: Designing Computers To Avoid The Memory Bottleneck", Proceedings of the Sixth International Workshop on Unique Chips and Systems, IEEE/ACM, pp. 44-47 dated Dec. 4, 2010.

PCT—Search Report for related international application PCT/JP2010/004642, 2 pages, dated Aug. 31, 2010.

Akihiro Iwaya et al., "The outline of the SX system", NEC Technical Journal, Dec. 12, 1985, vol. 39 No. 1, pp. 10-16.

Ken Sakamura, "Data Flow Architecture", Computer Architecture, 1st edition, Kyoritsu Shuppan Co., LTD, Dec. 15, 1984, pp. 88-94.

Office Action for the Japanese Application No. 2012-503797 which is the national phase of PCT/JP2010/004642, dated Jun. 11, 2013, 8 pages.

Office Action for the Korean Application No. 10-2012-7002982 which is the national phase of PCT/JP2010/004642, dated Jul. 29, 2013, 8 pages.

European Search Report, App. No. 13748879.7, dated Nov. 25, 2015, 12 pages.

Korean Office Action, dated Dec. 4, 2015, 7 pages.

English translation of Korean Office Action, dated Dec. 4, 2015, 10 pages.

English translation of Chinese First Office Action, dated Dec. 4, 2015, 12 pages.

Tadao Nakamura, Marching Memory, Jan. 1, 2010, retrieved from the Internet: URL: http://www.eda-express.com/verify2011/pdf/verify2011_04.pdf, 35 pages.

Korean Office Action and English translation, dated Jul. 26, 2016, 10 pages.

* cited by examiner

[Fig. 1]
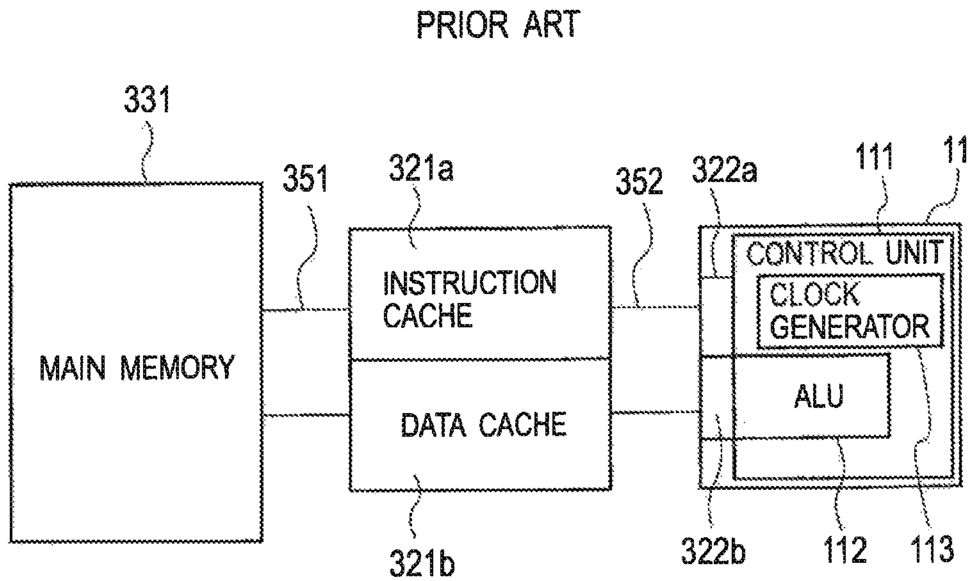
[Fig. 2]
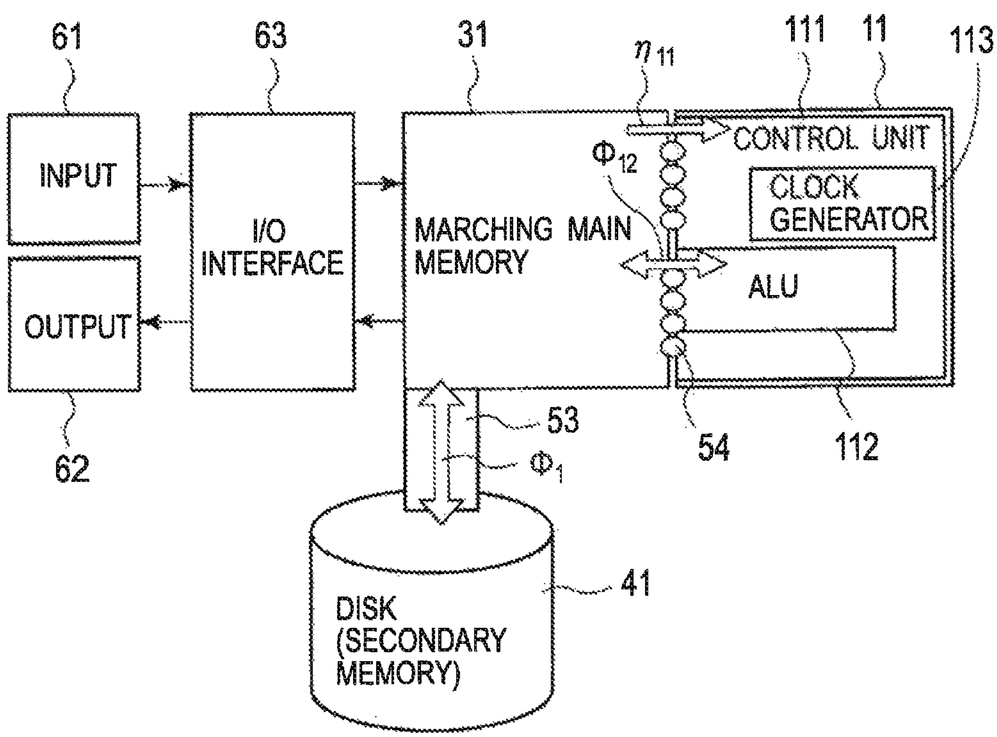

[Fig. 3]
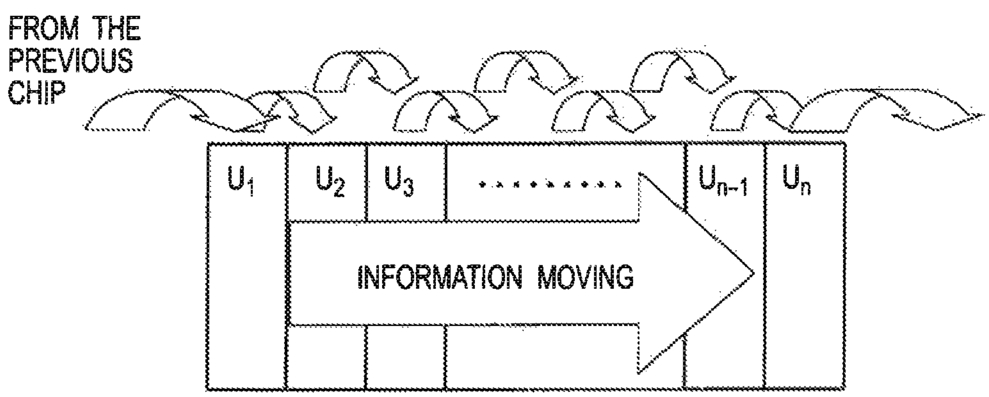

[Fig. 4]
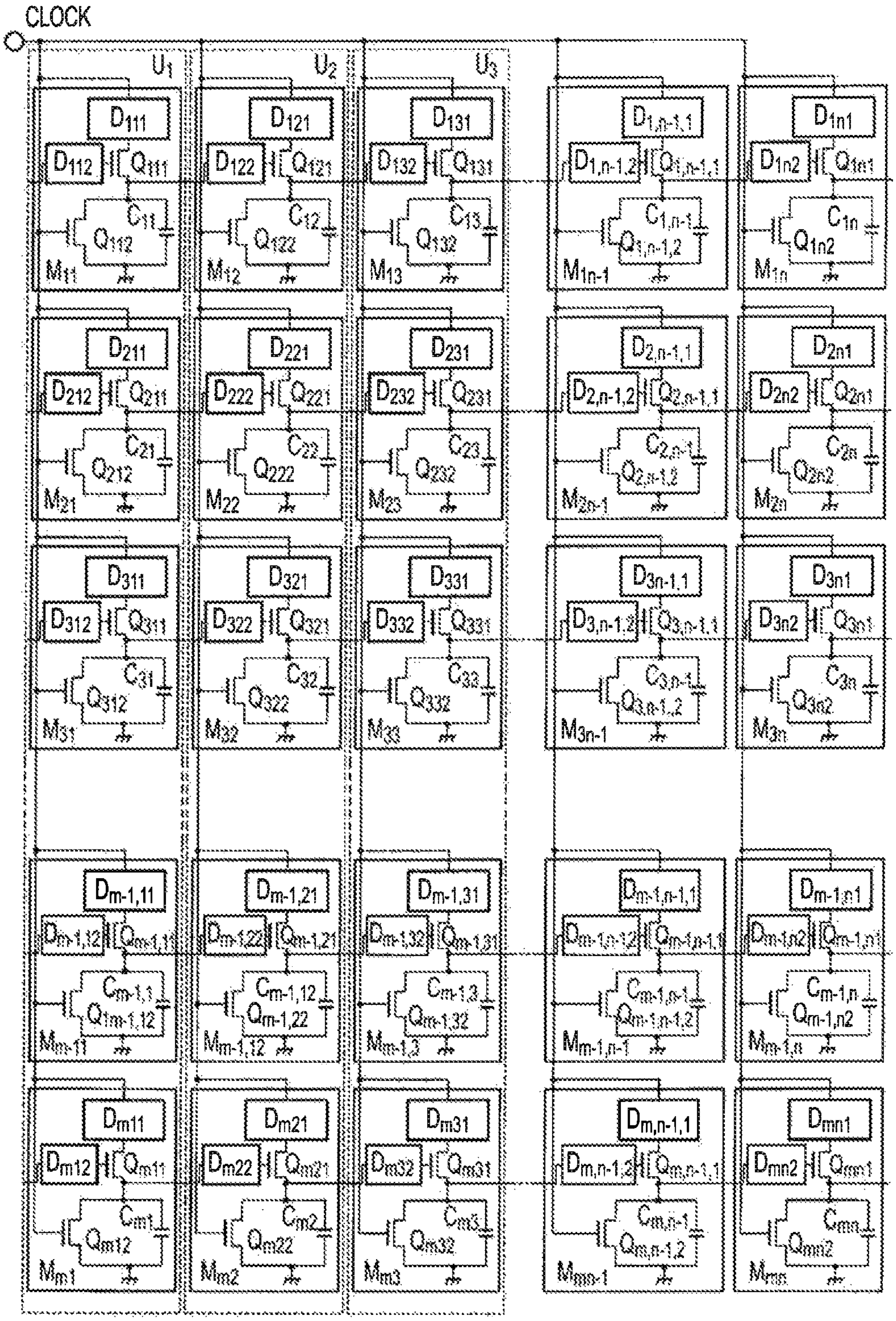

[Fig. 5]
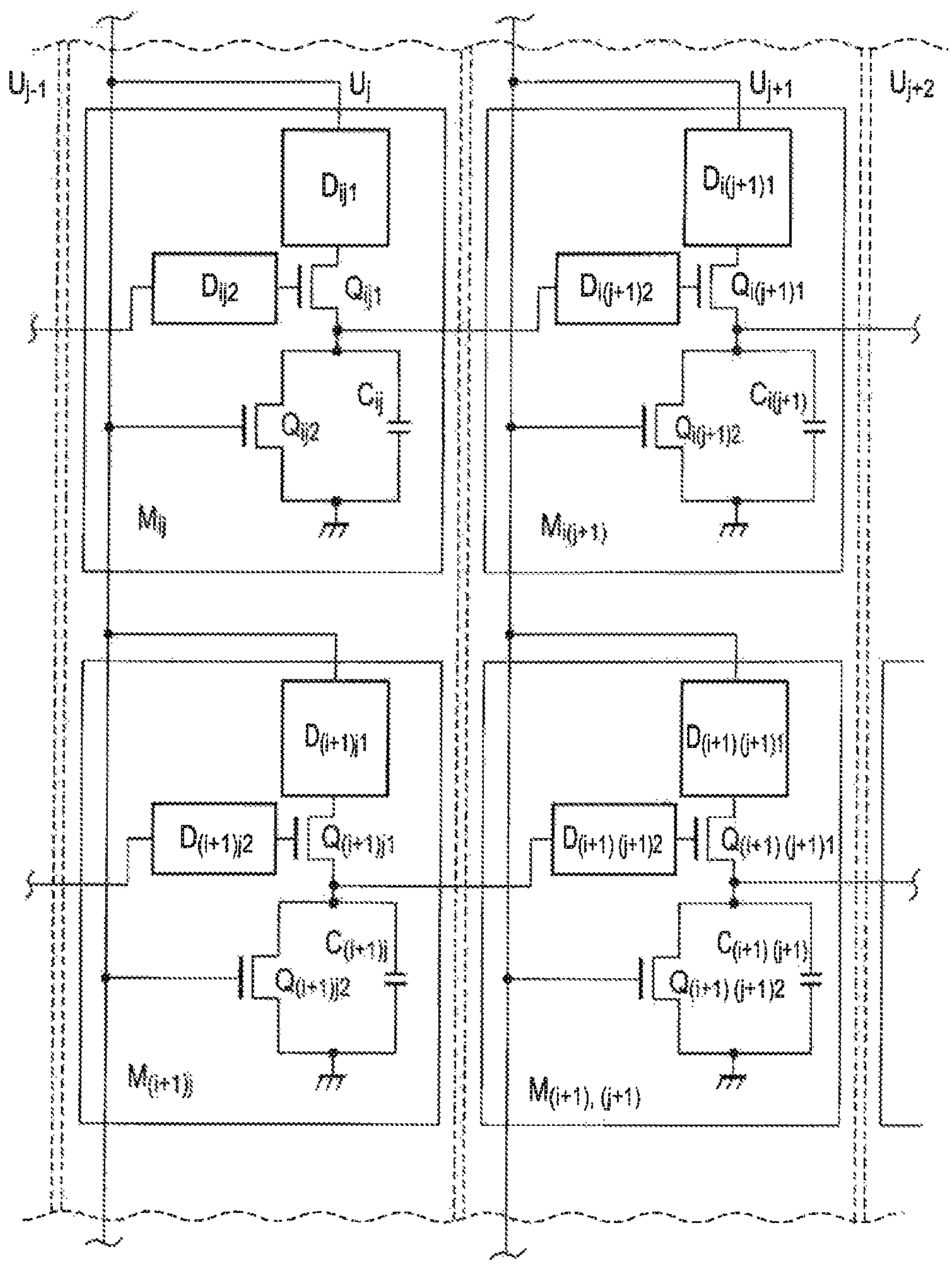

[Fig. 6]
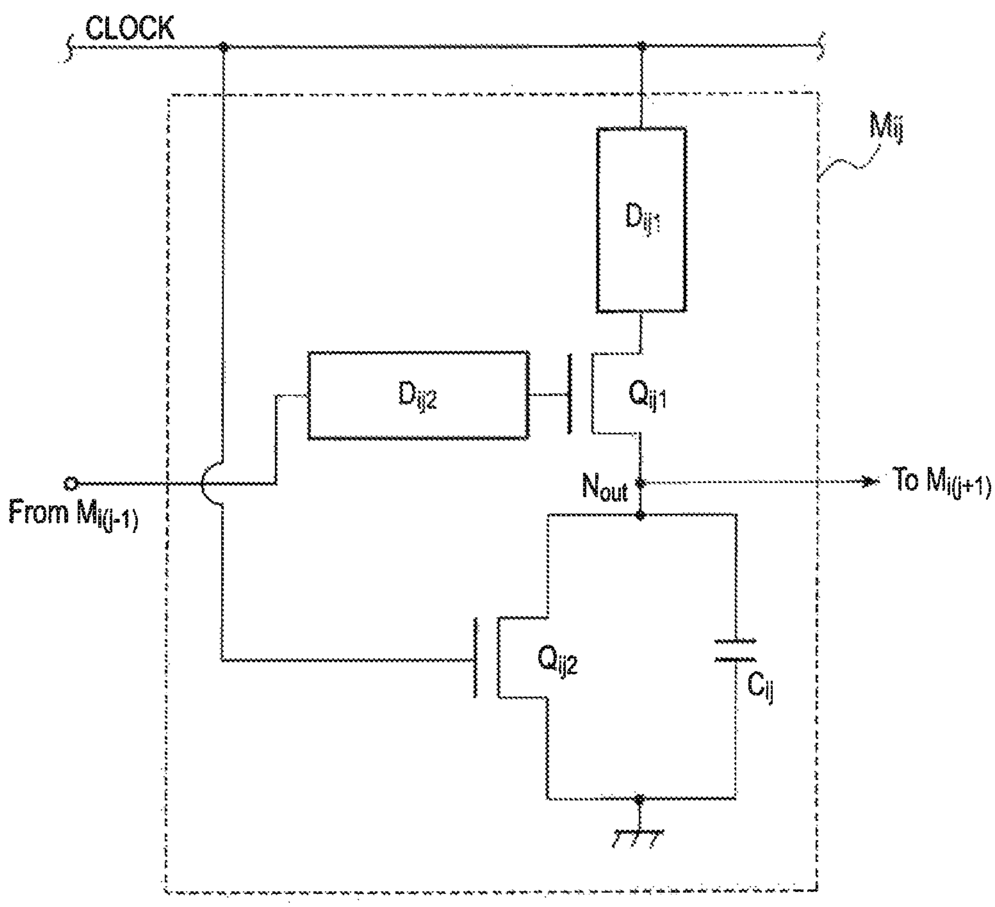

[Fig. 7A]
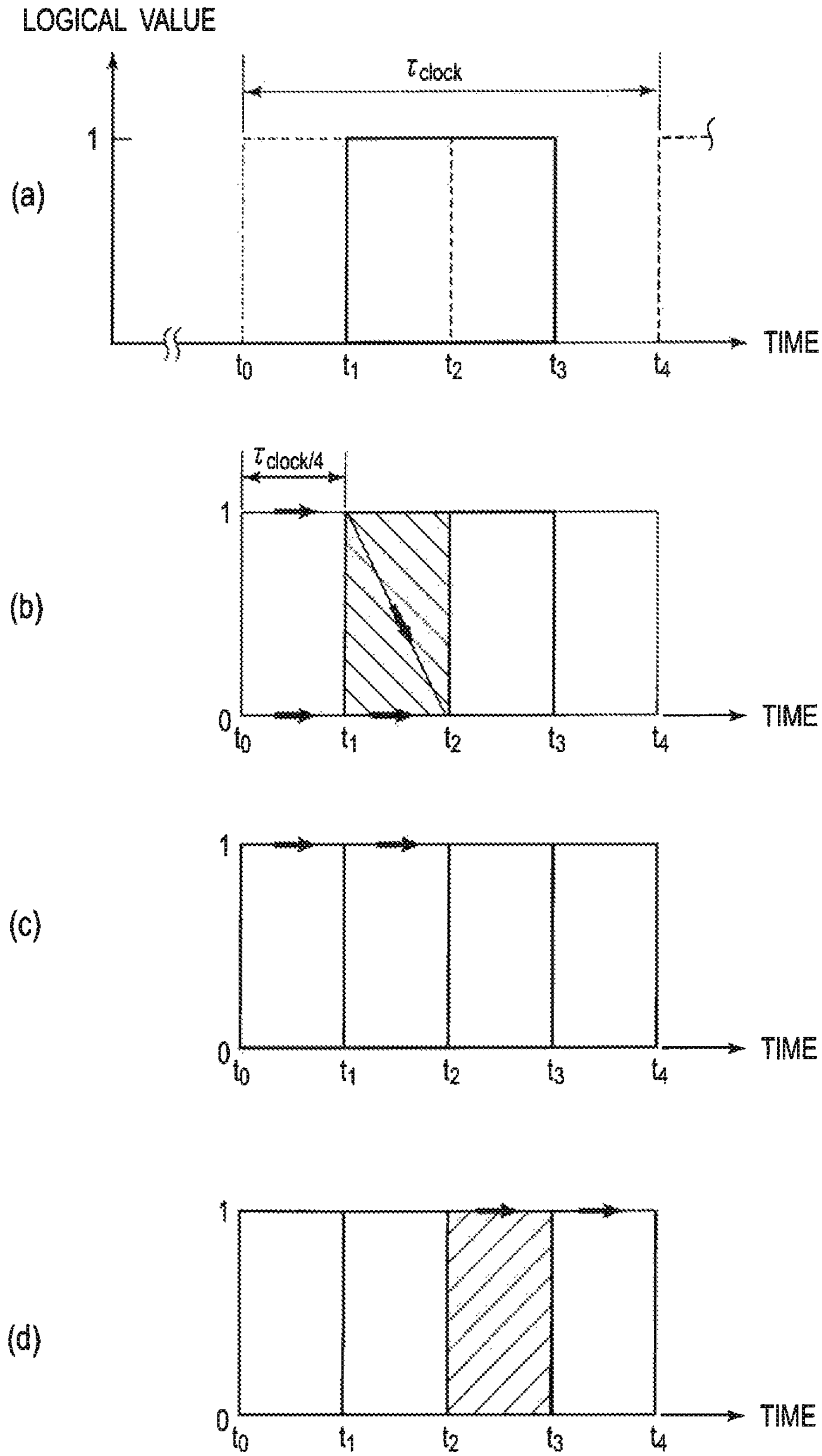

[Fig. 7B]
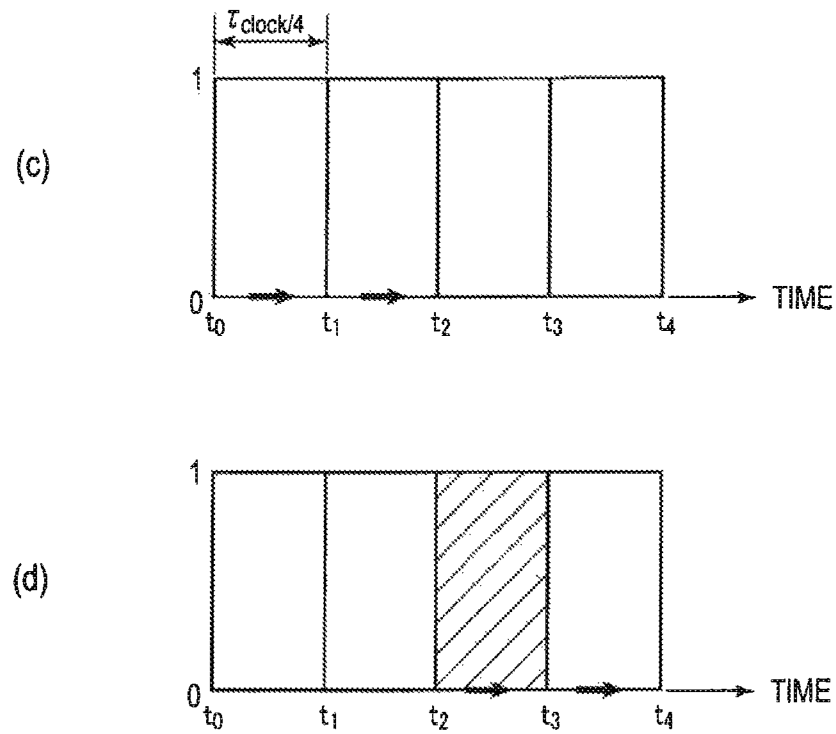
[Fig. 7C]
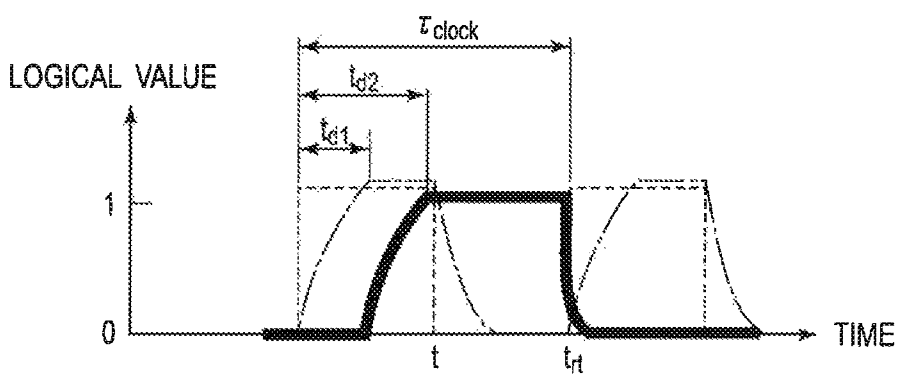

[Fig. 8]
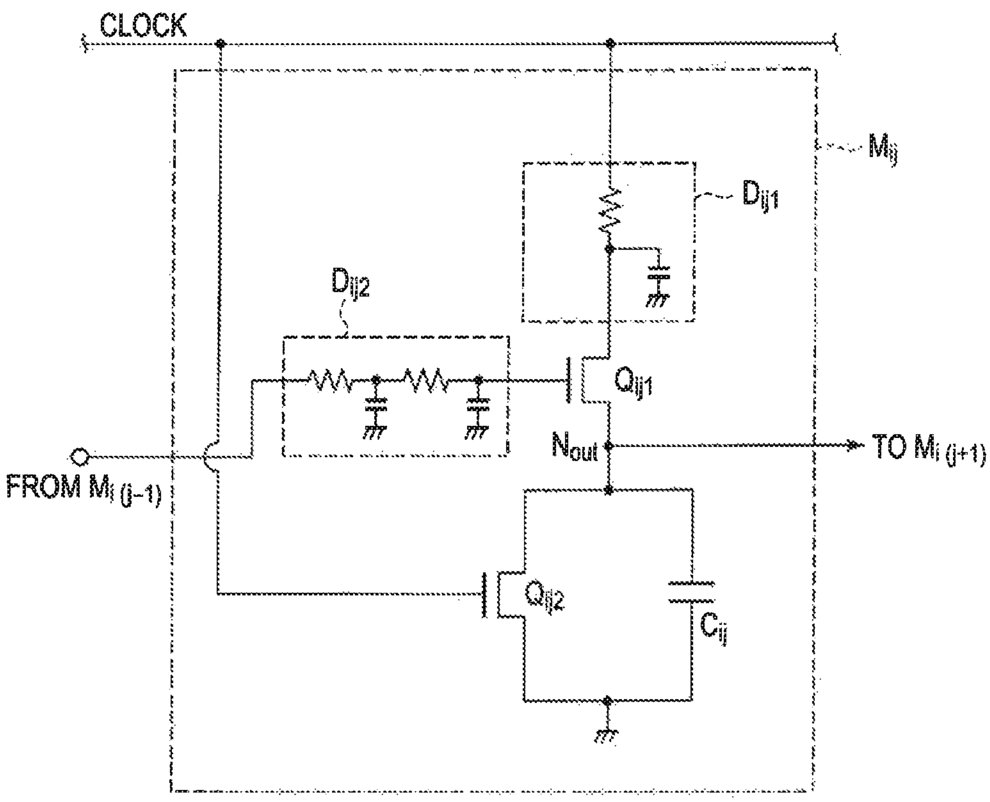

[Fig. 9]
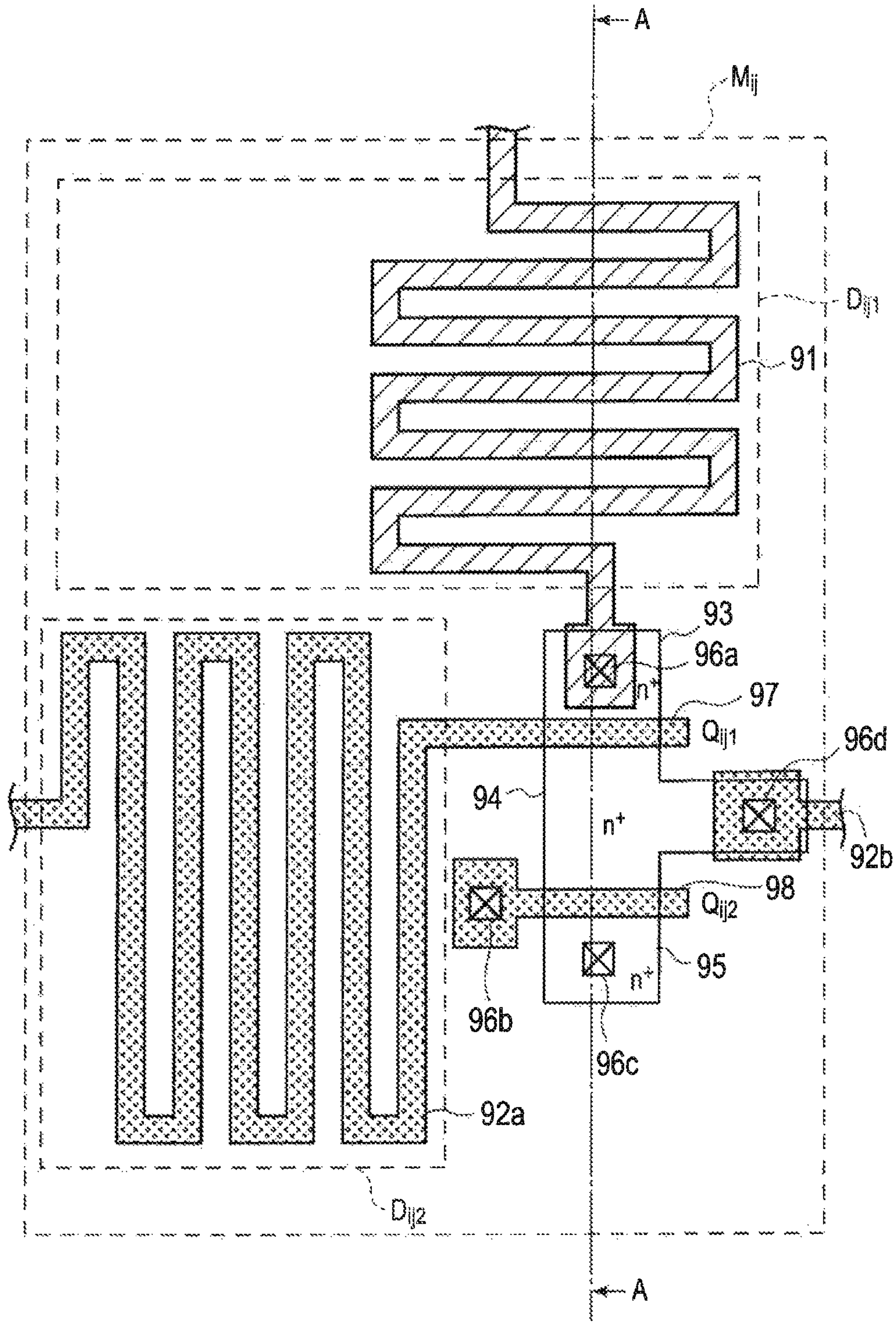

[Fig.10]
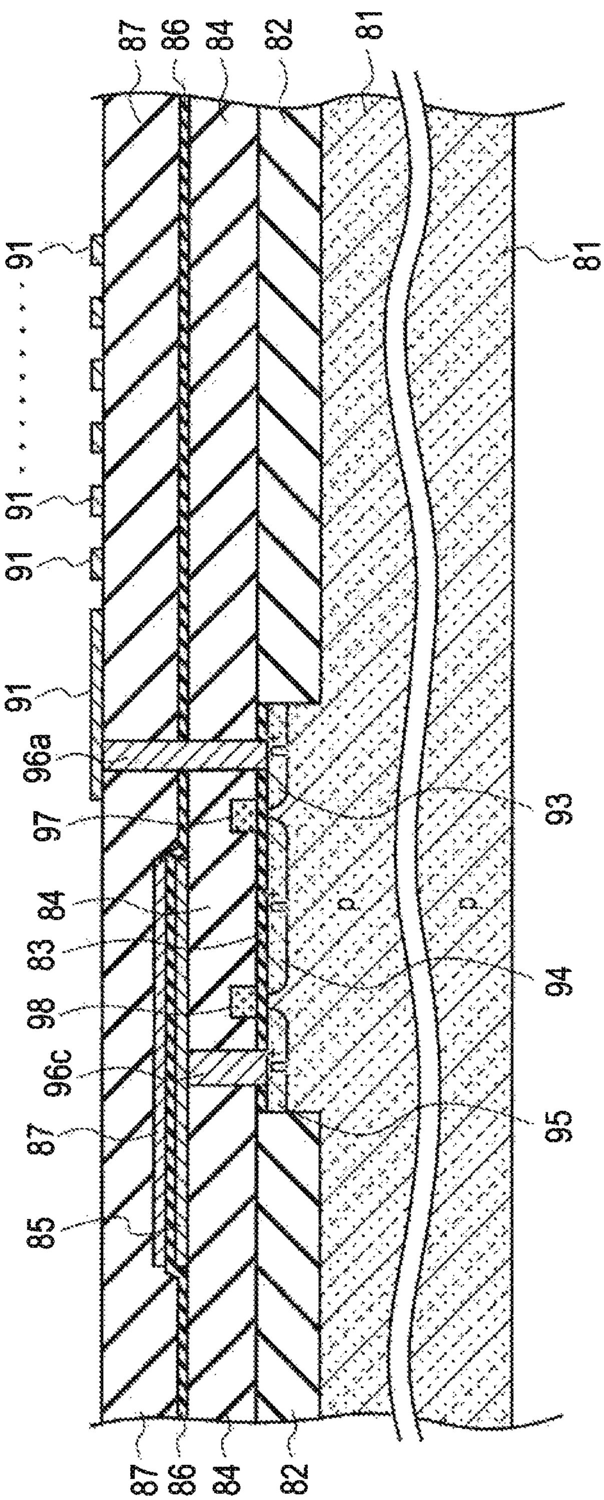

[Fig. 11]
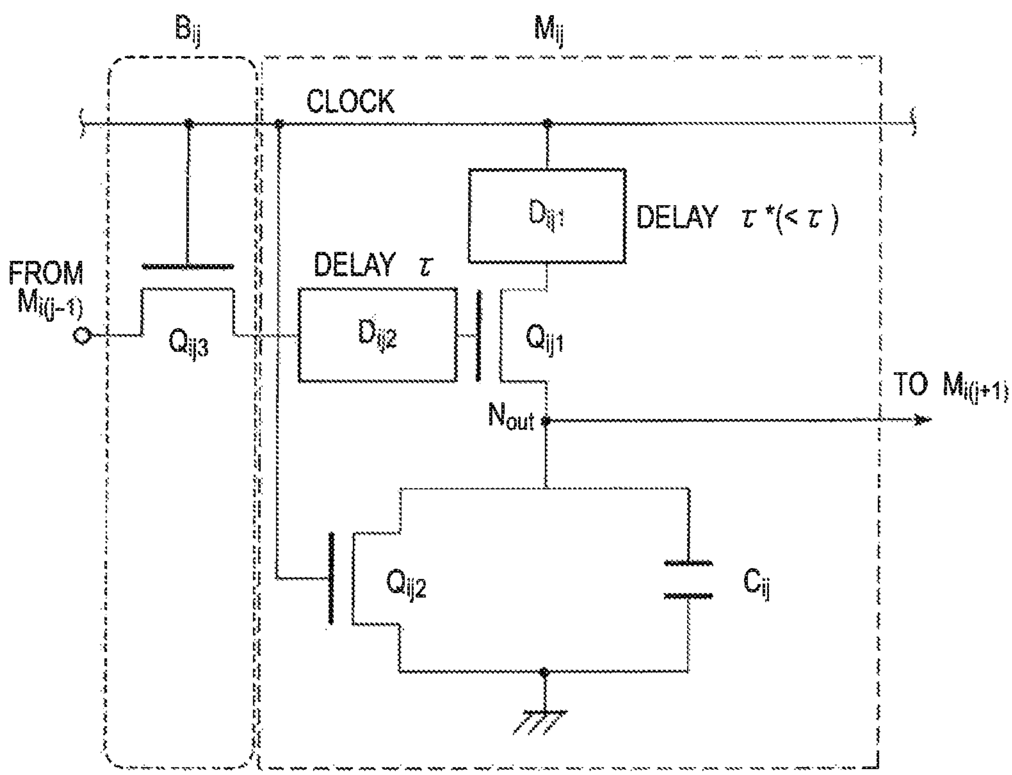

[Fig.12]
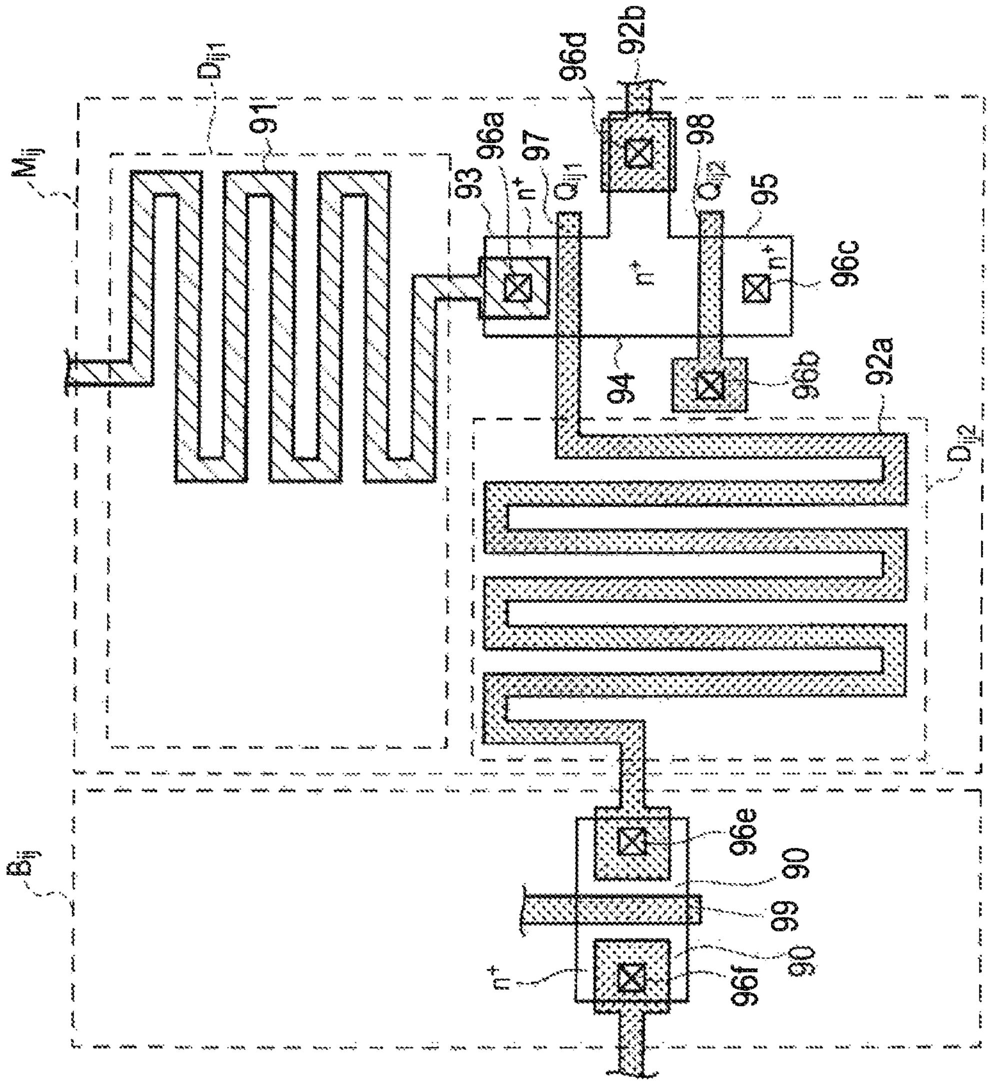

[Fig. 13]
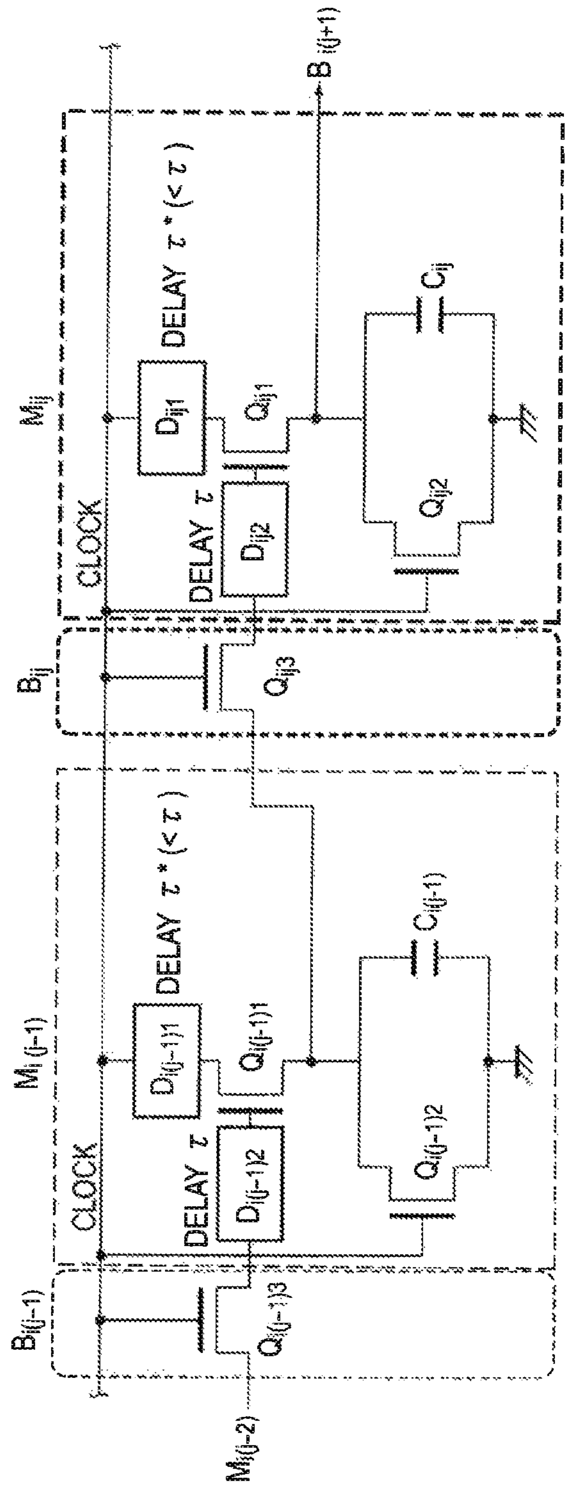

[Fig. 14 A]
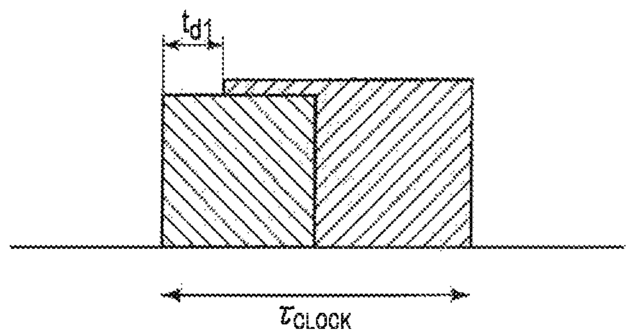
[Fig. 14 B]
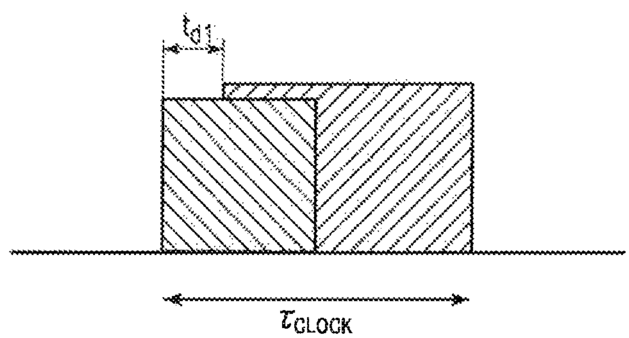

[Fig. 15]
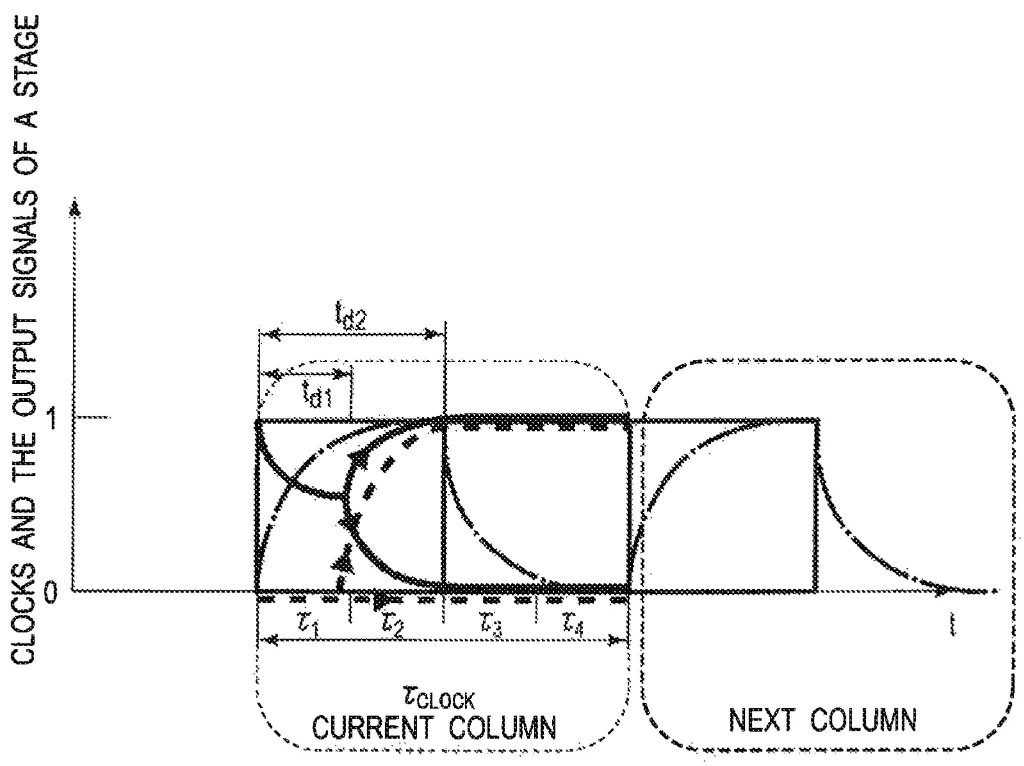

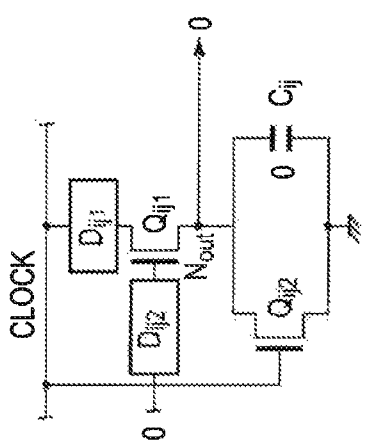
[Fig. 16A]
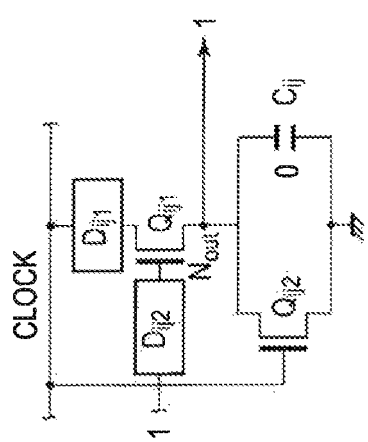
[Fig. 16B]
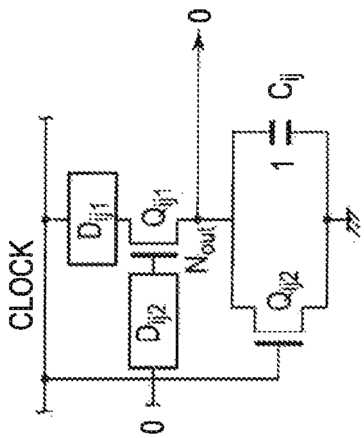
[Fig. 16C]
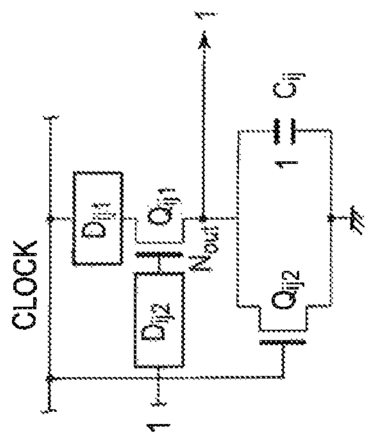
[Fig. 16D]

[Fig. 17]
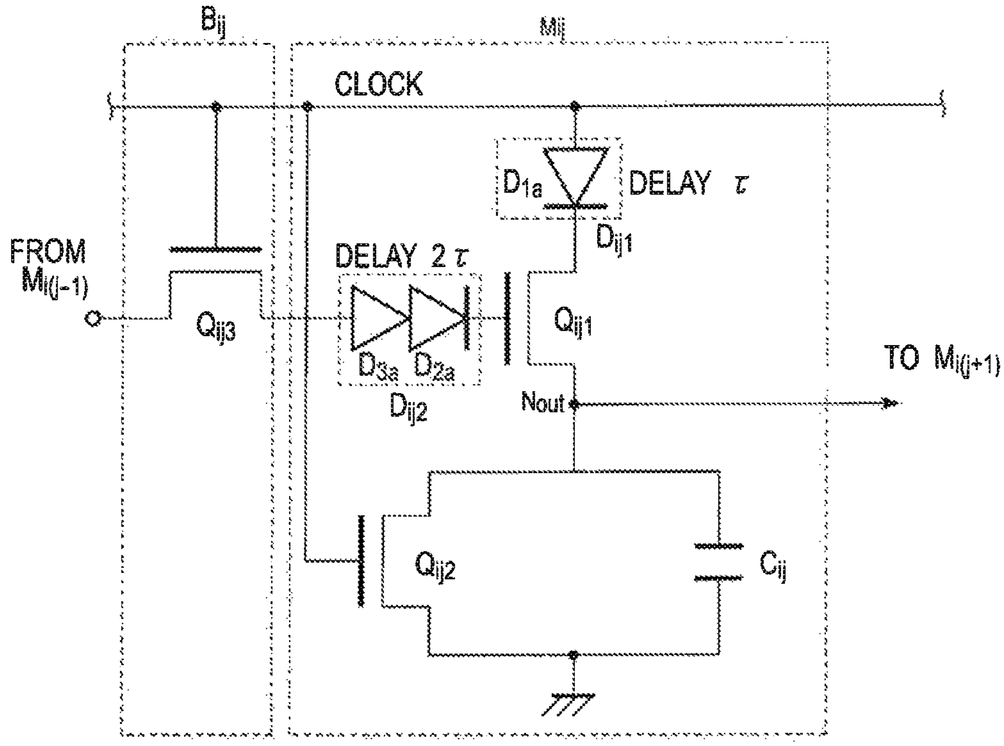

[Fig. 18]
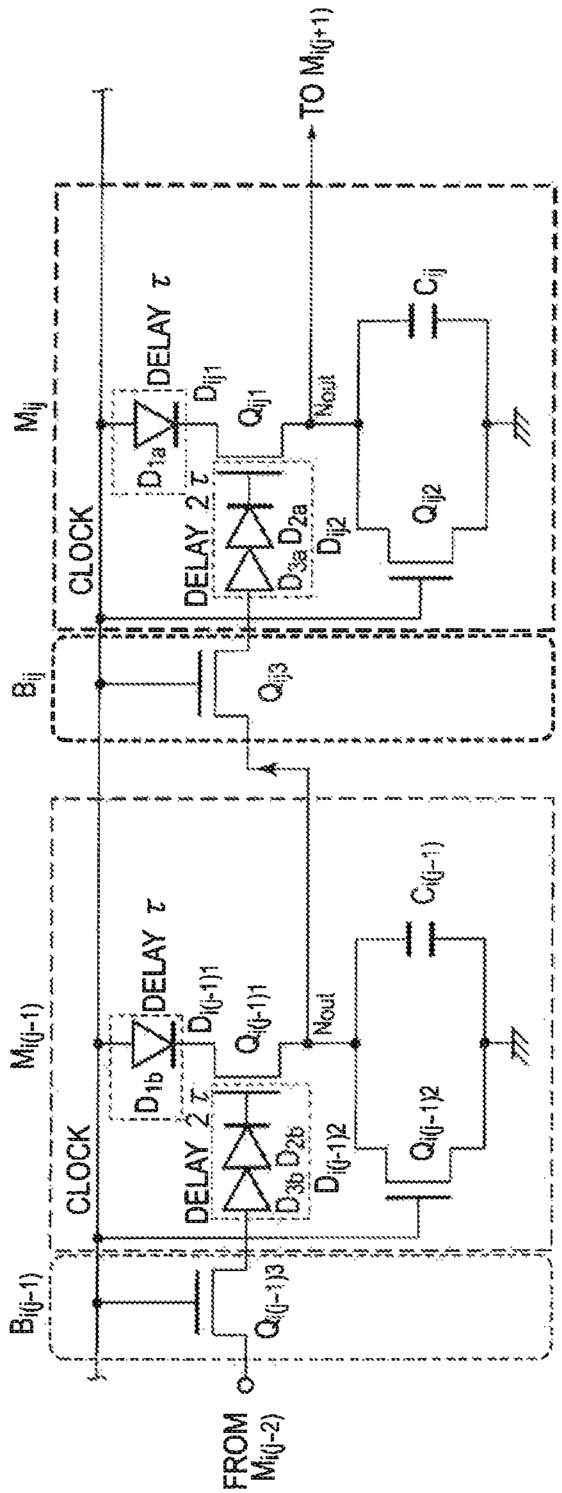

[Fig. 19]
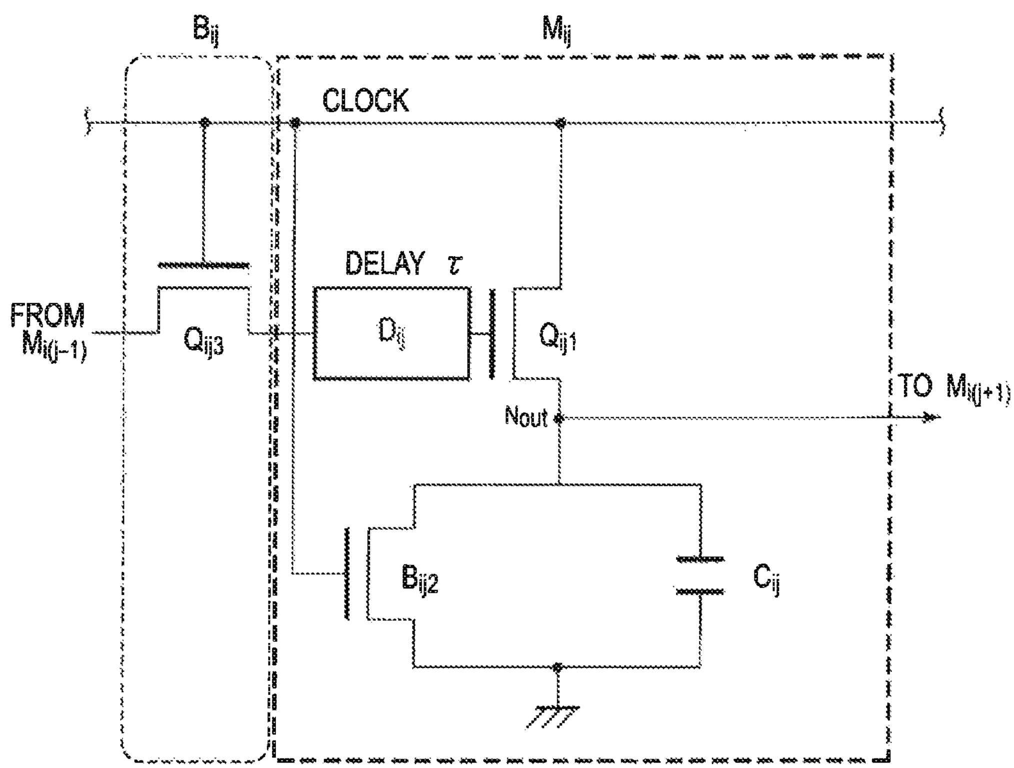

[Fig. 20]
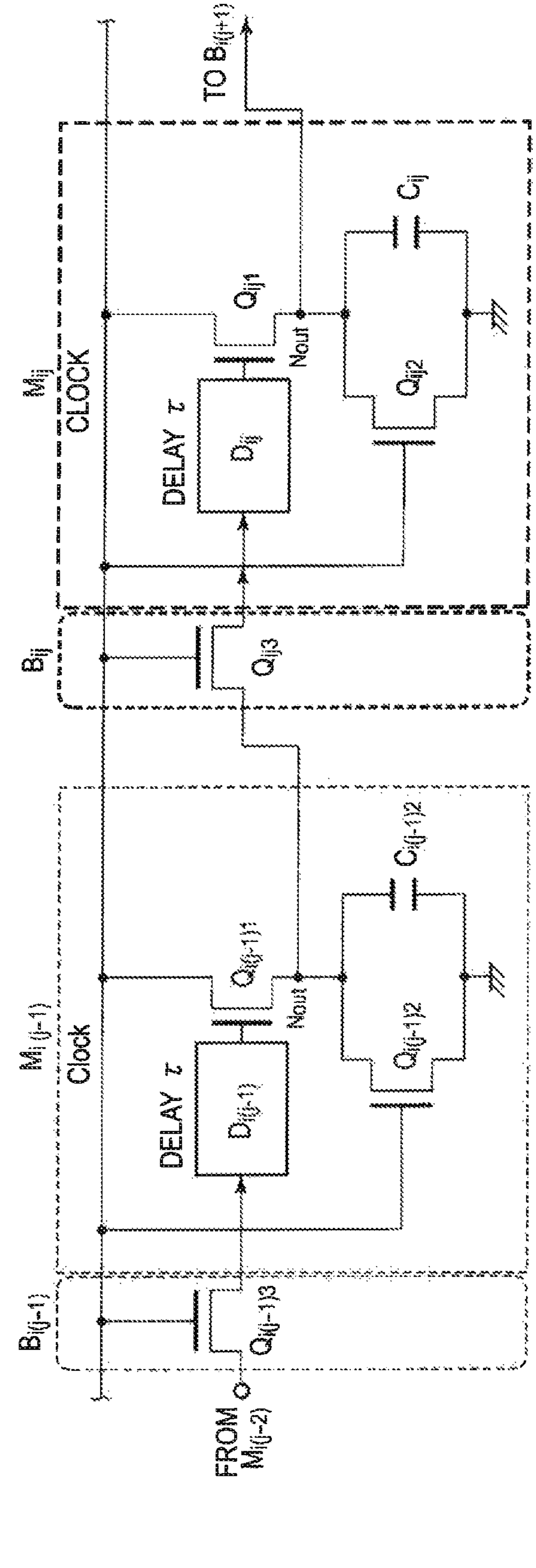

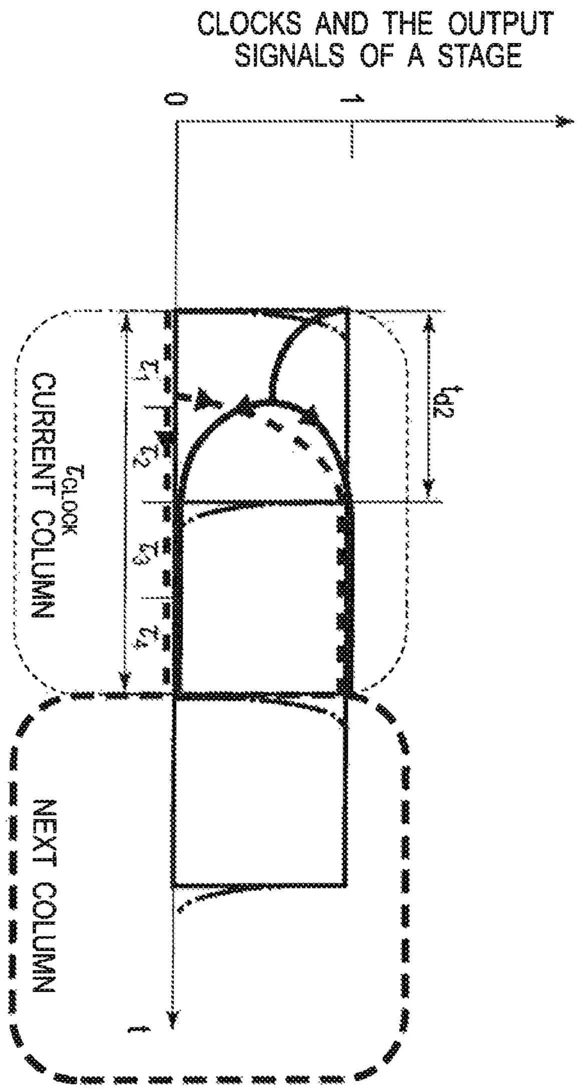
[Fig. 21]

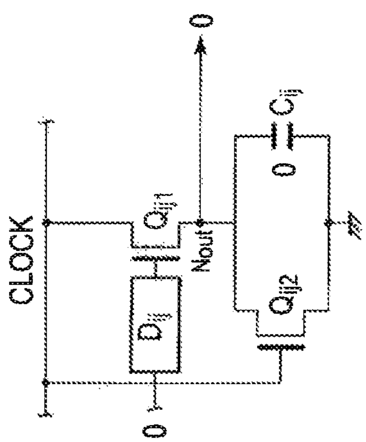
[Fig. 22A]
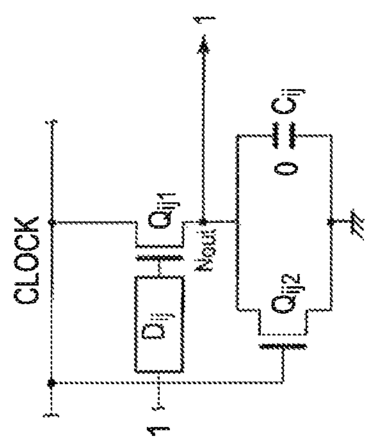
[Fig. 22B]
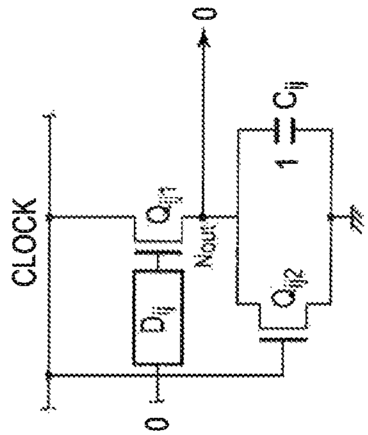
[Fig. 22C]
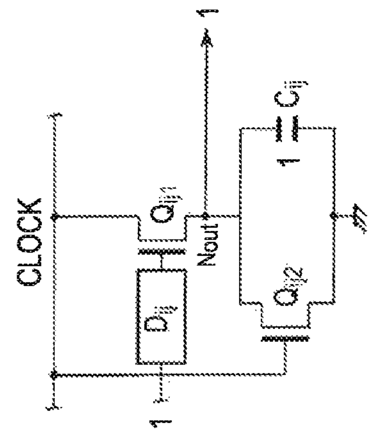
[Fig. 22D]

[Fig. 23]
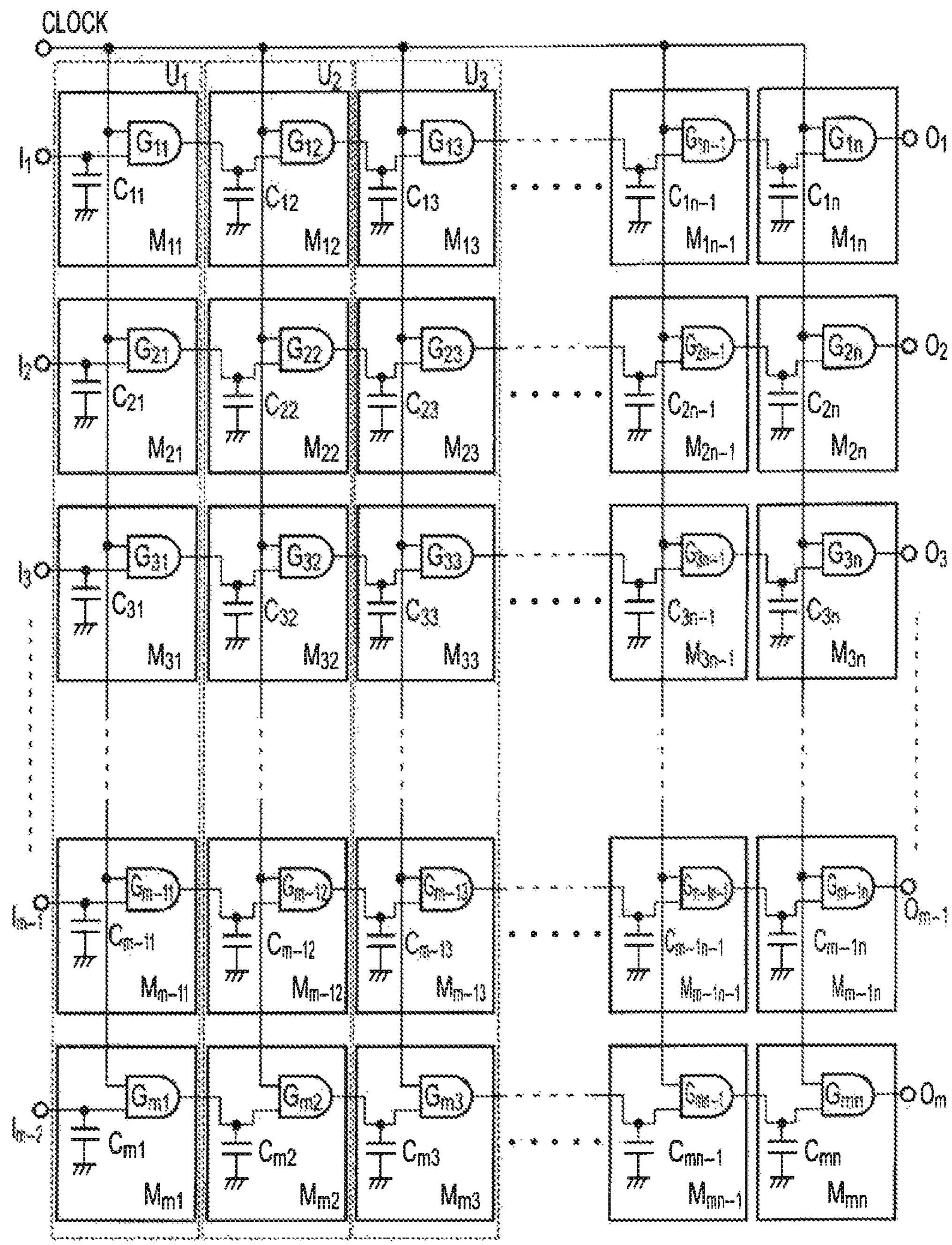

[Fig. 24]
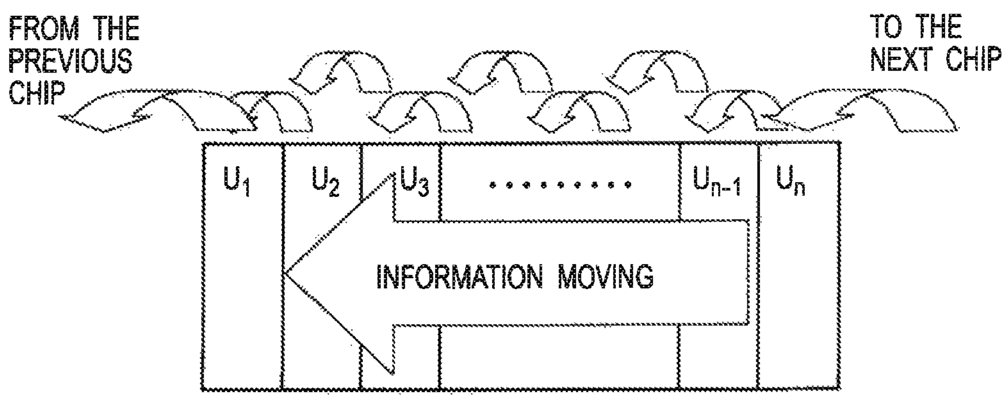

[Fig. 25A]
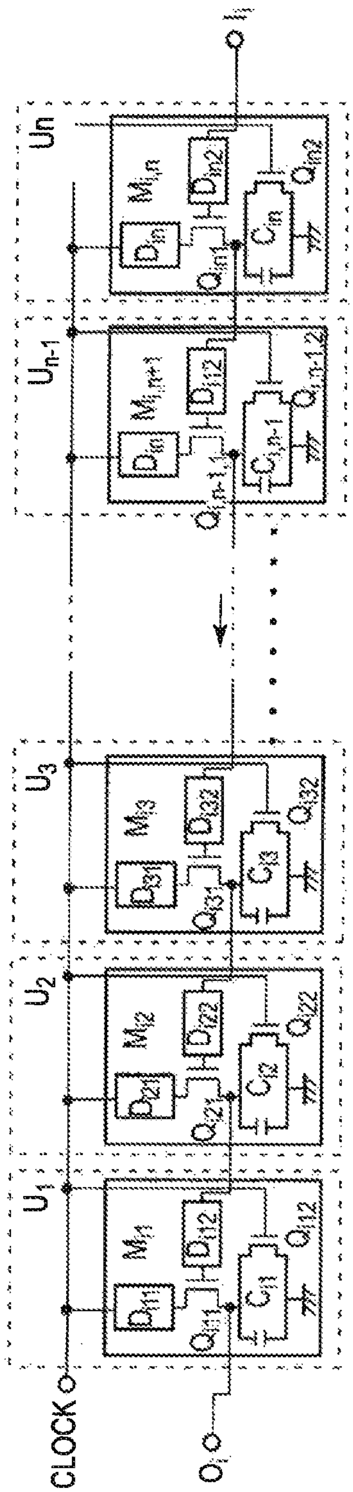
[Fig. 25B]
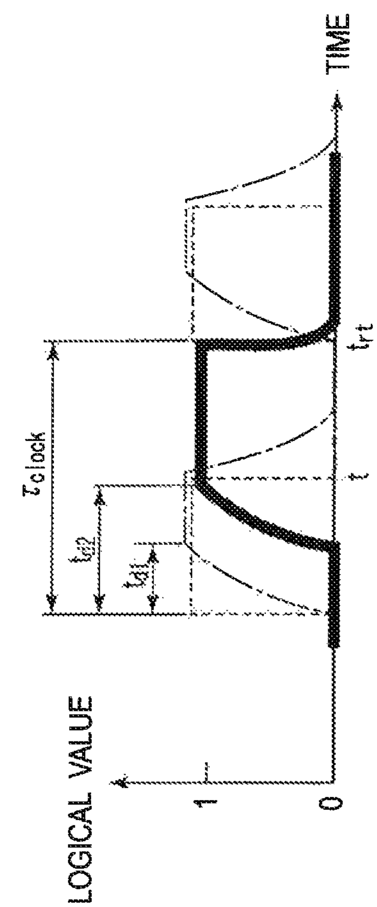

[Fig. 26]
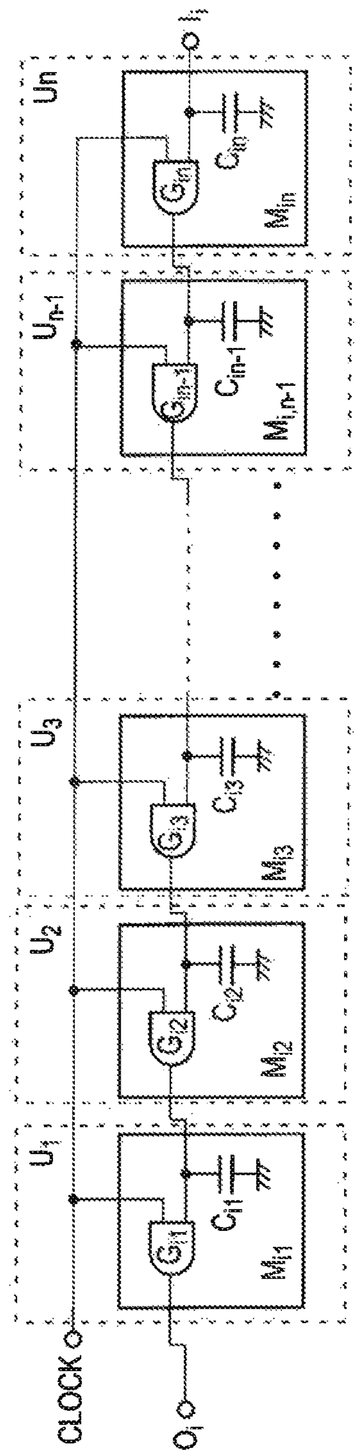

[Fig. 27]
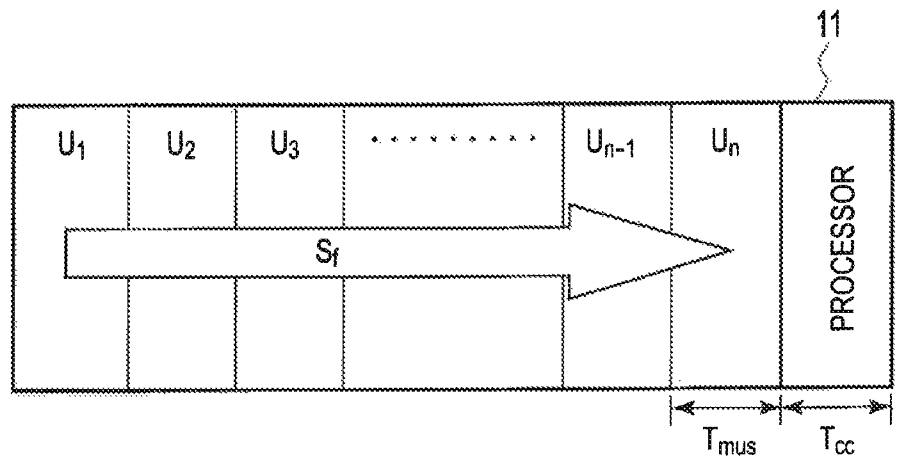
[Fig. 28]
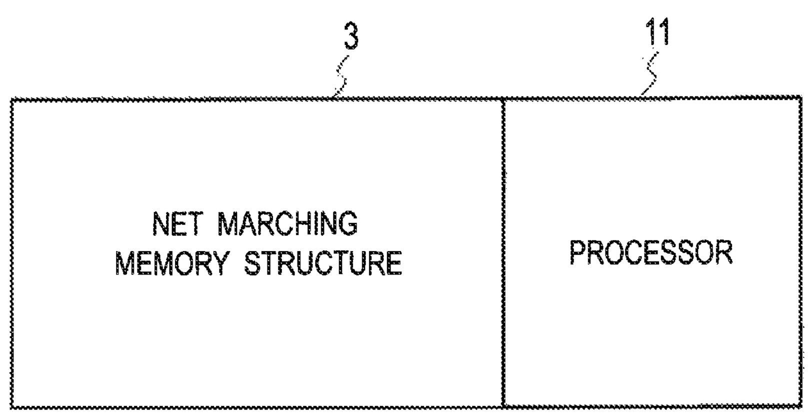

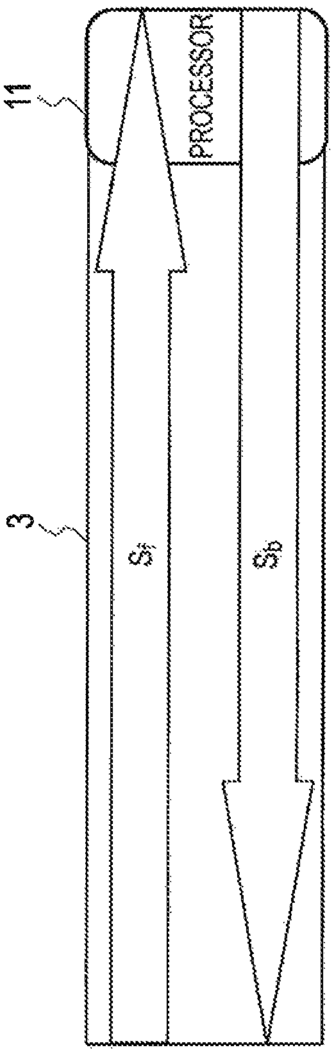
[Fig. 29A]
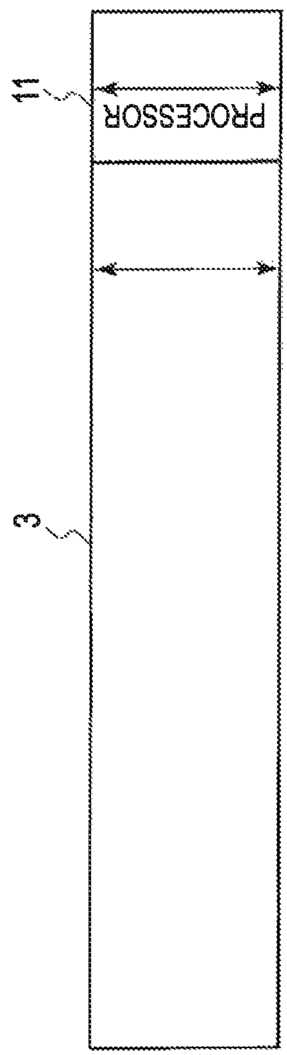
[Fig. 29B]

[Fig. 30 A]
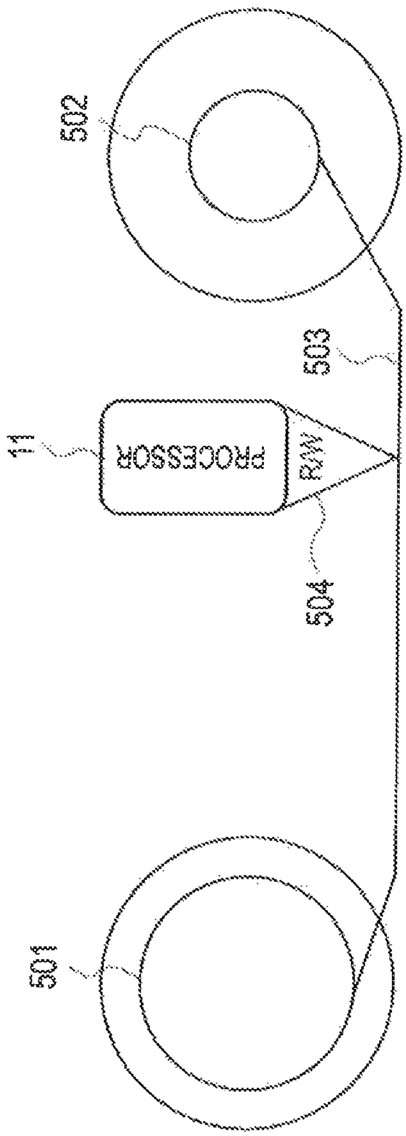
[Fig. 30 B]
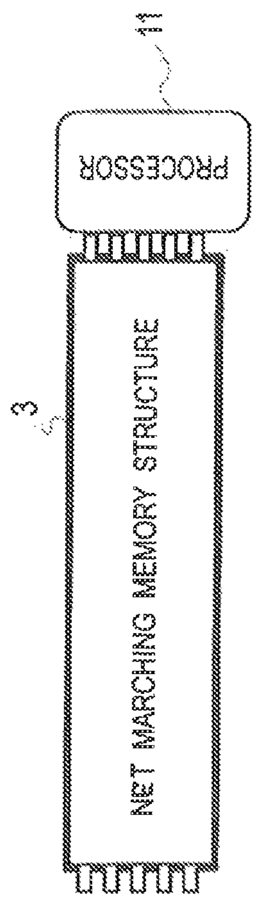
[Fig

[Fig. 31A]
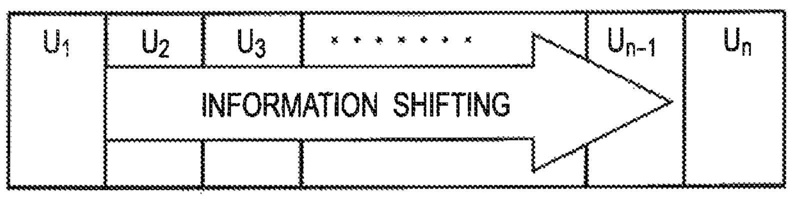
[Fig. 31B]
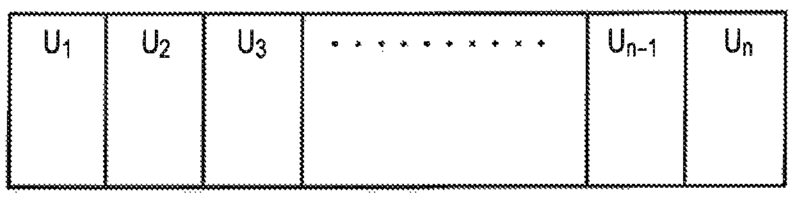
[Fig. 31C]
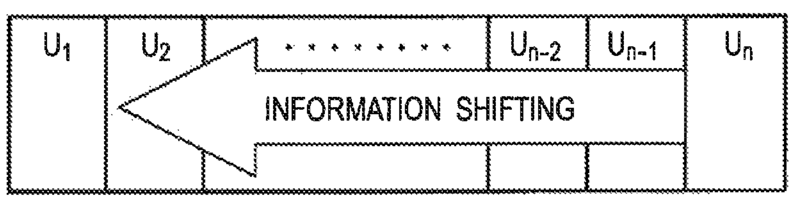

[Fig. 32]
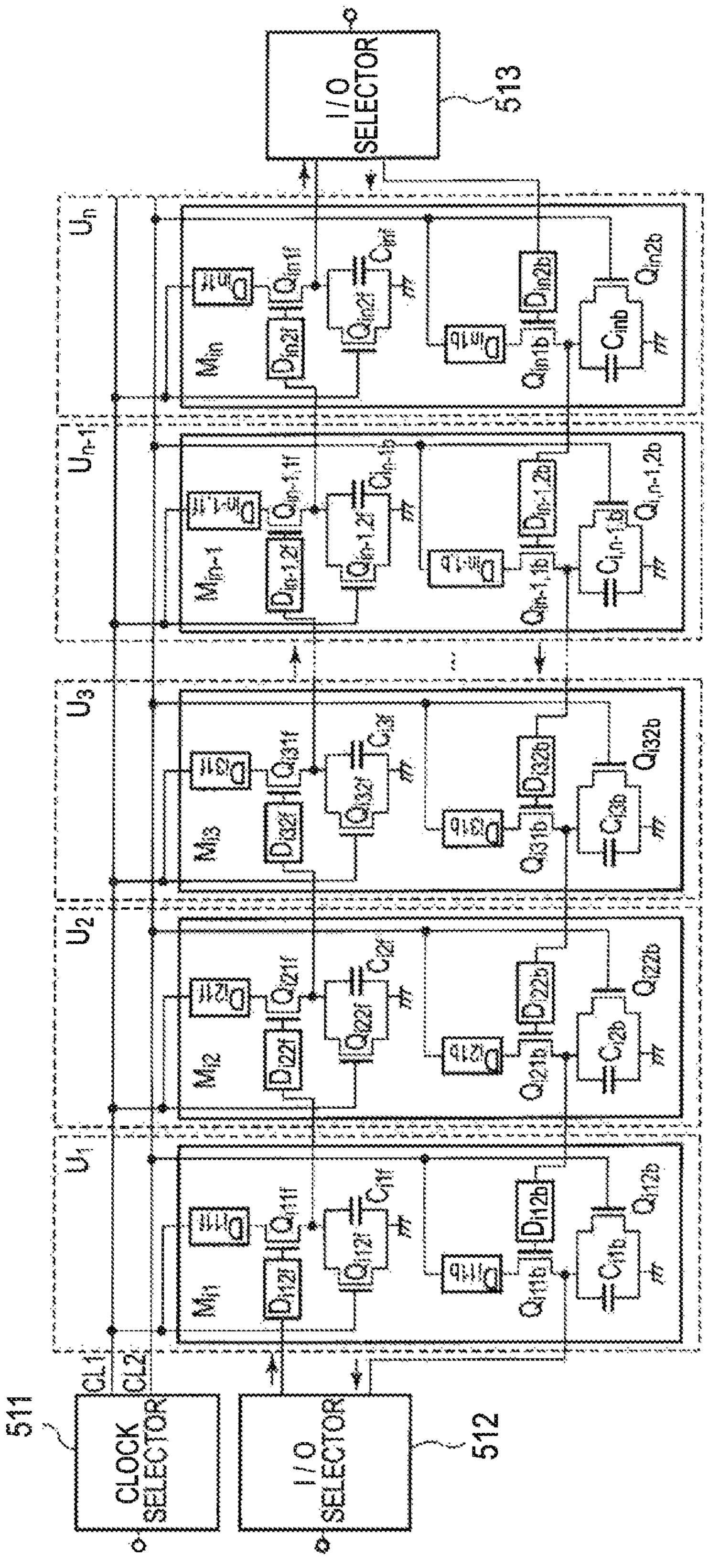

[Fig. 33]
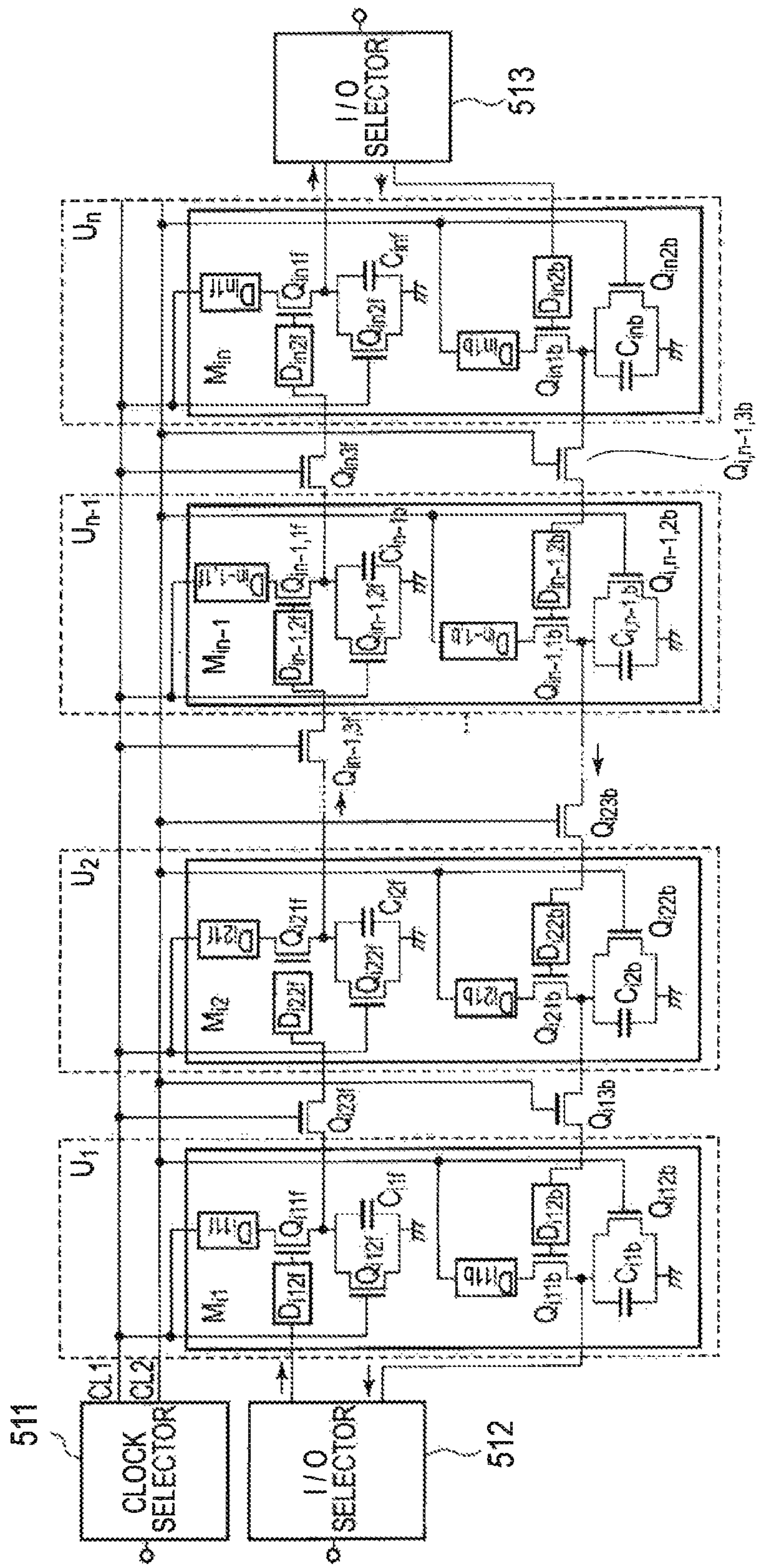

[Fig. 34]
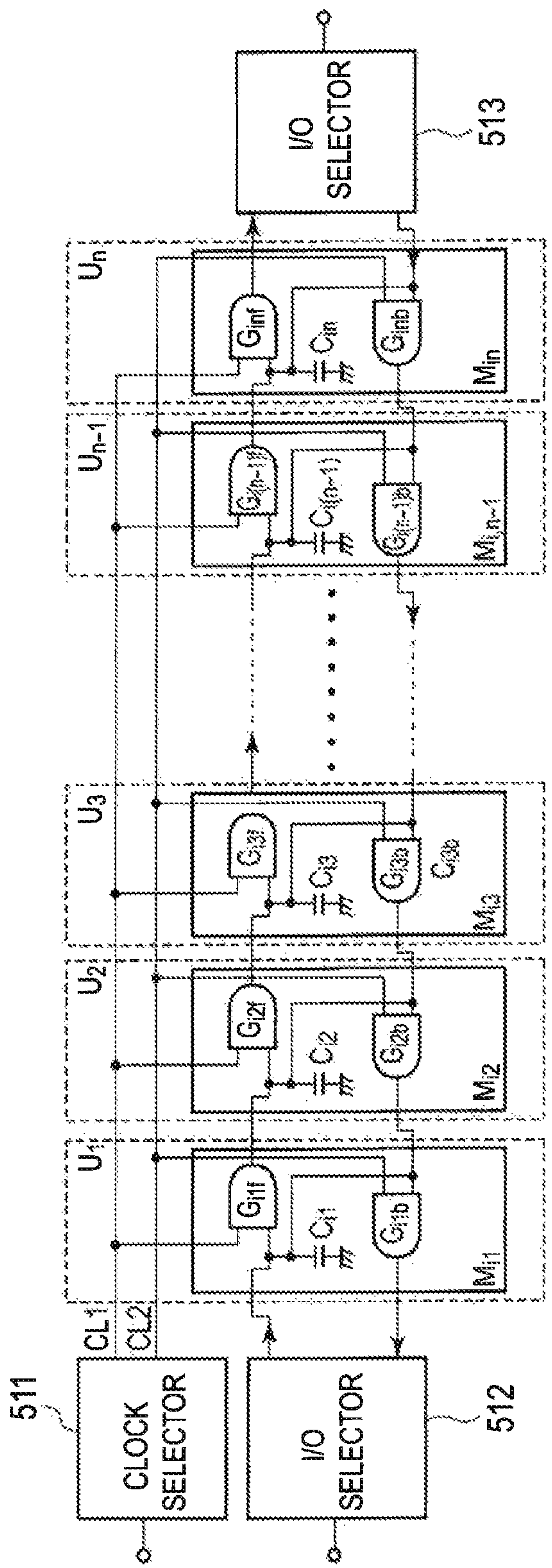

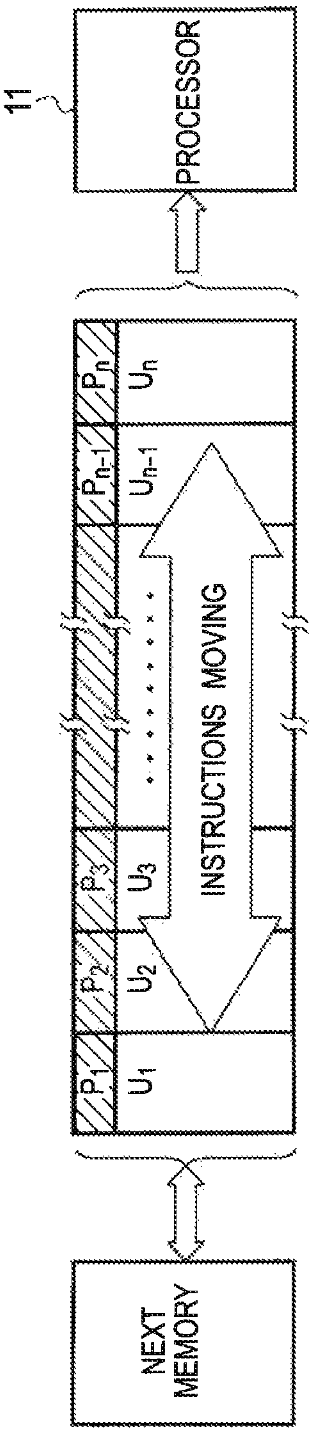
[Fig. 35A]
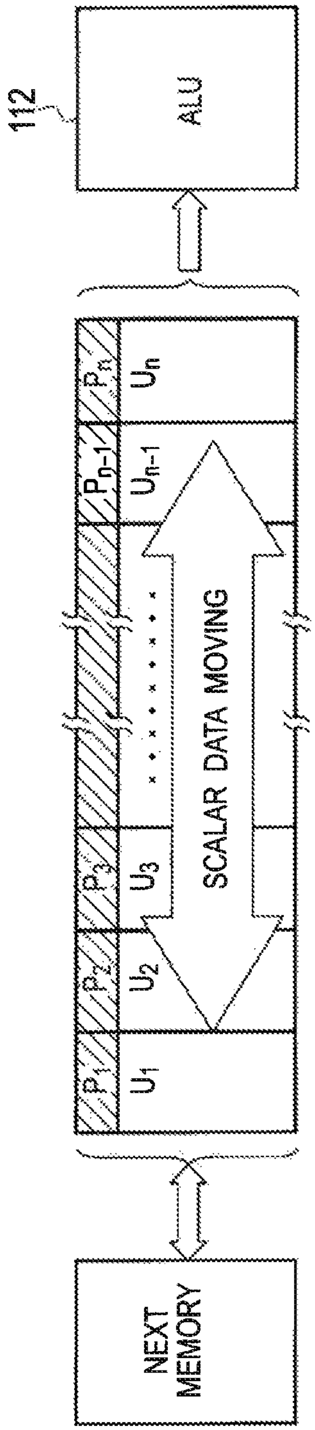
[Fig. 35B]
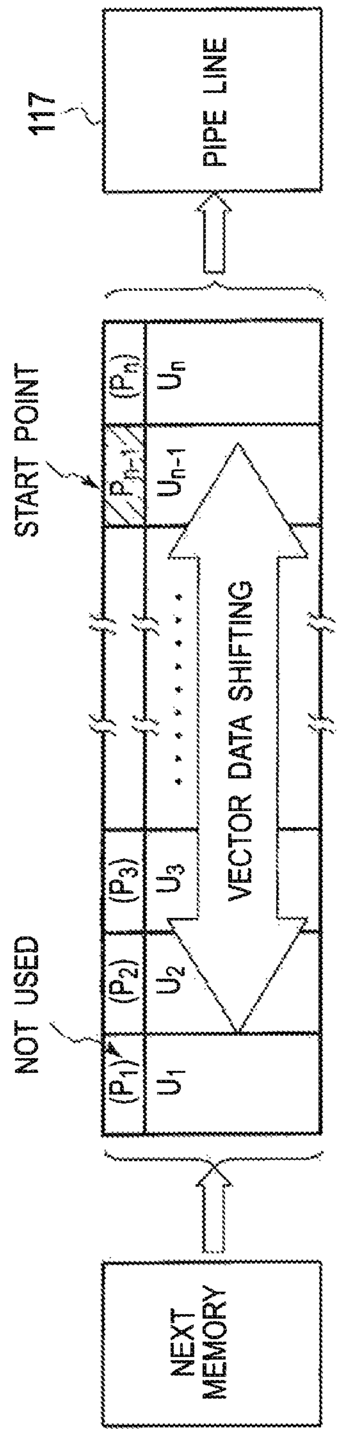
[Fig. 35C]

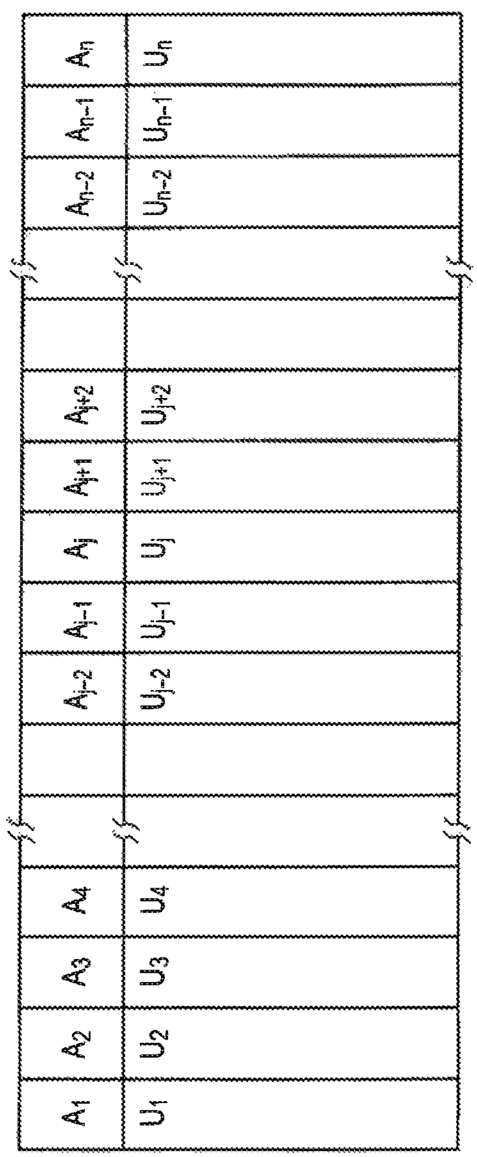
[Fig. 36A]
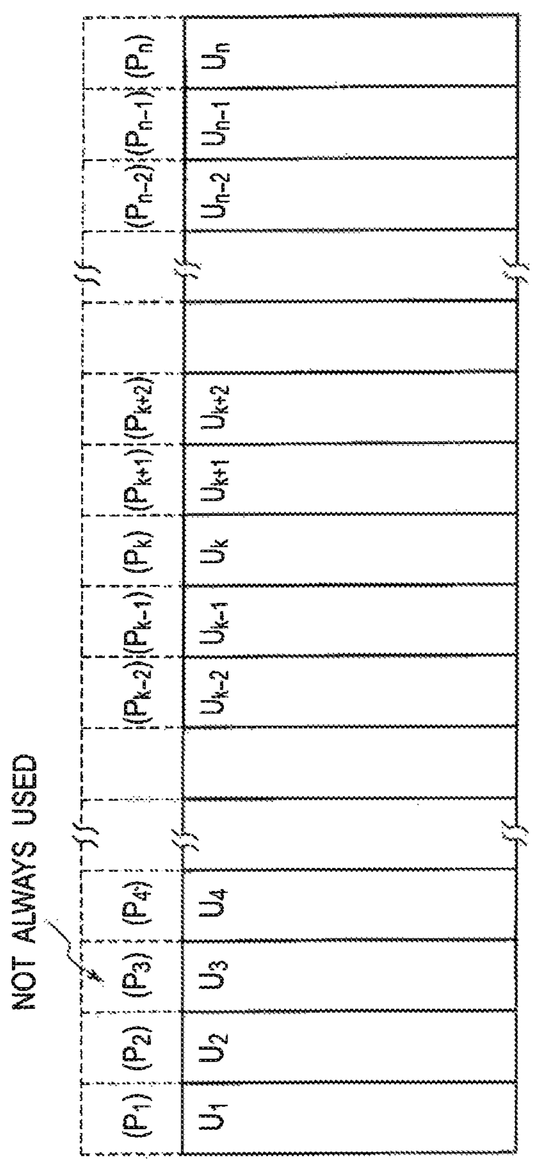
[Fig. 36B]

[Fig. 37A]
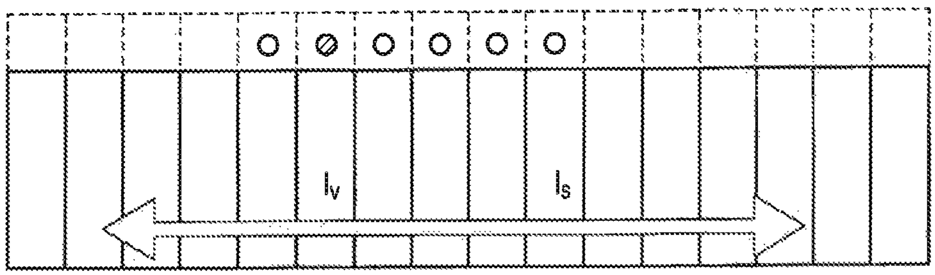
[Fig. 37B]
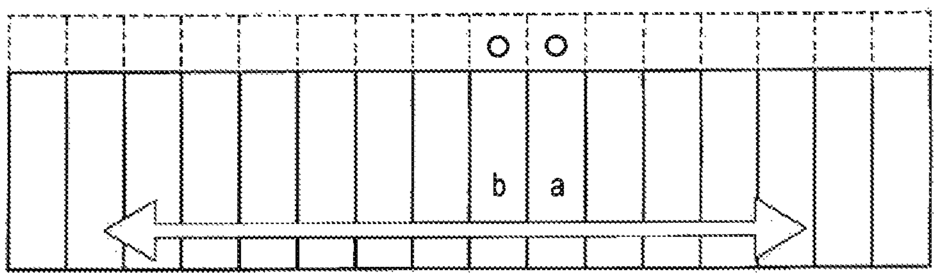
[Fig. 37C]
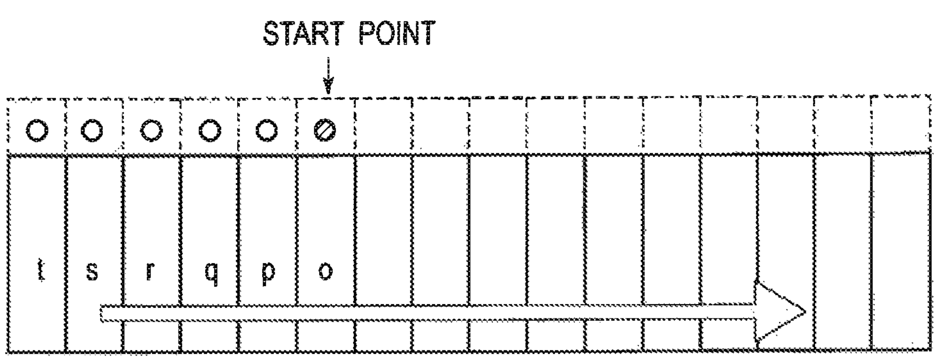

[Fig. 38A]
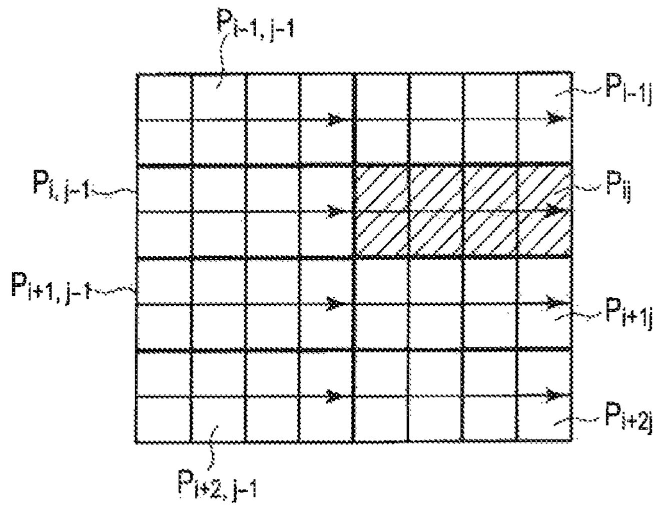
[Fig. 38B]
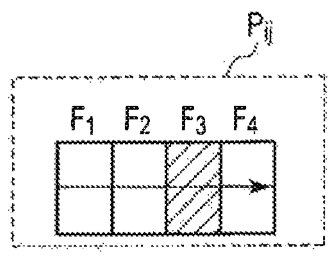
[Fig. 38C]
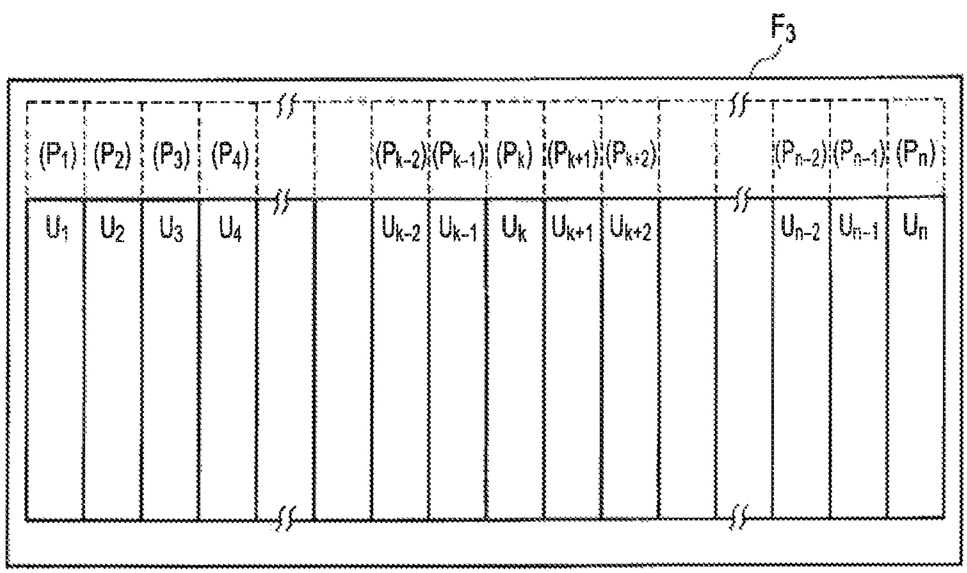

[Fig. 39A]
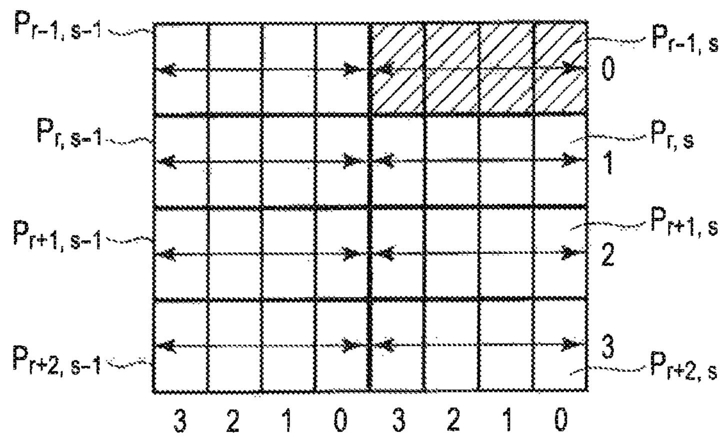
[Fig. 39B]
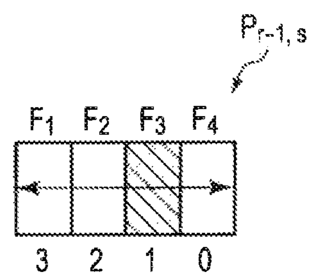
[Fig. 39C]
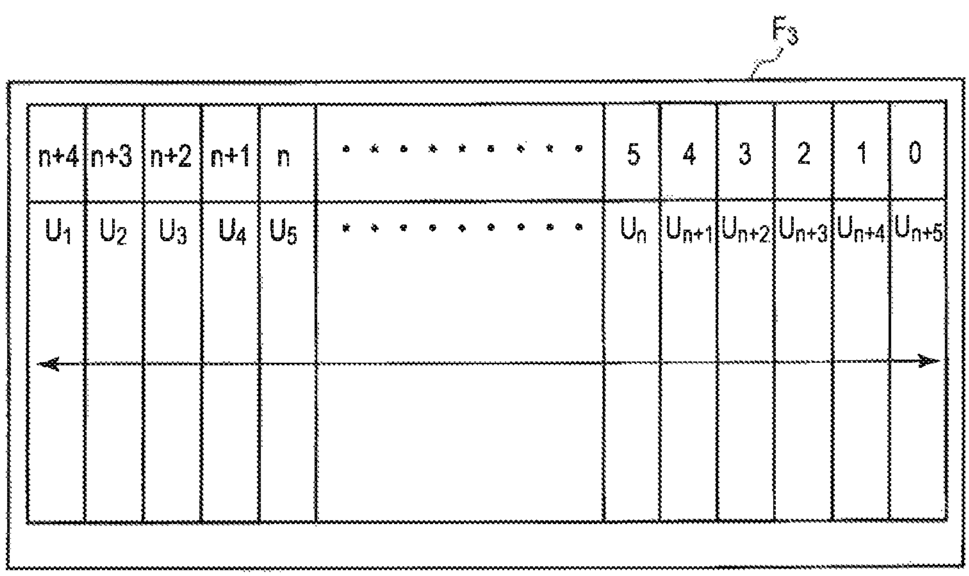

[Fig. 40A]
[Fig. 40B]
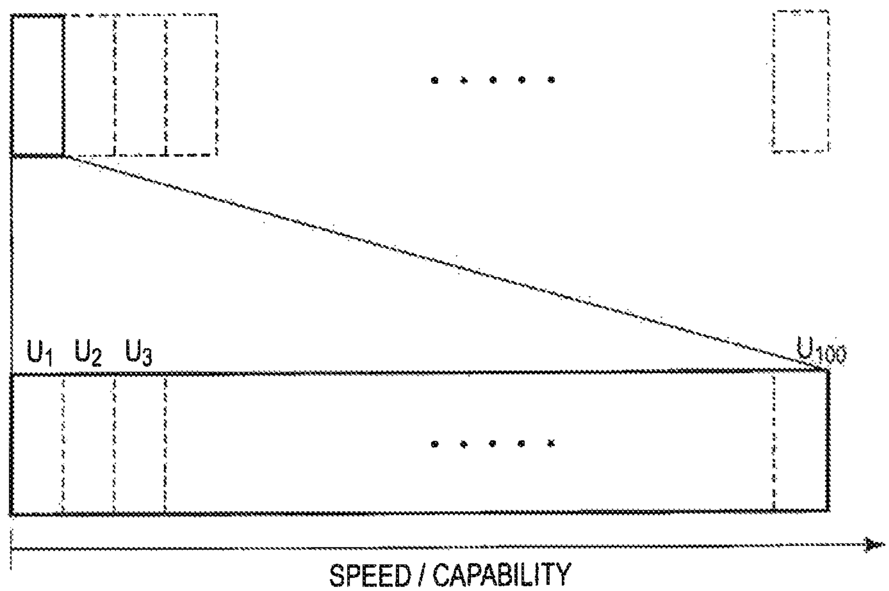
[Fig. 41A]
[Fig. 41B]
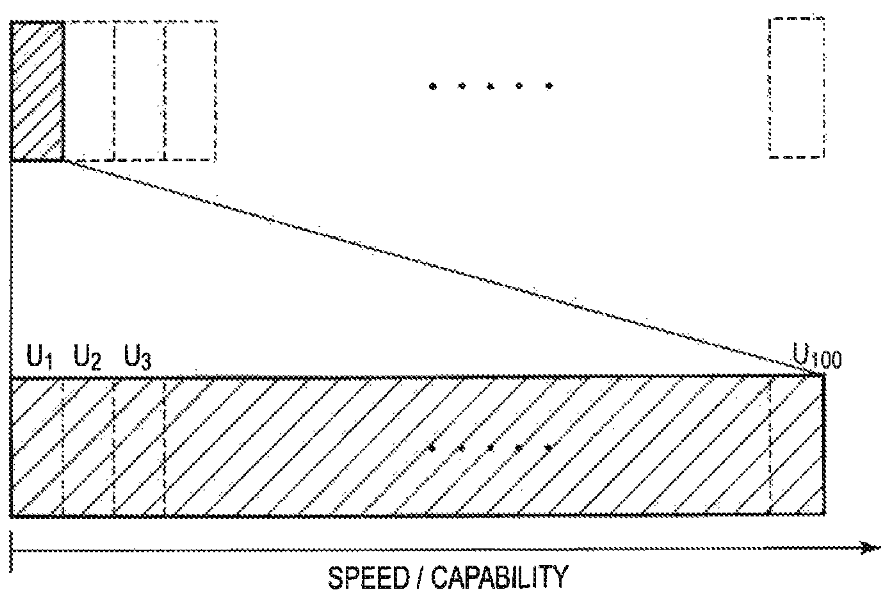

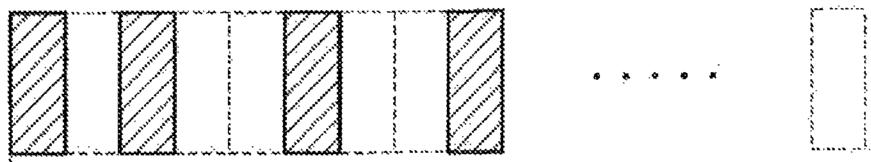
[Fig. 42A]
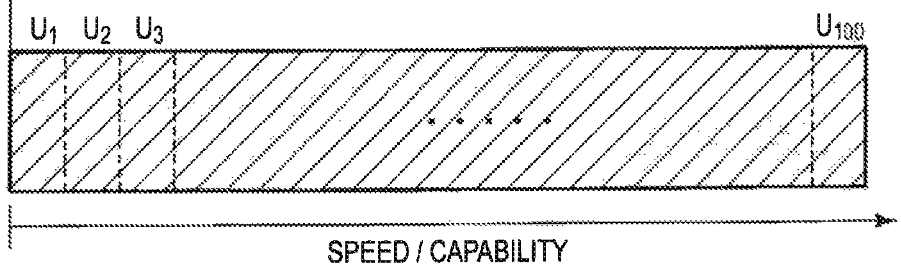
[Fig. 42B]
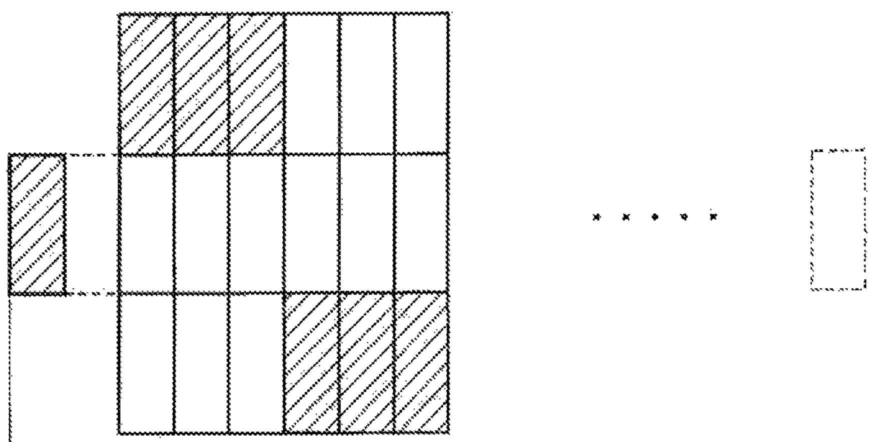
[Fig. 43A]
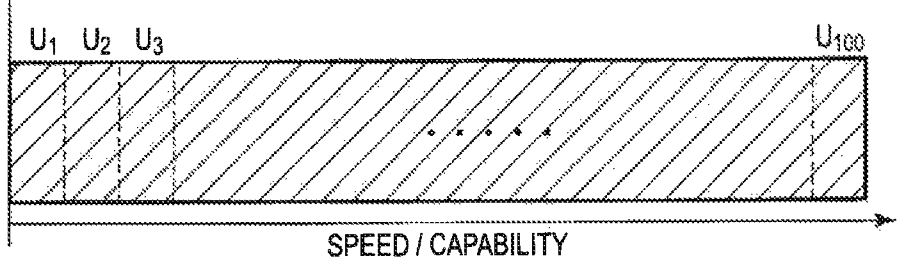
[Fig. 43B]

[Fig. 44A]
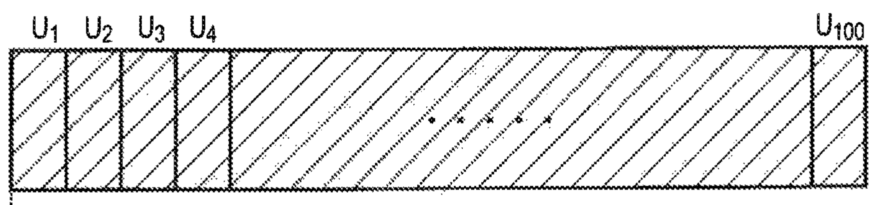
[Fig. 44B]
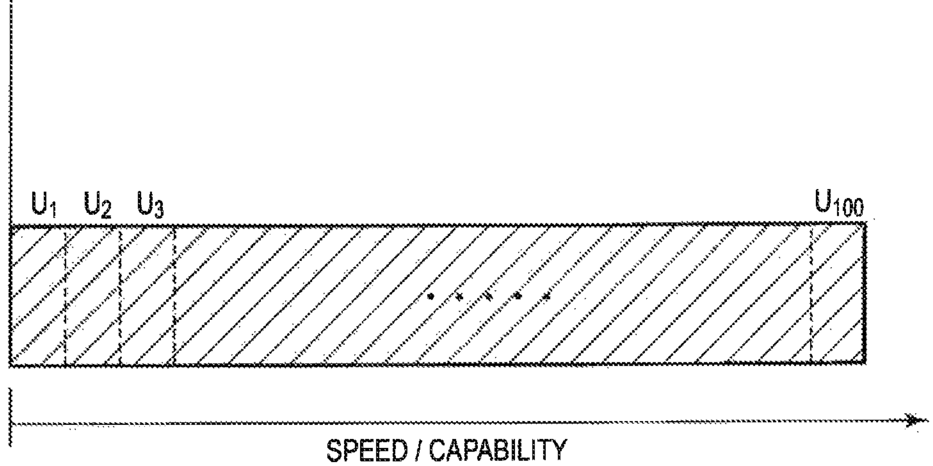

[Fig. 45]
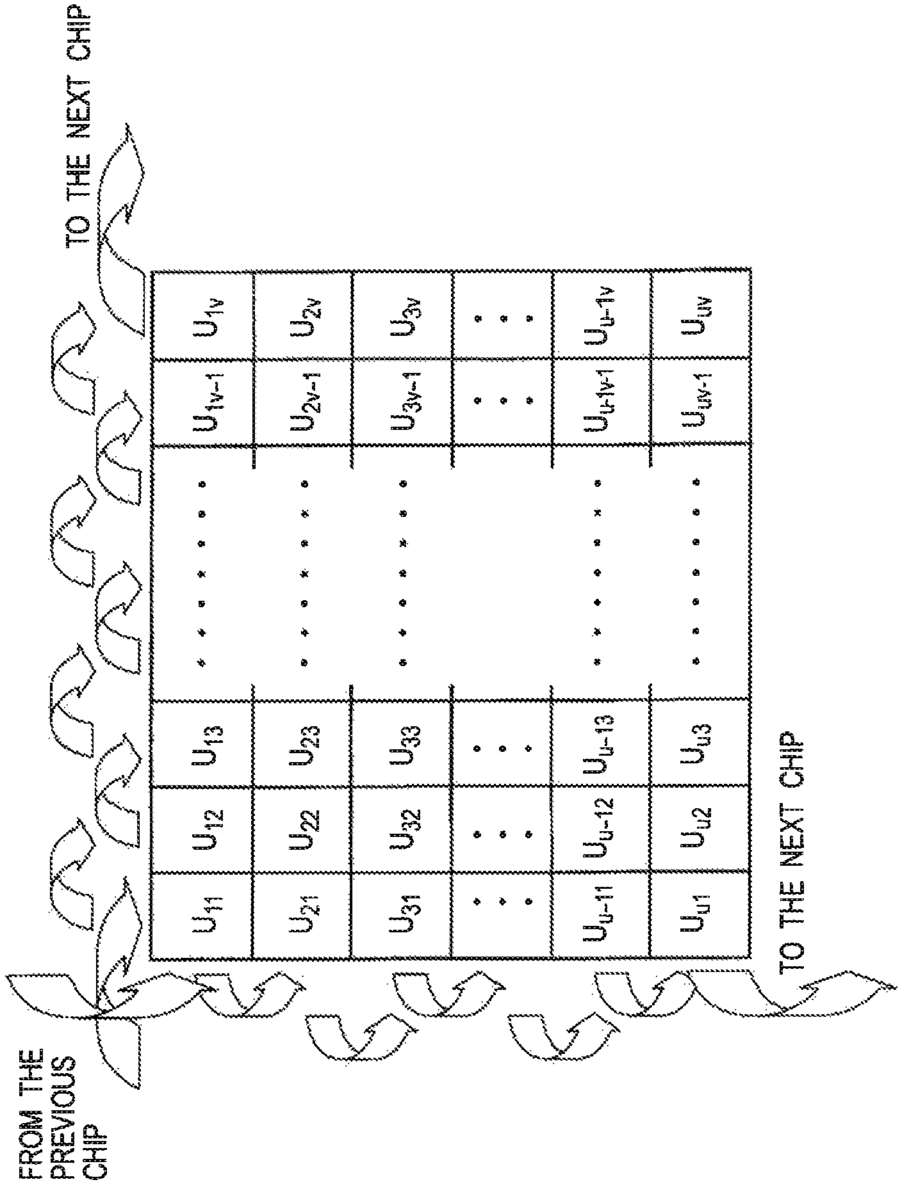

[Fig. 46]
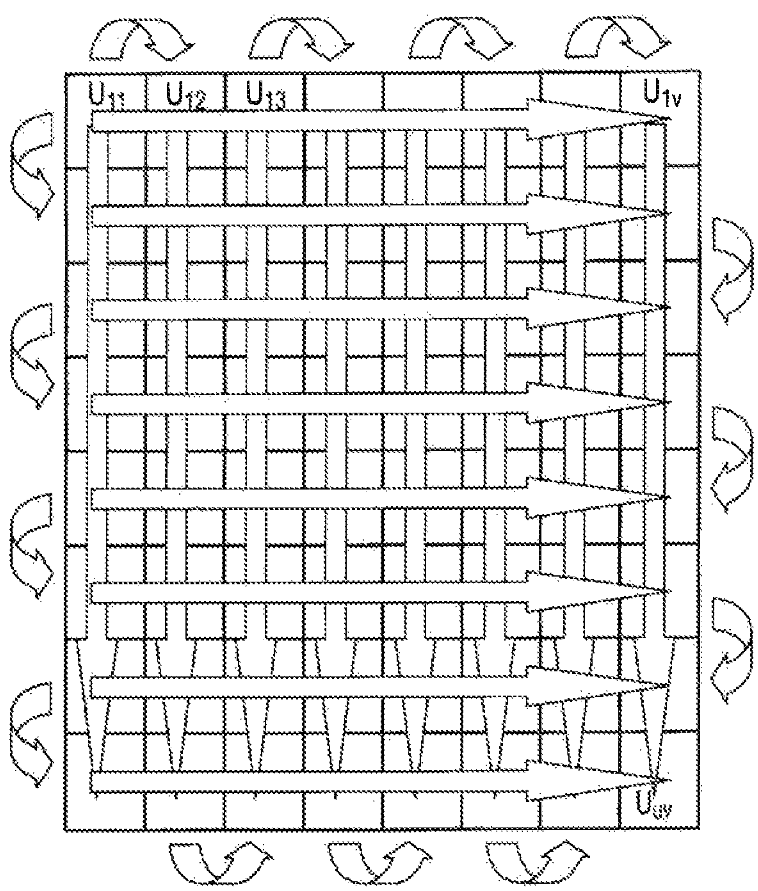

[Fig. 47]
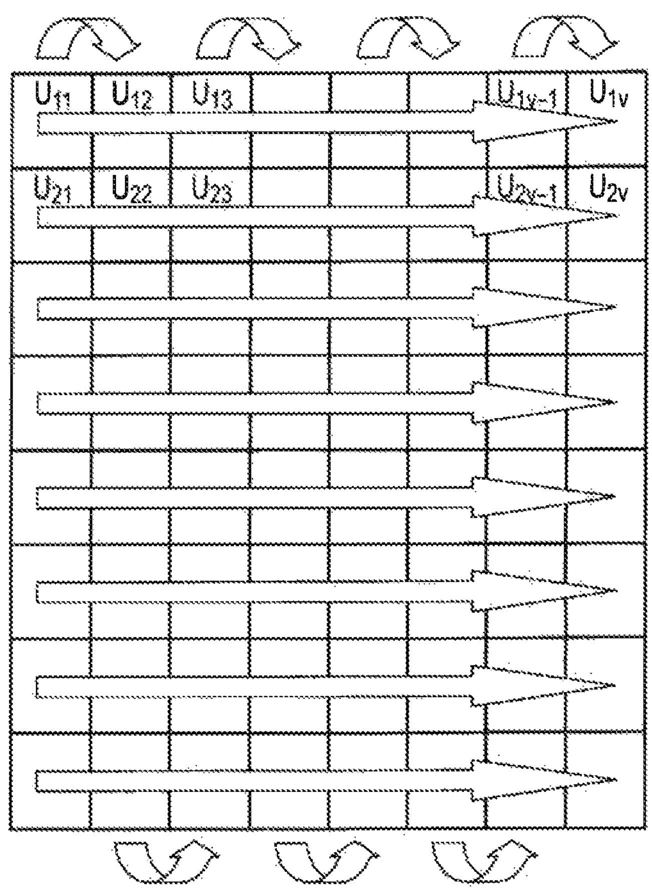

[Fig. 48]
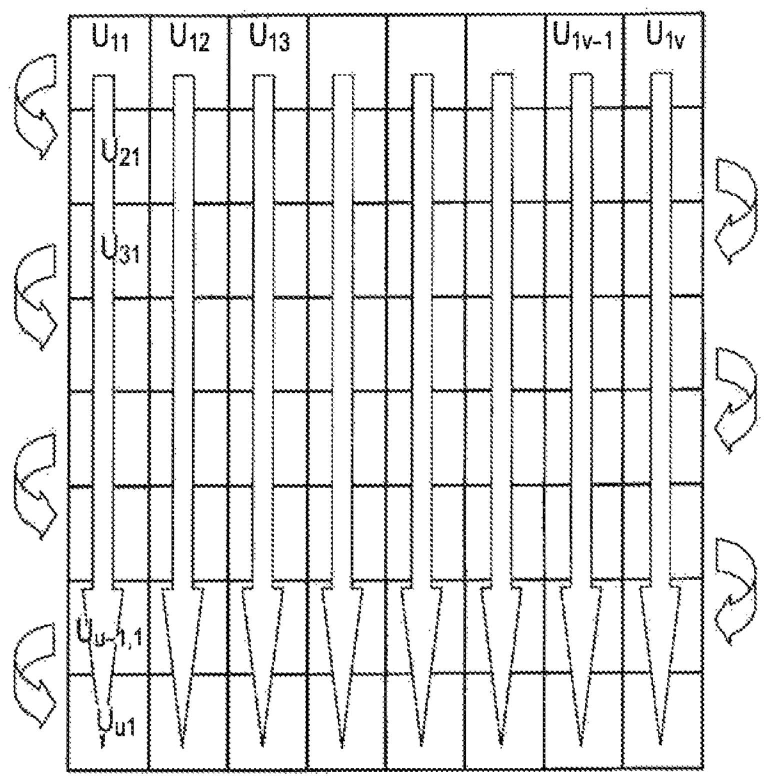

[Fig. 49]
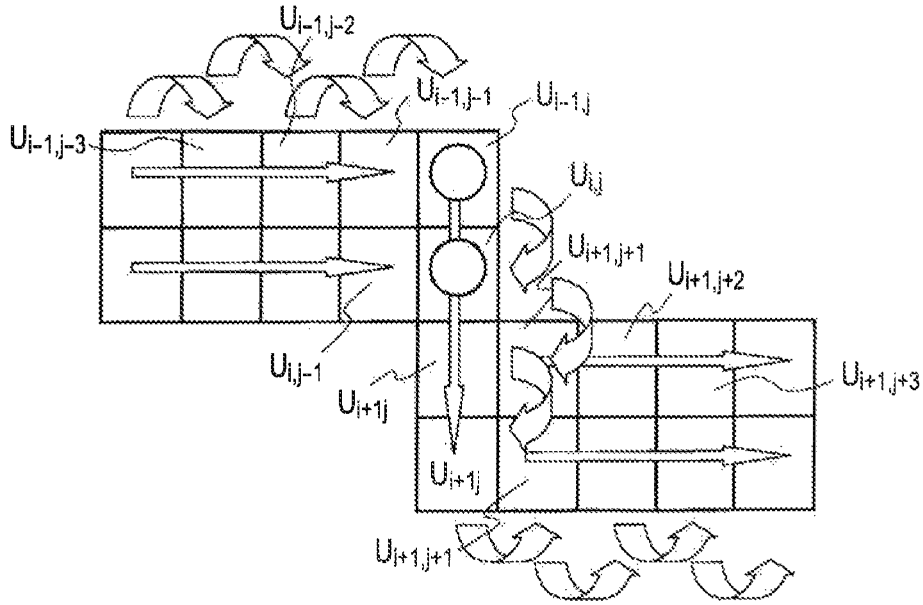
[Fig. 50]
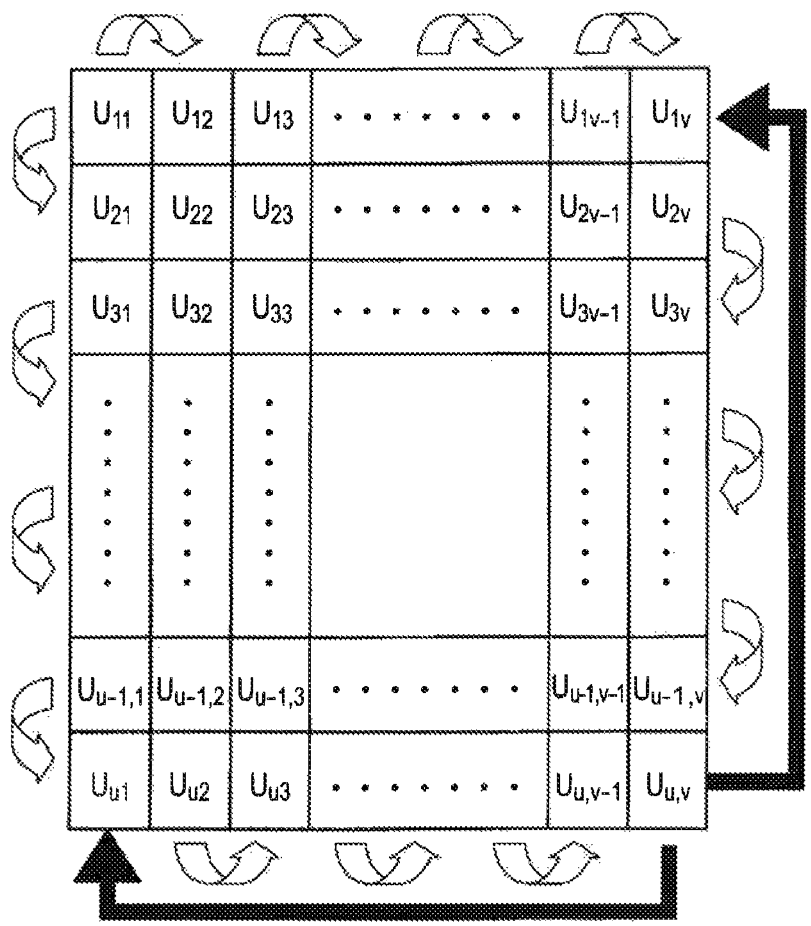

[Fig. 51]
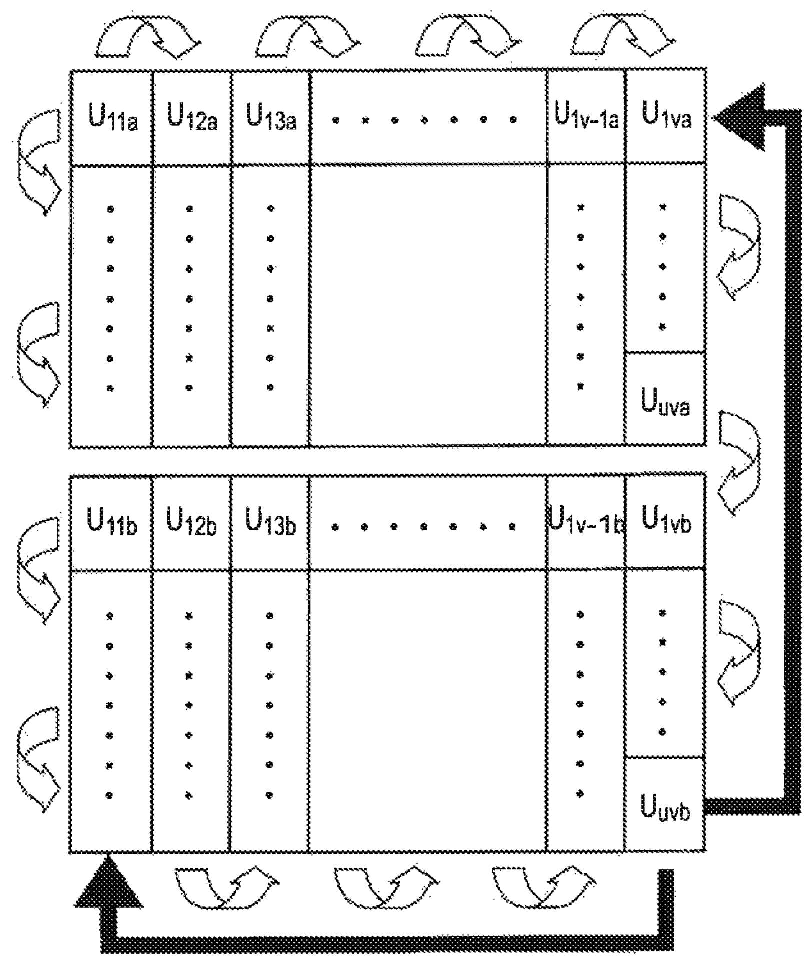

[Fig. 52A]
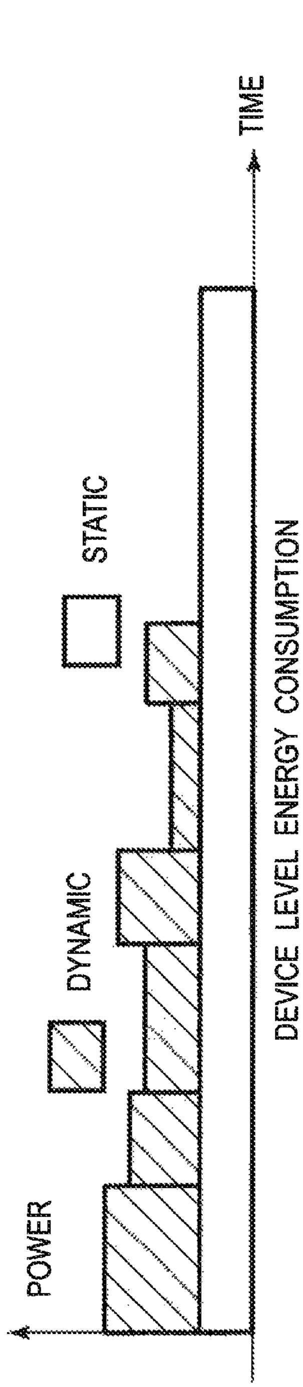
[Fig. 52B]
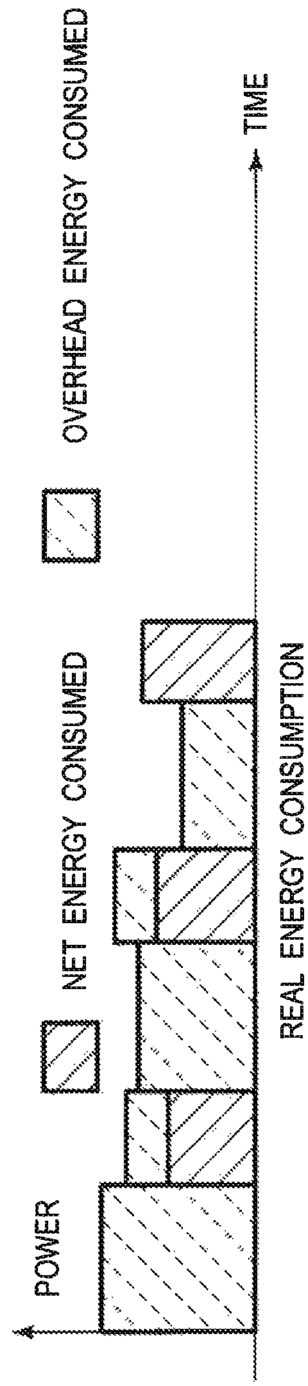
[Fig. 52C]
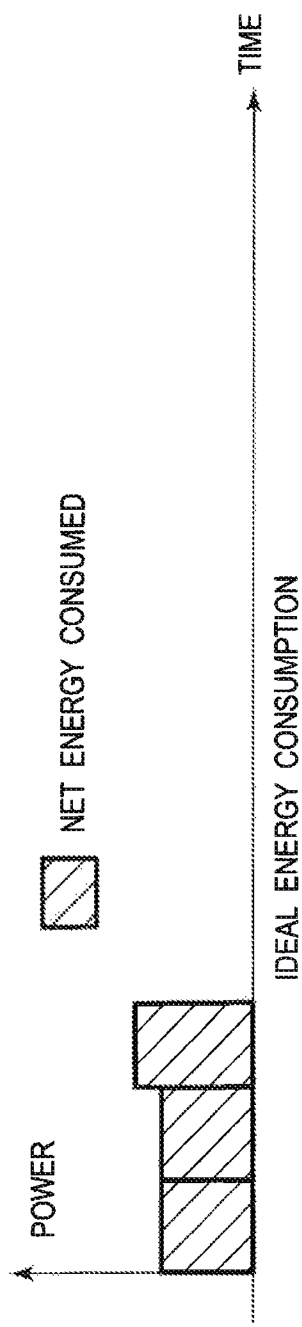

[Fig. 53]
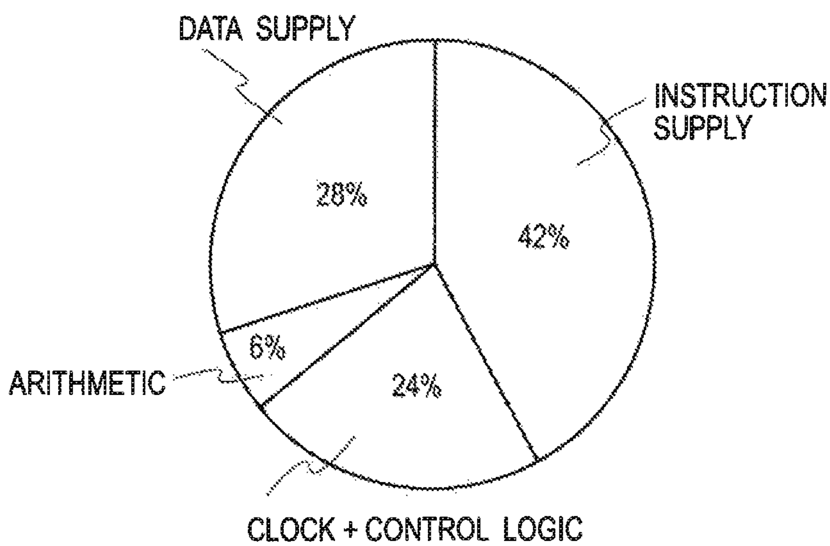

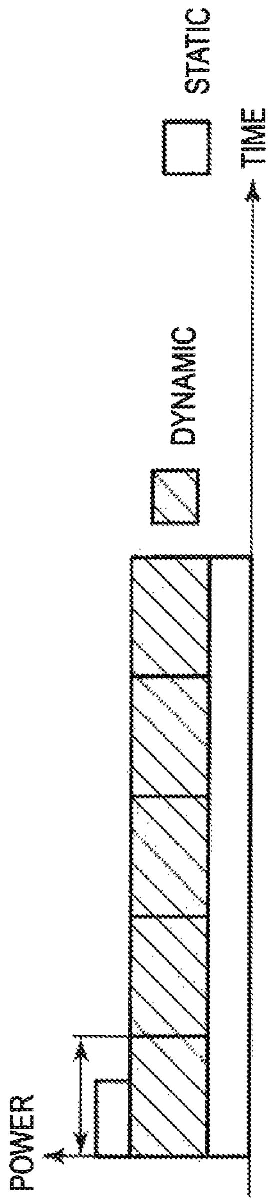
[Fig. 54A]
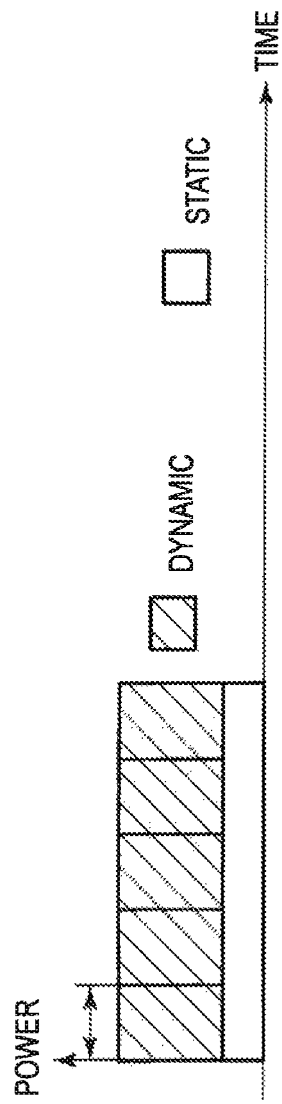
[Fig. 54B]

[Fig. 55]
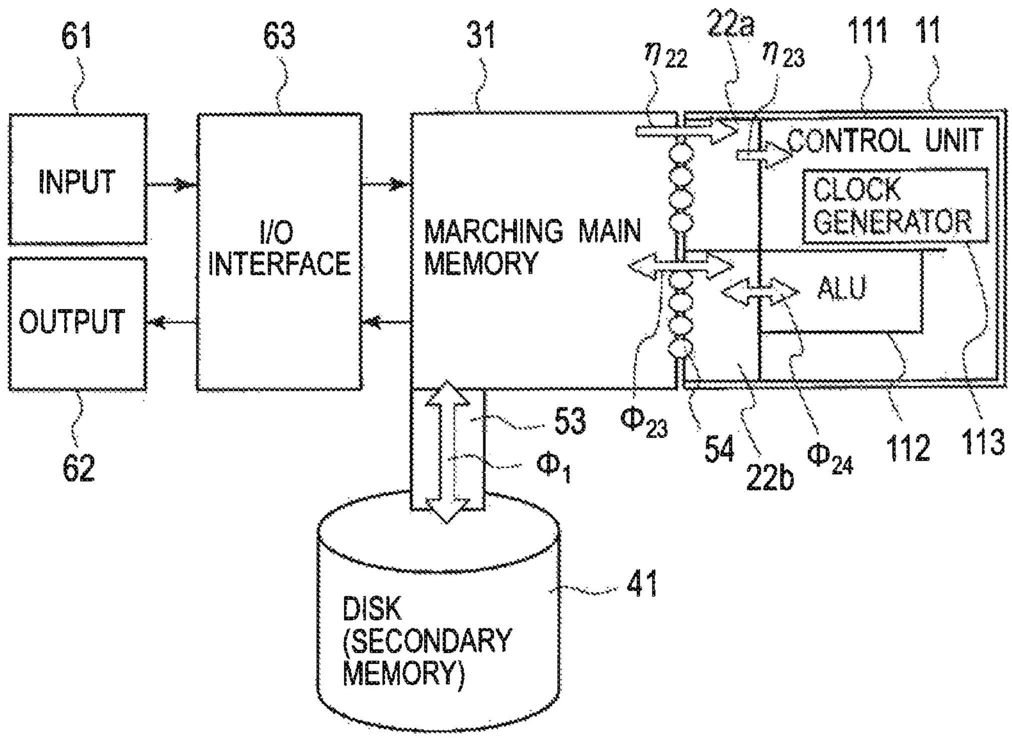

[Fig. 56]
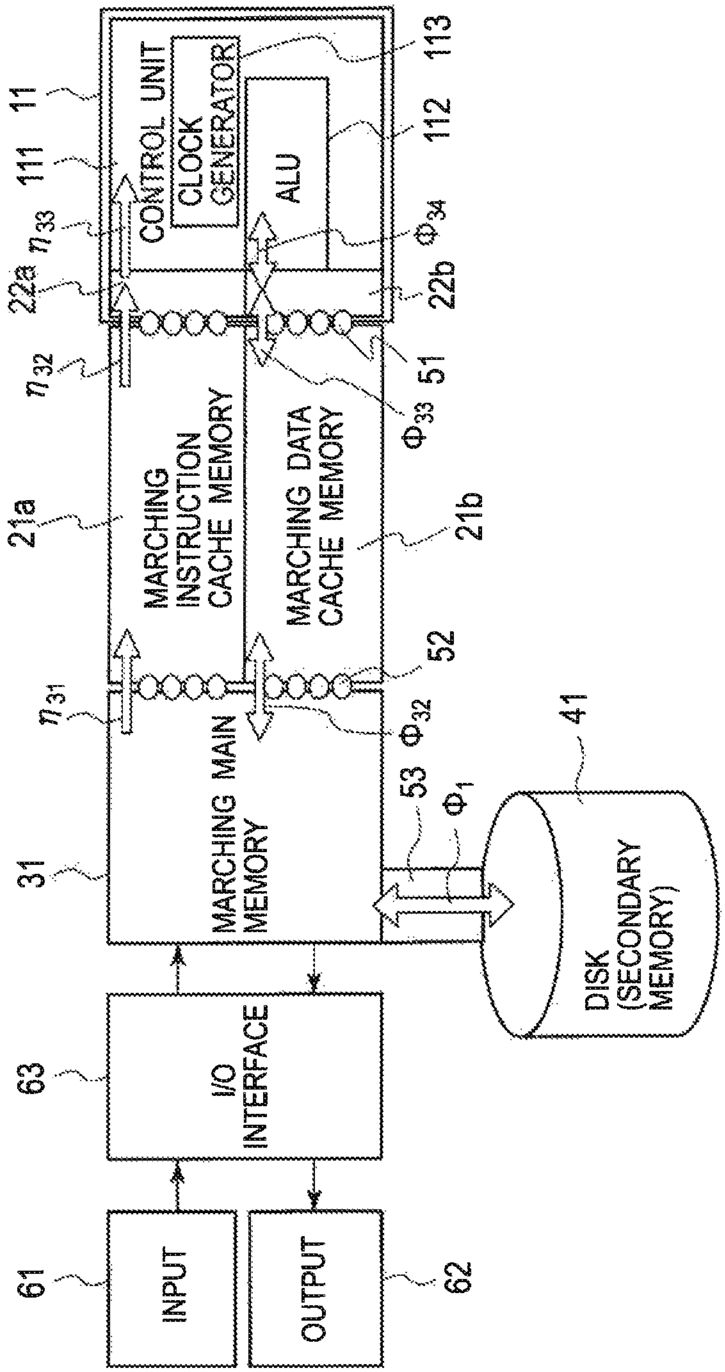

[Fig. 57B]
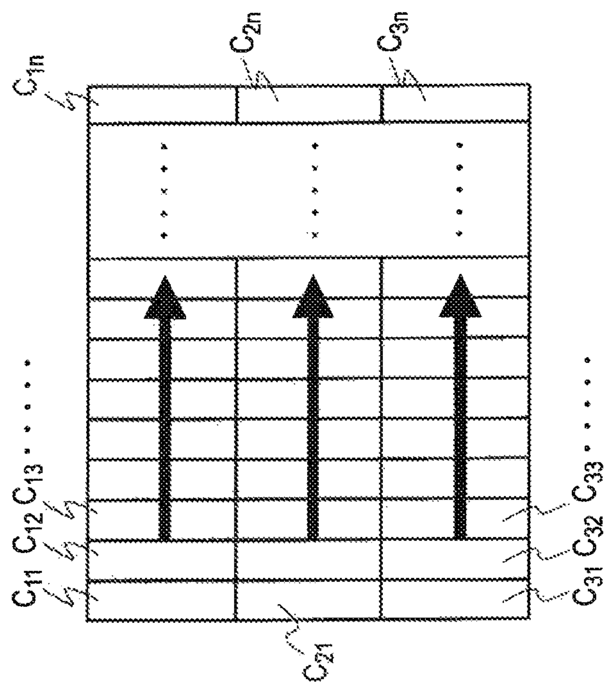
[Fig. 57A]
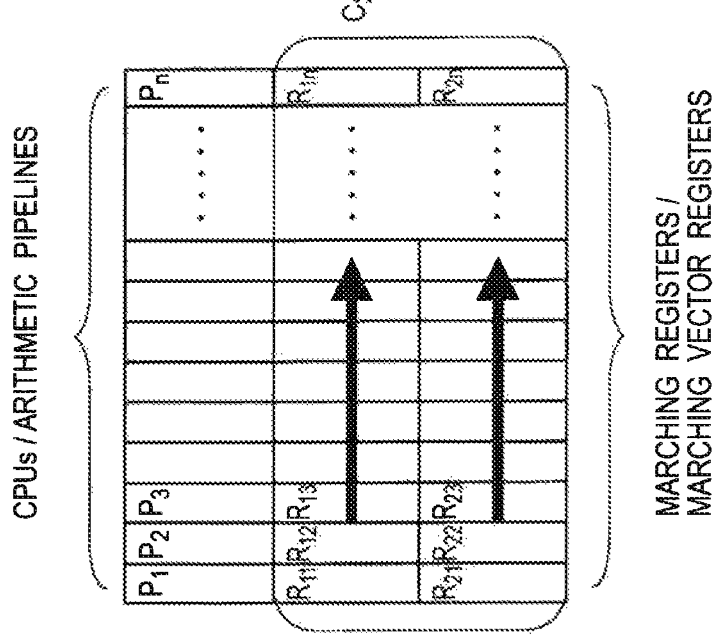

[Fig. 58]
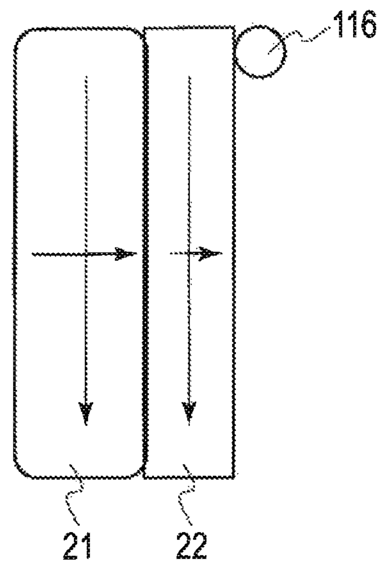
[Fig. 59]
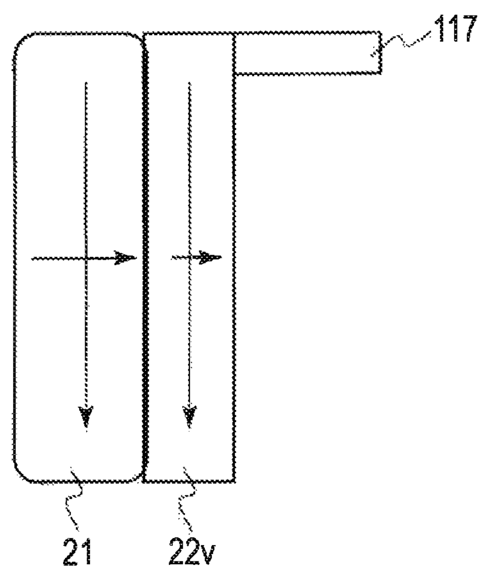

[Fig. 60]
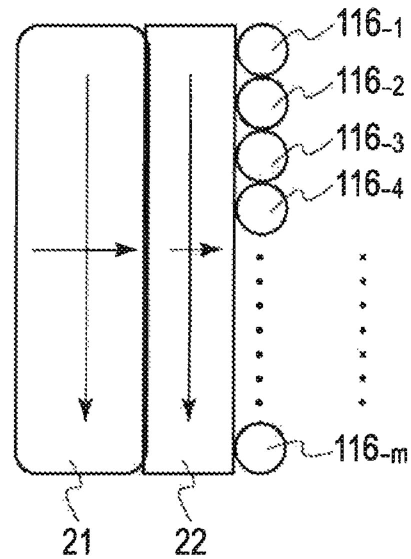
[Fig. 61]
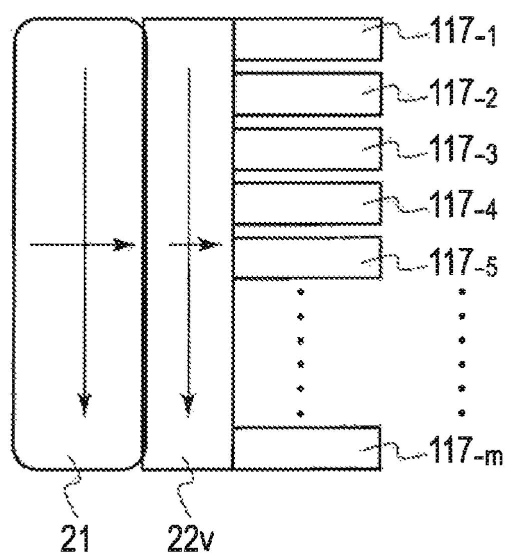

[Fig. 62B]
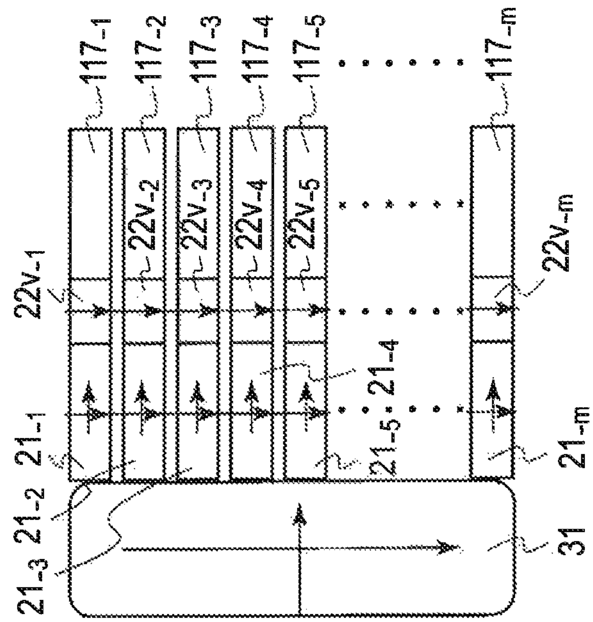
[Fig. 62A]
PRIOR ART
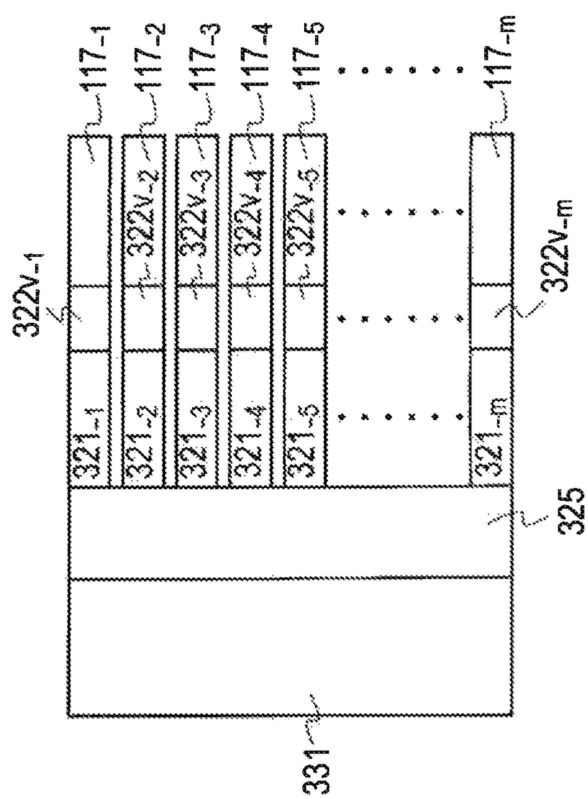

[Fig. 63]
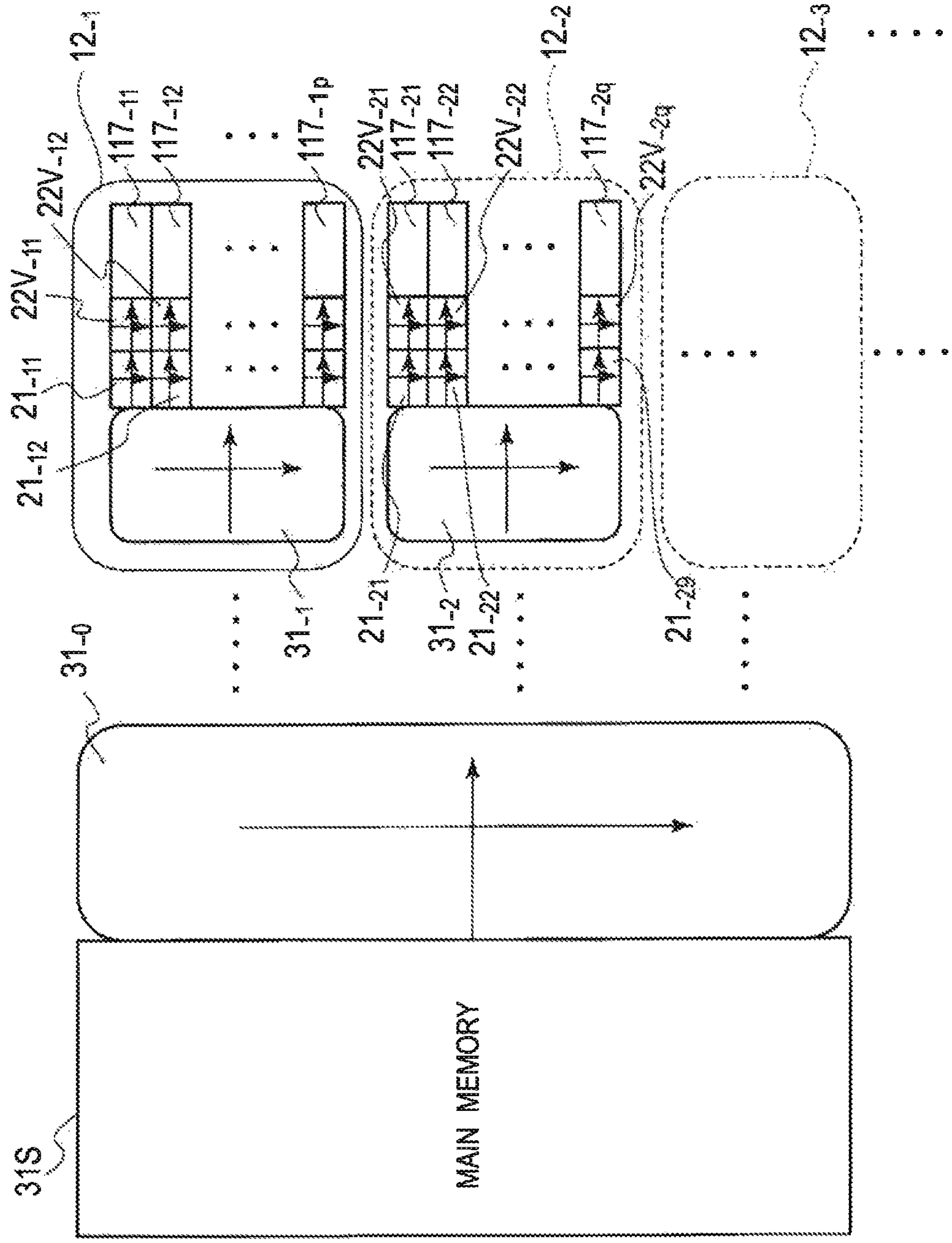

[Fig. 64]
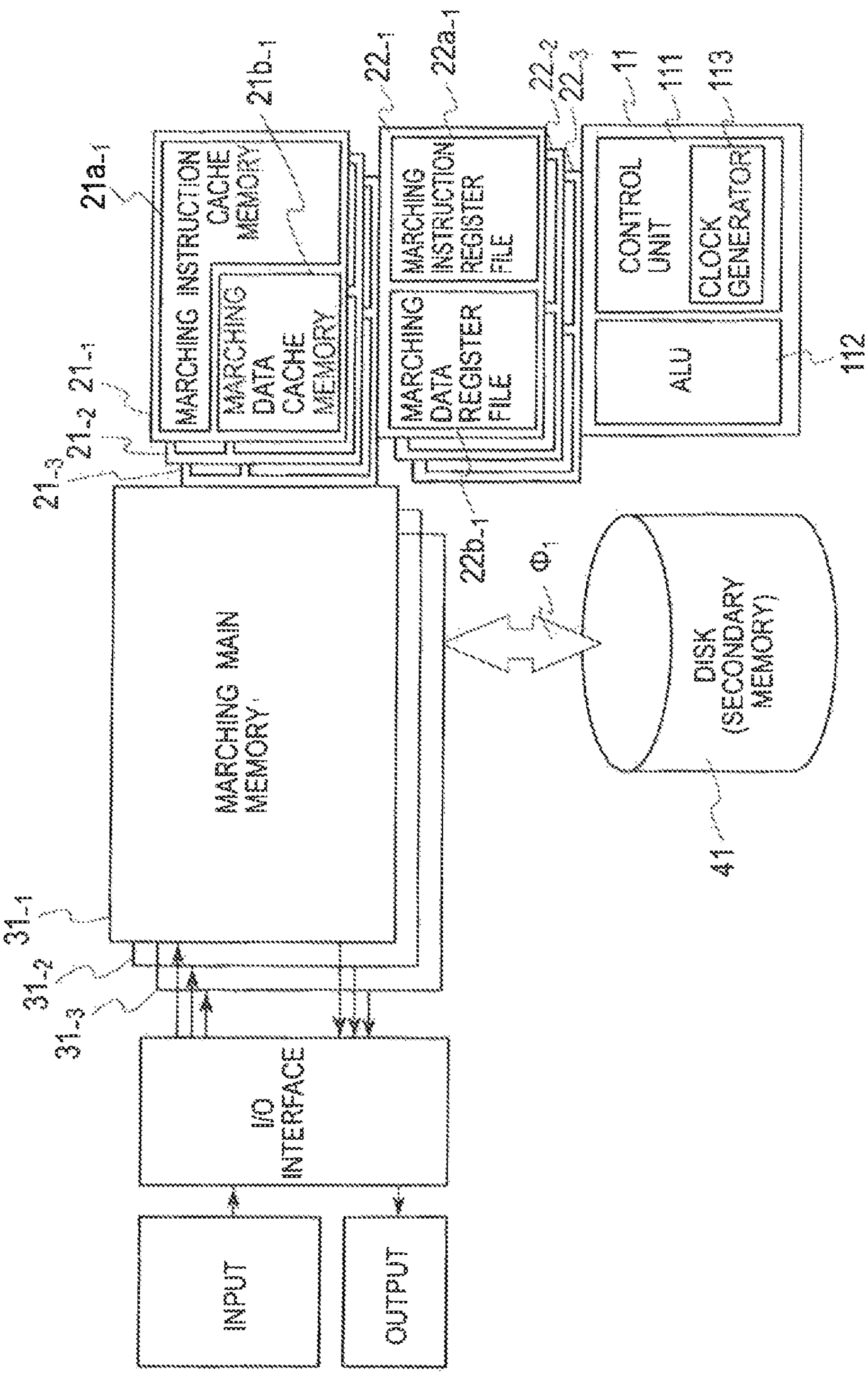

[Fig. 65A]
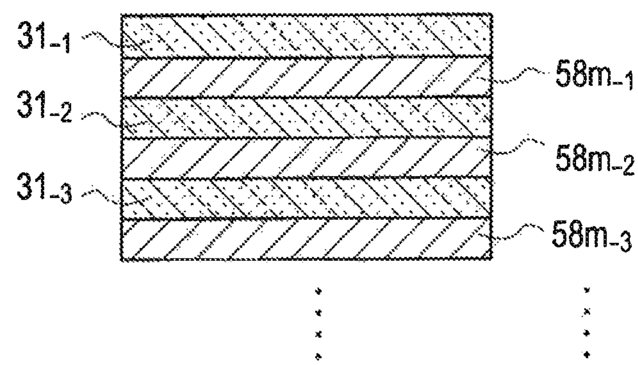
[Fig. 65B]
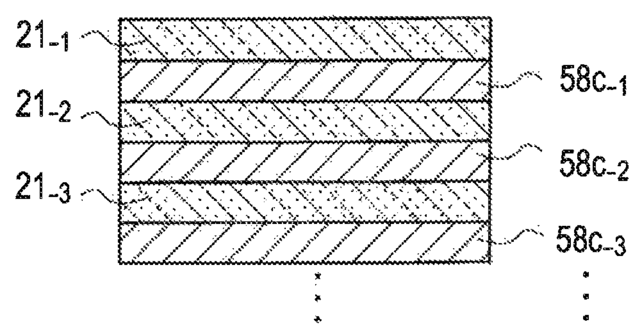
[Fig. 65C]
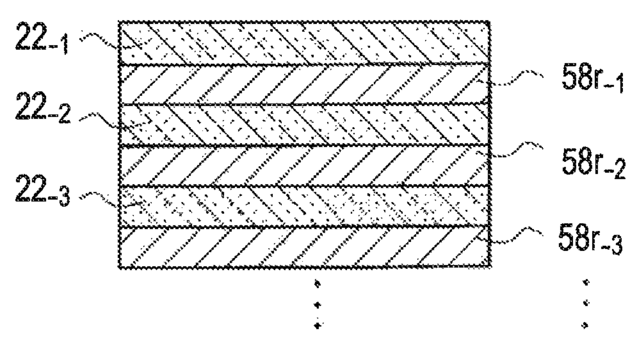

[Fig. 66]
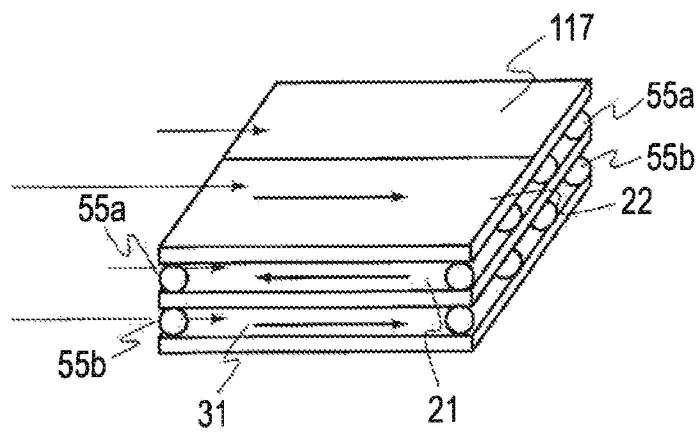
[Fig. 67]
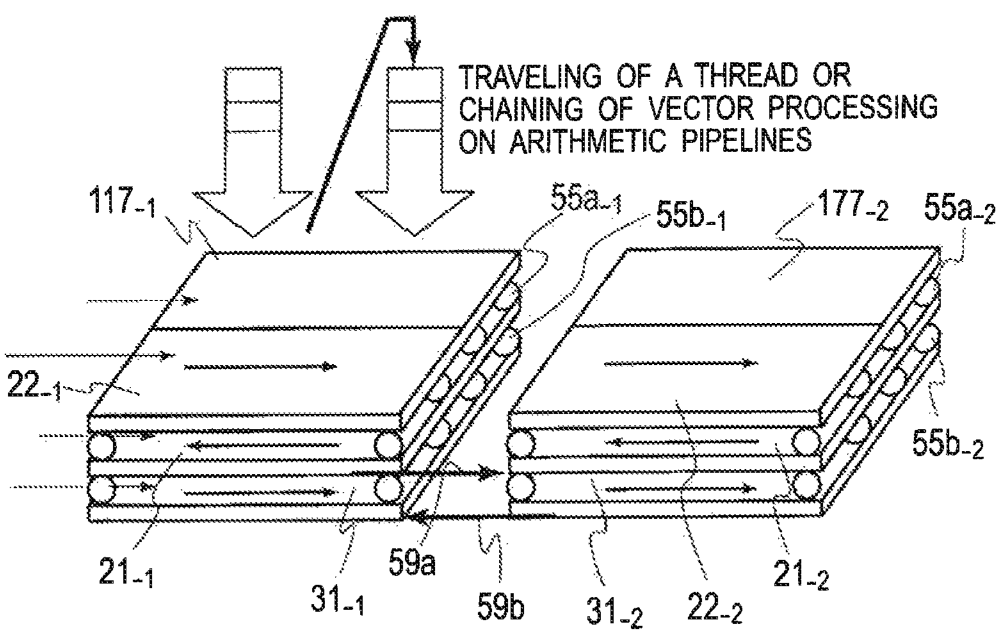

[Fig. 68]
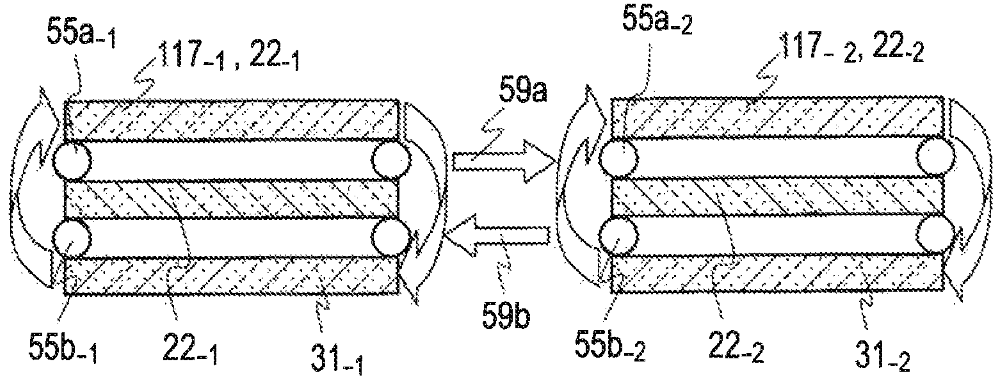
[Fig. 69]
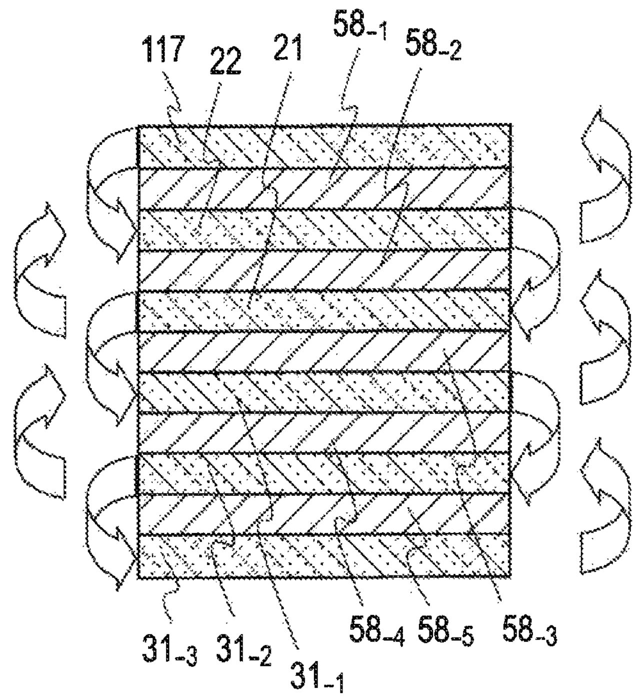

[Fig. 70]
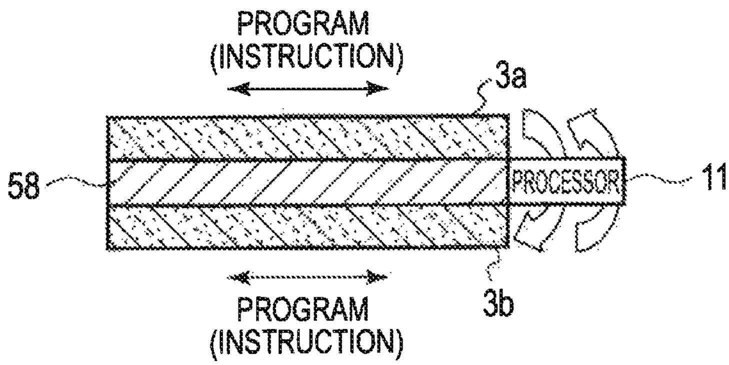
[Fig. 71]
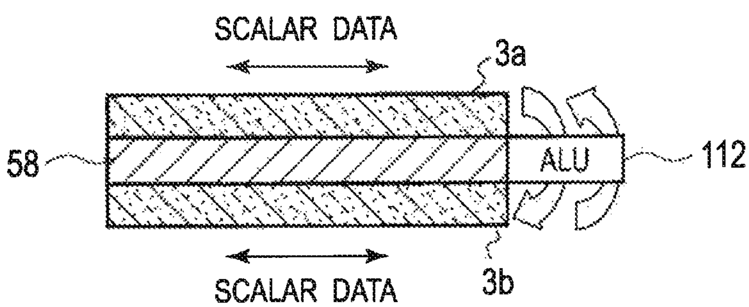
[Fig. 72]
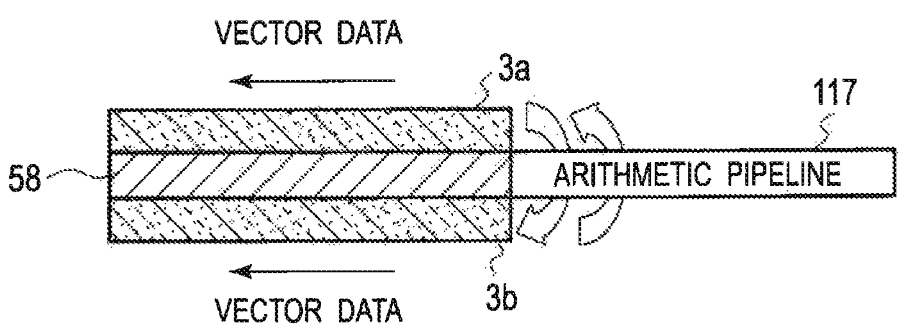

[Fig. 73]
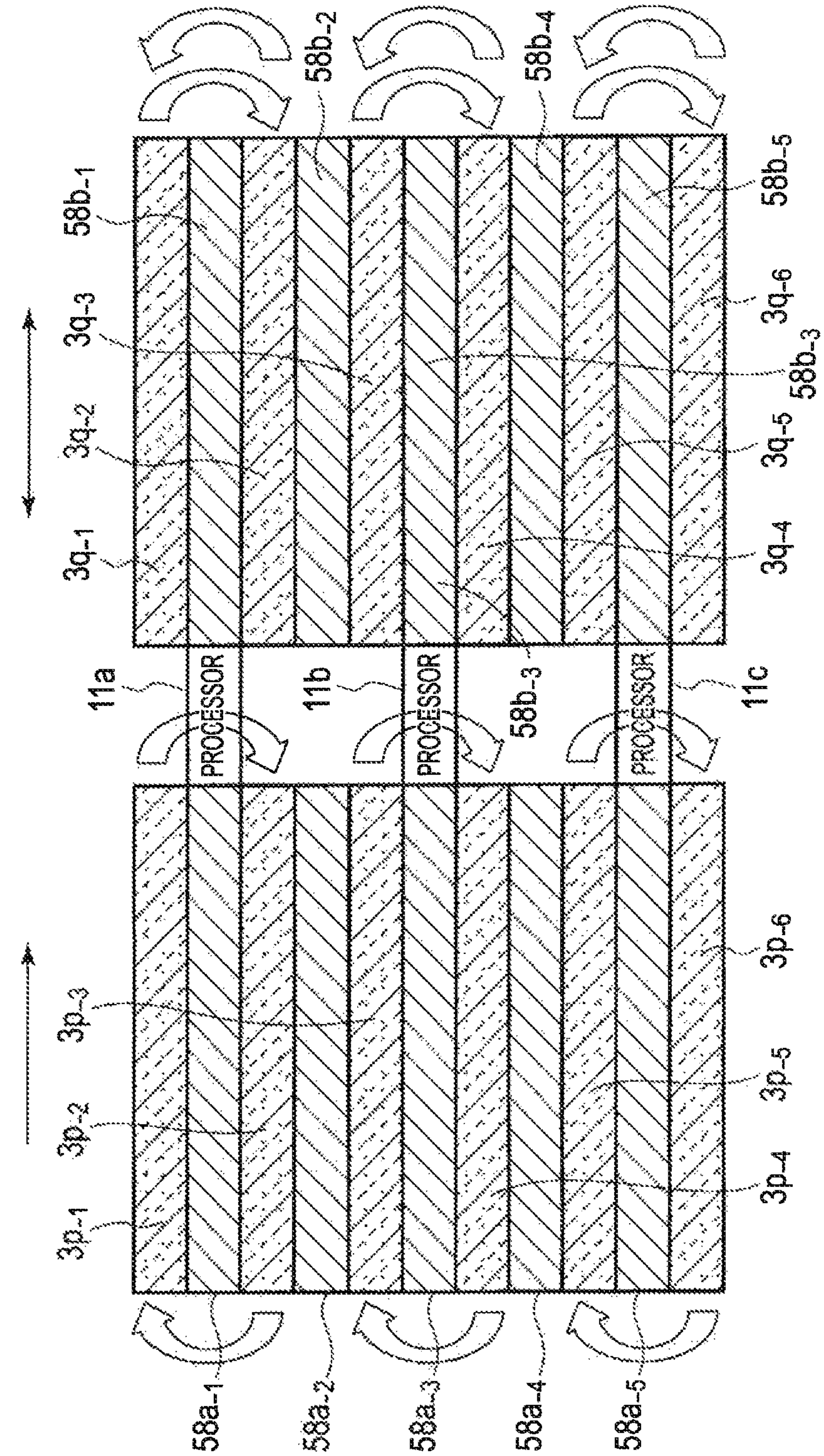

[Fig. 74]
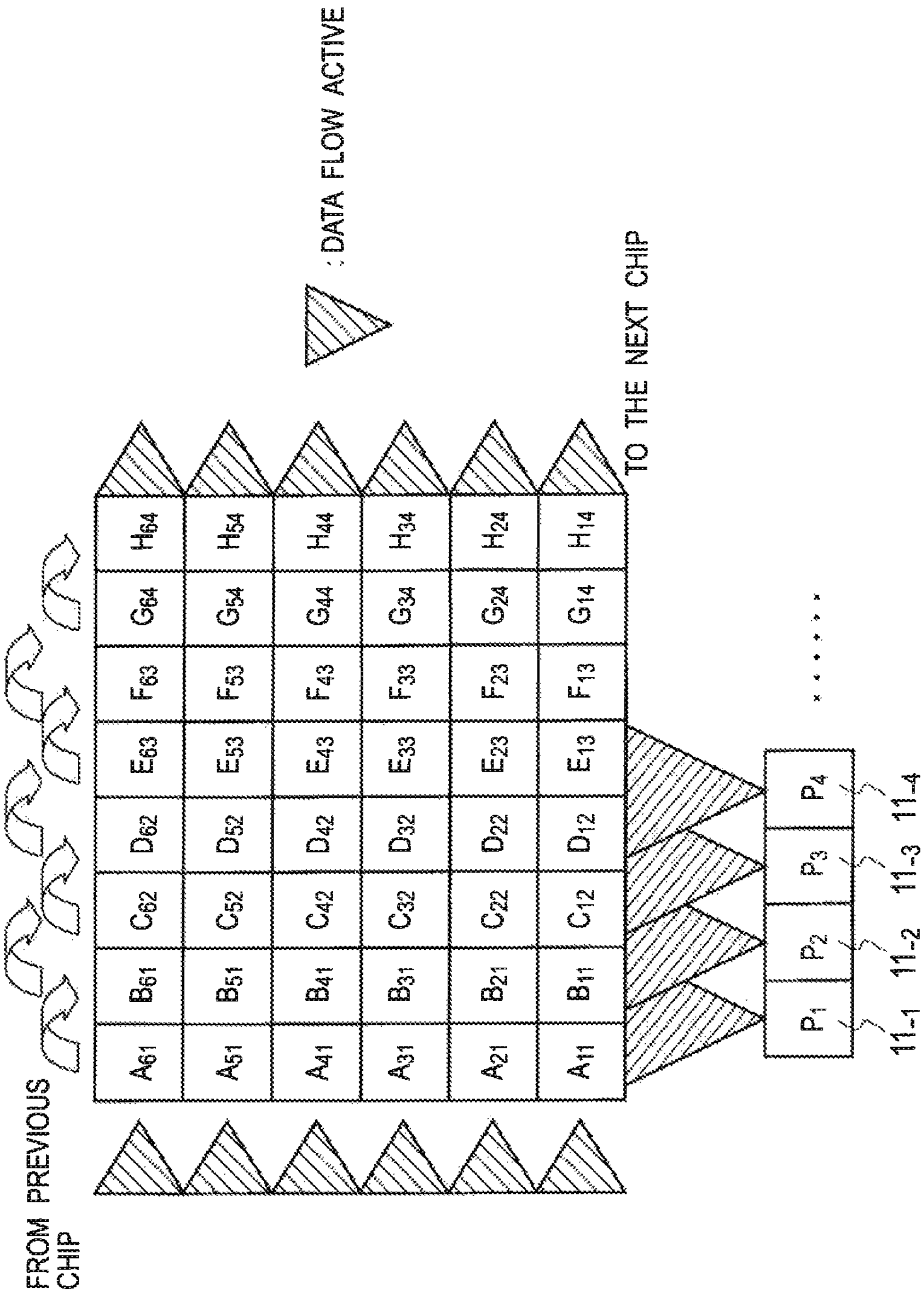

[Fig. 75]
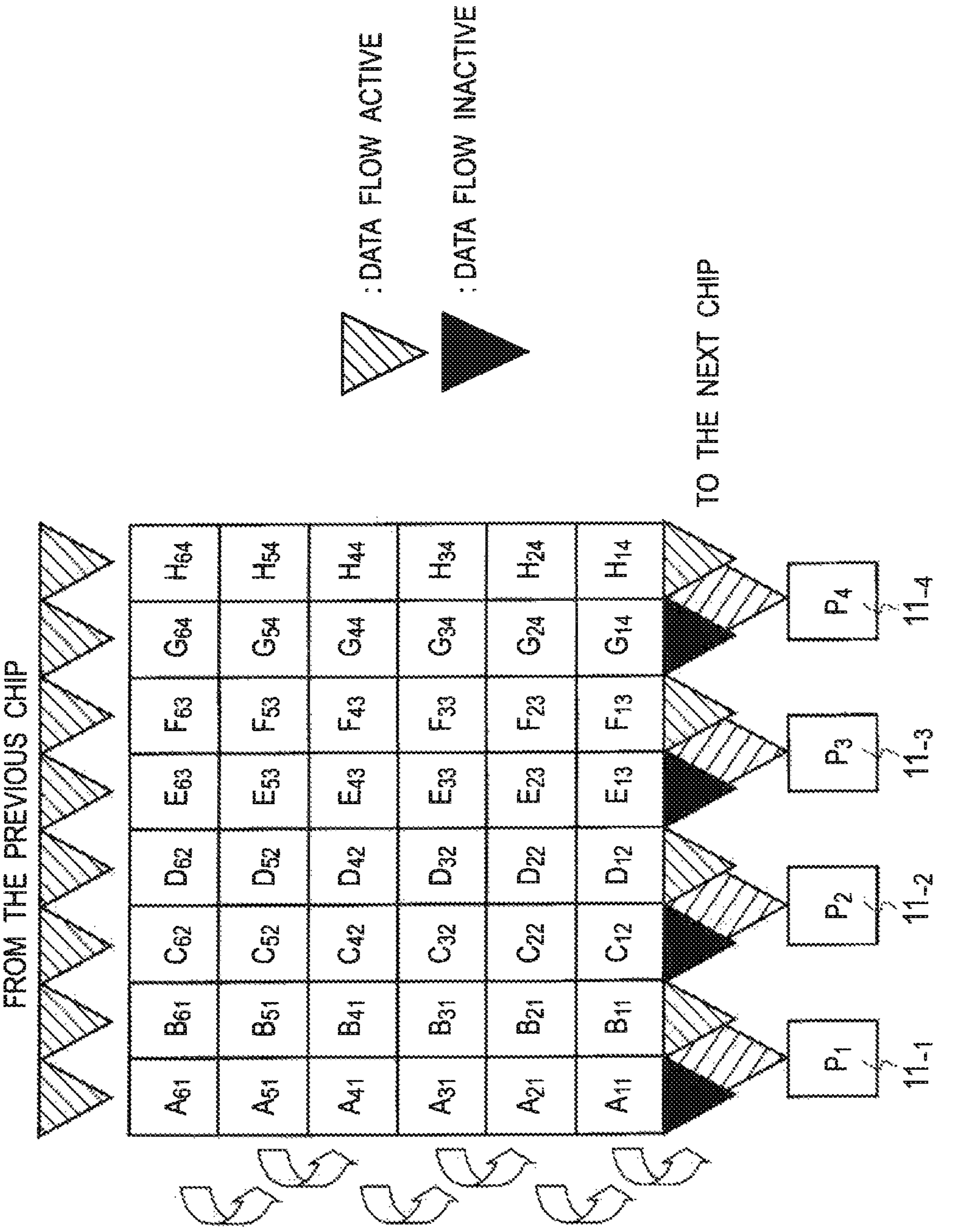

[Fig. 76]
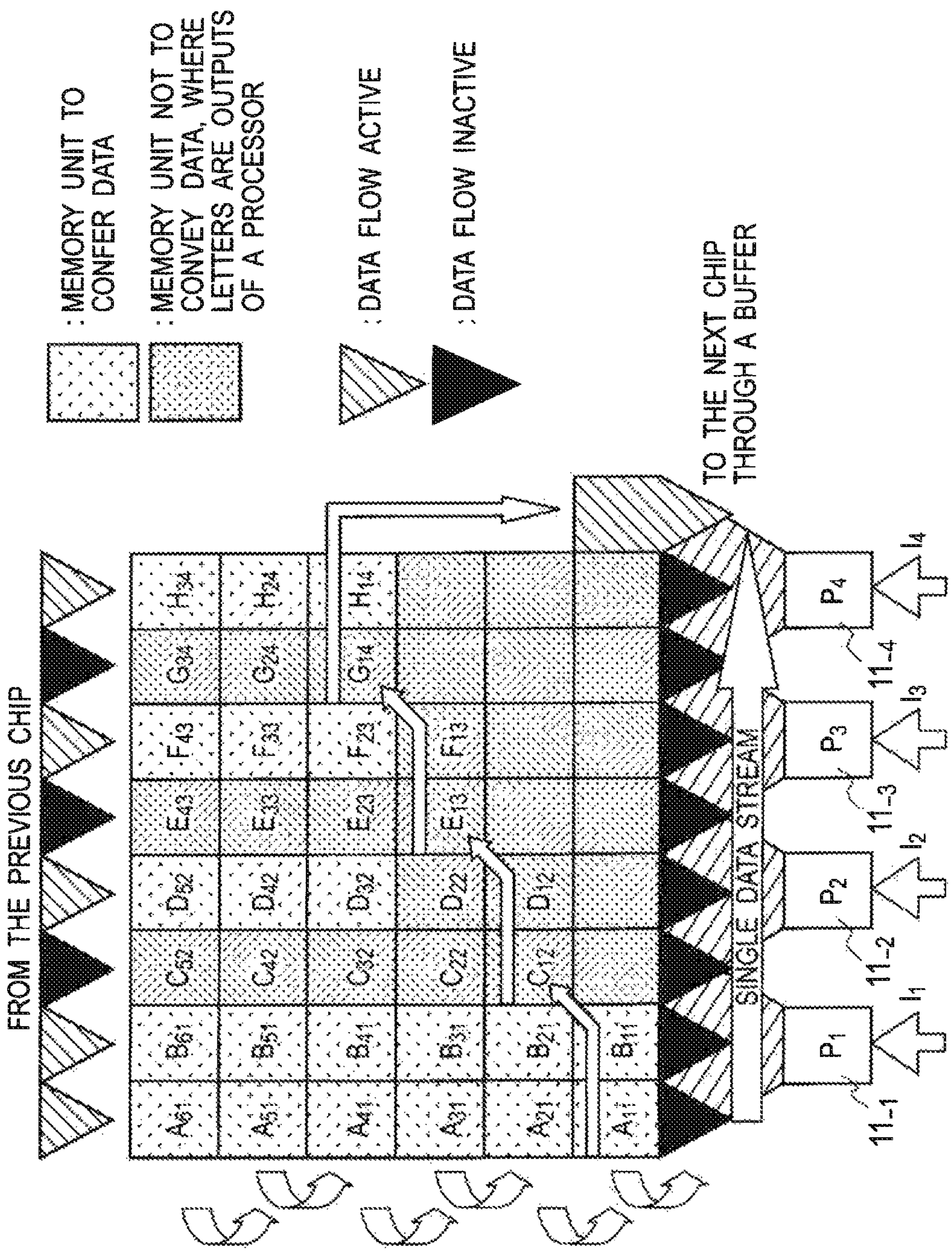

[Fig. 77]
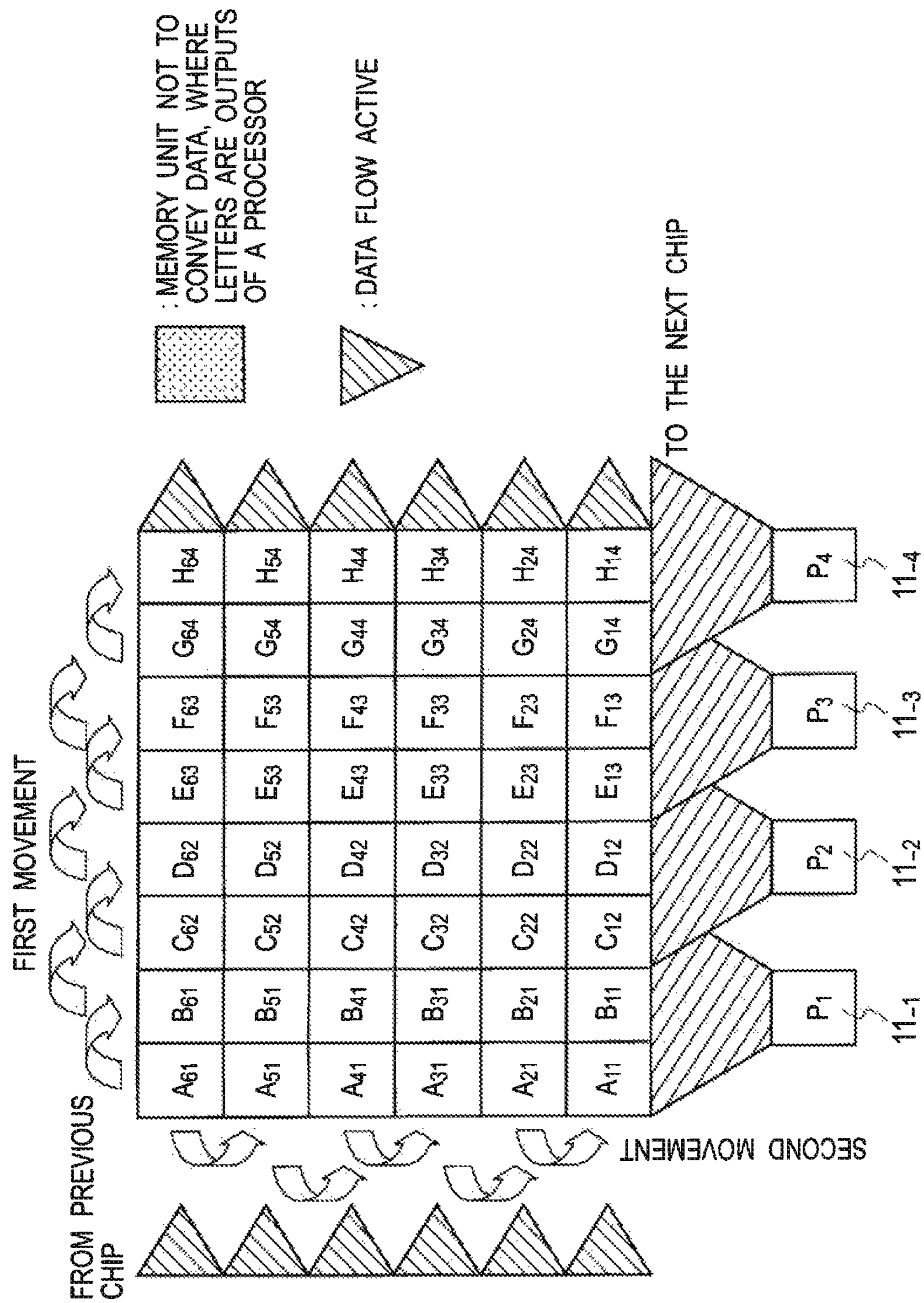

[Fig. 78]
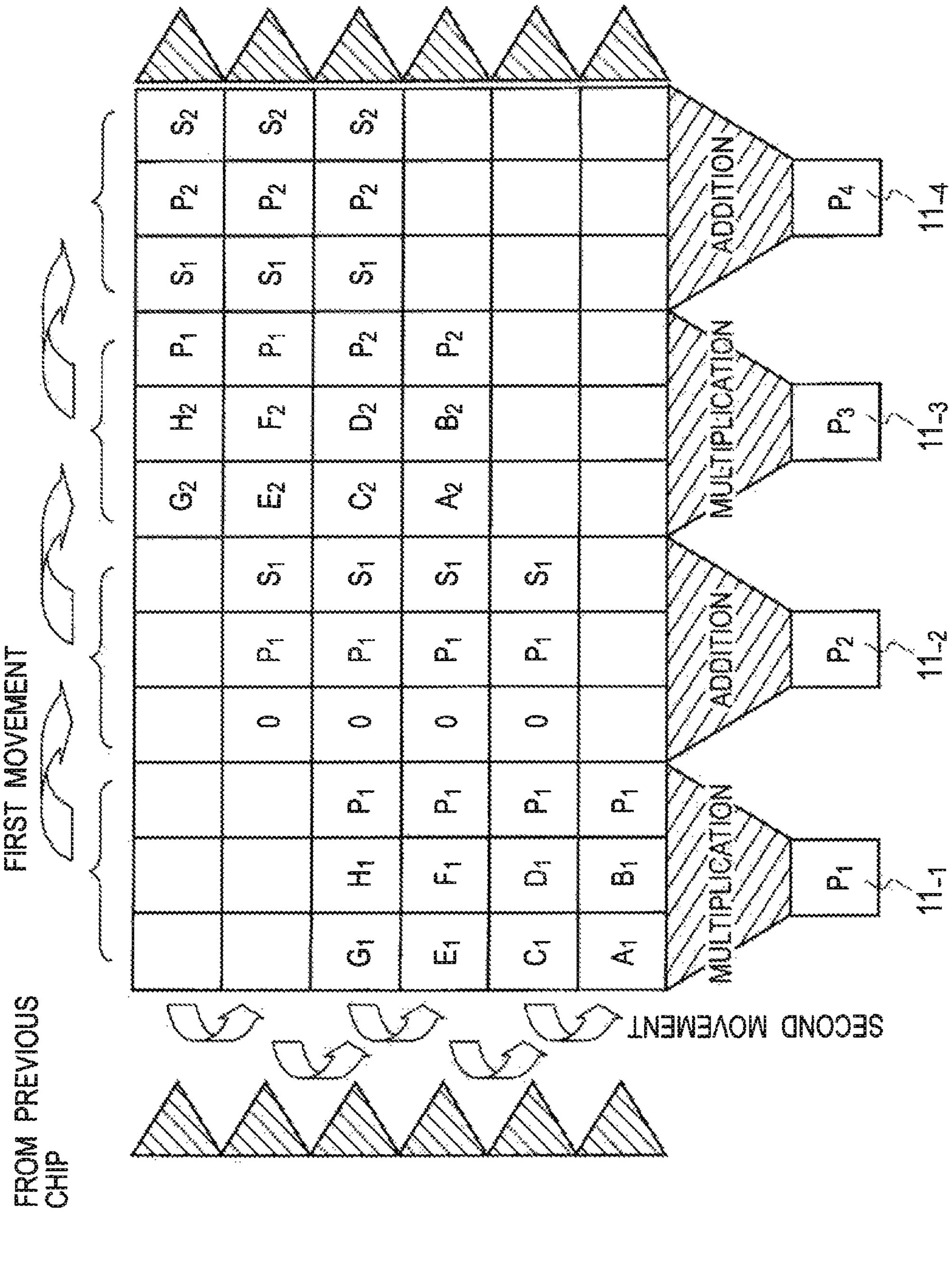

[Fig. 79B]
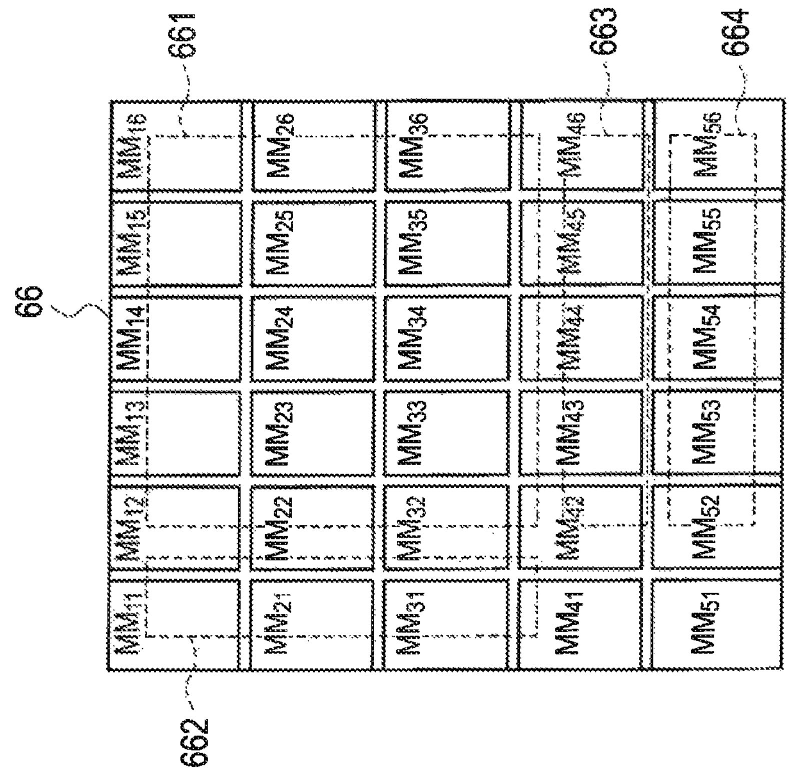
[Fig. 79A]
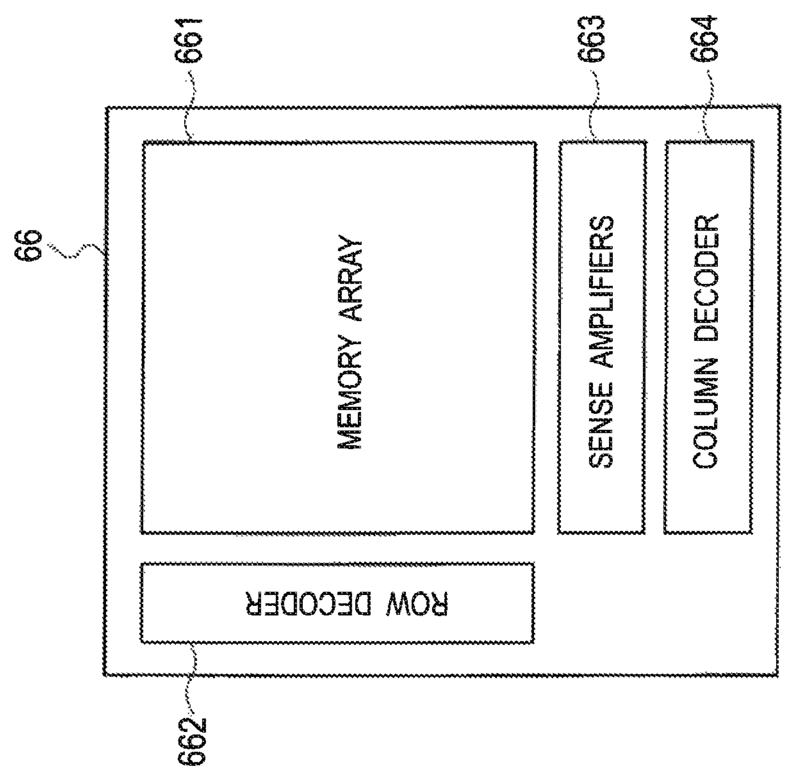

[Fig. 80A]
[Fig. 80B]
[Fig. 80C]
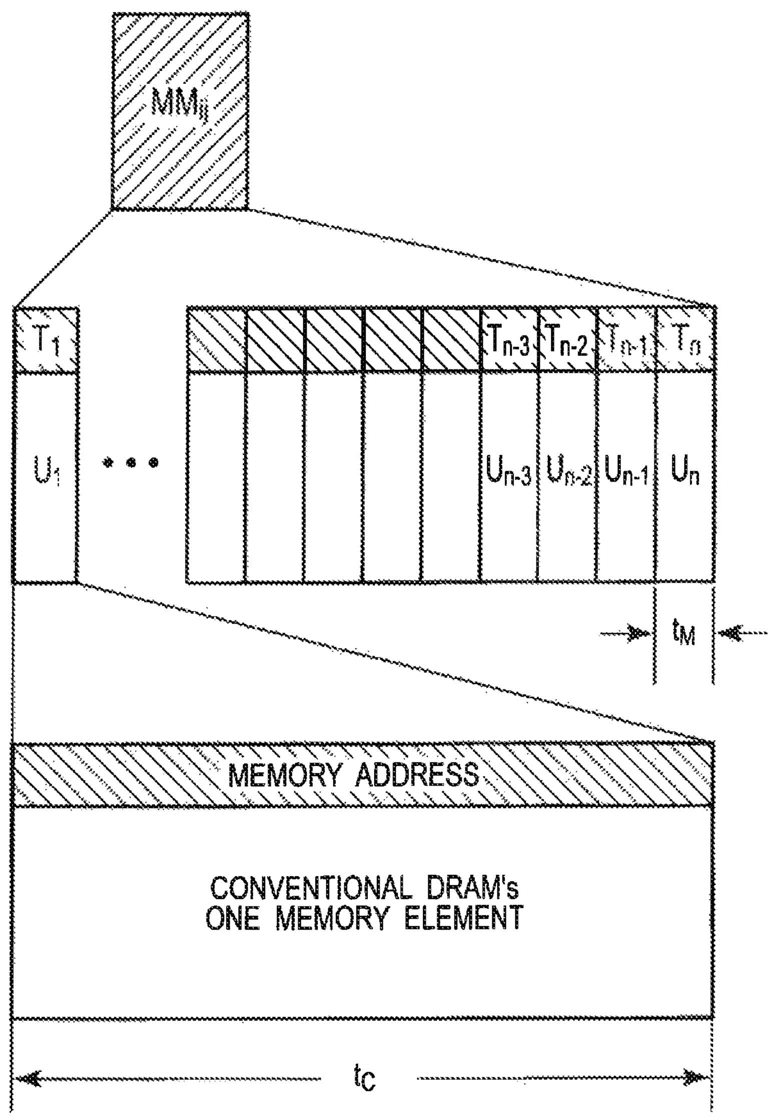

[Fig. 81]
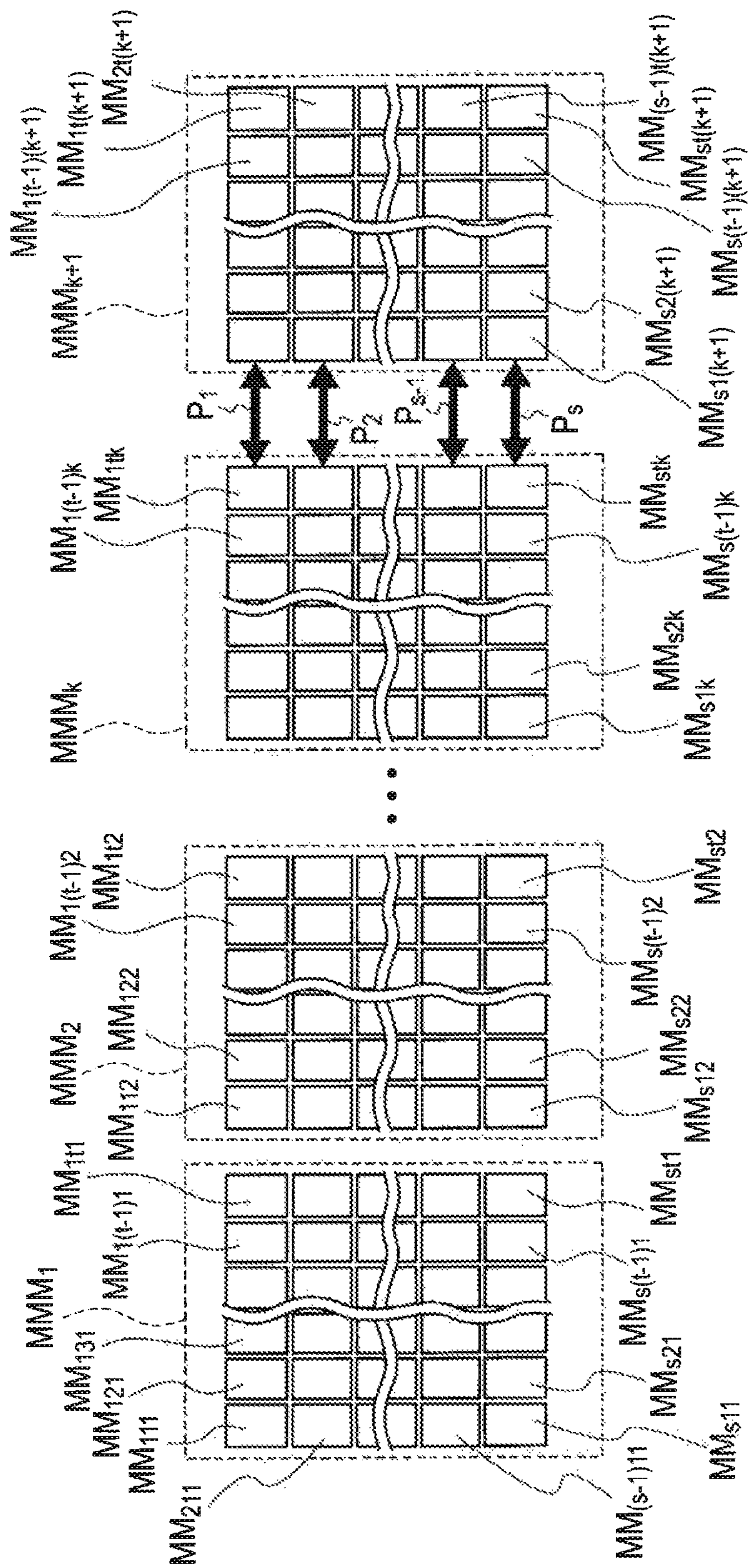

MARCHING MEMORY, A BIDIRECTIONAL MARCHING MEMORY, A COMPLEX MARCHING MEMORY AND A COMPUTER SYSTEM, WITHOUT THE MEMORY BOTTLENECK

CROSS-REFERENCE TO RELATED APPLICATION

This application is a continuation of U.S. patent application Ser. No. 14/450,705, filed on Aug. 4, 2014, which is a continuation of PCT International Application No. PCT/JP2013/000760, filed on Feb. 13, 2013, which claims priority under 35 U.S.C. § 119 to U.S. Provisional Patent Application No. 61/597,945, filed on Feb. 13, 2012.

FIELD OF THE INVENTION

The invention is generally related to new memories, and more specifically to computer systems using the new memories, which operate at a low energy consumption and high speed.

BACKGROUND

Since von Neumann and others more than 60 years ago developed a stored program electronic computer, the fundamental memory accessing principle has not been changed. While the processing speeds of computers have increased significantly over the years for whole range of high performance computing (HPC) applications, these accomplishments were either by device technology or by methods that avoid memory accessing, such as using cache. However, memory accessing time still remains a limit on performance.

Currently computer systems use many processors 11 and many large-scale main memories 331 shown. The computer system shown in FIG. 1 includes a processor 11, a cache memory (321*a*, 321*b*) and a main memory 331. The processor 11 includes a control unit 111 having a clock generator 113 that generates a clock signal, an arithmetic logic unit (ALU) 112 that executes arithmetic and logic operations synchronized with the clock signal, a instruction register file (RF) 322*a* connected to the control unit 111 and a data register file (RF) 322*b* connected to the ALU 112. The cache memory (321*a*, 321*b*) has an instruction cache memory 321*a* and a data cache memory 321*b*. A portion of the main memory 331 and the instruction cache memory 321*a* are electrically connected by wires and/or buses, which limit the memory access time or have the Von Neumann bottleneck 351. The remaining portion of the main memory 331 and the data cache memory 321*b* are electrically connected to enable a similar memory access 351. Furthermore, wires and/or buses, which implement memory access 352, electrically connect between the data cache memory 321*b* and the instruction cache memory 321*a*, and the instruction register file 322*a* and the data register file 322*b*.

Even though HPC systems operate at high speed and low energy consumption, there are speed limitations due to the memory accessing bottlenecks 351, 352. The bottlenecks 351, 352 are ascribable to the wirings between processors 11 and the main memory 331, because the wire length delays and stray capacitance existing between wires cause additional delay in access to the computers. Additionally, stray capacitance requires more power consumption that is proportional to the processor clock frequency in 11.

Some HPC processors use vector arithmetic pipelines. These vector processors display improved memory bandwidth for HPC applications that can be expressed in vector notation over more conventional HPC processors. The vector instructions are made from loops in a source program and each vector instruction is executed in an arithmetic pipeline in a vector processor or corresponding units in a parallel processor. The results of either of these processing methods give the same results.

However, in spite of the improved memory bandwidth, the vector processor based system still has the limiting memory bottleneck 351, 352 between all the units. Even in a single system with a wide memory and large bandwidth, the same bottleneck 351, 352 appears, and in systems employing many of the same units, as in a parallel processor, the bottleneck 351, 352 is unavoidable.

There are two essential memory access problems in conventional computer systems. The first problem is wiring between memory chips and caches, including where these two units are on a single chip and the wiring inside memory systems themselves. The wiring between chips results in a dynamic power consumption due to capacity and the wire signal time delay. This power consumption is extended to the internal wire problems within a memory chip, related to access lines and the remaining read/write lines. Thus in both inter and intra wiring of memory chips, wasteful energy consumption is caused by the capacitance of these wires.

The second problem is the memory bottleneck 351, 352 between the processor chip, cache and memory chips. Since the ALU can access any part of cache or memory, the access path 351, 352 consists of global wires of relatively long length. However, these paths are limited in the number of wires available. Such a bottleneck is often attributed to hardware such as busses. Therefore, when using a high speed CPU and a large capacity of memory, the most common bottleneck occurs between these two.

There are two approaches that can be used to address the bottleneck problems and create improved memory access. The first is to match the memory clock cycle to the CPU's clock cycle. The second is to reduce the time delay caused by longer wires both inside memory and outside memory.

By solving these two issues, a fast, direct coupling between memory and the CPU is possible without the memory bottleneck. As shown in FIG. 53, the processor and periphery of the processor consume 70% of the total energy because of these problems, which is divided into 42 percent for instruction supply and 28 percent for data supply shown. Therefore, the wiring problems generate not only power consumption but also time delay of signals. By eliminating the bottlenecks 351, 352 through removal of the wirings in the intra/inter chips, the problems of power consumption, time delay and memory bottlenecks 351, 352 would be solved.

SUMMARY

A marching memory is disclosed having an array of memory units. Each memory unit has a sequence of bit level cells. Each bit-level cell has a transfer-transistor having a first main-electrode connected to a clock signal supply line through a first delay element, and a control-electrode connected to an output terminal of a first neighboring bit-level cell positioned at an input side of the array of the memory units, through a second delay element. Each bit-level cell also has a reset-transistor having a first main-electrode connected to a second main-electrode of the transfer-transistor, a control-electrode connected to the clock signal supply line, and a second main-electrode connected to the ground potential. Each bit-level cell also has a capacitor connected in parallel with the reset-transistor.

BRIEF DESCRIPTION OF THE DRAWINGS

The invention will now be described by way of example, with reference to the accompanying figures, of which:

FIG. 1 is a schematic block diagram of an organization of a conventional computer system;

FIG. 2 is a schematic block diagram of a fundamental organization of a computer system according to the present invention;

FIG. 3 is a block diagram of an array of memory units implementing a marching main memory and a transfer of information in the marching main memory in the computer system shown in FIG. 2;

FIG. 4 is a transistor-level schematic view of the cell-array in the marching main memory;

FIG. 5 is an enlarged transistor-level schematic view of the cell-array in the marching main memory having four neighboring bit-level cells;

FIG. 6 is an enlarged transistor-level schematic view of a single bit-level cell in the marching main memory;

FIG. 7A is a graph of the response of the transistor to the waveform of a clock signal where a signal “1” is transferred from the previous stage;

FIG. 7B is a graph of the response of the transistor to the waveform of the clock signal where a signal “0” is transferred from the previous stage;

FIG. 7C is a graph of the responses of the transistors to the waveform of a clock signal;

FIG. 8 is schematic view a bit-level cell used in the marching main memory;

FIG. 9 is a plan view of the bit-level cell shown in FIG. 8;

FIG. 10 is a cross-sectional view of the bit-level cell shown in FIG. 9, taken on line A-A;

FIG. 11 is a transistor-level schematic view of the single bit-level cell in combination with an inter-unit cell of the marching main memory;

FIG. 12 is a plan view of the bit-level cell in FIG. 11;

FIG. 13 is a transistor-level schematic view of two neighboring bit-level cells in the cell-array in combination with corresponding inter-unit cells in the marching main memory;

FIG. 14(*a*) is a timing diagram of a response of the bit-level cell of FIG. 13, and FIG. 14(*b*) is a next timing diagram of a next response of the next bit-level cell of FIG. 13 to a waveform of a clock signal.

FIG. 15 is a graph of the responses of the transistors to the waveform of a clock signal applied to the marching main memory;

FIGS. 16(*a*)-(*d*) are schematic views of four modes of signal-transferring operations of the bit-level cells in FIGS. 11 and 13;

FIG. 17 is a transistor-level schematic view of the single bit-level cell in combination with an inter-unit cell adapted for a marching main memory;

FIG. 18 is a transistor-level schematic view of two neighboring bit-level cells of the cell-array in combination with corresponding inter-unit cells in the marching main memory;

FIG. 19 is a transistor-level schematic view of the single bit-level cell in combination with an inter-unit cell adapted for a marching main memory;

FIG. 20 is a transistor-level schematic view of two neighboring bit-level cells having a cell-array in combination with corresponding inter-unit cells in the marching main memory cells;

FIG. 21 is a diagram of the responses of the transistors to the waveform of a clock signal applied to the marching main memory;

FIGS. 22(*a*)-(*d*) is a schematic view of four modes of signal-transferring operations of the bit-level cell shown in FIGS. 20 and 21;

FIG. 23 is a schematic view of gate-level representation of the cell-array shown in FIG. 4;

FIG. 24 is an array of memory units implementing a reverse directional marching main memory having a reverse directional transfer of information;

FIG. 25(*a*) is a transistor-level schematic view of a circuit configuration of a cell array implementing i-th row of the reverse directional marching main memory shown in FIG. 24, and FIG. 25(*b*) is a diagram of the response of the transistor to the waveform of a clock signal applied to the reverse directional marching main memory shown in FIG. 24;

FIG. 26 is a gate-level schematic view of the cell-array implementing i-th row in the reverse directional marching main memory shown in FIG. 25(*a*);

FIG. 27 is a diagram of a time-domain relationship between the memory unit streaming time in a marching main memory and the clock cycle in a processor (CPU);

FIG. 28 is block diagram of an organization of the computer system in which the memory bottleneck is eliminated between the processor (CPU) and the marching memory structure, including the marching main memory;

FIG. 29(*a*) is a diagram of a forward data stream flowing from the marching memory structure to the processor (CPU) and backward data stream flowing from the processor (CPU) to the marching memory structure, and FIG. 29(*b*) is a diagram of bandwidths established between the marching memory structure and the processor (CPU) under an ideal condition where the memory unit streaming time of the marching memory structure is equal to the clock cycle of the processor (CPU);

FIG. 30(*a*) is a schematic view of an extremely high-speed magnetic tape system; FIG. 30(*b*) is a schematic view of the computer system in FIG. 2 compared with the tape system in FIG. 30(*b*);

FIG. 31(*a*) is a block diagram of a forward marching behavior of information marching (shifts) side by side toward right-hand direction in a one-dimensional marching main memory;

FIG. 31(*b*) is a block diagram of the one-dimensional marching main memory in a staying state;

FIG. 31(*c*) is a block diagram of a reverse-marching behavior of information marching (shifts) side by side toward left-hand direction in the one-dimensional marching main memory;

FIG. 32 is a transistor-level schematic view of a one-dimensional marching main memory circuit having the bidirectional transferring behavior show in FIGS. 31(*a*)-(*c*) to store and transfer bi-directionally instructions or scalar data;

FIG. 33 is a transistor-level schematic view of a one-dimensional marching main memory circuit having isolation transistors between memory units to achieve the bidirectional transferring behavior shown in FIGS. 31(*a*)-(*c*);

FIG. 34 is a schematic view of a gate-level circuit design of the one-dimensional marching main memory shown in FIG. 32;

FIG. 35(*a*) is a block diagram of a bidirectional transferring mode of instructions in a one-dimensional marching main memory adjacent to a processor;

FIG. 35(*b*) is a block diagram of a bidirectional transferring mode of scalar data in a one-dimensional marching main memory adjacent to an ALU;

FIG. 35(*c*) is a block diagram of a uni-directional transferring mode of vector/streaming data in a one-dimensional marching main memory adjacent to a pipeline;

FIG. 36(*a*) is a schematic diagram of an inner configuration of existing memory;

FIG. 36(*b*) is a schematic diagram of an inner configuration of present one-dimensional marching main memory where the positioning of individual memory unit identifies the starting point and ending point of a set of successive memory units in vector/streaming data;

FIG. 37(*a*) is a schematic diagram of an inner configuration of present one-dimensional marching main memory where the positioning of individual memory unit identifies the starting point and ending point of a set of successive memory units in vector instruction, FIG. 37(*b*) is a schematic diagram of an inner configuration of present one-dimensional marching main memory for scalar data.

FIG. 37(*c*) is a schematic diagram of an inner configuration of present one-dimensional marching main memory where position indexes identify the starting point and ending point of a set of successive memory units in vector/streaming data;

FIG. 38(*a*) is a schematic view of present marching main memory having a plurality of pages for vector/streaming data case;

FIG. 38(*b*) is a schematic view of one of the pages in FIG. 38(*a*);

FIG. 38(*c*) is a schematic view of one of the files implemented by a plurality of memory units for vector/streaming data case;

FIG. 39(*a*) is a schematic view of present marching main memory having a plurality of pages for its own position index as an address;

FIG. 39(*b*) is a schematic view of one of the pages in FIG. 39(*a*);

FIG. 39(*c*) is a schematic view of one of the files and the driving positions of the file implemented by a plurality of memory units for programs/scalar data case;

FIG. 40(*a*) is a diagram of the speed/capability of the existing memory compared with the marching main memory;

FIG. 40(*b*) is a diagram of the speed/capability of the marching main memory compared with the existing memory shown in FIG. 40(*a*);

FIG. 41(*a*) is a diagram of the speed/capability of a worst case of the existing memory for scalar instructions compared with the marching main memory;

FIG. 41(*b*) is a diagram of the speed/capability of the marching main memory compared with the worst case of the existing memory shown in FIG. 41(*a*);

FIG. 42(*a*) is a diagram of the speed/capability the existing memory for scalar instructions compared with the marching main memory;

FIG. 42(*b*) is a diagram of the speed/capability of the marching main memory compared with the existing memory in FIG. 42(*a*);

FIG. 43(*a*) is a diagram of the speed/capability of the existing memory for scalar data case compared with the marching main memory;

FIG. 43(*b*) is a diagram of the speed/capability of the marching main memory compared with the existing memory in FIG. 43(*a*);

FIG. 44(*a*) is a diagram of the speed/capability of a best case of the existing memory for streaming data and data parallel case compared with the marching main memory;

FIG. 44(*b*) is a diagram of the speed/capability of the marching main memory compared with the best case of the existing memory shown in FIG. 44(*a*);

FIG. 45 is a block diagram of an array of two-dimensional memory units implementing a marching main memory;

FIG. 46 is a block diagram of the array of two-dimensional memory units storing and transferring data or instructions while implementing the marching main memory;

FIG. 47 is another block diagram of the array of two-dimensional memory units storing and transferring data or instructions while implementing the marching main memory;

FIG. 48 is another block diagram of the array of two-dimensional memory units storing and transferring data or instructions while implementing the marching main memory;

FIG. 49 is a block diagram of the array of two-dimensional memory units storing and transferring data or instructions while implementing the marching main memory;

FIG. 50 is a block diagram of the array of two-dimensional memory units storing and transferring data or instructions while implementing the marching main memory;

FIG. 51 is another block diagram of the array of two-dimensional memory units storing and transferring data or instructions while implementing the marching main memory;

FIG. 52(*a*) is a diagram of a device's level of energy consumption in current microprocessors separated into static and dynamic energy consumptions;

FIG. 52(*b*) is a diagram of a net and overhead of the power consumption in the energy consumption shown in FIG. 52(*a*);

FIG. 52(*c*) is a diagram of a net energy consumption in the current microprocessors;

FIG. 53 is a pie diagram of actual energy consumption distribution over a processor;

FIG. 54(*a*) is a diagram of energy consumption in conventional cache-based architecture separated into static and dynamic energy consumptions;

FIG. 54(*b*) is a diagram of energy consumption in a computer system with the marching cache memory separated into static and dynamic energy consumption;

FIG. 55 is a schematic block diagram of an organization of a computer system;

FIG. 56 shows a schematic block diagram illustrating an organization of a computer system according to the present invention;

FIG. 57(*a*) is a schematic block diagram of a combination of arithmetic pipelines and marching register;

FIG. 57(*b*) is a block diagram of an array of marching cache units;

FIG. 58 is a schematic block diagram of a computer system having a single processor core, a marching-cache memory and a marching-register file;

FIG. 59 is a schematic block diagram of a computer system having a single arithmetic pipeline, a marching-cache memory and a marching-vector register;

FIG. 60 is a schematic block diagram of a computer system having a plurality of processor cores, a marching-cache memory and a marching-register file;

FIG. 61 is a schematic block diagram of a computer system having a plurality of arithmetic pipelines, a marching-cache memory and a marching-vector register file;

FIG. 62(*a*) is a schematic block diagram of a conventional computer system having a plurality of arithmetic pipelines, a plurality of conventional cache memories, a plurality of conventional-vector register files (RFs) and a conventional main memory, and having a bottleneck;

FIG. 62(*b*) is a schematic block diagram of a computer system having a plurality of arithmetic pipelines, a plurality of marching cache memories, a plurality of marching-vector register files and a marching main memory, but without a bottleneck;

FIG. 63 is a schematic block diagram of a high performance computing (HPC) system according to the present invention;

FIG. 64 is a schematic block diagram of a computer system according to the present invention;

FIG. 65(*a*) is a cross-sectional view of a three-dimensional marching main memory;

FIG. 65(*b*) is a cross-sectional view of a three-dimensional marching-cache;

FIG. 65(*c*) is a cross-sectional view of a three-dimensional marching-register file;

FIG. 66 is a perspective view of a three-dimensional representation of the computer system in FIG. 64;

FIG. 67 is a perspective view of another three-dimensional representation of the computer system in FIG. 64;

FIG. 68 is a cross-sectional view of the three-dimensional representation in FIG. 67;

FIG. 69 is a cross-sectional view of the three-dimensional representation of the computer system in FIG. 64;

FIG. 70 is a cross-sectional schematic view of the three-dimensional representation of control paths;

FIG. 71 is a cross-sectional schematic view of the three-dimensional representation of data-paths for scalar data;

FIG. 72 is a cross-sectional schematic view of the three-dimensional representation of data-paths for vector/streaming data;

FIG. 73 is a cross-sectional schematic view of the three-dimensional representation of the combination of the scalar data-path and the control path;

FIG. 74 is a cross-sectional schematic view of a bit-level parallel processing of scalar/vector data in MISD architecture;

FIG. 75 is a schematic diagram of parallel processing of vector data in SIMD architecture;

FIG. 76 is a schematic diagram of conventional chaining in vector processing;

FIG. 77 is a schematic diagram of parallel processing of scalar/vector data in MISD architecture;

FIG. 78 is a schematic diagram of parallel processing of scalar/vector data in MISD architecture;

FIG. 79(*a*) is a plan view of conventional DRAM on a single semiconductor chip;

FIG. 79(*b*) is a corresponding plan view of an inner layout of a complex marching memory, which is on the same single semiconductor chip of the conventional DRAM in FIG. 79(*a*);

FIG. 80(*a*) is a schematic diagram of an outer shape of a single marching memory block, FIG. 80(*b*) is a partial plan view of the marching memory block shown in FIG. 80(*a*), which has one thousand columns, where the marching memory's access time (cycle time) is defined to a single column, and FIG. 80(*c*) is a schematic diagram of the conventional DRAM's memory cycle for writing in or reading out the content of the conventional DRAM's one memory element; and FIG. 81 shows a schematic plan view of a complex marching memory module.

DETAILED DESCRIPTION

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally, as is conventional in the representation of semiconductor devices, it will be appreciated that the various drawings are not drawn to scale from one figure to another, nor inside a given figure, and in particular, that the layer thicknesses are arbitrarily drawn for facilitating the reading of the drawings. In the following description specific details are set forth, such as specific materials, processes and equipment in order to provide a thorough understanding of the present invention. It will be apparent to one skilled in the art that the present invention may be practiced without these specific details. In other instances, well-known manufacturing materials, processes and equipment are not set forth in detail in order to prevent unnecessary obscuring of the present invention. Prepositions, such as "on", "over", "under", "beneath", and "normal" are defined with respect to a planar surface of the substrate, regardless of the orientation in which the substrate is actually held. A layer is on another layer even if there are intervening layers.

Although nMOS transistors are shown as transfer-transistors and reset-transistors in transistor-level representations of bit-level cells in FIGS. 4, 5, 6, 8, 11, 13, 16-20, 22, 25 and 32, etc., pMOS transistors can be used as the transfer-transistors and the reset-transistors, if the opposite polarity of the clock signal is employed.

Fundamental Organization of Computer System

As shown in FIG. 2, a computer system pertaining to an exemplary embodiment of the present invention encompasses a processor 11 and a marching main memory 31. The processor 11 includes a control unit 111 having a clock generator 113 that generates a clock signal, and an arithmetic logic unit (ALU) 112 that executes arithmetic and logic operations synchronized with the clock signal. As shown in FIG. 3, the marching main memory 31 encompasses an array of memory units $U_1, U_2, U_3, \ldots, U_{n-1}, U_n$, each of memory units $U_1, U_2, U_3, \ldots, U_{n-1}, U_n$ having a unit of information including word size of data or instructions, input terminals of the array and output terminals of the array. As shown in FIG. 3, the marching main memory 31 stores the information in each of memory units $U_1, U_2, U_3, \ldots, U_{n-1}, U_n$ and transfers the information synchronously with the clock signal, step by step, toward the output terminals, so as to provide the processor 11 with the stored information actively and sequentially so that the ALU 112 can execute the arithmetic and logic operations with the stored information.

As shown in FIG. 2, the marching main memory 31 and the processor 11 are electrically connected by a plurality of joint members 54. Each of joint members 54 may be include a first terminal pin attached to the marching main memory 31, a second terminal pin attached to the processor 11, and an electrical conductive bump interposed between the first and second terminal pins. The material of the electrical conductive bumps, solder balls includes gold (Au) bumps, silver (Ag) bumps, copper (Cu) bumps, nickel-gold (Ni—Au) alloy bumps or nickel-gold-indium (Ni—Au—In) alloy bumps or other common electrically conductive material. The resultant data of the processing in the ALU 112 are sent out to the marching main memory 31 through the joint members 54. Therefore, as represented by bidirectional arrow $PHI_{12}$ ($\Phi_{12}$), data are transferred bi-directionally between the marching main memory 31 and the processor 11 through the joint members 54. On the contrary, as represented by uni-directional arrow $ETA_{11}$ ($\eta_{11}$), as to the instructions movement, there is only one way of instruction-flow from the marching main memory 31 to the processor 11.

As shown in FIG. 2, the organization of the computer system further includes an external secondary memory 41 such as disk, an input unit 61, an output unit 62 and input/output (I/O) interface circuit 63. Similar to a conventional von Neumann computer, the signals or data are received by the input unit 61, and the signals or data are sent from the output unit 62. For example, the input unit 61 may include known keyboards and known mice, and the output unit 62 may include known monitors and printers. Known devices for communication between computers, such as modems and network cards, typically serve for both the input unit 61 and the output unit 62. Note that the designation of a device as either the input unit 61 or the output unit 62 depends on the perspective. The input unit 61 takes as input physical movement that the human user provides and converts it into signals that the computer system can understand. For example, the input unit 61 converts incoming data and instructions into a pattern of electrical signals in binary code, and the output from the input unit 61 is fed to the marching main memory 31 through the I/O interface circuit 63. The output unit 62 takes input signals that the marching main memory 31 provides through the I/O interface circuit 63. The output unit 62 then converts these signals into representations that human users can see or read, reversing the process of the input unit 61 by translating the digitized signals into a form intelligible to the user. The I/O interface circuit 63 is required whenever the processor 11 drives the input unit 61 and the output unit 62. The processor 11 can communicate with the input unit 61 and the output unit 62 through the I/O interface circuit 63. If in the case of different data formatted being exchanged, the I/O interface circuit 63 converts serial data to parallel form and vice-versa. There is provision for generating interrupts and the corresponding type numbers for further processing by the processor 11 if required.

The secondary memory 41 stores data and information on a more long-term basis than the marching main memory 31. While the marching main memory 31 is concerned mainly with storing programs currently executing and data currently being employed, the secondary memory 41 is generally intended for storing anything that needs to be kept even if the computer is switched off or no programs are currently executing. Examples of the secondary memory 41 include known hard disks (or hard drives) and known external media drives (such as CD-ROM drives). These storage methods are most commonly used to store the computer's operating system, the user's collection of software and any other data the user wishes. While the hard drive is used to store data and software on a semi-permanent basis and the external media drives are used to hold other data, this setup varies wildly depending on the different forms of storage available and the convenience of using each. As represented by bidirectional arrow $PHI_1$ ($\Phi_1$), data are transferred bi-directionally between the secondary memory 41 and the marching main memory 31 and the processor 11 through existing wire connection 53.

Although the illustration is omitted, in the computer system of the exemplary embodiment shown in FIG. 2, the processor 11 may includes a plurality of arithmetic pipelines configured to receive the stored information through the output terminals from the marching main memory 31, and as represented by bidirectional arrow $PHI_{12}$, data are transferred bi-directionally between the marching main memory 31 and the plurality of arithmetic pipelines through the joint members 54.

In the computer system of the exemplary embodiment shown in FIG. 2, there are no buses consisting of the data bus and address bus because the whole computer system has no global wires, even in any data exchange between the processor 11 and the marching main memory 31. The advantage of this computer system over conventional computer systems is that the bottleneck is eliminated by eliminating the use of global wires and buses. The computer system in FIG. 2 only uses short local wires within the marching main memory 31 or connecting portions of the marching main memory 31 with a corresponding ALU 112. As there are no global wires, which generate time delay and stray capacitances between these wires, the computer system of the exemplary embodiment can achieve much higher processing speed and lower power consumption.

Cell Array for the Marching Main Memory

In most conventional computers, the unit of address resolution is either a character (e.g. a byte) or a word. If the unit is a word, then a larger amount of memory can be accessed using an address of a given size. On the other hand, if the unit is a byte, then individual characters can be addressed (i.e. selected during the memory operation). Machine instructions are normally fractions or multiples of the architecture's word size. This is a natural choice since instructions and data usually share the same memory subsystem. FIGS. 4 and 5 correspond to transistor-level representations of the cell array implementing the marching main memory 31 shown in FIG. 3, and FIG. 23 corresponds to a gate-level representation of the cell array implementing marching main memory 31 shown in FIG. 3.

In FIG. 4, the first column of the m*n matrix, which is implemented by a vertical array of cell $M_{11}$, $M_{21}$, $M_{31}$, . . . , $M_{m-1,1}$, $M_{m1}$, represents the first memory unit $U_1$ shown in FIG. 3. Here, "m" is an integer determined by word size. Although the choice of a word size is of substantial importance, when computer architecture is designed, word sizes are naturally multiples of eight bits, with 16, 32, and 64 bits being commonly used. Similarly, the second column of the m*n matrix, which is implemented by a vertical array of cell $M_{12}$, $M_{22}$, $M_{32}$, . . . , $M_{m-1,2}$, $M_{m2}$, represents the second memory unit $U_2$, the third column of the m*n matrix, which is implemented by a vertical array of cell $M_{13}$, $M_{23}$, $M_{33}$, . . . , $M_{m-1,3}$, $M_{m3}$, represents the third memory unit $U_3$, . . . , the (n−1)-th column of the m*n matrix, which is implemented by a vertical array of cell $M_{1,n-1}$, $M_{2,n-1}$, $M_{3,n-1}$, . . . $M_{m-1,n-1}$, $M_{m,n-1}$, represents the (n−1)-th memory unit $U_{n-1}$, and the n-th column of the m*n matrix, which is implemented by a vertical array of cell $M_{1,n}$, $M_{2,n}$, $M_{3,n}$, . . . , $M_{m-1,n}$, $M_{m,n}$, represents the n-th memory unit $U_n$.

As shown in FIG. 4, the first memory unit $U_1$ of word-size level is implemented by a vertical array of bit-level cell $M_{11}$, $M_{21}$, $M_{31}$, . . . , $M_{m-1,1}$, $M_{m1}$ in the first column of the m*n matrix. The first-column cell $M_{11}$ on the first row encompasses a first nMOS transistor $Q_{111}$ having a drain electrode connected to a clock signal supply line through a first delay element D in and a gate electrode connected to the output terminal of a first bit-level input terminal through a second delay element $D_{112}$; a second nMOS transistor $Q_{112}$ having a drain electrode connected to a source electrode of the first nMOS transistor $Q_{111}$, a gate electrode connected to the clock signal supply line, and a source electrode connected to the ground potential; and a capacitor $C_{11}$ configured to store the information of the cell $M_{11}$, connected in parallel with the second nMOS transistor $Q_{112}$, wherein an output node connecting the source electrode of the first nMOS transistor $Q_{111}$ and the drain electrode of the second nMOS transistor $Q_{112}$ serves as an output terminal of the cell $M_{11}$, configured to deliver the signal stored in the capacitor $C_{11}$ to the next bit-level cell $M_{12}$. The first-column cell $M_{21}$ on the second row encompasses a first nMOS transistor $Q_{211}$ having a drain electrode connected to the clock signal supply line through a first delay element $D_{211}$ and a gate electrode connected to the output terminal of a second bit-level input terminal through a second delay element $D_{212}$; a second nMOS transistor $Q_{212}$ having a drain electrode connected to a source electrode of the first nMOS transistor $Q_{211}$, a gate electrode connected to the clock signal supply line, and a source electrode connected to the ground potential; and a capacitor $C_{21}$ configured to store the information of the cell $M_{21}$, connected in parallel with the second nMOS transistor $Q_{212}$, wherein an output node connecting the source electrode of the first nMOS transistor $Q_{211}$ and the drain electrode of the second nMOS transistor $Q_{212}$ serves as an output terminal of the cell $M_{21}$, configured to deliver the signal stored in the capacitor $C_{21}$ to the next bit-level cell $M_{22}$. The first-column cell $M_{31}$ on the third row encompasses a first nMOS transistor $Q_{311}$ having a drain electrode connected to the clock signal supply line through a first delay element $D_{311}$ and a gate electrode connected to the output terminal of a third bit-level input terminal through a second delay element $D_{312}$; a second nMOS transistor $Q_{312}$ having a drain electrode connected to a source electrode of the first nMOS transistor $Q_{311}$, a gate electrode connected to the clock signal supply line, and a source electrode connected to the ground potential; and a capacitor $C_{31}$ configured to store the information of the cell $M_{31}$, connected in parallel with the second nMOS transistor $Q_{312}$, wherein an output node connecting the source electrode of the first nMOS transistor $Q_{311}$ and the drain electrode of the second nMOS transistor $Q_{312}$ serves as an output terminal of the cell $M_{31}$, configured to deliver the signal stored in the capacitor $C_{31}$ to the next bit-level cell $M_{31}$ . . . . The first-column cell $M_{(m-1)1}$ on the (m−1)-th row encompasses a first nMOS transistor $Q_{(m-1)11}$ having a drain electrode connected to the clock signal supply line through a first delay element $D_{(m-1)11}$ and a gate electrode connected to the output terminal of a (m−1)-th bit-level input terminal through a second delay element $D_{(m-1)12}$; a second nMOS transistor $Q_{(m-1)12}$ having a drain electrode connected to a source electrode of the first nMOS transistor $Q_{(m-1)11}$, a gate electrode connected to the clock signal supply line, and a source electrode connected to the ground potential; and a capacitor $C_{(m-1)1}$ configured to store the information of the cell $M_{(m-1)1}$, connected in parallel with the second nMOS transistor $Q_{(m-1)12}$, wherein an output node connecting the source electrode of the first nMOS transistor $Q_{(m-1)11}$ and the drain electrode of the second nMOS transistor $Q_{(m-1)12}$ serves as an output terminal of the cell $M_{(n-1)1}$, configured to deliver the signal stored in the capacitor $C_{(m-1)1}$ to the next bit-level cell $M_{(m-1)12}$. The first-column cell $M_{m1}$ on the m-th row encompasses a first nMOS transistor $Q_{m11}$ having a drain electrode connected to the clock signal supply line through a first delay element $D_{m11}$ and a gate electrode connected to the output terminal of a m-th bit-level input terminal through a second delay element $D_{m12}$; a second nMOS transistor $Q_{m12}$ having a drain electrode connected to a source electrode of the first nMOS transistor $Q_{m11}$, a gate electrode connected to the clock signal supply line, and a source electrode connected to the ground potential; and a capacitor $C_{m1}$ configured to store the information of the cell $M_{m1}$, connected in parallel with the second nMOS transistor $Q_{m12}$, wherein an output node connecting the source electrode of the first nMOS transistor $Q_{m11}$ and the drain electrode of the second nMOS transistor $Q_{m12}$ serves as an output terminal of the cell $M_{m1}$, configured to deliver the signal stored in the capacitor $C_{m1}$ to the next bit-level cell $M_{m2}$.

As shown in FIG. 4, the second memory unit $U_2$ of word-size level is implemented by a vertical array of bit-level cell $M_{12}$, $M_{22}$, $M_{32}$, . . . , $M_{m-1,2}$, $M_{m2}$ in the second column of the m*n matrix. The second column cell $M_{12}$ on the first row encompasses a first nMOS transistor $Q_{121}$ having a drain electrode connected to the clock signal supply line through a first delay element $D_{121}$ and a gate electrode connected to the output terminal of the previous bit-level cell Mu through a second delay element $D_{122}$; a second nMOS transistor $Q_{122}$ having a drain electrode connected to a source electrode of the first nMOS transistor $Q_{121}$, a gate electrode connected to the clock signal supply line, and a source electrode connected to the ground potential; and a capacitor $C_{12}$ configured to store the information of the cell $M_{12}$, connected in parallel with the second nMOS transistor $Q_{122}$, wherein an output node connecting the source electrode of the first nMOS transistor $Q_{121}$ and the drain electrode of the second nMOS transistor $Q_{122}$ serves as an output terminal of the cell $M_{12}$, configured to deliver the signal stored in the capacitor $C_{12}$ to the next bit-level cell $M_{13}$. The second column cell $M_{22}$ on the second row encompasses a first nMOS transistor $Q_{221}$ having a drain electrode connected to the clock signal supply line through a first delay element $D_{221}$ and a gate electrode connected to the output terminal of the previous bit-level cell $M_{21}$ through a second delay element $D_{222}$; a second nMOS transistor $Q_{222}$ having a drain electrode connected to a source electrode of the first nMOS transistor $Q_{221}$, a gate electrode connected to the clock signal supply line, and a source electrode connected to the ground potential; and a capacitor $C_{22}$ configured to store the information of the cell $M_{22}$, connected in parallel with the second nMOS transistor $Q_{222}$, wherein an output node connecting the source electrode of the first nMOS transistor $Q_{221}$ and the drain electrode of the second nMOS transistor $Q_{222}$ serves as an output terminal of the cell $M_{22}$, configured to deliver the signal stored in the capacitor $C_{22}$ to the next bit-level cell $M_{23}$. The second column cell $M_{32}$ on the third row encompasses a first nMOS transistor $Q_{321}$ having a drain electrode connected to the clock signal supply line through a first delay element $D_{321}$ and a gate electrode connected to the output terminal of the previous bit-level cell $M_{31}$ through a second delay element $D_{322}$; a second nMOS transistor $Q_{322}$ having a drain electrode connected to a source electrode of the first nMOS transistor $Q_{321}$, a gate electrode connected to the clock signal supply line, and a source electrode connected to the ground potential; and a capacitor $C_{32}$ configured to store the information of the cell $M_{32}$, connected in parallel with the second nMOS transistor $Q_{322}$, wherein an output node connecting the source electrode of the first nMOS transistor $Q_{321}$ and the drain electrode of the second nMOS transistor $Q_{322}$ serves as an output terminal of the cell $M_{32}$, configured to deliver the signal stored in the capacitor $C_{32}$ to the next bit-level cell $M_{33}$ . . . . The second column cell $M_{(n-1)2}$ on the (m−1)-th row encompasses a first nMOS transistor $Q_{(m-1)21}$ having a drain electrode connected to the clock signal supply line through a first delay element $D_{(m-1)21}$ and a gate electrode connected to the output terminal of the previous bit-level cell $M_{(n-1)1}$ through a second delay element $D_{(m-1)22}$; a second nMOS transistor $Q_{(m-1)22}$ having a drain electrode connected to a source electrode of the first nMOS transistor $Q_{(m-1)21}$, a gate electrode connected to the clock signal supply line, and a source electrode connected to the ground potential; and a capacitor $C_{(n-1)2}$ configured to store the information of the cell $M_{(n-1)2}$, connected in parallel with the second nMOS transistor $Q_{(m-1)22}$, wherein an output node connecting the source electrode of the first nMOS transistor $Q_{(n-1)21}$ and the drain electrode of the second nMOS transistor $Q_{(m-1)22}$ serves as an output terminal of the cell $M_{(n-1)2}$, configured to deliver the signal stored in the capacitor $C_{(n-1)2}$ to the next bit-level cell $M_{(n-1)3}$. The second column cell $M_{m2}$ on the m-th row encompasses a first nMOS transistor $Q_{m21}$ having a drain electrode connected to the clock signal supply line through a first delay element $D_{m21}$ and a gate electrode connected to the output terminal of the previous bit-level cell $M_{m1}$ through a second delay element $D_{m22}$; a second nMOS transistor $Q_{m22}$ having a drain electrode connected to a source electrode of the first nMOS transistor $Q_{m21}$, a gate electrode connected to the clock signal supply line, and a source electrode connected to the ground potential; and a capacitor $C_{m2}$ configured to store the information of the cell $M_{m2}$, connected in parallel with the second nMOS transistor $Q_{m22}$, wherein an output node connecting the source electrode of the first nMOS transistor $Q_{m21}$ and the drain electrode of the second nMOS transistor $Q_{m22}$ serves as an output terminal of the cell $M_{m2}$, configured to deliver the signal stored in the capacitor $C_{m2}$ to the next bit-level cell $M_{m3}$.

As shown in FIG. 4, the third memory unit $U_3$ of word-size level is implemented by a vertical array of bit-level cell $M_{13}$, $M_{23}$, $M_{33}$, . . . , $M_{m-1,3}$, $M_{m3}$ in the third column of the m*n matrix. The third-column cell $M_{13}$ on the first row encompasses a first nMOS transistor $Q_{131}$ having a drain electrode connected to the clock signal supply line through a first delay element $D_{131}$ and a gate electrode connected to the output terminal of the previous bit-level cell $M_{12}$ through a second delay element $D_{132}$; a second nMOS transistor $Q_{132}$ having a drain electrode connected to a source electrode of the first nMOS transistor $Q_{131}$, a gate electrode connected to the clock signal supply line, and a source electrode connected to the ground potential; and a capacitor $C_{13}$ configured to store the information of the cell $M_{13}$, connected in parallel with the second nMOS transistor $Q_{132}$, wherein an output node connecting the source electrode of the first nMOS transistor $Q_{131}$ and the drain electrode of the second nMOS transistor $Q_{132}$ serves as an output terminal of the cell $M_{13}$, configured to deliver the signal stored in the capacitor $C_{13}$ to the next bit-level cell. The third-column cell $M_{23}$ on the second row encompasses a first nMOS transistor $Q_{231}$ having a drain electrode connected to the clock signal supply line through a first delay element $D_{231}$ and a gate electrode connected to the output terminal of the previous bit-level cell $M_{22}$ through a second delay element $D_{232}$; a second nMOS transistor $Q_{232}$ having a drain electrode connected to a source electrode of the first nMOS transistor $Q_{231}$, a gate electrode connected to the clock signal supply line, and a source electrode connected to the ground potential; and a capacitor $C_{23}$ configured to store the information of the cell $M_{23}$, connected in parallel with the second nMOS transistor $Q_{232}$, wherein an output node connecting the source electrode of the first nMOS transistor $Q_{231}$ and the drain electrode of the second nMOS transistor $Q_{232}$ serves as an output terminal of the cell $M_{23}$, configured to deliver the signal stored in the capacitor $C_{23}$ to the next bit-level cell. The third-column cell $M_{33}$ on the third row encompasses a first nMOS transistor $Q_{331}$ having a drain electrode connected to the clock signal supply line through a first delay element $D_{331}$ and a gate electrode connected to the output terminal of the previous bit-level cell $M_{32}$ through a second delay element $D_{332}$; a second nMOS transistor $Q_{332}$ having a drain electrode connected to a source electrode of the first nMOS transistor $Q_{331}$, a gate electrode connected to the clock signal supply line, and a source electrode connected to the ground potential; and a capacitor $C_{33}$ configured to store the information of the cell $M_{33}$, connected in parallel with the second nMOS transistor $Q_{332}$, wherein an output node connecting the source electrode of the first nMOS transistor $Q_{331}$ and the drain electrode of the second nMOS transistor $Q_{332}$ serves as an output terminal of the cell $M_{33}$, configured to deliver the signal stored in the capacitor $C_{33}$ to the next bit-level cell.

The third-column cell $M_{(n-1)3}$ on the (m−1)-th row encompasses a first nMOS transistor $Q_{(m-1)31}$ having a drain electrode connected to the clock signal supply line through a first delay element $D_{(m-1)31}$ and a gate electrode connected to the output terminal of the previous bit-level cell $M_{(n-1)2}$ through a second delay element $D_{(m-1)32}$; a second nMOS transistor $Q_{(m-1)32}$ having a drain electrode connected to a source electrode of the first nMOS transistor $Q_{(m-1)31}$, a gate electrode connected to the clock signal supply line, and a source electrode connected to the ground potential; and a capacitor $C_{(n-1)3}$ configured to store the information of the cell $M_{(n-1)3}$, connected in parallel with the second nMOS transistor $Q_{(m-1)32}$, wherein an output node connecting the source electrode of the first nMOS transistor $Q_{(m-1)31}$ and the drain electrode of the second nMOS transistor $Q_{(m-1)32}$ serves as an output terminal of the cell $M_{(n-1)3}$, configured to deliver the signal stored in the capacitor $C_{(n-1)3}$ to the next bit-level cell. The third-column cell $M_{m3}$ on the m-th row encompasses a first nMOS transistor $Q_{m31}$ having a drain electrode connected to the clock signal supply line through a first delay element $D_{m31}$ and a gate electrode connected to the output terminal of the previous bit-level cell $M_{m2}$ through a second delay element $D_{m32}$; a second nMOS transistor $Q_{m32}$ having a drain electrode connected to a source electrode of the first nMOS transistor $Q_{m31}$, a gate electrode connected to the clock signal supply line, and a source electrode connected to the ground potential; and a capacitor $C_{m3}$ configured to store the information of the cell $M_{m3}$, connected in parallel with the second nMOS transistor $Q_{m32}$, wherein an output node connecting the source electrode of the first nMOS transistor $Q_{m31}$ and the drain electrode of the second nMOS transistor $Q_{m32}$ serves as an output terminal of the cell $M_{m3}$, configured to deliver the signal stored in the capacitor $C_{m3}$ to the next bit-level cell.

As shown in FIG. 4, the n-th memory unit of word-size level is implemented by a vertical array of bit-level cell $M_{1n}$, $M_{2n}$, $M_{3n}$, . . . , $M_{m-1,n}$, $M_{mn}$ in the n-th column of the m*n matrix. The n-th-column cell $M_{1n}$ on the first row encompasses a first nMOS transistor $Q_{1n1}$ having a drain electrode connected to the clock signal supply line through a first delay element $D_{1n1}$ and a gate electrode connected to the bit-level output terminal of the previous bit-level cell $M_{1(n-1)}$ through a second delay element $D_{1n2}$; a second nMOS transistor $Q_{1n2}$ having a drain electrode connected to a source electrode of the first nMOS transistor $Q_{1n1}$, a gate electrode connected to the clock signal supply line, and a source electrode connected to the ground potential; and a capacitor $C_{1n}$ configured to store the information of the cell $M_{1n}$, connected in parallel with the second nMOS transistor $Q_{1n2}$, wherein an output node connecting the source electrode of the first nMOS transistor $Q_{1n1}$ and the drain electrode of the second nMOS transistor $Q_{1n2}$ serves as a bit-level output terminal of the cell $M_{1n}$, configured to deliver the signal stored in the capacitor $C_{1n}$ to a first bit-level output terminal. The n-th-column cell $M_{2n}$ on the second row encompasses a first nMOS transistor $Q_{2n1}$ having a drain electrode connected to the clock signal supply line through a first delay element $D_{2n1}$ and a gate electrode connected to the bit-level output terminal of the previous bit-level cell $M_{2(n-1)}$ through a second delay element $D_{2n2}$; a second nMOS transistor $Q_{2n2}$ having a drain electrode connected to a source electrode of the first nMOS transistor $Q_{2n1}$, a gate electrode connected to the clock signal supply line, and a source electrode connected to the ground potential; and a capacitor $C_{2n}$ configured to store the information of the cell $M_{2n}$, connected in parallel with the second nMOS transistor $Q_{2n2}$, wherein an output node connecting the source electrode of the first nMOS transistor $Q_{2n1}$ and the drain electrode of the second nMOS transistor $Q_{2n2}$ serves as a bit-level output terminal of the cell $M_{2n}$, configured to deliver the signal stored in the capacitor $C_{2n}$ to a second bit-level output terminal. The n-th-column cell $M_{3n}$ on the third row encompasses a first nMOS transistor $Q_{3n1}$ having a drain electrode connected to the clock signal supply line through a first delay element $D_{3n1}$ and a gate electrode connected to the bit-level output terminal of the previous bit-level cell $M_{3(n-1)}$ through a second delay element $D_{3n2}$; a second nMOS transistor $Q_{3n2}$ having a drain electrode connected to a source electrode of the first nMOS transistor $Q_{3n1}$, a gate electrode connected to the clock signal supply line, and a source electrode connected to the ground potential; and a capacitor $C_{3n}$ configured to store the information of the cell $M_{3n}$, connected in parallel with the second nMOS transistor $Q_{3n2}$, wherein an output node connecting the source electrode of the first nMOS transistor $Q_{3n1}$ and the drain electrode of the second nMOS transistor $Q_{3n2}$ serves as a bit-level output terminal of the cell $M_{3n}$, configured to deliver the signal stored in the capacitor $C_{3n}$ to a third bit-level output terminal.

The n-th-column cell $M_{(m-1)n}$ on the (m−1)-th row encompasses a first nMOS transistor $Q_{(m-1)n1}$ having a drain electrode connected to the clock signal supply line through a first delay element $D_{(m-1)n1}$ and a gate electrode connected to the bit-level output terminal of the previous bit-level cell $M_{(m-1)(n-1)}$ through a second delay element $D_{(m-1)n2}$; a second nMOS transistor $Q_{(m-1)n2}$ having a drain electrode connected to a source electrode of the first nMOS transistor $Q_{(m-1)n1}$, a gate electrode connected to the clock signal supply line, and a source electrode connected to the ground potential; and a capacitor $C_{(m-1)n}$ configured to store the information of the cell $M_{(m-1)n}$, connected in parallel with the second nMOS transistor $Q_{(m-1)n2}$, wherein an output node connecting the source electrode of the first nMOS transistor $Q_{(m-1)n1}$ and the drain electrode of the second nMOS transistor $Q_{(m-1)n2}$ serves as a bit-level output terminal of the cell $M_{(m-1)n}$, configured to deliver the signal stored in the capacitor $C_{(m-1)n}$ to a (m−1)-th bit-level output terminal. The n-th-column cell $M_{mn}$ on the m-th row encompasses a first nMOS transistor $Q_{mn1}$ having a drain electrode connected to the clock signal supply line through a first delay element $D_{mn1}$ and a gate electrode connected to the bit-level output terminal of the previous bit-level cell $M_{m(n-1)}$ through a second delay element $D_{mn2}$; a second nMOS transistor $Q_{mn2}$ having a drain electrode connected to a source electrode of the first nMOS transistor $Q_{mn1}$, a gate electrode connected to the clock signal supply line, and a source electrode connected to the ground potential; and a capacitor $C_{mn}$ configured to store the information of the cell $M_{mn}$, connected in parallel with the second nMOS transistor $Q_{mn2}$, wherein an output node connecting the source electrode of the first nMOS transistor $Q_{mn1}$ and the drain electrode of the second nMOS transistor $Q_{mn2}$ serves as a bit-level output terminal of the cell $M_{mn}$, configured to deliver the signal stored in the capacitor $C_{mn}$ to a m-th bit-level output terminal.

As shown in FIG. 5, a bit-level cell $M_{ij}$ of the j-th column and on the i-th row, in the representative 2*2 cell-array of the marching main memory used in the computer system pertaining to the exemplary embodiment of the present invention, encompasses a first nMOS transistor $Q_{ij1}$ having a drain electrode connected to a clock signal supply line through a first delay element $D_{ij1}$ and a gate electrode connected to the output terminal of the previous bit-level cell through a second delay element $D_{ij2}$; a second nMOS transistor $Q_{ij2}$ having a drain electrode connected to a source electrode of the first nMOS transistor $Q_{ij1}$, a gate electrode connected to the clock signal supply line, and a source electrode connected to the ground potential; and a capacitor $C_{ij}$ configured to store the information of the bit-level cell $M_{ij}$, connected in parallel with the second nMOS transistor $Q_{ij2}$, wherein an output node connecting the source electrode of the first nMOS transistor $Q_{ij1}$ and the drain electrode of the second nMOS transistor $Q_{ij2}$ serves as an output terminal of the bit-level cell $M_{ij}$, configured to deliver the signal stored in the capacitor $C_{ij}$ to the next bit-level cell $M_{i(j+1)}$.

A column bit-level cell $M_{i(j+1)}$ of the (j+1)-th column and on the i-th row encompasses a first nMOS transistor $Q_{i(j+1)1}$ having a drain electrode connected to clock signal supply line through a first delay element $D_{i(j+1)1}$ and a gate electrode connected to the output terminal of the previous bit-level cell $M_{ij}$ through a second delay element $D_{i(j+1)2}$; a second nMOS transistor $Q_{i(j+1)2}$ having a drain electrode connected to a source electrode of the first nMOS transistor $Q_{i(j+1)1}$, a gate electrode connected to the clock signal supply line, and a source electrode connected to the ground potential; and a capacitor $C_{i(j+1)}$ configured to store the information of the bit-level cell $M_{i(j+1)}$, connected in parallel with the second nMOS transistor $Q_{i(j+1)2}$, wherein an output node connecting the source electrode of the first nMOS transistor $Q_{i(j+1)1}$ and the drain electrode of the second nMOS transistor $Q_{i(j+1)2}$ serves as an output terminal of the bit-level cell $M_{i(j+1)}$, configured to deliver the signal stored in the capacitor $C_{i(j+1)}$ to the next cell.

And, a bit-level cell $M_{(i+1)j}$ of the j-th column and on the (i+1)-th row encompasses a first nMOS transistor $Q_{(i+1)j1}$ having a drain electrode connected to the clock signal supply line through a first delay element $D_{(i+1)j1}$ and a gate electrode connected to the output terminal of the previous bit-level cell through a second delay element $D_{(i+1)j2}$; a second nMOS transistor $Q_{(i+1)j2}$ having a drain electrode connected to a source electrode of the first nMOS transistor $Q_{(i+1)j1}$, a gate electrode connected to the clock signal supply line, and a source electrode connected to the ground potential; and a capacitor $C_{(i+1)j}$ configured to store the information of the bit-level cell $M_{(i+1)j}$, connected in parallel with the second nMOS transistor $Q_{(i+1)j2}$, wherein an output node connecting the source electrode of the first nMOS transistor $Q_{(i+1)j1}$ and the drain electrode of the second nMOS transistor $Q_{(i+1)j2}$ serves as an output terminal of the bit-level cell $M_{(i+1)j}$, configured to deliver the signal stored in the capacitor $C_{(i+1)j}$ to the next bit-level cell $M_{(i+1)(j+1)}$.

Furthermore, a bit-level cell $M_{(i+1)(j+1)}$ of the (j+1)-th column and on the (i+1)-th row encompasses a first nMOS transistor $Q_{(i+1)(j+1)1}$ having a drain electrode connected to the clock signal supply line through a first delay element $D_{(i+1)(j+1)1}$ and a gate electrode connected to the output terminal of the previous bit-level cell $M_{(i+1)j}$ through a second delay element $D_{(i+1)(j+1)2}$; a second nMOS transistor $Q_{(i+1)(j+1)2}$ having a drain electrode connected to a source electrode of the first nMOS transistor $Q_{(i+1)(j+1)1}$, a gate electrode connected to the clock signal supply line, and a source electrode connected to the ground potential; and a capacitor $C_{(i+1)(j+1)}$ configured to store the information of the bit-level cell $M_{(i+1)(j+1)}$, connected in parallel with the second nMOS transistor $Q_{(i+1)(j+1)2}$, wherein an output node connecting the source electrode of the first nMOS transistor $Q_{(i+1)(j+1)1}$ and the drain electrode of the second nMOS transistor $Q_{(i+1)(j+1)2}$ serves as an output terminal of the bit-level cell $M_{(i+1)(j+1)}$, configured to deliver the signal stored in the capacitor $C_{(i+1)(j+1)}$ to the next cell.

As shown in FIG. 6, the j-th bit-level cell $M_{ij}$ on the i-th row encompasses a first nMOS transistor $Q_{ij1}$ having a drain electrode connected to a clock signal supply line through a first delay element $D_{ij1}$ and a gate electrode connected to the output terminal of the previous cell through a second delay element $D_{ij2}$; a second nMOS transistor $Q_{ij2}$ having a drain electrode connected to a source electrode of the first nMOS transistor $Q_{ij1}$, a gate electrode connected to the clock signal supply line, and a source electrode connected to the ground potential; and a capacitor $C_{ij}$ configured to store the information of the bit-level cell $M_{ij}$, connected in parallel with the second nMOS transistor $Q_{ij2}$.

In the circuit configuration shown in FIG. 6, the second nMOS transistor $Q_{ij2}$ serves as a reset-transistor configured to reset the signal charge stored in the capacitor $C_{ij}$, when a clock signal of high-level (or a logical level of "1") is applied to the gate electrode of the second nMOS transistor $Q_{ij2}$, discharging the signal charge already stored in the capacitor $C_{ij}$.

FIGS. 7A and 7B show a schematic example of the transistor-level responses of the bit-level cell $M_{ij}$ shown in FIG. 6, which is one of the bit-level cells used in the computer system, to a waveform of a clock signal shown by broken line. The clock signal shown by broken line swings periodically between the logical levels of "1" and "0" with the clock period TAU(Greek-letter)$_{clock}$. In FIGS. 7A and 7B, $t_1-t_0$ ($=t_2-t_1=t_3-t_2=t_4-t_3$) is defined to be a quarter of the clock period $TAU_{clock}$($=TAU_{clock}/4$).

As shown in FIG. 7A(a), at time "$t_0$", although the clock signal of high-level shown by the broken line is applied both to a drain electrode of the first nMOS transistor $Q_{ij1}$ through a first ideal delay element $D_{ij1}$ and to a gate electrode of the second nMOS transistor $Q_{ij2}$, the second nMOS transistor $Q_{ij2}$ keeps off-state until the first nMOS transistor $Q_{ij1}$ will establish on-state at time "$t_1$", because the potential of the output node $N_{out}$, connecting between a source electrode of the first nMOS transistor $Q_{ij1}$ and a drain electrode of the second nMOS transistor $Q_{ij2}$, is supposed to be a floating state, lying between the logical levels of "0" and "1", between the time "$t_0$" and the time "$t_1$".

Owing to the first ideal delay element $D_{ij1}$, because the turn on of the first nMOS transistor $Q_{ij1}$ is delayed by $t_1-t_0=TAU_{clock}/4$, the first nMOS transistor $Q_{ij1}$ becomes active as a transfer-transistor at time "$t_1$", and the potential of the output node $N_{out}$ becomes the logical level "1". Here, it is assumed that the first ideal delay element $D_{ij1}$ can achieve a delay of $TAU_{clock}/4$ with very sharp leading edge, by which the rise time can be neglected. That is, as shown by solid line with very sharp leading edge and very sharp trailing edge in FIG. 7A(a), the clock signal applied at time "to" is delayed by $t_1-t_0=TAU_{clock}/4$. Then, as shown in FIG. 7A(*c*)-(*d*), if the signal stored in the previous bit-level cell $M_{i(j-1)}$ is the logical level of "1", the second nMOS transistor $Q_{ij2}$ becomes active as a reset-transistor, and any signal charge stored in the capacitor $C_{ij}$ is driven to be discharged, at time "$t_2$".

The first nMOS transistor $Q_{ij1}$ becomes completely active as the transfer-transistor at time "$t_2$", delayed by a predetermined delay time $t_{d2}=t_2-t_0=TAU_{clock}/2$, determined by the second ideal delay element $D_{ij2}$. Here, it is assumed that the second ideal delay element $D_{ij2}$ can achieve a delay of $TAU_{clock}/2$ with very sharp leading edge, by which the rise time can be neglected. Then, if the signal of the logical level of "1" stored in a previous bit-level cell $M_{i(j-1)}$ is fed from the previous bit-level cell $M_{i(j-1)}$ on the i-th row to the gate electrode of the first nMOS transistor $Q_{ij1}$, at time "$t_2$", the signal charge stored in the capacitor $C_{ij}$ is completely discharged to establish the logical level of "0", as shown in FIG. 7A(b), and the first nMOS transistor $Q_{ij1}$ begins transferring the signal of the logical level of "1" stored in the previous bit-level cell $M_{i(j-1)}$, to the capacitor $C_{ij}$ so as to execute marching AND-gate operation as shown in FIG. 7A(*c*)-(*d*). That is, with an input signal of "1" provided by the clock signal and another input signal of "1" provided by the previous bit-level cell $M_{i(j-1)}$, the conventional 2-input AND operation of:

$$1+1=1$$

can be executed. By the way, if the signal charge stored in the capacitor $C_{ij}$ is of the logical level of "1", the capacitor $C_{ij}$ can begin discharging at time "to", because the second nMOS transistor $Q_{ij2}$ can become active as the reset-transistor with the clock signal of the high-level shown by the broken line applied to the gate electrode of the second nMOS transistor $Q_{ij2}$ at time "$t_0$", if the operation of the second nMOS transistor $Q_{ij2}$ has no delay.

Alternatively, as shown in FIG. 7B(*c*)-(*d*), if the signal stored in the previous bit-level cell $M_{i(j-1)}$ is the logical level of "0", the first nMOS transistor $Q_{ij1}$ keeps off-sate at any time "$t_0$", "$t_1$", "$t_2$" and "$t_3$". As above-mentioned, if the signal charge stored in the capacitor $C_{ij}$ is of the logical level of "1", although the first nMOS transistor $Q_{ij1}$ keeps off-sate, the capacitor $C_{ij}$ can begin discharging at time "$t_0$", because the second nMOS transistor $Q_{ij2}$ can become active as the reset-transistor with the clock signal of the high-level shown by the broken line applied to the gate electrode of the second nMOS transistor $Q_{ij2}$ at time "$t_0$", and the marching AND-gate operation of:

$$1+0=0$$

is executed as shown in FIG. 7A(*c*)-(*d*), with an input signal of "1" provided by the clock signal and another input signal of "0" provided by the previous bit-level cell $M_{i(j-1)}$. However, if the signal charge stored in the capacitor $C_{ij}$ is of the logical level of "0", because both of the first nMOS transistor $Q_{ij1}$ and the second nMOS transistor $Q_{ij2}$ keep the off-sate, the capacitor $C_{ij}$ keep the logical level of "0" at any time "$t_0$", "$t_1$", "$t_2$" and "$t_3$", and the marching AND-gate operation of is executed as shown in FIG. 7A(*c*)-(*d*). The output node $N_{out}$ connecting the source electrode of the first nMOS transistor $Q_{ij1}$ and the drain electrode of the second nMOS transistor $Q_{ij2}$ serves as an output terminal of the bit-level cell $M_{ij}$, and the output terminal of the bit-level cell $M_{ij}$ delivers the signal stored in the capacitor $C_{ij}$ to the next bit-level cell on the i-th row.

FIG. 7C shows an actual example of the response to the waveform of the clock signal, for a case that both of the first delay element $D_{ij1}$ and the second delay element $D_{ij2}$ are implemented by R-C delay circuit, as shown in FIG. 8. In a normal operation of the marching memory, the signal charge stored in the capacitor $C_{ij}$ is actually either of the logical level of "0" or"1", and if the signal charge stored in the capacitor $C_{ij}$ is of the logical level of "1", although the first nMOS transistor $Q_{ij1}$ still keeps off-sate, the capacitor $C_{ij}$ can begin discharging at time "$t_0$", because the second nMOS transistor $Q_{ij2}$ can become active when the clock signal of the high-level is applied to the gate electrode of the second nMOS transistor $Q_{ij2}$, if an ideal operation of the second nMOS transistor $Q_{ij2}$ with no delay can be approximated. Therefore, if the signal charge stored in the capacitor $C_{ij}$ is actually of the logical level of "1", after the clock signal of high-level has been applied to the gate electrode of the second nMOS transistor $Q_{ij2}$ and the signal charge stored in the capacitor $C_{ij}$ has been discharged, the first nMOS transistor $Q_{ij1}$ becomes active as a transfer-transistor, delayed by a predetermined delay time to determined by the first delay element $D_{ij1}$ implemented by the R-C delay circuit. And when the signal stored in a previous bit-level cell $M_{i(j-1)}$ is fed from the previous bit-level cell $M_{i(j-1)}$ on the i-th row to the gate electrode of the first nMOS transistor $Q_{ij1}$, the first nMOS transistor $Q_{ij1}$ transfers the signal stored in the previous bit-level cell $M_{i(j-1)}$, further delayed by a predetermined delay time $t_{d2}$ determined by the second delay element $D_{ij2}$ to the capacitor $C_{ij}$. An output node $N_{out}$ connecting the source electrode of the first nMOS transistor $Q_{ij1}$ and the drain electrode of the second nMOS transistor $Q_{ij2}$ serves as an output terminal of the bit-level cell $M_{ij}$, and the output terminal of the bit-level cell $M_{ij}$ delivers the signal stored in the capacitor $C_{ij}$ to the next bit-level cell on the i-th row.

As shown in FIG. 7C, the clock signal swings periodically between the logical levels of "1" and "0", with a predetermined clock period (clock cycle time) $TAU_{clock}$, and when the clock signal becomes the logical level of "1", the second nMOS transistor $Q_{ij2}$ begins to discharge the signal charge, which is already stored in the capacitor $C_{ij}$ at a previous clock cycle. And, after the clock signal of the logical level of "1" is applied and the signal charge stored in the capacitor $C_{ij}$ is completely discharged to the potential of the logical level of "0", the first nMOS transistor $Q_{ij1}$ becomes active as the transfer-transistor, delayed by the predetermined delay time $t_{d1}$ determined by the first delay element $D_{ij1}$. The delay time $t_{d1}$ is set to be equal to ¼$TAU_{clock}$ in an exemplary embodiment. Thereafter, when the signal stored in the previous bit-level cell $M_{i(j-1)}$ on the i-th row is fed from the previous bit-level cell $M_{i(j-1)}$ to the gate electrode of the first nMOS transistor $Q_{ij1}$, the first nMOS transistor $Q_{ij1}$ transfers the signal stored in the previous bit-level cell $M_{i(j-1)}$, further delayed by the predetermined delay time $t_{d2}$ determined by the second delay element $D_{ij2}$ implemented by the R-C delay circuit to the capacitor $C_{ij}$.

For example, if the logical level of "1" stored in the previous bit-level cell $M_{i(j-1)}$ on the i-th row is fed from the previous bit-level cell $M_{i(j-1)}$ to the gate electrode of the first nMOS transistor $Q_{ij1}$, the first nMOS transistor $Q_{ij1}$ becomes conductive state, and the logical level of "1" is stored in the capacitor $C_{ij}$. On the other hand, if the logical level of "0" stored in the previous bit-level cell $M_{i(j-1)}$ is fed from the previous bit-level cell $M_{i(j-1)}$ to the gate electrode of the first nMOS transistor $Q_{ij1}$, the first nMOS transistor $Q_{ij1}$ keeps cut-off state, and the logical level of "0" is maintained in the capacitor $C_{ij}$. Therefore, the bit-level cell $M_{ij}$ can establish "a marching AND-gate" operation. The delay time $t_{d2}$ shall be longer than the delay time $t_{d1}$, and the delay time $t_{d2}$ is set to be equal to ½$TAU_{clock}$ in an exemplary embodiment.

Since the clock signal swings periodically between the logical levels of "1" and "0", with the clock period $TAU_{clock}$, the clock signal becomes the logical level of "0" at a time when time proceeds 1/2$TAU_{clock}$, and the output node $N_{out}$ connecting the source electrode of the first nMOS transistor $Q_{ij1}$ and the drain electrode of the second nMOS transistor $Q_{ij2}$ cannot deliver the signal transferred from the previous bit-level cell $M_{i(j-1)}$ further to the next bit-level cell $M_{i(j+1)}$ at a time when time proceeds 1/2$TAU_{clock}$, as the signal is blocked to be transferred to the gate electrode of the next first nMOS transistor $Q_{i(j+1)1}$ delayed by the delay time $t_{d2}$=1/2$TAU_{clock}$ determined by the second delay element $D_{i(j+1)2}$. When the clock signal becomes the logical level of "1" again at a time when time proceeds $TAU_{clock}$, the output node $N_{out}$ connecting the source electrode of the first nMOS transistor $Q_{ij1}$ and the drain electrode of the second nMOS transistor $Q_{ij2}$, which is serving as the output terminal of the bit-level cell $M_{ij}$, can deliver the signal stored in the capacitor $C_{ij}$ to the next bit-level cell $M_{i(j+1)}$ at the next clock cycle.

Again referring to FIG. 4, when the clock signal shown in FIG. 7A(a) or FIG. 7C becomes the logical level of "1", a sequence of the second nMOS transistors $Q_{112}$, $Q_{212}$, $Q_{312}$, . . . , $Q_{m-1,12}$, $Q_{m12}$ in the first memory unit $U_1$ begin to discharge the signal charges, respectively, which are already stored in the capacitors $C_{11}$, $C_{21}$, $C_{31}$, . . . , $C_{m-1,1}$, $C_{m1}$, respectively, in the first memory unit $U_1$ at a previous clock cycle. And, after the clock signal of the logical level of "1" is applied to the gate electrodes of the sequence of the second nMOS transistors $Q_{112}$, $Q_{212}$, $Q_{312}$, . . . , $Q_{m-1,12}$, $Q_{m12}$, respectively, and the signal charges stored in the capacitors $C_{11}$, $C_{21}$, $C_{31}$, . . . , $C_{m-1,1}$, $C_{m1}$ are completely discharged to the potential of the logical level of "0", a sequence of the first nMOS transistors $Q_{111}$, $Q_{211}$, $Q_{311}$, . . . , $Q_{m-1,11}$, $Q_{m11}$ becomes active as the transfer-transistors, delayed by the delay time to determined by the first delay elements $D_{111}$, $D_{211}$, $D_{311}$, . . . , $D_{m-1,11}$, $D_{m11}$, respectively. Thereafter, when a sequence of signals of word size, which is multiples of eight bits, such as 16, 32, and 64 bits are entered to the gate electrodes of the sequence of the first nMOS transistors $Q_{111}$, $Q_{211}$, $Q_{311}$, . . . , $Q_{m-1,11}$, $Q_{m11}$, the sequence of the first nMOS transistors $Q_{111}$, $Q_{211}$, $Q_{311}$, . . . , $Q_{m-1,11}$, $Q_{m11}$ transfer the sequence of signals of word size to the capacitors $C_{11}$, $C_{21}$, $C_{31}$, . . . , $C_{m-1,1}$, $C_{m1}$, delayed by the delay time $t_{d2}$ determined by the second delay elements $D_{112}$, $D_{212}$, $D_{312}$, . . . , $D_{m-1,12}$, $D_{m12}$, respectively.

When the clock signal becomes the logical level of "0" at a time when time proceeds 1/2$TAU_{clock}$, each of the output nodes connecting the source electrodes of the first nMOS transistors $Q_{111}$, $Q_{211}$, $Q_{311}$, . . . , $Q_{m-1,11}$, $Q_{m11}$ and the drain electrodes of the second nMOS transistors $Q_{112}$, $Q_{212}$, $Q_{312}$, . . . , $Q_{m-1,12}$, $Q_{m12}$ cannot deliver the signals, which are entered to the gate electrodes of the first nMOS transistors $Q_{111}$, $Q_{211}$, $Q_{311}$, . . . , $Q_{m-1,11}$, $Q_{m11}$, further to the next bit-level cell $M_{12}$, $M_{22}$, $M_{32}$, . . . , $M_{m-1,2}$, $M_{m2}$ at a time when time proceeds 1/2$TAU_{clock}$, as each of the signals is blocked to be transferred to the gate electrodes of the next first nMOS transistors $Q_{121}$, $Q_{221}$, $Q_{321}$, . . . , $Q_{m-1,21}$, $Q_{m21}$ delayed by the delay time $t_{d2}$=1/2$TAU_{clock}$ determined by the second delay element $D_{122}$, $D_{222}$, $D_{322}$, . . . , $D_{m-1,22}$, $D_{m22}$.

At a time when time proceeds $TAU_{clock}$, when the next clock signal becomes the logical level of "1" again, a sequence of the second nMOS transistors $Q_{122}$, $Q_{222}$, $Q_{322}$, . . . , $Q_{m-1,22}$, $Q_{m22}$ in the second memory unit $U_2$ begin to discharge the signal charges, respectively, which are already stored in the capacitors $C_{12}$, $C_{22}$, $C_{32}$, . . . , $C_{m-1,2}$, $C_{m2}$, respectively, in the second memory unit $U_2$ at the previous clock cycle. And, after the clock signal of the logical level of "1" is applied to the gate electrodes of the sequence of the second nMOS transistors $Q_{122}$, $Q_{222}$, $Q_{322}$, . . . , $Q_{m-1,22}$, $Q_{m22}$, respectively, and the signal charges stored in the capacitors $C_{12}$, $C_{22}$, $C_{32}$, . . . , $C_{m-1,2}$, $C_{m2}$, are completely discharged to the potential of the logical level of "0", a sequence of the first nMOS transistors $Q_{121}$, $Q_{221}$, $Q_{321}$, . . . , $Q_{m-1,21}$, $Q_{m21}$ becomes active as the transfer-transistors, delayed by the delay time to determined by the first delay elements $D_{121}$, $D_{221}$, $D_{321}$, . . . , $D_{m-1,21}$, $D_{m21}$, respectively. Thereafter, when the sequence of signals of word size stored in the previous capacitors $C_{11}$, $C_{21}$, $C_{31}$, . . . , $C_{m-1,1}$, $C_{m1}$ are fed to the gate electrode of the sequence of the first nMOS transistors $Q_{121}$, $Q_{221}$, $Q_{321}$, . . . , $Q_{m-1,21}$, $Q_{m21}$, the first nMOS transistor $Q_{121}$, $Q_{221}$, $Q_{321}$, . . . , $Q_{m-1,21}$, $Q_{m21}$ transfer the sequence of signals of word size, delayed by the delay time $t_{d2}$ determined by the second delay element $D_{122}$, $D_{222}$, $D_{322}$, . . . , $D_{m-1,22}$, $D_{m22}$, to the capacitors $C_{12}$, $C_{22}$, $C_{32}$, . . . , $C_{m-1,2}$, $C_{m2}$.

When the clock signal becomes the logical level of "0" at a time when time further proceeds $(1+1/2)TAU_{clock}$, each of the output nodes connecting the source electrodes of the first nMOS transistors $Q_{121}$, $Q_{221}$, $Q_{321}$, . . . , $Q_{m-1,21}$, $Q_{m21}$ and the drain electrodes of the second nMOS transistors $Q_{122}$, $Q_{222}$, $Q_{322}$, . . . , $Q_{m-1,22}$, $Q_{m2}$ cannot deliver the signals stored in the previous bit-level cell $M_{11}$, $M_{21}$, $M_{31}$, . . . , $M_{m-1,1}$, $M_{m1}$ further to the next bit-level cell $M_{12}$, $M_{22}$, $M_{32}$, . . . , $M_{m-1,2}$, $M_{m2}$ at a time when time proceeds $(1+1/2)TAU_{clock}$, as each of the signals is blocked to be transferred to the gate electrode of the next first nMOS transistor $Q_{131}$, $Q_{231}$, $Q_{331}$, . . . , $Q_{m-1,31}$, $Q_{m31}$ delayed by the delay time $t_{d2}=1/2TAU_{clock}$ determined by the second delay element $D_{132}$, $D_{232}$, $D_{332}$, . . . , $D_{m-1,32}$, $D_{m32}$.

At a time when time further proceeds $2TAU_{clock}$, when the next clock signal becomes the logical level of "1" again, a sequence of the second nMOS transistors $Q_{132}$, $Q_{232}$, $Q_{332}$, . . . , $Q_{m-1,32}$, $Q_{m32}$ in the third memory unit $U_3$ begin to discharge the signal charges, respectively, which are already stored in the capacitors $C_{13}$, $C_{23}$, $C_{33}$, . . . , $C_{m-1,3}$, $C_{m3}$, respectively, in the third memory unit $U_3$ at the previous clock cycle. And, after the clock signal of the logical level of "1" is applied to the gate electrodes of the sequence of the second nMOS transistors $Q_{132}$, $Q_{232}$, $Q_{332}$, . . . , $Q_{m-1,32}$, $Q_{m32}$, respectively, and the signal charges stored in the capacitors $C_{13}$, $C_{23}$, $C_{33}$, . . . , $C_{m-1,3}$, $C_{m3}$, are completely discharged to the potential of the logical level of "0", a sequence of the first nMOS transistors $Q_{131}$, $Q_{231}$, $Q_{331}$, . . . , $Q_{m-1,31}$, $Q_{m31}$ becomes active as the transfer-transistors, delayed by the delay time to determined by the first delay elements $D_{131}$, $D_{231}$, $D_{331}$, . . . , $D_{m-1,31}$, $D_{m31}$, respectively. Thereafter, when the sequence of signals of word size stored in the previous capacitors $C_{12}$, $C_{22}$, $C_{32}$, . . . , $C_{m-1,2}$, $C_{m2}$ are fed to the gate electrode of the sequence of the first nMOS transistors $Q_{131}$, $Q_{231}$, $Q_{331}$, . . . , $Q_{m-1,31}$, $Q_{m31}$, the first nMOS transistor $Q_{131}$, $Q_{231}$, $Q_{331}$, . . . , $Q_{m-1,31}$, $Q_{m31}$ transfer the sequence of signals of word size, delayed by the delay time $t_{d2}$ determined by the second delay element $D_{132}$, $D_{232}$, $D_{332}$, . . . , $D_{m-1,32}$, $D_{m32}$, to the capacitors $C_{13}$, $C_{23}$, $C_{33}$, . . . , $C_{m-1,3}$, $C_{m3}$.

As shown in FIG. 8, each of the first delay element D and the second delay element $D_{ij2}$ can be implemented by known "resistive-capacitive delay" or "R-C delay". In the RC circuit, the value of the time constant (in seconds) is equal to the product of the circuit resistance (in ohms) and the circuit capacitance (in farads), i.e. $t_{d1}$, $t_{d2}$=R*C. Because the structure of the RC circuit is very simple, an RC circuit may be used for the first delay element $D_{ij1}$ and the second delay element $D_{ij2}$. However, the RC circuit is exemplary, and the first delay element $D_{ij1}$ and the second delay element $D_{ij2}$. can be implemented by another passive delay elements, or various active delay element, which may include active element of transistor, etc.

FIG. 9 is an example of the top view of the actual planar pattern of the bit-level cell $M_{ij}$ of the j-th column and on the i-th row shown in FIG. 8, which has the first delay element $D_{ij1}$ and the second delay element $D_{ij2}$ implemented by the R-C delay circuit, and FIG. 10 shows the corresponding cross-sectional view taken on the line A-A of FIG. 9. As shown in FIG. 9, the first delay element $D_{ij1}$ is implemented by a first meandering line 91 of conductive wire, and the second delay element $D_{ij2}$ is implemented by a second meandering line 97 of conductive wire.

In FIG. 9, the first nMOS transistor $Q_{ij1}$ has a drain electrode region 93 connected to the first meandering line 91 via a contact plug 96*a*. The other end of the first meandering line 91 opposite to the end connected to the drain electrode region 93 of the first nMOS transistor $Q_{ij1}$ is connected to the clock signal supply line. The drain electrode region 93 is implemented by an $n^+$ semiconductor region. A gate electrode of the first nMOS transistor $Q_{ij1}$ is implemented by the second meandering line 97. The other end of the second meandering line 97 opposite to the end serving as the gate electrode of the first nMOS transistor $Q_{ij1}$ is connected to the output terminal of the previous cell.

The second nMOS transistor $Q_{ij2}$ has a drain electrode region implemented by a common $n^+$ semiconductor region 94, which also serves as the source electrode region of the first nMOS transistor $Q_{ij1}$, a gate electrode 98 connected to the clock signal supply line via a contact plug 96*a*, and a source electrode region 95 connected to the ground potential via a contact plug 96*a*. The source electrode region 95 is implemented by an $n^+$ semiconductor region. Because the common $n^+$ semiconductor region 94 is the output node connecting the source electrode region of the first nMOS transistor $Q_{ij1}$ and the drain electrode region of the second nMOS transistor $Q_{ij2}$, the common $n^+$ semiconductor region 94 is connected to a surface wiring 92*b* via a contact plug 96*d*. The common $n^+$ semiconductor region 94 serves as the output terminal of the bit-level cell $M_{ij}$, and delivers the signal stored in the capacitor $C_{ij}$ to the next bit-level cell through the surface wiring 92*b*.

As shown in FIG. 10, the drain electrode region 93, the common $n^+$ semiconductor region 94, and the source electrode region 95 is provided at the surface of and in the upper portion of the p-type semiconductor substrate 81. Instead of the p-type semiconductor substrate 81, the drain electrode region 93, the common $n^+$ semiconductor region 94, and the source electrode region 95 can be provided in the upper portion of the p-well, or p-type epitaxial layer grown on a semiconductor substrate. On the p-type semiconductor substrate 81, an element isolation insulator 82 is provided so as to define an active area of the p-type semiconductor substrate 81 as a window provided in the element isolation insulator 82. And the drain electrode region 93, the common $n^+$ semiconductor region 94, and the source electrode region 95 is provided in the active area, surrounded by the element isolation insulator 82. At the surface of and on the active area, a gate insulating film 83 is provided. And the gate electrode of the first nMOS transistor $Q_{ij1}$ implemented by the second meandering line 97 and the gate electrode 98 of the second nMOS transistor $Q_{ij2}$ are provided on the gate insulating film 83.

As shown in FIG. 10, a first interlayer dielectric film 84 is provided on the second meandering line 97 and the gate electrode 98. On a part of the first interlayer dielectric film 84, a bottom electrode 85 of the capacitor $C_{ij}$ configured to store the information of the bit-level cell $M_{ij}$ is provided. The bottom electrode 85 is made of conducting film, and a contact plug 96*c* is provided in the first interlayer dielectric film 84 so as to connect between the bottom electrode 85 and the source electrode region 95. And, on the bottom electrode 85, a capacitor insulating film 86 is provided.

Furthermore, on the capacitor insulating film 86, a top electrode 87 of the capacitor $C_{ij}$ is provided so as to occupy an upper portion of the bottom electrode 85. The top electrode 87 is made of conducting film. Although the illustration is omitted in the cross-sectional view shown in FIG. 10, the top electrode 87 is electrically connected to the common $n^+$ semiconductor region 94 so as to establish an electric circuit topology that the capacitor $C_{ij}$ is connected in parallel with the second nMOS transistor $Q_{ij2}$. A variety of insulator films may be used as the capacitor insulating film 86. The miniaturized marching main memory may be required to occupy a small area of the bottom electrode 85 opposing the top electrode 87. However, to allow the marching main memory to function successfully, the capacitance between the bottom electrode 85 and the top electrode 87 via the capacitor insulating film 86 needs to maintain a constant value. In particular, with a miniaturized marching main memory with a minimum line width of approximately 100 nm or less, usage of a material with a dielectric constant $e_r$ greater than that of a silicon oxide ($SiO_2$) film is used in an exemplary embodiment, considering the storage capacitance between the bottom electrode 85 and the top electrode 87. With an ONO film, for example, the ratio in thickness of the upper layer silicon oxide film, the middle layer silicon nitride film, and the underlayer silicon oxide film is selectable, however, a dielectric constant $e_r$ of approximately 5 to 5.5 can be provided. Alternatively, a single layer film made from any one of a strontium oxide (SrO) film with $e_r$=6, a silicon nitride ($Si_3N_4$) film with $e_r$=7, an aluminum oxide ($Al_2O_3$) film where $e_r$=8-11, a magnesium oxide (MgO) film where $e_r$=10, an yttrium oxide ($Y_2O_3$) film where $e_r$=16-17, a hafnium oxide ($HfO_2$) film where $e_r$=22-23, a zirconium oxide ($ZrO_2$) film where $e_r$=22-23, a tantalum oxide ($Ta_2O_5$) film where $e_r$=25-27, or a bismuth oxide ($Bi_2O_3$) film where $e_r$=40, or a composite film embracing at least two of these plural layers thereof may be used. $Ta_2O_5$ and $Bi_2O_3$ show disadvantages in lacking thermal stability at the interface with the polysilicon. Furthermore, it may be a composite film made from a silicon oxide film and these films. The composite film may have a stacked structure of triple-levels or more. In other words, it should be an insulating film containing a material with the relative dielectric constant $e_r$ of 5 to 6 or greater in at least a portion thereof. However, in the case of a composite film, selecting a combination that results in having an effective relative dielectric constant $e_{reff}$ of 5 to 6 or greater measured for the entire film is used in an exemplary embodiment. Moreover, it may also be an insulating film made from an oxide film of a ternary compound such as a hafnium aluminate (HfAlO) film.

Furthermore, a second interlayer dielectric film 87 is provided on the top electrode 87. And the first meandering line 91 is provided on second interlayer dielectric film 87. As shown in FIG. 10, the contact plug 96*a* is provided, penetrating the first interlayer dielectric film 84, the capacitor insulating film 86 and the second interlayer dielectric film 87 so as to connect between the first meandering line 91 and the drain electrode region 93

In a topology shown in FIGS. 9 and 10, the capacitance C of the R-C delay is implemented by the stray capacitance associated with the first meandering line 91 and the second meandering line 97. Because both R and C are proportional to wire lengths of the first meandering line 91 and the second meandering line 97, the delay times $t_{d1}$, $t_{d2}$ can be easily designed by electing the wire lengths of the first meandering line 91 and the second meandering line 97. Furthermore, we can design the thickness, the cross section, or the resistivity of the first meandering line 91 and the second meandering line 97 to as to achieve desired value of the delay times $t_{d1}$, $t_{d2}$.

For example, because the delay time $t_{d2}$ shall be twice of the delay time $t_{d1}$, the wire length of the second meandering line 97 can be designed as $2^{1/2}$ time of the wire length the first meandering line 91, if we use the same thickness, the same cross section, and the material having the same specific resistively for the first meandering line 91 and the second meandering line 97, and further the same effective thickness and the same effective dielectric constant for the insulating film implementing the stray capacitance for the R-C delay (=R*C). However, if we use different materials for the first meandering line 91 and the second meandering line 97, the wire lengths of the first meandering line 91 and the second meandering line 97 shall be determined depending on the resistivities of the first meandering line 91 and the second meandering line 97 so as to achieve the required values of the delay times $t_{d1}$, $t_{d2}$. For example, in a case that the second meandering line 97 is formed of polycrystalline silicon, and the first meandering line 91 is formed of refractory material such as tungsten (W), molybdenum (Mo), platinum (Pt), having a higher resistivity than the polycrystalline silicon, the wire lengths of the first meandering line 91 and the second meandering line 97 are determined depending on the resistivities of the first meandering line 91 and the second meandering line 97 so as to achieve the required values of the delay times $t_{d1}$, $t_{d2}$.

Furthermore, although the first meandering line 91 and the second meandering line 97 are shown in FIG. 9, the shown meandering topology for resistor R is mere example, and other topologies such as a straight line configuration can be used depending upon the required values of resistor R and capacitance C. In a very high speed operation of the marching main memory 31, the delineation of extrinsic resistor elements R can be omitted, if parasitic resistance (stray resistance) and parasitic capacitance (stray capacitance) can achieve the required delay times $t_{d1}$, $t_{d2}$.

In the configuration shown in FIGS. 4-6, although an isolation between a signal-storage state of the (j−1)-th bit-level cell $M_{ij-1}$ on the i-th row and a signal-storage state of the j-th bit-level cell $M_{ij}$ on the i-th row can be established by a propagation delay accompanying the signal propagation path between the output terminal of the (j−1)-th bit-level cell $M_{ij-1}$ and the gate electrode of the first nMOS transistor $Q_{ij1}$ of the j-th bit-level cell the propagation delay is mainly ascribable to the value of the second delay element $D_{ij2}$, in an exemplary embodiment, an inter-unit cell is inserted between the (j−1)-th bit-level cell $M_{ij-1}$ and the j-th bit-level cell as shown in FIGS. 11 and 13.

Although the inter-unit cell $B_{ij}$ is provided so as to isolate the signal-storage state of the j-th bit-level cell $M_{ij}$ in the j-th memory unit $U_j$ from the signal-storage state of the (j−1)-th bit-level cell $M_{ij-1}$ in the (j−1)-th memory unit $U_{j-1}$, the inter-unit cell $B_{ij}$ transfers a signal from the (j−1)-th bit-level cell $M_{ij-1}$ to the j-th bit-level cell $M_{ij}$ at a required timing determined by a clock signal, which is supplied through the clock signal supply line. Because the j-th memory unit $U_j$ stores information of byte size or word size by the sequence of bit-level cells arrayed in the j-th memory unit $U_j$, and the (j−1)-th memory unit $U_{j-1}$ stores information of byte size or word size by the sequence of bit-level cells arrayed in the (j−1)-th memory unit $U_{j-1}$, a sequence of inter-unit cells arrayed in parallel with the memory units $U_{j-1}$ and $U_j$ transfers the information of byte size or word size, controlled by the clock signal supplied through the clock signal supply line so that the information of byte size or word size can march along a predetermined direction, pari passu. As shown in FIGS. 11 and 13, because the input terminal of the j-th bit-level cell $M_{ij}$ on the i-th row is connected to the inter-unit cell $B_{ij}$, the signal charge stored in the (j−1)-th bit-level cell $M_{ij-1}$ is fed to the second delay element $D_{ij2}$ through the inter-unit cell $B_{ij}$ at the required timing, and the transfer operation of the signal charge is cut off at periods other than the required timing.

In FIGS. 11 and 13, although an example of the inter-unit cell $B_{ij}$, which encompasses a single isolation transistor $Q_{ij3}$ having a first main-electrode connected to the output terminal of the (j−1)-th bit-level cell $M_{ij}$, a second main-electrode connected to the input terminal of the j-th bit-level cell $M_{ij}$ and a control electrode connected to the clock signal supply line, the structure of the inter-unit cell $B_{ij}$ is not limited to the configuration shown in FIGS. 11 and 13. For example, the inter-unit cell $B_{ij}$ may be implemented by a clocked-circuit having a plurality of transistors, which can transfer the signal from the (j−1)-th bit-level cell $M_{ij-1}$ to the j-th bit-level cell $M_{ij}$ at the required timing determined by the clock signal.

Similar to the configuration shown in FIG. 5, the j-th bit-level cell $M_{ij}$ encompasses the first nMOS transistor $Q_{ij1}$ having the drain electrode connected to the clock signal supply line through the first delay element $D_{ij1}$ and the gate electrode connected to the inter-unit cell $B_{ij}$ through the second delay element $D_{ij2}$; the second nMOS transistor $Q_{ij2}$ having the drain electrode connected to the source electrode of the first nMOS transistor $Q_{ij1}$, the gate electrode connected to the clock signal supply line, and the source electrode connected to the ground potential; and the capacitor $C_{ij}$ configured to store the information of the bit-level cell $M_{ij}$, connected in parallel with the second nMOS transistor $Q_{ij2}$.

An example of planar structure of the inter-unit cell $B_{ij}$, encompassing a single isolation transistor $Q_{ij3}$ of nMOS transistor is shown in FIG. 12, in addition to the configuration of the bit-level cell $M_{ij}$, which are already shown in FIG. 9. In the bit-level cell $M_{ij}$, the first nMOS transistor $Q_{ij1}$ having the drain electrode region 93, the first meandering line 91 connected to the drain electrode region 93 via a contact plug 96*a*, the second meandering line 97 implementing the gate electrode of the first nMOS transistor $Q_{ij1}$, and the second nMOS transistor $Q_{ij3}$ having the drain electrode region implemented by the common $n^+$ semiconductor region 94, serving as the output terminal of the bit-level cell $M_{ij}$ are shown.

In FIG. 12, the isolation transistor $Q_{ij3}$ of the inter-unit cell $B_{ij}$ has a first main-electrode region implemented by a left side of an $n^+$ semiconductor region 90, a gate electrode 99 connected to the clock signal supply line, and a second main-electrode region implemented by a right side of the $n^+$ semiconductor region 90. The second main-electrode region is connected to one end of the second meandering line 97 opposite to the other end of the second meandering line 97, which serves as the gate electrode of the first nMOS transistor $Q_{ij1}$ via a contact plug 96*e*, and first main-electrode region is connected to the output terminal of the previous cell $M_{ij-1}$ via a contact plug 96*f*. Although the illustration is omitted, similar to the structure shown in FIG. 10, on an interlayer dielectric film provided on the second meandering line 97, a parallel plate structure of the capacitor $C_{ij}$ configured to store the information of the bit-level cell $M_{ij}$ may be provided, being connected in parallel with the second nMOS transistor $Q_{ij2}$.

In FIG. 13, in addition to the configuration shown in FIG. 11, another inter-unit cell $B_{i(j-1)}$ is provided between the (j−2)-th bit-level cell $M_{i(j-2)}$ and the (j−1)-th bit-level cell $M_{i(j-1)}$, configured to isolate the signal-storage state of the (j−1)-th bit-level cell $M_{i(j-1)}$ in the (j−1)-th memory unit $U_{j-1}$ from the signal-storage state of the (j−2)-th bit-level cell $M_{i(j-2)}$ in the (j−2)-th memory unit $U_{j-2}$, and to transfer a signal from the (j−2)-th bit-level cell $M_{i(j-2)}$ to the (j−1)-th bit-level cell $M_{i(j-1)}$ at the required timing determined by the clock signal, which is supplied through the clock signal supply line. In FIG. 13, because the input terminal of the (j−1)-th bit-level cell $M_{i(j-1)}$ on the i-th row is connected to the inter-unit cell $B_{i(j-1)}$, the signal charge stored in the (j−2)-th bit-level cell $M_{i(j-2)}$ is fed to the second delay element $D_{i(j-1)2}$ through the inter-unit cell $B_{i(j-1)}$ at the required timing, and the transfer operation of the signal charge is cut off thereafter.

In FIG. 13, although an example of the inter-unit cell $B_{i(j-1)}$, which encompasses a single isolation transistor $Q_{i(j-1)3}$ having a first main-electrode connected to the output terminal of the (j−2)-th bit-level cell $M_{i(j-1)}$, a second main-electrode connected to the input terminal of the (j−1)-th bit-level cell $M_{i(j-1)}$ and a control electrode connected to the clock signal supply line, the structure of the inter-unit cell $B_{i(j-1)}$ is not limited to the configuration shown in FIG. 13, and the inter-unit cell $B_{i(j-1)}$ may be implemented by a clocked-circuit having a plurality of transistors, which can transfer the signal from the (j−2)-th bit-level cell $M_{i(j-2)}$ to the (j−1)-th bit-level cell $M_{i(j-1)}$ at the required timing determined by the clock signal.

Similar to the configuration of the j-th bit-level cell $M_{ij}$, the (j−1)-th bit-level cell $M_{i(j-1)}$ encompasses a first nMOS transistor $Q_{i(j-1)1}$ having a drain electrode connected to the clock signal supply line through a first delay element $D_{i(j-1)}$ and a gate electrode connected to the inter-unit cell $B_{i(j-1)}$ through a second delay element $D_{i(j-1)2}$; a second nMOS transistor $Q_{i(j-1)2}$ having a drain electrode connected to the source electrode of the first nMOS transistor $Q_{i(j-1)1}$, a gate electrode connected to the clock signal supply line, and a source electrode connected to the ground potential; and a capacitor $C_{i(j-1)}$ configured to store the information of the bit-level cell $M_{i(j-1)}$, connected in parallel with the second nMOS transistor $Q_{i(j-1)2}$.

In the circuit configuration shown in FIGS. 11 and 13, the second nMOS transistor $Q_{ij2}$ of the bit-level cell $M_{ij}$, serves as a reset-transistor configured to reset the signal charge stored in the capacitor $C_{ij}$, when the clock signal of high-level (or a logical level of "1") is applied to the gate electrode of the second nMOS transistor $Q_{ij2}$, discharging the signal charge already stored in the capacitor $C_{ij}$, and the second nMOS transistor $Q_{i(j-1)2}$ of the bit-level cell $M_{i(j-1)}$ serves as a reset-transistor configured to reset the signal charge stored in the capacitor $C_{i(j-1)}$, when the clock signal of high-level (or a logical level of "1") is applied to the gate electrode of the second nMOS transistor $Q_{i(j-1)2}$, discharging the signal charge already stored in the capacitor $C_{i(j-1)}$. Therefore, the isolation transistors $Q_{i(j-1)3}$ and $Q_{ij3}$ may be pMOS transistors, which can operate complementary with the second nMOS transistors $Q_{i(j-1)2}$ and $Q_{ij2}$, although FIGS. 11 and 13 represent the transistor symbol of an nMOS transistor as the isolation transistors $Q_{i(j-1)3}$ and $Q_{ij3}$. That is, when the second nMOS transistors $Q_{i(j-1)2}$ and $Q_{ij2}$ are conductive state for discharging the signal charge stored in the capacitors $C_{i(j-1)}$ and $C_{ij}$, the isolation transistors $Q_{i(j-1)3}$ and $Q_{ij3}$ shall be cut-off state so as to establish the isolation between the memory units, and when the second nMOS transistors $Q_{i(j-1)2}$ and $Q_{ij2}$ are cut-off state, the isolation transistors $Q_{i(j-1)3}$ and $Q_{ij3}$ shall be conductive state so as to transfer the signal charges between the memory units.

Alternatively, if the isolation transistors $Q_{i(j-1)3}$ and $Q_{ij3}$ are nMOS transistors, as the transistor symbol shows in FIGS. 11 and 13, the isolation transistors $Q_{i(j-1)3}$ and $Q_{ij3}$ shall be high-speed transistors having a shorter rise time, a shorter period of conductive state, and a shorter fall time than the second nMOS transistors $Q_{i(j-1)2}$ and $Q_{ij2}$, which have larger stray capacitances and larger stray resistances associated with gate circuits and gate structures so that, when the second nMOS transistors $Q_{i(j-1)2}$ and $Q_{ij2}$ are still in the cut-off state, the isolation transistors $Q_{i(j-1)3}$ and $Q_{ij3}$ becomes the conductive state very rapidly so as to transfer the signal charges between the memory units, and when the second nMOS transistors $Q_{i(j-1)2}$ and $Q_{ij2}$ start slowly toward the conductive state for discharging the signal charge stored in the capacitors $C_{i(j-1)}$ and $C_{ij}$, the isolation transistors $Q_{i(j-1)3}$ and $Q_{ij3}$ proceeds to become the cut-off state very rapidly so as to establish the isolation between the memory units. As a candidate for such high-speed transistors, a normally off type MOS static induction transistor (SIT) can be used, which represents triode-like I-V characteristic. N-channel MOSFET can be considered as an extreme ultimate structure of the short channel nMOSFET. Owing to the triode-like I-V characteristic, because the on-state of the MOSSIT depends both on a gate voltage and a potential deference between the first and second main-electrodes, a very short time interval of the on-state can be achieved. Instead of the MOSSIT, any normally off type switching devices such as a tunneling SIT, which represent a very short on-state period like Dirac delta function, can be used.

FIG. 14(*a*) shows a timing diagram of a response of the bit-level cell $M_{i(j-1)}$ shown in FIG. 13, and FIG. 14(*b*) shows a next timing diagram of a next response of the next bit-level cell $M_{ij}$ shown in FIG. 13, to a waveform of a clock signal. In FIGS. 14(*a*) and (*b*), the clock signal is supposed to swing periodically between the logical levels of "1" and "0" with the clock period TAU(Greek-letter) clock, and the shaded rectangular area with backward diagonals shows a regime for a reset timing of the signal charges stored in the capacitors $C_{i(j-1)}$ and $C_{ij}$, respectively, and further, the shaded rectangular area with forward diagonals shows a regime for a charge-transfer timing of the signal charges to the capacitors $C_{i(j-1)}$ and $C_{ij}$, respectively.

As shown in FIG. 14(*a*), if the signal charges stored in the capacitor $C_{i(j-1)}$ is of the logical level of "1", although the first nMOS transistor $Q_{i(j-1)1}$ still keeps off-sate, the signal charge stored in the capacitor $C_{i(j-1)}$ is being driven to be discharging, in the shaded rectangular area with backward diagonals. After the capacitor $C_{i(j-1)}$ begins discharging, in the shaded rectangular area with forward diagonals, the first nMOS transistor $Q_{i(j-1)1}$ becomes active as a transfer-transistor, delayed by a predetermined delay time $t_{d1}$ determined by the first delay element $D_{i(j-1)1}$ implemented by the R-C delay circuit. When the signal stored in a previous bit-level cell $M_{i(j-2)}$ is fed through the inter-unit cell $B_{i(j-1)}$ to the gate electrode of the first nMOS transistor $Q_{i(j-1)1}$, the first nMOS transistor $Q_{i(j-1)1}$ transfers the signal stored in the previous bit-level cell $M_{i(j-2)}$, further delayed by a predetermined delay time $t_{d2}$ determined by the second delay element $D_{i(j-1)2}$ to the capacitor $C_{i(j-1)}$ in the shaded rectangular area with forward diagonals.

Similarly, as shown in FIG. 14(*b*), if the signal charges stored in the capacitor is of the logical level of "1", although the first nMOS transistor $Q_{ij1}$ still keeps off-sate, the signal charge stored in the capacitor $C_{ij}$ is being driven to be discharging, in the shaded rectangular area with backward diagonals. After the capacitor $C_{ij}$ begins discharging, in the shaded rectangular area with forward diagonals, the first nMOS transistor $Q_{ij1}$ becomes active as a transfer-transistor, delayed by a predetermined delay time $t_{d1}$ determined by the first delay element $D_{ij1}$ implemented by the R-C delay circuit. When the signal stored in a previous bit-level cell $M_{i(j-1)}$ is fed through the inter-unit cell $B_{ij}$ to the gate electrode of the first nMOS transistor $Q_{ij1}$, the first nMOS transistor $Q_{ij1}$ transfers the signal stored in the previous bit-level cell $M_{i(j-1)}$, further delayed by a predetermined delay time $t_{d2}$ determined by the second delay element $D_{ij2}$ to the capacitor $C_{ij}$ in the shaded rectangular area with forward diagonals FIG. 15 shows a more detailed response of the bit-level cell $M_{i(j-1)}$ shown in FIG. 13 to the waveform of the clock signal shown by thin solid line, for a case that both of the first delay element $D_{i(j-1)1}$ and the second delay element $D_{i(j-1)2}$ are implemented by R-C delay circuit, as shown in FIG. 12. The clock signal shown by thin solid line swings periodically between the logical levels of "1" and "0" with the clock period $TAU_{clock}$. In FIG. 15, time interval $TAU_1=TAU_2=TAU_3=TAU_4$ is defined to be a quarter of the clock period $TAU_{clock}$ ($=TAU_{clock}/4$).

In a normal operation of the marching memory, the signal charge stored in the capacitor $C_{i(j-1)}$ is actually either of the logical level of "0" or"1", as shown in FIGS. 16(*a*)-(*d*). If the signal charge stored in the capacitor $C_{i(j-1)}$ is of the logical level of "1", as shown in FIGS. 16(*c*) and (*d*), although the first nMOS transistor $Q_{i(j-1)1}$ still keeps off-sate, the capacitor $C_{i(j-1)}$ can begin discharging at the beginning of the time interval $TAU_1$, because the second nMOS transistor $Q_{i(j-1)2}$ becomes active when the clock signal of the high-level is applied to the gate electrode of the second nMOS transistor $Q_{i(j-1)2}$, under the assumption that an ideal operation of the second nMOS transistor $Q_{i(j-1)2}$ with no delay can be approximated. Therefore, if the signal charge stored in the capacitor $C_{i(j-1)}$ is actually of the logical level of "1", after the clock signal of high-level has been applied to the gate electrode of the second nMOS transistor $Q_{i(j-1)2}$, as shown by the thin solid line in FIG. 15, and the signal charge stored in the capacitor $C_{i(j-1)}$ will be discharged, and thereafter, the first nMOS transistor $Q_{i(j-1)1}$ becomes active as a transfer-transistor, delayed by a predetermined delay time to determined by the first delay element $D_{i(j-1)1}$ implemented by the R-C delay circuit. In FIG. 15, the change of the potential at the drain electrode of the first nMOS transistor $Q_{i(j-1)1}$ is shown by dash-dotted line.

As shown by a thick solid line in FIG. 15, when the signal level of "1" stored in a previous bit-level cell $M_{i(j-2)}$ is fed from the previous bit-level cell $M_{i(j-2)}$ on the i-th row through the inter-unit cell $B_{i(j-1)}$ to the gate electrode of the first nMOS transistor $Q_{i(j-1)1}$, the first nMOS transistor $Q_{i(j-1)1}$ transfers the signal level of "1" stored in the previous bit-level cell $M_{i(j-2)}$, further delayed by a predetermined delay time $t_{d2}$ determined by the second delay element $D_{i(j-1)2}$ to the capacitor $C_{i(j-1)}$. Alternatively, as shown by a broken line in FIG. 15, when the signal level of "0" stored in a previous bit-level cell $M_{i(j-2)}$ is fed from the previous bit-level cell $M_{i(j-2)}$ to the gate electrode of the first nMOS transistor $Q_{i(j-1)1}$, the first nMOS transistor $Q_{i(j-1)1}$ transfers the signal level of "0" stored in the previous bit-level cell $M_{i(j-2)}$, further delayed by the predetermined delay time $t_{d2}$ to the capacitor $C_{i(j-1)}$. An output node $N_{out}$ connecting the source electrode of the first nMOS transistor $Q_{i(j-1)1}$ and the drain electrode of the second nMOS transistor $Q_{i(j-1)2}$ serves as an output terminal of the bit-level cell $M_{i(j-1)}$, and the output terminal delivers the signal stored in the capacitor $C_{i(j-1)}$ to the next bit-level cell on the i-th row.

As shown by the thin solid line in FIG. 15, when the clock signal becomes the logical level of "1", the second nMOS transistor $Q_{i(j-1)2}$ begins to discharge the signal charge, which is already stored in the capacitor $C_{i(j-1)}$ at a previous clock cycle. After the clock signal of the logical level of "1" is applied and the signal charge stored in the capacitor $C_{i(j-1)}$ is completely discharged to the potential of the logical level of "0", the first nMOS transistor $Q_{i(j-1)1}$ becomes active as the transfer-transistor, delayed by the predetermined delay time $t_{d1}$ determined by the first delay element $D_{i(j-1)1}$. The delay time to is set to be equal to ¼$TAU_{clock}$=$TAU_1$ in an exemplary embodiment.

When the signal stored in the previous bit-level cell $M_{i(j-2)}$ is fed from the previous bit-level cell $M_{i(j-2)}$ to the gate electrode of the first nMOS transistor $Q_{i(j-1)1}$ through the inter-unit cell $B_{i(j-1)}$, as shown by thick solid line and broken line, the first nMOS transistor $Q_{i(j-1)1}$ transfers the signal stored in the previous bit-level cell $M_{i(j-2)}$, further delayed by the predetermined delay time $t_{d2}$ determined by the second delay element $D_{i(j-1)2}$ implemented by the R-C delay circuit to the capacitor $C_{i(j-1)}$.

For example, if the logical level of "1" stored in the previous bit-level cell $M_{i(j-2)}$ is fed from the previous bit-level cell $M_{i(j-2)}$ to the gate electrode of the first nMOS transistor $Q_{i(j-1)1}$ as shown by the thick solid line, the first nMOS transistor $Q_{i(j-1)1}$ becomes conductive state at the beginning of the time interval$TAU_3$, and the logical level of "1" is stored in the capacitor $C_{i(j-1)}$. On the other hand, if the logical level of "0" stored in the previous bit-level cell $M_{i(j-2)}$ is fed from the previous bit-level cell $M_{i(j-1)2}$ to the gate electrode of the first nMOS transistor $Q_{i(j-1)1}$ as shown by the broken line, the first nMOS transistor $Q_{i(j-1)1}$ keeps the cut-off state, and the logical level of "0" is maintained in the capacitor $C_{i(j-1)}$. Therefore, the bit-level cell $M_{i(j-1)}$ can establish "a marching AND-gate" operation. The delay time $t_{d2}$ is longer than the delay time to, and the delay time $t_{d2}$ is set to be equal to ½$TAU_{clock}$ in an exemplary embodiment.

Since the clock signal swings periodically between the logical levels of "1" and "0", with the clock period $TAU_{clock}$, as shown by the thin solid line, then the clock signal becomes the logical level of "0" as time proceeds by ½$TAU_{clock}$, or at the beginning of the time interval $TAU_3$, the potential at the drain electrode of the first nMOS transistor $Q_{i(j-1)1}$ begins to decay as shown by the dash-dotted line. If the inter-unit cell $B_{ij}$, inserted between the current bit-level cell $M_{i(j-1)}$ and the next bit-level cell $M_{ij}$, is implemented by an nMOS transistor, the path between the output terminal of the current bit-level cell $M_{i(j-1)}$ and the gate electrode of the first nMOS transistor $Q_{ij1}$ of the next bit-level cell $M_{ij}$, becomes the cut-off state by the logical level of "0" of the clock signal being applied to the gate electrode of the nMOS transistor, and therefore, the output node $N_{out}$ connecting the source electrode of the first nMOS transistor $Q_{i(j-1)1}$ and the drain electrode of the second nMOS transistor $Q_{i(j-1)2}$ cannot deliver the signal transferred from the previous bit-level cell $M_{i(j-2)}$ further to the next bit-level cell $M_{ij}$ like duckpins in the time intervals$TAU_3$ and $TAU_4$, and the signal is blocked to be domino transferred to the gate electrode of the next first nMOS transistor $Q_{ij1}$. Since the first nMOS transistor $Q_{i(j-1)1}$ becomes the cut-off state in the time intervals $TAU_3$ and $TAU_4$, the potential at the output node $N_{out}$ is kept in a floating state, and the signal states stored in the capacitor $C_{i(j-1)}$ are held.

When the clock signal becomes the logical level of "1" again, as shown by the thin solid line in a next column of FIG. 15, the output node $N_{out}$ connecting the source electrode of the first nMOS transistor $Q_{i(j-1)1}$ and the drain electrode of the second nMOS transistor $Q_{i(j-1)2}$, which is serving as the output terminal of the bit-level cell $M_{i(j-1)}$, can deliver the signal stored in the capacitor $C_{i(j-1)}$ to the next bit-level cell $M_{ij}$ at the next clock cycle because the inter-unit cell $B_{ij}$ becomes conductive state, and the potential at the drain electrode of the first nMOS transistor $Q_{i(j-1)1}$ increase as shown by the dash-dotted line.

FIGS. 16(*a*)-(*d*) show four modes of signal-transferring operations, respectively, focusing to the bit-level cell $M_{ij}$ shown in FIGS. 11 and 13, the bit-level cell $M_{ij}$ is one of the bit-level cells arrayed sequentially in the j-th memory unit $U_j$, the j-th memory unit $U_j$ stores information of byte size or word size by the sequence of bit-level cells arrayed sequentially in the j-th memory unit $U_j$. In the exemplary computer system, the information of byte size or word size arrayed sequentially marches side by side from a previous memory unit to a next memory unit, pari passu. In FIGS. 16(*a*)-(*d*), the clock signal is supplied by the clock signal supply line CLOCK so as to swing periodically between the logical levels of "1" and "0" with the clock period $TAU_{clock}$, while the clock signal supply line CLOCK serves as a power supply line.

FIGS. 16(*a*) and (*b*) show when the logical level of "0" is stored by previous clock signal into the capacitor $C_{ij}$, and FIGS. 16(*c*) and (*d*) show when the logical level of "1" is stored by previous clock signal into the capacitor $C_{ij}$ as one of the signal in the information of byte size or word size. As shown in FIG. 16(*a*), in a case when the signal charge previously stored in the capacitor $C_{ij}$ is of the logical level of "0", if the signal of the logical level of "0", which is stored in a previous bit-level cell $M_{i(j-1)}$, as one of the signal in the information of byte size or word size to be transferred in a cooperative way, is fed from the previous bit-level cell $M_{i(j-1)}$ through the inter-unit cell $B_{ij}$ (the illustration is omitted) to the gate electrode of the first nMOS transistor $Q_{ij1}$, in the timing the signal charge stored in the capacitor $C_{ij}$ keeping the logical level of "0", because the first nMOS transistor $Q_{ij1}$ keeps off-state, the output node $N_{out}$ connecting the source electrode of the first nMOS transistor $Q_{ij1}$ and the drain electrode of the second nMOS transistor $Q_{ij2}$ delivers the signal level of "0", which is maintained in the capacitor $C_{ij}$, to the next bit-level cell on the i-th row, so as to execute marching AND-gate operation of 0+1=0 with an input signal of "1" provided by the clock signal.

Similarly, as shown in FIG. 16(*b*), in a case when the signal charge previously stored in the capacitor $C_{ij}$ is of the logical level of "0", if the signal of the logical level of "1" stored in a previous bit-level cell $M_{i(j-1)}$ is fed from the previous bit-level cell $M_{i(j-1)}$ through the inter-unit cell $B_{ij}$ to the gate electrode of the first nMOS transistor $Q_{ij1}$, in the timing the signal charge stored in the capacitor $C_{ij}$ keeps the logical level of "0", the first nMOS transistor $Q_{ij1}$ begins turning-on for transferring the signal of the logical level of "1" stored in the previous bit-level cell $M_{i(j-1)}$ to the capacitor $C_{ij}$ so that the logical level of "1" can be stored in the capacitor $C_{ij}$, and the output node $N_{out}$ delivers the signal level of "1" stored in the capacitor $C_{ij}$ to the next bit-level cell on the i-th row, so as to execute marching AND-gate operation 1+1=1 with an input signal of "1" provided by the clock signal.

On the contrary, as shown in FIG. 16(*c*), when the signal charge previously stored in the capacitor $C_{ij}$ is of the logical level of "1", if the signal of the logical level of "0", which is stored in a previous bit-level cell $M_{i(j-1)}$, is fed from the previous bit-level cell $M_{i(j-1)}$ through the inter-unit cell $B_{ij}$ to the gate electrode of the first nMOS transistor $Q_{ij1}$, after the timing when the signal charge stored in the capacitor $C_{ij}$ is completely discharged to establish the logical level of "0", because the first nMOS transistor $Q_{ij1}$ keeps off-state, the output node $N_{out}$ delivers the signal level of "0" stored in the capacitor $C_{ij}$ to the next bit-level cell on the i-th row, so as to execute marching AND-gate operation of 0+1=0 with an input signal of "1" provided by the clock signal.

Similarly, as shown in FIG. 16(*d*), when the signal charge previously stored in the capacitor $C_{ij}$ is of the logical level of "1", if the signal of the logical level of "1" stored in a previous bit-level cell $M_{i(j-1)}$ is fed from the previous bit-level cell $M_{i(j-1)}$ through the inter-unit cell $B_{ij}$ to the gate electrode of the first nMOS transistor $Q_{ij1}$, after the timing when the signal charge stored in the capacitor $C_{ij}$ is completely discharged to establish the logical level of "0", the first nMOS transistor $Q_{ij1}$ begins turning-on for transferring the signal of the logical level of "1" stored in the previous bit-level cell $M_{i(j-1)}$ to the capacitor $C_{ij}$ so that the logical level of "1" can be stored in the capacitor $C_{ij}$, and the output node $N_{out}$ delivers the signal level of "1" stored in the capacitor $C_{ij}$ to the next bit-level cell on the i-th row, so as to execute marching AND-gate operation 1+1=1 with an input signal of "1" provided by the clock signal.

Similar to the configuration shown in FIG. 11, although an inter-unit cell $B_{ij}$ is inserted between the (j−1)-th bit-level cell $M_{ij-1}$ and the j-th bit-level cell $M_{ij}$, and the j-th bit-level cell $M_{ij}$ encompasses the first nMOS transistor $Q_{ij1}$ having the drain electrode connected to the clock signal supply line through the first delay element $D_{ij1}$ and the gate electrode connected to the inter-unit cell $B_{ij}$ through the second delay element $D_{ij2}$; the second nMOS transistor $Q_{ij2}$ having the drain electrode connected to the source electrode of the first nMOS transistor $Q_{ij1}$, the gate electrode connected to the clock signal supply line, and the source electrode connected to the ground potential; and the capacitor $C_{ij}$ configured to store the information of the bit-level cell $M_{ij}$, connected in parallel with the second nMOS transistor $Q_{ij2}$, the features such that the first delay element $D_{ij1}$ is implemented by a first diode $D_{1a}$, and the second delay element $D_{ij2}$ is implemented by a tandem connection of a second diode $D_{2a}$ and a third diode $D_{3a}$ is distinguishable from the configuration shown in FIG. 11.

Although any p-n junction diode can be represented by an equivalent circuit encompassing resistors, including the series resistance such as the diffusion resistance, the lead resistance, the ohmic contact resistance and the spreading resistance, etc., and capacitors including the diode capacitance such as the junction capacitance or the diffusion capacitance, and a single diode or a tandem connection of diodes can serve as "resistive-capacitive delay" or "R-C delay", because the value of "R-C delay" can be made much smaller than the values achieved by the specialized and dedicated R-C elements, such as the first meandering line 91 and the second meandering line 97 shown in FIGS. 9 and 12, the operation of the j-th bit-level cell $M_{ij}$ with the inter-unit cell $B_{ij}$ shown in FIG. 17 can achieve a higher level of operation than the operation achieved by the configuration shown in FIG. 12. That is, the operation of the j-th bit-level cell $M_{ij}$ with the inter-unit cell $B_{ij}$ shown in FIG. 17 can approach an ideal delay performance shown in FIGS. 7A and 7B, in which any rise time and fall time are not shown, and wave forms of the pulses are shown by ideal rectangular shape. In addition to the performance by the configuration shown in FIGS. 11 and 12, because the tandem connection of the second diode $D_{2a}$ and the third diode $D_{3a}$ can block efficiently the flow of the reverse-directional current, the configuration implemented by a combination of the j-th bit-level cell $M_{ij}$ with the inter-unit cell $B_{ij}$ shown in FIG. 17 can achieve a better isolation between the signal-storage state of the (j−1)-th bit-level cell $M_{i(j-1)}$ and the signal-storage state of the j-th bit-level cell $M_{ij}$, even if the signal of the lower logical level of "0" stored in the previous bit-level cell $M_{i(j-1)}$ is fed to the gate electrode of the first nMOS transistor $Q_{ij1}$ through the inter-unit cell $B_{ij}$.

In FIG. 18, in addition to the configuration shown in FIG. 17, another inter-unit cell $B_{i(j-1)}$ is provided between the (j−2)-th bit-level cell $M_{i(j-2)}$ and the (j−1)-th bit-level cell $M_{i(j-1)}$, configured to isolate the signal-storage state of the (j−1)-th bit-level cell $M_{i(j-1)}$ in the (j−1)-th memory unit $U_{j-1}$ from the signal-storage state of the (j−2)-th bit-level cell $M_{i(j-2)}$ in the (j−2)-th memory unit $U_{j-2}$, and to transfer a signal from the (j−2)-th bit-level cell $M_{i(j-2)}$ to the (j−1)-th bit-level cell $M_{i(j-1)}$ at the required timing determined by the clock signal, which is supplied through the clock signal supply line. In FIG. 18, because the input terminal of the (j−1)-th bit-level cell $M_{i(j-1)}$ is connected to the inter-unit cell $B_{i(j-1)}$, the signal charge stored in the (j−2)-th bit-level cell $M_{i(j-2)}$ is fed to the second delay element $D_{i(j-1)2}$ through the inter-unit cell $B_{i(j-1)}$ at the required timing, and the transfer of the signal charge is cut off thereafter.

Similar to the configuration of the j-th bit-level cell $M_{ij}$, the (j−1)-th bit-level cell $M_{i(j-1)}$ encompasses a first nMOS transistor $Q_{i(j-1)1}$ having a drain electrode connected to the clock signal supply line through a first delay element $D_{i(j-1)1}$ and a gate electrode connected to the inter-unit cell $B_{i(j-1)}$ through a second delay element $D_{i(j-1)2}$; a second nMOS transistor $Q_{i(j-1)2}$ having a drain electrode connected to the source electrode of the first nMOS transistor $Q_{i(j-1)1}$, a gate electrode connected to the clock signal supply line, and a source electrode connected to the ground potential; and a capacitor $C_{i(j-1)}$ configured to store the information of the bit-level cell $M_{i(j-1)}$, connected in parallel with the second nMOS transistor $Q_{i(j-1)2}$. Here, the first delay element $D_{i(i-1)1}$ is implemented by a first diode $D_{1b}$, and the second delay element $D_{i(i-1)2}$ is implemented by a tandem connection of a second diode $D_{2b}$ and a third diode $D_{3b}$.

As explained above, because a single diode or a tandem connection of diodes can serve as "resistive-capacitive delay" or "R-C delay", the operation of the (j−1)-th bit-level cell $M_{i(j-1)}$ with the inter-unit cell $B_{i(j-1)}$ shown in FIG. 18 is substantially same as the operation shown in FIG. 13. In addition to the performance by the configuration shown in FIG. 13, because the tandem connection of the second diode $D_{2b}$ and the third diode $D_{3b}$ can block efficiently the flow of the reverse-directional current, the configuration implemented by a combination of the (j−1)-th bit-level cell $M_{i(j-1)}$ with the inter-unit cell $B_{i(j-1)}$ shown in FIG. 18 can achieve a better isolation between the signal-storage state of the (j−2)-th bit-level cell $M_{i(j-2)}$ and the signal-storage state of the (j−1)-th bit-level cell $M_{i(j-1)}$, even if the signal of the lower logical level of "0" stored in the previous bit-level cell $M_{i(j-2)}$ is fed to the gate electrode of the first nMOS transistor $Q_{i(j-1)1}$ through the inter-unit cell $B_{i(j-1)}$.

In actual semiconductor devices, because many parasitic resistances (stray resistances) and many parasitic capacitances (stray capacitances) associated with wirings, gate structures, electrode structures, and junction structures are inherent, in a very high speed operation of the marching main memory, the delineation of extrinsic resistor elements and capacitor elements can be omitted, if the parasitic resistances and the parasitic capacitances can achieve the required delay times $t_{d1}$, $t_{d2}$ compared with operation speed of the marching main memory. Therefore, in the configuration shown in FIGS. 11-13 and 16, the first delay elements $D_{i(j-1)1}$ and $D_{ij1}$ can be omitted, as shown in FIGS. 19, 20 and 22.

In another exemplary embodiment of the bit-level cells shown in FIG. 19, although the j-th bit-level cell $M_{ij}$ encompasses a first nMOS transistor $Q_{ij1}$, similar to the configuration shown in FIG. 11, the first nMOS transistor $Q_{ij1}$ has a drain electrode directly connected to the clock signal supply line, and the first delay element $D_{ij1}$ employed in the configuration shown in FIG. 11 is omitted. The feature that the first nMOS transistor $Q_{ij1}$ has a gate electrode connected to the inter-unit cell $B_{ij}$ through a signal-delay element $D_{ij}$, which corresponds to the second delay element $D_{ij2}$ shown in FIG. 11, and the second nMOS transistor $Q_{ij2}$ has a drain electrode connected to a source electrode of the first nMOS transistor $Q_{ij1}$, a gate electrode connected to the clock signal supply line, and a source electrode connected to the ground potential, and a capacitor $C_{ij}$ configured to store the information of the bit-level cell $M_{ij}$, connected in parallel with the second nMOS transistor $Q_{ij2}$ is substantially same as the configuration shown in FIG. 11.

In another exemplary embodiment of the bit-level cell shown in FIG. 19, similar to the configuration shown in FIGS. 11-13 and 16, the inter-unit cell $B_{ij}$ is further provided so as to isolate the signal-storage state of the j-th bit-level cell $M_{ij}$ in the j-th memory unit $U_j$ from the signal-storage state of the (j−1)-th bit-level cell $M_{ij-1}$ in the (j−1)-th memory unit $U_{j-1}$. Furthermore, the inter-unit cell $B_{ij}$ transfers a signal from the (j−1)-th bit-level cell $M_{ij-1}$ to the j-th bit-level cell $M_{ij}$ at a required timing determined by a clock signal, which is supplied through the clock signal supply line. Since the j-th memory unit $U_j$ stores information of byte size or word size by the sequence of bit-level cells arrayed in the j-th memory unit $U_j$, and the (j−1)-th memory unit $U_{j-1}$ stores information of byte size or word size by the sequence of bit-level cells arrayed in the (j−1)-th memory unit $U_{j-1}$, a sequence of inter-unit cells arrayed in parallel with the memory units $U_{j-1}$ and $U_j$ transfers the information of byte size or word size, controlled by the clock signal supplied through the clock signal supply line so that the information of byte size or word size can march along a predetermined direction, pari passu.

As shown in FIG. 19, the input terminal of the j-th bit-level cell $M_{ij}$ on the i-th row is connected to the inter-unit cell $B_{ij}$, the signal charge stored in the (j−1)-th bit-level cell $M_{ij-1}$ is fed to the signal-delay element $D_{ij}$ through the inter-unit cell $B_{ij}$ at the required timing, and the transfer operation of the signal charge is cut off at periods other than the required timing.

In FIG. 20, in addition to the configuration shown in FIG. 19, another inter-unit cell $B_{i(j-1)}$ is provided between the (j−2)-th bit-level cell $M_{i(j-2)}$ and the (j−1)-th bit-level cell $M_{i(j-1)}$, configured to isolate the signal-storage state of the (j−1)-th bit-level cell $M_{i(j-1)}$ in the (j−1)-th memory unit $U_{j-1}$ from the signal-storage state of the (j−2)-th bit-level cell $M_{i(j-2)}$ in the (j−2)-th memory unit $U_{j-2}$, and to transfer a signal from the (j−2)-th bit-level cell $M_{i(j-2)}$ to the (j−1)-th bit-level cell $M_{i(j-1)}$ at the required timing determined by the clock signal, which is supplied through the clock signal supply line. In FIG. 20, because the input terminal of the (j−1)-th bit-level cell $M_{i(j-1)}$ on the i-th row is connected to the inter-unit cell $B_{i(j-1)}$, the signal charge stored in the (j−2)-th bit-level cell $M_{i(j-2)}$ is fed to the signal-delay element $D_{i(j-1)}$ through the inter-unit cell $B_{i(j-1)}$ at the required timing, and the transfer operation of the signal charge is cut off thereafter.

Similar to the configuration of the j-th bit-level cell $M_{ij}$, the (j−1)-th bit-level cell $M_{i(j-1)}$ encompasses a first nMOS transistor $Q_{i(j-1)1}$ having a drain electrode directly connected to the clock signal supply line and a gate electrode connected to the inter-unit cell $B_{i(j-1)}$ through a signal-delay element $D_{i(j-1)}$; a second nMOS transistor $Q_{i(j-1)2}$ having a drain electrode connected to the source electrode of the first nMOS transistor $Q_{i(j-1)1}$, a gate electrode connected to the clock signal supply line, and a source electrode connected to the ground potential; and a capacitor $C_{i(j-1)}$ configured to store the information of the bit-level cell $M_{i(j-1)}$, connected in parallel with the second nMOS transistor $Q_{i(j-1)2}$.

In the circuit configuration, as one of other examples of the bit-level cells pertaining to the exemplary embodiment, shown in FIGS. 19 and 20, the second nMOS transistor $Q_{ij2}$ of the bit-level cell $M_{ij}$, serves as a reset-transistor configured to reset the signal charge stored in the capacitor $C_{ij}$, when the clock signal of high-level (or a logical level of "1") is applied to the gate electrode of the second nMOS transistor $Q_{ij2}$, discharging the signal charge already stored in the capacitor $C_{ij}$, and the second nMOS transistor $Q_{i(j-1)2}$ of the bit-level cell $M_{i(j-1)}$ serves as a reset-transistor configured to reset the signal charge stored in the capacitor $C_{i(j-1)}$, when the clock signal of high-level (or a logical level of "1") is applied to the gate electrode of the second nMOS transistor $Q_{i(j-1)2}$, discharging the signal charge already stored in the capacitor $C_{i(j-1)}$.

In FIGS. 19 and 20, the isolation transistors $Q_{i(j-1)3}$ and $Q_{ij3}$ are high-speed transistors having a shorter rise time, a shorter period of conductive state, and a shorter fall time than the second nMOS transistors $Q_{i(j-1)2}$ and $Q_{ij2}$, which have larger stray capacitances and larger stray resistances associated with gate circuits and gate structures so that, when the second nMOS transistors $Q_{i(j-1)2}$ and $Q_{ij2}$ are still in the cut-off state, the isolation transistors $Q_{i(j-1)3}$ and $Q_{ij3}$ becomes the conductive state very rapidly so as to transfer the signal charges between the memory units, and when the second nMOS transistors $Q_{i(j-1)2}$ and $Q_{ij2}$ start slowly toward the conductive state for discharging the signal charge stored in the capacitors $C_{i(j-1)}$ and $C_{ij}$, the isolation transistors $Q_{i(j-1)3}$ and $Q_{ij3}$ proceeds to become the cut-off state very rapidly so as to establish the isolation between the memory units.

FIG. 21 shows a detailed response of the bit-level cell $M_{i(j-1)}$ shown in FIG. 20, which is one of other examples of the bit-level cells used in the computer system pertaining to the exemplary embodiment of the present invention, to the waveform of the clock signal shown by thin solid line, for a case that the signal-delay element $D_{i(j-1)}$ is implemented by R-C delay circuit. The clock signal shown by thin solid line swings periodically between the logical levels of "1" and "0" with the clock period $TAU_{clock}$. In FIG. 21, time intervalTAU$_1$=TAU$_2$=TAU$_3$=TAU$_4$ is defined to be a quarter of the clock period $TAU_{clock}$ (=$TAU_{clock}$/4).

In a normal operation of the marching memory, the signal charge stored in the capacitor $C_{i(j-1)}$ is actually either of the logical level of "0" or"1", as shown in FIGS. 22(*a*)-(*d*). If the signal charge stored in the capacitor $C_{i(j-1)}$ is of the logical level of "1", as shown in FIGS. 22(*c*) and (*d*), although the first nMOS transistor $Q_{i(j-1)1}$ still keeps off-sate because the potential of the gate electrode of the first nMOS transistor $Q_{i(j-1)1}$ is delayed by the signal-delay element $D_{i(j-1)}$, the capacitor $C_{i(j-1)}$ can begin discharging at the beginning of the time intervalTAU$_1$, because the second nMOS transistor $Q_{i(j-1)2}$ becomes active rapidly when the clock signal of the high-level is applied to the gate electrode of the second nMOS transistor $Q_{i(j-1)2}$, under the assumption that an ideal operation of the second nMOS transistor $Q_{i(j-1)2}$ with no delay can be approximated. Therefore, if the signal charge stored in the capacitor $C_{i(j-1)}$ is actually of the logical level of "1", after the clock signal of high-level has been applied to the gate electrode of the second nMOS transistor $Q_{i(j-1)2}$, as shown by the thin solid line in FIG. 21, and the signal charge stored in the capacitor $C_{i(j-1)}$ will be discharged to the logical level of "0", and at the same time approximately, the first nMOS transistor $Q_{i(j-1)1}$ is prepared to be active as a transfer-transistor, delayed by a negligibly-short delay time determined by parasitic elements implemented by stray resistance and stray capacitance. In FIG. 21, the change of the potential at the drain electrode of the first nMOS transistor $Q_{i(j-1)1}$ is shown exaggeratingly by dash-dotted line.

As shown by a thick solid line in FIG. 21, when the signal level of "1" stored in a previous bit-level cell $M_{i(j-2)}$ is fed from the previous bit-level cell $M_{i(j-2)}$ through the inter-unit cell $B_{i(j-1)}$ to the gate electrode of the first nMOS transistor $Q_{i(j-1)1}$, the first nMOS transistor $Q_{i(j-1)1}$ turns on, and the first nMOS transistor $Q_{i(j-1)1}$ transfers the signal level of "1" stored in the previous bit-level cell $M_{i(j-2)}$, delayed by a predetermined delay time $t_{d2}$ determined by the signal-delay element $D_{i(j-1)}$ to the capacitor $C_{i(j-1)}$. Alternatively, as shown by a broken line in FIG. 21, when the signal level of "0" stored in a previous bit-level cell $M_{i(j-2)}$ is fed from the previous bit-level cell $M_{i(j-2)}$ to the gate electrode of the first nMOS transistor $Q_{i(j-1)1}$, the first nMOS transistor $Q_{i(j-1)1}$ keeps off-state. At this instant of time, since the capacitor $C_{i(j-1)}$ still keeps the logical level of "0", the first nMOS transistor $Q_{i(j-1)1}$ transfers equivalently the signal level of "0" stored in the previous bit-level cell $M_{i(j-2)}$. An output node $N_{out}$ serving as an output terminal of the bit-level cell $M_{i(j-1)}$ delivers the signal stored in the capacitor $C_{i(j-1)}$ to the next bit-level cell on the i-th row.

Since the clock signal swings periodically between the logical levels of "1" and "0", with the clock period $TAU_{clock}$ as shown by the thin solid line, the clock signal becomes the logical level of "0" as time proceeds by ½$TAU_{clock}$, or at the beginning of the time intervalTAU$_3$, the potential at the drain electrode of the first nMOS transistor $Q_{i(j-1)1}$ begins to decay rapidly as shown exaggeratingly by the dash-dotted line. If the inter-unit cell $B_{ij}$, inserted between the current bit-level cell $M_{i(j-1)}$ and the next bit-level cell $M_{ij}$, is implemented by an nMOS transistor, the path between the output terminal of the current bit-level cell $M_{i(j-1)}$ and the gate electrode of the first nMOS transistor $Q_{ij1}$ of the next bit-level cell $M_{ij}$, becomes the cut-off state by the logical level of "0" of the clock signal being applied to the gate electrode of the nMOS transistor, and therefore, the output node $N_{out}$ cannot deliver the signal transferred from the previous bit-level cell $M_{i(j-2)}$ further to the next bit-level cell $M_{ij}$ like duckpins in the time intervalsTAU$_3$ and TAU$_4$, and the signal is blocked to be domino transferred to the gate electrode of the next first nMOS transistor $Q_{ij1}$. Because the first nMOS transistor $Q_{i(j-1)1}$ becomes the cut-off state in the time intervalsTAU$_3$ and TAU$_4$, the potential at the output node $N_{out}$ is kept in a floating state, and the signal states stored in the capacitor $C_{i(j-1)}$ are held.

When the clock signal becomes the logical level of "1" again, as shown by the thin solid line in a next column of FIG. 21, the output node $N_{out}$ connecting the source electrode of the first nMOS transistor $Q_{i(j-1)1}$ and the drain electrode of the second nMOS transistor $Q_{i(j-1)2}$, which is serving as the output terminal of the bit-level cell $M_{i(j-1)}$, can deliver the signal stored in the capacitor $C_{i(j-1)}$ to the next bit-level cell $M_{ij}$ at the next clock cycle because the inter-unit cell $B_{ij}$ becomes conductive state, and the potential at the drain electrode of the first nMOS transistor $Q_{i(j-1)}$ increase as shown exaggeratingly by the dash-dotted line.

FIGS. 22(*a*)-(*d*) show four modes of signal-transferring operations, respectively, focusing to the bit-level cell $M_{ij}$ shown in FIGS. 19 and 20, the bit-level cell $M_{ij}$ is one of the bit-level cells arrayed sequentially in the j-th memory unit $U_j$, the j-th memory unit $U_j$ stores information of byte size or word size by the sequence of bit-level cells arrayed sequentially in the j-th memory unit $U_j$. In the computer system pertaining to the exemplary embodiment of the present invention, the information of byte size or word size arrayed sequentially marches side by side from a previous memory unit to a next memory unit, pari passu. In FIGS. 22(*a*)-(*d*), the clock signal is supplied by the clock signal supply line CLOCK so as to swing periodically between the logical levels of "1" and "0" with the clock period $TAU_{clock}$, while the clock signal supply line CLOCK serves as a power supply line.

FIGS. 22(*a*) and (*b*) show when the logical level of "0" is stored by previous clock signal into the capacitor $C_{ij}$, and FIGS. 22(*c*) and (*d*) show when the logical level of "1" is stored by previous clock signal into the capacitor $C_{ij}$ as one of the signal in the information of byte size or word size. As shown in FIG. 22(*a*), when the signal charge previously stored in the capacitor $C_{ij}$ is of the logical level of "0", if the signal of the logical level of "0", which is stored in a previous bit-level cell $M_{i(j-1)}$, as one of the signal in the information of byte size or word size to be transferred in a cooperative way, is fed from the previous bit-level cell $M_{i(j-1)}$ through the inter-unit cell $B_{ij}$ (the illustration is omitted) to the gate electrode of the first nMOS transistor $Q_{ij1}$, the first nMOS transistor $Q_{ij1}$ keeps off-state. At this instant of time, because the capacitor $C_{ij}$ still keep the logical level of "0", the first nMOS transistor $Q_{i(j-1)1}$ transfers equivalently the logical level of "0" to the capacitor $C_{ij}$. Then, the output node $N_{out}$ delivers the signal level of "0", which is maintained in the capacitor $C_{ij}$, to the next bit-level cell as shown in FIG. 22(*a*).

Similarly, as shown in FIG. 22(*b*), when the signal charge previously stored in the capacitor $C_{ij}$ is of the logical level of "0", if the signal of the logical level of "1" stored in a previous bit-level cell $M_{i(j-1)}$ is fed from the previous bit-level cell $M_{i(j-1)}$ through the inter-unit cell $B_{ij}$ to the gate electrode of the first nMOS transistor $Q_{ij1}$, in the timing the signal charge stored in the capacitor $C_{ij}$ keeps the logical level of "0", the first nMOS transistor $Q_{ij1}$ begins turning-on for transferring the signal of the logical level of "1" stored in the previous bit-level cell $M_{i(j-1)}$ to the capacitor $C_{ij}$ so that the logical level of "1" can be stored in the capacitor $C_{ij}$, and the output node $N_{out}$ delivers the signal level of "1" stored in the capacitor $C_{ij}$ to the next bit-level cell as shown in FIG. 22(*b*).

On the contrary, as shown in FIG. 22(*c*), when the signal charge previously stored in the capacitor $C_{ij}$ is of the logical level of "1", if the signal of the logical level of "0", which is stored in a previous bit-level cell $M_{i(j-1)}$, is fed from the previous bit-level cell $M_{i(j-1)}$ through the inter-unit cell $B_{ij}$ to the gate electrode of the first nMOS transistor $Q_{ij1}$, after the timing when the signal charge stored in the capacitor $C_{ij}$ is completely discharged to establish the logical level of "0", the first nMOS transistor $Q_{ij1}$ keeps off-state. Then, the output node $N_{out}$ delivers the signal level of "0" stored in the capacitor $C_{ij}$ to the next bit-level cell as shown in FIG. 22(*c*).

Similarly, as shown in FIG. 22(*d*), when the signal charge previously stored in the capacitor $C_{ij}$ is of the logical level of "1", if the signal of the logical level of "1" stored in a previous bit-level cell $M_{i(j-1)}$ is fed from the previous bit-level cell $M_{i(j-1)}$ through the inter-unit cell $B_{ij}$ to the gate electrode of the first nMOS transistor $Q_{ij1}$, after the timing when the signal charge stored in the capacitor $C_{ij}$ is completely discharged to establish the logical level of "0", the first nMOS transistor $Q_{ij1}$ turns on, and the first nMOS transistor $Q_{ij1}$ transfers the signal of the logical level of "1" stored in the previous bit-level cell $M_{i(j-1)}$ to the capacitor $C_{ij}$. Then, the output node $N_{out}$ delivers the signal level of "1" stored in the capacitor $C_{ij}$ to the next bit-level cell as shown in FIG. 22(*d*).

As above-mentioned, with an input signal of "1" provided by the clock signal and another input signal of "1" or "0" provided by the previous bit-level cell $M_{i(j-1)}$, the bit-level cell $M_{ij}$ can establish "a marching AND-gate" operations of:

$$1+1=1$$

$$1+0=1,$$

and with an input signal of "0" provided by the clock signal and another input signal of "1" or "0" provided by the previous bit-level cell $M_{i(j-1)}$, the bit-level cell $M_{ij}$ can establish "the marching AND-gate" operations of:

$$0+1=0$$

$$0+0=0.$$

Therefore, in a gate-level representation of the cell array corresponding to the marching main memory 31 shown in FIG. 4, as shown in FIG. 23, a first cell $M_{11}$ allocated at the leftmost side on a first row and connected to an input terminal $I_1$ encompasses a capacitor $C_{11}$ configured to store the information, and a marching AND-gate $G_{11}$ having one input terminal connected to the capacitor $C_{11}$, the other input terminal configured to be supplied with the clock signal, and an output terminal connected to one input terminal of the next marching AND-gate $G_{21}$ assigned to the adjacent second cell $M_{21}$ on the first row. An example of the response to the waveform of the clock signal is shown in FIG. 7C. When the logical values of "1" of the clock signal is fed to the other input terminal of the marching AND-gate $G_{11}$, the information stored in the capacitor $C_{11}$ is transferred to a capacitor $C_{12}$, assigned to the adjacent second cell $M_{12}$, and the capacitor $C_{12}$ stores the information. Namely, the second cell $M_{12}$ on the first row of the gate-level representation of cell array implementing the marching main memory 31 encompasses the capacitor $C_{12}$ and a marching AND-gate $G_{12}$, which has one input terminal connected to the capacitor $C_{12}$, the other input terminal configured to be supplied with the clock signal, and an output terminal connected to one input terminal of the next marching AND-gate $G_{13}$ assigned to the adjacent third cell $M_{13}$ on the first row. Similarly the third cell $M_{13}$ on the first row of the gate-level representation of cell array implementing the marching main memory 31 encompasses a capacitor $C_{13}$ configured to store the information, and a marching AND-gate $G_{13}$ having one input terminal connected to the capacitor $C_{13}$, the other input terminal configured to be supplied with the clock signal, and an output terminal connected to one input terminal of the next marching AND-gate assigned to the adjacent fourth cell, although the illustration of the fourth cell is omitted. Therefore, when the logical values of "1" is fed to the other input terminal of the marching AND-gate $G_{12}$, the information stored in the capacitor $C_{12}$ is transferred to the capacitor $C_{13}$, assigned to the third cell $M_{13}$, and the capacitor $C_{13}$ stores the information, and when the logical values of "1" is fed to the other input terminal of the marching AND-gate $G_{13}$, the information stored in the capacitor $C_{13}$ is transferred to the capacitor, assigned to the fourth cell. Furthermore, a (n−1)-th cell $M_{1,n-1}$ on the first row of the gate-level representation of cell array implementing the marching main memory 31 encompasses a capacitor $C_{1,n-1}$ configured to store the information, and a marching AND-gate $G_{1,n-1}$ having one input terminal connected to the capacitor $C_{1,n-1}$, the other input terminal configured to be supplied with the clock signal, and an output terminal connected to one input terminal of the next marching AND-gate $G_{1n}$ assigned to the adjacent n-th cell $M_{1n}$, which is allocated at the rightmost side on the first row and connected to an output terminal $O_1$. Therefore, each of the cells $M_{11}, M_{12}, M_{13}, \ldots, M_{1,n-1}, M_{1n}$ stores the information, and transfers the information synchronously with the clock signal, step by step, toward the output terminals $O_1$, so as to provide the processor 11 with the stored information actively and sequentially so that the ALU 112 can execute the arithmetic and logic operations with the stored information.

Similarly, in a gate-level representation of cell array implementing the marching main memory 31 shown in FIG. 23, a first cell $M_{21}$ allocated at the leftmost side on a second row and connected to an input terminal 12 encompasses a capacitor $C_{21}$, and a marching AND-gate $G_{21}$ having one input terminal connected to the capacitor $C_{21}$, the other input terminal configured to be supplied with the clock signal, and an output terminal connected to one input terminal of the next marching AND-gate $G_{21}$ assigned to the adjacent second cell $M_{21}$ on the second row. The second cell $M_{22}$ on the second row of the gate-level representation of cell array implementing the marching main memory 31 encompasses the capacitor $C_{22}$ and a marching AND-gate $G_{22}$, which has one input terminal connected to the capacitor $C_{22}$, the other input terminal configured to be supplied with the clock signal, and an output terminal connected to one input terminal of the next marching AND-gate $G_{23}$ assigned to the adjacent third cell $M_{23}$ on the second row. Similarly the third cell $M_{23}$ on the second row of the gate-level representation of cell array implementing the marching main memory 31 encompasses a capacitor $C_{23}$, and a marching AND-gate $G_{23}$ having one input terminal connected to the capacitor $C_{23}$, the other input terminal configured to be supplied with the clock signal, and an output terminal connected to one input terminal of the next marching AND-gate assigned to the adjacent fourth cell. Furthermore, a (n−1)-th cell $M_{2,n-1}$ on the second row of the gate-level representation of cell array implementing the marching main memory 31 encompasses a capacitor $C_{2, n-1}$, and a marching AND-gate $G_{2, n-1}$ having one input terminal connected to the capacitor $C_{2, n-1}$, the other input terminal configured to be supplied with the clock signal, and an output terminal connected to one input terminal of the next marching AND-gate $G_{1n}$ assigned to the adjacent n-th cell $M_{1n}$, which is allocated at the rightmost side on the second row and connected to an output terminal $O_1$. Therefore, each of the cells $M_{21}$, $M_{22}$, $M_{23}$, . . . , $M_{2, n-1}$, $M_{2n}$ on the second row stores the information, and transfers the information synchronously with the clock signal, step by step, toward the output terminals $O_1$, so as to provide the processor 11 with the stored information actively and sequentially so that the ALU 112 can execute the arithmetic and logic operations with the stored information.

On a third row, a first cell $M_{31}$ allocated at the leftmost side and connected to an input terminal 13, a second cell $M_{32}$ adjacent to the first cell $M_{31}$, a third cell $M_{33}$ adjacent to the second cell $M_{32}$, . . . , a (n−1)-th cell $M_{3, n-1}$, and an n-th cell $M_{3n}$, which is allocated at the rightmost side on the third row and connected to an output terminal $O_3$ are aligned. And, each of the cells $M_{31}$, $M_{32}$, $M_{33}$, . . . , $M_{3, n-1}$, $M_{3n}$ on the third row stores the information, and transfers the information synchronously with the clock signal, step by step, toward the output terminals $O_3$, so as to provide the processor 11 with the stored information actively and sequentially so that the ALU 112 can execute the arithmetic and logic operations with the stored information.

On a (m−1)-th row, a first cell $M_{(m-1),1}$ allocated at the leftmost side and connected to an input terminal a second cell $M_{(m-1),2}$ adjacent to the first cell $M_{(m-1), n-1}$, a third cell $M_{(m-1),3}$ adjacent to the second cell $M_{(m-1),2}$, . . . , a (n−1)-th cell $M_{(m-1), n-1}$, and an n-th cell $M_{(m-1),n}$, which is allocated at the rightmost side on the (m−1)-th row and connected to an output terminal $O_{m-1}$, are aligned. And, each of the cells $M_{(m-1),1}$, $M_{(m-1),2}$, $M_{(m-1),3}$, . . . , $M_{(m-1), n-1}$, $M_{(m-1),n}$ on the (m−1)-th row stores the information, and transfers the information synchronously with the clock signal, step by step, toward the output terminals $O_{m-1}$, so as to provide the processor 11 with the stored information actively and sequentially so that the ALU 112 can execute the arithmetic and logic operations with the stored information.

On a m-th row, a first cell $M_{m1}$ allocated at the leftmost side and connected to an input terminal $I_{m-1}$, a second cell $M_{m2}$ adjacent to the first cell $M_{m1}$, a third cell $M_{m3}$ adjacent to the second cell $M_{m2}$, . . . , a (n−1)-th cell $M_{m(n-1)}$, and an n-th cell $M_{mn}$, which is allocated at the rightmost side on the m-th row and connected to an output terminal $O_m$, are aligned. And, each of the cells $M_{m1}$, $M_{m2}$, $M_{m3}$, . . . , $M_{m(n-1)}$, $M_{mn}$ on the m-th row stores the information, and transfers the information synchronously with the clock signal, step by step, toward the output terminals $O_m$, so as to provide the processor 11 with the stored information actively and sequentially so that the ALU 112 can execute the arithmetic and logic operations with the stored information.

Although one of the examples of the transistor-level configurations of the marching AND-gate $G_{ij}$ is shown in FIG. 6, there are various circuit configurations to implement the marching AND-gate, which can be applied to the cell array implementing the marching main memory 31. Another example of the marching AND-gate $G_{ij}$, which can be applied to the cell array implementing the marching main memory 31, may be a configuration encompassing a CMOS NAND gate and a CMOS inverter connected to the output terminal of the CMOS NAND gate. Because the CMOS NAND gate requires two nMOS transistors and two pMOS transistors, and the CMOS inverter requires one nMOS transistor and one pMOS transistor, the configuration encompassing the CMOS NAND gate and the CMOS inverter requires six transistors. Furthermore, the marching AND-gate $G_{ij}$ can be implemented by other circuit configurations such as resistor-transistor logics, or by various semiconductor elements, magnetic elements, superconductor elements, or single quantum elements, etc. which has a function of AND logic.

As shown in FIG. 23, the gate-level representation of cell array implementing the marching main memory 31 is as simple as the configuration of DRAM, where each of the bit-level cells $M_{ij}$ (i=1 to m; j=1 to n) is represented by one capacitor and one marching AND-gate. Each of the vertical sequence of marching AND-gates $G_{11}$, $G_{21}$, $G_{31}$, . . . , $G_{m-1,1}$, $G_{m1}$ implementing the first memory unit $U_1$ shifts the sequence of signals from input terminals $I_1$, $I_2$, $I_3$, . . . , $I_{n-1}$, $I_n$ to right along row-direction, or horizontal direction, based on clocks as shown in FIG. 7C. And, each of the vertical sequence of marching AND-gates $G_{12}$, $G_{22}$, $G_{32}$, . . . , $G_{m-1,2}$, $G_{m2}$ implementing the second memory unit $U_2$ shifts the sequence of signals of word size from left to right along row-direction based on clocks, each of the vertical sequence of marching AND-gates $G_{13}$, $G_{23}$, $G_{33}$, . . . , $G_{m-1,3}$, $G_{m3}$ implementing the third memory unit $U_3$ shifts the sequence of signals of word size from left to right along row-direction based on clocks, . . . , each of the vertical sequence of marching AND-gates $G_{1,n-1}$, $G_{2,n-1}$, $G_{3,n-1}$, . . . , $G_{m-1,n-1}$, $G_{m,n-1}$ implementing the (n−1)-th memory unit $U_{n-1}$ shifts the sequence of signals of word size from left to right along row-direction based on clocks, and each of the vertical sequence of marching AND-gates $G_{1,n}$, $G_{2,n}$, $G_{3,n}$, . . . , $G_{m-1,n}$, $G_{m,n}$ implementing the n-th memory unit $U_n$ shifts the sequence of signals of word size from left to right to the output terminals $O_1$, $O_2$, $O_3$, . . . , $O_{n-1}$, $O_n$ based on clocks as shown in FIG. 7C. Especially, the time delay $t_{d1}$, $t_{d2}$ in each of marching AND-gate $G_{ij}$ (i=1 to m; j=1 to n) is significant to correctly perform the marching-shift actions in every memory units in the marching main memory 31 successively.

Reverse-Directional Marching Main Memory

Although FIGS. 3-23 show the marching main memory which stores the information in each of memory units $U_1$, $U_2$, $U_3$, . . . , $U_{n-1}$, $U_n$ and transfers the information synchronously with the clock signal, step by step, from input terminal toward the output terminal, FIG. 24 shows another marching main memory.

In FIG. 24, each of the memory units $U_1$, $U_2$, $U_3$, . . . , $U_{n-1}$, $U_n$ stores the information including word size of data or instructions, and transfers in the reverse direction the information synchronously with the clock signal, step by step, toward the output terminals, provided from the processor 11 with the resultant data executed in the ALU 112.

FIG. 25(*a*) shows an array of i-th row of the m*n matrix (here, "m" is an integer determined by word size) in a cell-level representation of the another marching main memory shown in FIG. 24, which stores the information of bit level in each of cells $M_{i1}$, $M_{i2}$, $M_{i3}$, . . . , $M_{i,n-1}$, $M_{i,n}$ and transfers the information synchronously with the clock signal, step by step in the reverse direction to the marching main memory shown in FIGS. 3-23, namely from the output terminal OUT toward the input terminal IN.

As shown in FIG. 25(*a*), in a reverse-directional marching main memory, a bit-level cell $M_{in}$ of the n-th column and on the i-th row, allocated at the rightmost side on the i-th row and connected to an input terminal IN encompasses a first nMOS transistor $Q_{in1}$ having a drain electrode connected to a clock signal supply line through a first delay element $D_{in1}$ and a gate electrode connected to the input terminal IN through a second delay element $D_{in2}$; a second nMOS transistor $Q_{in2}$ having a drain electrode connected to a source electrode of the first nMOS transistor $Q_{in1}$, a gate electrode connected to the clock signal supply line, and a source electrode connected to the ground potential; and a capacitor $C_{in}$ configured to store the information of the bit-level cell $M_{in}$, connected in parallel with the second nMOS transistor $Q_{in2}$, wherein an output node connecting the source electrode of the first nMOS transistor $Q_{in1}$ and the drain electrode of the second nMOS transistor $Q_{in2}$ serves as an output terminal of the bit-level cell $M_{in}$, configured to transfer the signal stored in the capacitor $C_{in}$ to the next bit-level cell $M_{i2}$.

As shown in FIG. 25(*b*), the clock signal swings periodically between the logical levels of "1" and "0", with a predetermined clock period $TAU_{clock}$, and when the clock signal becomes the logical level of "1", the second nMOS transistor $Q_{in2}$ begins to discharge the signal charge, which is already stored in the capacitor $C_{in}$ at a previous clock cycle. After the clock signal of the logical level of "1" is applied and the signal charge stored in the capacitor $C_{in}$ is completely discharged to become the logical level of "0", the first nMOS transistor $Q_{in1}$ becomes active as the transfer transistor, delayed by the predetermined delay time to determined by the first delay element $D_{in1}$. The delay time to is set to be equal to ¼$TAU_{clock}$ in an exemplary embodiment. Thereafter, when the signal is fed from the input terminal IN to the gate electrode of the first nMOS transistor $Q_{in1}$, the first nMOS transistor $Q_{in1}$ transfers the signal stored in the previous bit-level cell $M_{i2}$, further delayed by the predetermined delay time $t_{d2}$ determined by the second delay element $D_{in2}$ to the capacitor $C_{in}$. For example, if the logical level of "1" is fed from the input terminal IN to the gate electrode of the first nMOS transistor $Q_{in1}$, the first nMOS transistor $Q_{in1}$ becomes conductive state, and the logical level of "1" is stored in the capacitor $C_{in}$. On the other hand, if the logical level of "0" is fed from the input terminal IN to the gate electrode of the first nMOS transistor $Q_{in1}$, the first nMOS transistor $Q_{in1}$ keeps cut-off state, and the logical level of "0" is maintained in the capacitor $C_{in}$. Therefore, the bit-level cell $M_{in}$ can establish "a marching AND-gate" operation. The delay time $t_{d2}$ shall be longer than the delay time $t_{d1}$, and the delay time $t_{d2}$ is set to be equal to ½$TAU_{clock}$ in an exemplary embodiment. When the clock signal becomes the logical level of "0" at a time when time proceeds ½$TAU_{clock}$, the output node connecting the source electrodes of the first nMOS transistor $Q_{in1}$ and the drain electrodes of the second nMOS transistor $Q_{in2}$ cannot deliver the signals, which are entered to the gate electrodes of the first nMOS transistor $Q_{in1}$, further to the next bit-level cell $M_{i2}$, at a time when time proceeds ½$TAU_{clock}$, as the signals is blocked to be transferred to the gate electrodes of the next first nMOS transistor $Q_{i21}$ delayed by the delay time $t_{d2}$=½$TAU_{clock}$ determined by the second delay element $D_{i22}$. As shown in FIG. 25(*a*), in a reverse-directional marching main memory, a bit-level cell $M_{i(n-1)}$ of the (n−1)-th column and on the i-th row, allocated at the second right side on the i-th row, encompasses a first nMOS transistor $Q_{i(n-1)1}$ having a drain electrode connected to the clock signal supply line through a first delay element $D_{i(n-1)1}$ and a gate electrode connected to the output terminal of the bit-level cell $M_{in}$ through a second delay element $D_{i(n-1)2}$; a second nMOS transistor $Q_{i(n-1)2}$ having a drain electrode connected to a source electrode of the first nMOS transistor $Q_{i(n-1)1}$, a gate electrode connected to the clock signal supply line, and a source electrode connected to the ground potential; and a capacitor $C_{i(n-1)}$ configured to store the information of the bit-level cell $M_{i(n-1)}$, connected in parallel with the second nMOS transistor $Q_{i(n-1)2}$. When the clock signal becomes the logical level of "1", the second nMOS transistor $Q_{i(n-1)2}$ begins to discharge the signal charge, which is already stored in the capacitor $C_{i(n-1)}$ at a previous clock cycle. As shown in FIG. 25(*b*), and the logical values of "1" is kept from time "t" to time "t+1" in the capacitor $C_{i(n-1)}$. After the clock signal of the logical level of "1" is applied and the signal charge stored in the capacitor $C_{i(n-1)}$ is completely discharged to becomes the logical level of "0", the first nMOS transistor $Q_{i(n-1)1}$ becomes active as the transfer transistor, delayed by the delay time to determined by the first delay element $D_{i(n-1)1}$. Thereafter, when the signal is fed from the output terminal of the bit-level cell $M_{in}$ to the gate electrode of the first nMOS transistor $Q_{i(n-1)1}$, the first nMOS transistor $Q_{i(n-1)1}$ transfers the signal stored in the previous bit-level cell $M_{in}$, further delayed by the delay time $t_{d2}$ determined by the second delay element $D_{i(n-1)2}$ to the capacitor $C_{i(n-1)}$. When the clock signal becomes the logical level of "0" at a time when time proceeds 1/2$TAU_{clock}$, the output node connecting the source electrodes of the first nMOS transistor $Q_{i(n-1)1}$ and the drain electrodes of the second nMOS transistor $Q_{i(n-1)2}$ cannot deliver the signals, which are entered to the gate electrodes of the first nMOS transistor $Q_{i(n-1)1}$, further to the next bit-level cell $M_{i(n-2)}$, at a time when time proceeds 1/2$TAU_{clock}$, as the signals is blocked to be transferred to the gate electrodes of the next first nMOS transistor $Q_{i(n-2)1}$ (illustration is omitted) delayed by the delay time $t_{d2}$=1/2$TAU_{clock}$ determined by the second delay element $D_{i(n-2)2}$ (illustration is omitted).

Similarly the third cell $M_{i3}$ from the left, on the i-th row, of the reverse-directional marching main memory encompasses a first nMOS transistor $Q_{i31}$ having a drain electrode connected to the clock signal supply line through a first delay element $D_{i31}$ and a gate electrode connected to the output terminal of the bit-level cell $M_{i4}$ (illustration is omitted) through a second delay element $D_{i32}$; a second nMOS transistor $Q_{i32}$ having a drain electrode connected to a source electrode of the first nMOS transistor $Q_{i31}$, a gate electrode connected to the clock signal supply line, and a source electrode connected to the ground potential; and a capacitor $C_{i3}$ configured to store the information of the bit-level cell $M_{i3}$, connected in parallel with the second nMOS transistor $Q_{i32}$. When the clock signal becomes the logical level of "1", the second nMOS transistor $Q_{i32}$ begins to discharge the signal charge, which is already stored in the capacitor $C_{i3}$ at a previous clock cycle. After the clock signal of the logical level of "1" is applied and the signal charge stored in the capacitor $C_{i3}$ is completely discharged to becomes the logical level of "0", the first nMOS transistor $Q_{i31}$ becomes active as the transfer transistor, delayed by the delay time to determined by the first delay element $D_{i31}$. Thereafter, when the signal is fed from the output terminal of the bit-level cell $M_{i4}$ to the gate electrode of the first nMOS transistor $Q_{i31}$, the first nMOS transistor $Q_{i31}$ transfers the signal stored in the previous bit-level cell $M_{in}$, further delayed by the delay time $t_{d2}$ determined by the second delay element $D_{i32}$ to the capacitor $C_{i3}$. When the clock signal becomes the logical level of "0" at a time when time proceeds 1/2$TAU_{clock}$, the output node connecting the source electrodes of the first nMOS transistor $Q_{i31}$ and the drain electrodes of the second nMOS transistor $Q_{i32}$ cannot deliver the signals, which are entered to the gate electrodes of the first nMOS transistor $Q_{i31}$, further to the next bit-level cell $M_{i2}$, at a time when time proceeds $1/2TAU_{clock}$, as the signals is blocked to be transferred to the gate electrodes of the next first nMOS transistor $Q_{i21}$ delayed by the delay time $t_{d2}=1/2TAU_{clock}$ determined by the second delay element $D_{i22}$ As shown in FIG. 25(*a*), in a reverse-directional marching main memory, a bit-level cell $M_{i2}$ of the second column from the left, and on the i-th row, encompasses a first nMOS transistor $Q_{i21}$ having a drain electrode connected to the clock signal supply line through a first delay element $D_{i21}$ and a gate electrode connected to the output terminal of the bit-level cell $M_{i3}$ through a second delay element $D_{i22}$; a second nMOS transistor $Q_{i22}$ having a drain electrode connected to a source electrode of the first nMOS transistor $Q_{i21}$, a gate electrode connected to the clock signal supply line, and a source electrode connected to the ground potential; and a capacitor $C_{i2}$ configured to store the information of the bit-level cell $M_{i2}$, connected in parallel with the second nMOS transistor $Q_{i22}$. When the clock signal becomes the logical level of "1", the second nMOS transistor $Q_{i22}$ begins to discharge the signal charge, which is already stored in the capacitor $C_{i2}$ at a previous clock cycle. After the clock signal of the logical level of "1" is applied and the signal charge stored in the capacitor $C_{i2}$ is completely discharged to becomes the logical level of "0", the first nMOS transistor $Q_{i21}$ becomes active as the transfer transistor, delayed by the delay time $t_{d1}$ determined by the first delay element $D_{i21}$. Thereafter, when the signal is fed from the output terminal of the bit-level cell $M_{i3}$ to the gate electrode of the first nMOS transistor $Q_{i21}$, the first nMOS transistor $Q_{i21}$ transfers the signal stored in the previous bit-level cell $M_{i3}$, further delayed by the delay time $t_{d2}$ determined by the second delay element $D_{i22}$ to the capacitor $C_{i2}$. When the clock signal becomes the logical level of "0" at a time when time proceeds $1/2TAU_{clock}$, the output node connecting the source electrode of the first nMOS transistor $Q_{i21}$ and the drain electrode of the second nMOS transistor $Q_{i22}$ cannot deliver the signal, which is entered to the gate electrode of the first nMOS transistor $Q_{i21}$, further to the next bit-level cell $M_{i1}$, at a time when time proceeds $1/2TAU_{clock}$, as the signal is blocked to be transferred to the gate electrode of the next first nMOS transistor $Q_{i11}$ delayed by the delay time $t_{d2}=1/2TAU_{clock}$ determined by the second delay element $D_{i12}$.

As shown in FIG. 25(*a*), in a reverse-directional marching main memory, a bit-level cell $M_{i1}$ of the first column and on the i-th row, which is allocated at the leftmost side on the i-th row and connected to an output terminal OUT, encompasses a first nMOS transistor $Q_{i11}$ having a drain electrode connected to the clock signal supply line through a first delay element $D_{i11}$ and a gate electrode connected to the output terminal of the bit-level cell $M_{i2}$ through a second delay element $D_{i12}$; a second nMOS transistor $Q_{i12}$ having a drain electrode connected to a source electrode of the first nMOS transistor $Q_{i11}$, a gate electrode connected to the clock signal supply line, and a source electrode connected to the ground potential; and a capacitor $C_{i1}$ configured to store the information of the bit-level cell $M_{i1}$, connected in parallel with the second nMOS transistor $Q_{i12}$. When the clock signal becomes the logical level of "1", the second nMOS transistor $Q_{i12}$ begins to discharge the signal charge, which is already stored in the capacitor $C_{i1}$ at a previous clock cycle. After the clock signal of the logical level of "1" is applied and the signal charge stored in the capacitor $C_{i1}$ is completely discharged to becomes the logical level of "0", the first nMOS transistor $Q_{i11}$ becomes active as the transfer transistor, delayed by the delay time $t_{d1}$ determined by the first delay element $D_{i11}$. Thereafter, when the signal is fed from the output terminal of the bit-level cell $M_{i2}$ to the gate electrode of the first nMOS transistor $Q_{i11}$, the first nMOS transistor $Q_{i11}$ transfers the signal stored in the previous bit-level cell $M_{i2}$, further delayed by the delay time $t_{d2}$ determined by the second delay element $D_{i12}$ to the capacitor $C_{i1}$. The output node connecting the source electrode of the first nMOS transistor $Q_{i11}$ and the drain electrode of the second nMOS transistor $Q_{i12}$ delivers the signal stored in the capacitor $C_{i1}$ to the output terminal OUT.

According to the reverse-directional one-dimensional marching main memory 31 of the exemplary embodiment shown in FIGS. 24. 25(*a*) and 25(*b*), addressing to each of memory units $U_1, U_2, U_3, \ldots, U_{n-1}, U_n$ disappears and required information is heading for its destination unit connected to the edge of the memory. The mechanism of accessing the reverse-directional one-dimensional marching main memory 31 of the exemplary embodiment is truly alternative to existing memory schemes that are starting from the addressing mode to read/write information. Therefore, according to the reverse-directional one-dimensional marching main memory 31 of the exemplary embodiment, the memory-accessing without addressing mode is quite simpler than existing memory schemes.

As above mentioned, the bit-level cell $M_{ij}$ can establish "a marching AND-gate" operation. Therefore, as shown in FIG. 26, in a gate-level representation of the cell array corresponding to the reverse-directional marching main memory 31 shown in FIG. 25(*a*), the n-th bit-level cell $M_{i,n}$ allocated at the rightmost side on the i-th row and connected to an input terminal IN encompasses a capacitor $C_{in}$ configured to store the information, and a marching AND-gate $G_{in}$ having one input terminal connected to the capacitor $C_{in}$, the other input terminal configured to be supplied with the clock signal, and an output terminal connected to one input terminal of the preceding marching AND-gate $G_{in-1}$ assigned to the adjacent (n−1)-th bit-level cell $M_{i,n-1}$ on the i-th row. When the logical values of "1" is fed to the other input terminal of the marching AND-gate $G_n$, the information stored in the capacitor $C_{in}$ is transferred to a capacitor $C_{i,n-1}$, assigned to the adjacent (n−1)-th bit-level cell on the i-th row, and the capacitor $C_{i,n-1}$ stores the information. Namely, the (n−1)-th bit-level cell on the i-th row of the reverse-directional marching main memory encompasses the capacitor $C_{i,n-1}$ and a marching AND-gate $G_{i,n-1}$, which has one input terminal connected to the capacitor $C_{i,n-1}$, the other input terminal configured to be supplied with the clock signal, and an output terminal connected to one input terminal of the preceding marching AND-gate $G_{i,n-2}$ assigned to the adjacent third bit-level cell $M_{i,n-2}$ (illustration is omitted).

Similarly the third bit-level cell $M_{i3}$ on the i-th row of the reverse-directional marching main memory encompasses a capacitor $C_{i3}$ configured to store the information, and a marching AND-gate $G_{i3}$ having one input terminal connected to the capacitor $C_{i3}$, the other input terminal configured to be supplied with the clock signal, and an output terminal connected to one input terminal of the preceding marching AND-gate $G_{i2}$ assigned to the adjacent second bit-level cell $M_{i2}$. When the logical values of "1" is fed to the other input terminal of the marching AND-gate $G_{i3}$, the information stored in the capacitor $C_{i3}$ is transferred to the capacitor $C_{i2}$, assigned to the second bit-level cell $M_{i2}$, and the capacitor $C_{i2}$ stores the information.

Furthermore, the second bit-level cell $M_{i2}$ on the i-th row of the reverse-directional marching main memory encompasses the capacitor $C_{i2}$ configured to store the information, and the marching AND-gate $G_{i2}$ having one input terminal connected to the capacitor $C_{i2}$, the other input terminal configured to be supplied with the clock signal, and an output terminal connected to one input terminal of the preceding marching AND-gate $G_{i1}$ assigned to the adjacent first bit-level cell $M_{i1}$, which is allocated at the leftmost side on the i-th row and connected to an output terminal OUT.

The concept of marching main memory 31 is shown in FIG. 27. This is different from existing computer memory, because the marching main memory 31 is purposely designed with functionality of storage and conveyance of information/data through all of memory units $U_1$, $U_2$, $U_3$, . . . , $U_{n-1}$, $U_n$ in the marching main memory 31. Marching memory supplies information/data to the processor (CPU) 11 at the same speed of the processor 11. As shown in the time-domain relationship of FIG. 9, the memory unit streaming time $T_{mus}$ required for transferring information/data through one memory units $U_1$, $U_2$, $U_3$, . . . , $U_{n-1}$, $U_n$, in the marching main memory 31 is equal to the clock cycle $T_{cc}$ in the processor 11. The marching main memory 31 stores information/data in each of the memory units $U_1$, $U_2$, $U_3$, . . . , $U_{n-1}$, $U_n$, and transfers synchronously with the clock signal, step by step, toward the output terminals, so as to provide the processor 11 with the stored information/data so that the arithmetic logic unit 112 can execute the arithmetic and logic operations with the stored information/data.

As shown in FIG. 28, marching memory structure 3 includes the marching main memory 31 of the exemplary embodiment of the present invention. The term "marching memory structure 3" means a generic concept of the memory structure including a marching-instruction register file (RF) 22*a* and a marching-data register file (RF) 22*b* connected to the ALU 112, which will be explained further in the following second embodiment, and a marching-instruction cache memory 21*a* and a marching-data cache memory 21*b*, which will be explained further in the following exemplary embodiments, in addition to the marching main memory 31.

FIG. 29(*a*) shows a forward data-stream $S_f$ flowing from the marching memory structure 3 to the processor 11 and backward data-stream (reverse data-stream) $S_b$ flowing from the processor 11 to the marching memory structure 3, and FIG. 29(*b*) shows bandwidths established between the marching memory structure 3 and the processor 11 assuming that the memory unit streaming time $T_{mus}$ in the marching memory structure 3 is equal to the clock cycle $T_{cc}$ of the processor 11.

The scheme of the marching main memory 31 may be considered to be analogous to a magnetic tape system shown in FIG. 30(*a*), which encompasses a magnetic tape 503, a take-up reel 502 for winding the magnetic tape 503, a supply reel 501 for rewinding and releasing the magnetic tape 503, a read/write header 504 for reading information/data from the magnetic tape 503 or writing information/data to the magnetic tape 503, and a processor 11 connected to the read/write header 504. As the take-up reel 502 winds the magnetic tape 503, which is released from the supply reel 501, the magnetic tape 503 moves at high speed from the supply reel 501 toward the take-up reel 502, and information/data stored on the magnetic tape 503, being transferred with the movement of the magnetic tape 503 at high speed, are read by the read/write header 504. And the processor 11 connected to the read/write header 504 can execute arithmetic and logic operations with information/data read from the magnetic tape 503. Alternatively, the results of the processing in the processor 11 are sent out to the magnetic tape 503 through the read/write header 504.

If the architecture of the magnetic tape system shown in FIG. 30(*a*) is implemented by semiconductor technology, such that one images an extremely high-speed magnetic tape system virtually established on semiconductor silicon chip as shown in FIG. 30(*b*), the extremely high-speed magnetic tape system shown in FIG. 30(*a*) may correspond to a net marching memory structure 3, including the marching main memory 31 of the present invention. The net marching memory structure 3 shown in FIG. 30(*b*) stores information/data in each of the memory units on the silicon chip and transfers synchronously with the clock signal, step by step, toward the take-up reel 502, so as to provide the processor 11 with the stored information/data actively and sequentially so that the processor 11 can execute the arithmetic and logic operations with the stored information/data, and the results of the processing in the processor 11 are sent out to the net marching memory structure 3.

Bidirectional Marching Main Memory

As shown in FIGS. 31(*a*)-(*c*), the exemplary embodiment of the marching main memory 31, can achieve bidirectional transferring of information/data. FIG. 31(*a*) shows a forward marching behavior of information/data, in which information/data marches (shifts) side by side toward right-hand direction (forward direction) in a one-dimensional marching main memory 31. FIG. 31(*b*) shows a staying state of the one-dimensional marching main memory 31. FIG. 31(*c*) shows a reverse-marching behavior of information/data (a backward marching behavior), in which information/data marches (shifts) side by side toward left-hand direction (reverse direction) in the one-dimensional marching main memory 31.

FIGS. 32 and 33 show two examples of the representative arrays of i-th row of the m*n matrix (here, "m" is an integer determined by word size) in a transistor-level representation of the cell array for the bidirectional marching main memory 31, respectively, which can achieve the bidirectional behavior shown in FIGS. 31(*a*)-(*c*). The bidirectional marching main memory 31 stores the information/data of bit level in each of cells $M_{i1}$, $M_{i2}$, $M_{i3}$, . . . , $M_{i,n-1}$, $M_{i,n}$ and transfers bi-directionally the information/data synchronously with the clock signal, step by step in the forward direction and/or reverse direction (backward direction) between a first I/O selector 512 and a second I/O selector 513.

In FIGS. 32 and 33, each of the cells $M_{i1}$, $M_{i2}$, $M_{i3}$, . . . , $M_{i,n-1}$, $M_{i,n}$ is assigned in memory unit $U_1$, $U_2$, $U_3$, . . . , $U_{n-1}$, $U_n$, respectively. That is the cell $M_{i1}$ is assigned as the first bit-level cell in the first memory unit $U_1$, the first memory unit $U_1$ stores information of byte size or word size by the sequence of bit-level cells arrayed in the first memory unit $U_1$. Similarly, the cell $M_{i2}$ is assigned as the second bit-level cell in the second memory unit $U_2$, the cell $M_{i3}$ is assigned as the third bit-level cell in the third memory unit $U_3$, . . . , the cell $M_{i,n-1}$ is assigned as the (n−1)-th bit-level cell in the (n−1)-th memory unit $U_{n-1}$, and the cell $M_{i,n}$ is assigned as the n-th bit-level cell in the n-th memory unit $U_n$. And the memory units $U_2$, $U_3$, . . . , $U_{n-1}$, $U_n$ stores information of byte size or word size by the sequence of bit-level cells arrayed in the memory unit $U_2$, $U_3$, . . . , $U_{n-1}$, $U_n$, respectively. The bidirectional marching main memory 31 stores the information/data of byte size or word size in each of cells $U_1$, $U_2$, $U_3$, . . . , $U_{n-1}$, $U_n$ and transfers bi-directionally the information/data of byte size or word size synchronously with the clock signal, pari passu, in the forward direction and/or reverse direction (backward direction) between a first I/O selector 512 and a second I/O selector 513.

A clock selector 511 selects a first clock signal supply line CL1 and a second clock signal supply line CL2. The first clock signal supply line CL1 drives the forward data-stream, and the second clock signal supply line CL2 drives the backward data-stream, and each of the first clock signal supply line CL1 and the second clock signal supply line CL2 has logical values of "1" and "0".

In the transistor-level representation of the cell array implementing the marching main memory 31 shown in FIG. 32, a first bit-level cell $M_{i1}$ allocated at the leftmost side on i-th row, being connected to a first I/O selector 512, encompasses a first forward nMOS transistor $Q_{1i11f}$ having a drain electrode connected to a first clock signal supply line CL1 through a first forward delay element $D_{i11f}$ and a gate electrode connected to the first I/O selector 512 through a second forward delay element $D_{i12f}$; a second forward nMOS transistor $Q_{i12f}$ having a drain electrode connected to a source electrode of the first forward nMOS transistor $Q_{i11f}$, a gate electrode connected to the first clock signal supply line, and a source electrode connected to the ground potential; and a forward capacitor $C_{i1f}$ configured to store the forward information/data of the cell connected in parallel with the second forward nMOS transistor $Q_{i12f}$, wherein an output node connecting the source electrode of the first forward nMOS transistor $Q_{i11f}$ and the drain electrode of the second forward nMOS transistor $Q_{i12f}$ serves as a forward output terminal of the cell configured to transfer the signal stored in the forward capacitor $C_{i1f}$ to the next bit-level cell $M_{i2}$. The first bit-level cell $M_{i1}$ further encompasses a first backward nMOS transistor $Q_{i11g}$ having a drain electrode connected to a second clock signal supply line through a first backward delay element $D_{i11g}$ and a gate electrode connected to the backward output terminal of the bit-level cell $M_{i2}$ through a second backward delay element $D_{i12g}$; a second backward nMOS transistor $Q_{i12g}$ having a drain electrode connected to a source electrode of the first backward nMOS transistor $Q_{i11g}$, a gate electrode connected to the second clock signal supply line, and a source electrode connected to the ground potential; and a backward capacitor $C_{i1g}$ configured to store the backward information/data of the cell connected in parallel with the second backward nMOS transistor $Q_{i12g}$, wherein an output node connecting the source electrode of the first backward nMOS transistor $Q_{i11g}$ and the drain electrode of the second backward nMOS transistor $Q_{i12g}$ serves as a backward output terminal of the cell $M_{i1}$, configured to transfer the signal stored in the backward capacitor $C_{i1g}$ to the first I/O selector 512.

A second bit-level cell $M_{i2}$ allocated at the second from the left side on i-th row, being connected to the bit-level cell $M_{i1}$, encompasses a first forward nMOS transistor $Q_{i21f}$ having a drain electrode connected to the first clock signal supply line CL1 through a first forward delay element $D_{i21f}$ and a gate electrode connected to the forward output terminal of the bit-level cell nu through a second forward delay element $D_{i22f}$; a second forward nMOS transistor $Q_{i22f}$ having a drain electrode connected to a source electrode of the first forward nMOS transistor $Q_{i21f}$, a gate electrode connected to the first clock signal supply line CL1, and a source electrode connected to the ground potential; and a forward capacitor $C_{i2f}$ configured to store the forward information/data of the cell $M_{i2}$, connected in parallel with the second forward nMOS transistor $Q_{i22f}$, wherein an output node connecting the source electrode of the first forward nMOS transistor $Q_{i21f}$ and the drain electrode of the second forward nMOS transistor $Q_{i22f}$ serves as a forward output terminal of the cell $M_{i2}$, configured to transfer the signal stored in the forward capacitor $C_{i2f}$ to the next bit-level cell $M_{i3}$. The second bit-level cell $M_{i2}$ further encompasses a first backward nMOS transistor $Q_{i21g}$ having a drain electrode connected to the second clock signal supply line CL2 through a first backward delay element $D_{i21g}$ and a gate electrode connected to the backward output terminal of the bit-level cell $M_{i3}$ through a second backward delay element $D_{i22g}$; a second backward nMOS transistor $Q_{i22g}$ having a drain electrode connected to a source electrode of the first backward nMOS transistor $Q_{i21g}$, a gate electrode connected to the second clock signal supply line CL2, and a source electrode connected to the ground potential; and a backward capacitor $C_{i2g}$ configured to store the backward information/data of the cell $M_{i2}$, connected in parallel with the second backward nMOS transistor $Q_{i22g}$, wherein an output node connecting the source electrode of the first backward nMOS transistor $Q_{i21g}$ and the drain electrode of the second backward nMOS transistor $Q_{i22g}$ serves as a backward output terminal of the cell $M_{i2}$, configured to transfer the signal stored in the backward capacitor $C_{i2g}$ to the next bit-level cell $M_{i1}$.

A third bit-level cell $M_{i3}$ allocated at the third from the left side on i-th row, being connected to the bit-level cell $M_{i2}$, encompasses a first forward nMOS transistor $Q_{i31f}$ having a drain electrode connected to the first clock signal supply line CL1 through a first forward delay element $D_{i31f}$ and a gate electrode connected to the forward output terminal of the bit-level cell $M_{i2}$ through a second forward delay element $D_{i32f}$; a second forward nMOS transistor $Q_{i32f}$ having a drain electrode connected to a source electrode of the first forward nMOS transistor $Q_{i31f}$, a gate electrode connected to the first clock signal supply line CL1, and a source electrode connected to the ground potential; and a forward capacitor $C_{i3f}$ configured to store the forward information/data of the cell $M_{i3}$, connected in parallel with the second forward nMOS transistor $Q_{i32f}$, wherein an output node connecting the source electrode of the first forward nMOS transistor $Q_{i31f}$ and the drain electrode of the second forward nMOS transistor $Q_{i32f}$ serves as a forward output terminal of the cell $M_{i3}$, configured to transfer the signal stored in the forward capacitor $C_{i3f}$ to the next bit-level cell $M_{i4}$ (illustration is omitted). The third bit-level cell $M_{i3}$ further encompasses a first backward nMOS transistor $Q_{i31g}$ having a drain electrode connected to the second clock signal supply line CL2 through a first backward delay element $D_{i31g}$ and a gate electrode connected to the backward output terminal of the bit-level cell $M_{i4}$ through a second backward delay element $D_{i32g}$; a second backward nMOS transistor $Q_{i32g}$ having a drain electrode connected to a source electrode of the first backward nMOS transistor $Q_{i31g}$, a gate electrode connected to the second clock signal supply line CL2, and a source electrode connected to the ground potential; and a backward capacitor $C_{i3g}$ configured to store the backward information/data of the cell $M_{i3}$, connected in parallel with the second backward nMOS transistor $Q_{i32g}$, wherein an output node connecting the source electrode of the first backward nMOS transistor $Q_{i31g}$ and the drain electrode of the second backward nMOS transistor $Q_{i32g}$ serves as a backward output terminal of the cell $M_{i3}$, configured to transfer the signal stored in the backward capacitor $C_{i3g}$ to the next bit-level cell $M_{i2}$.

A (n−1)-th bit-level cell $M_{i(n-1)}$ allocated at the second (n−1)-th from the left side on i-th row, encompasses a first forward nMOS transistor $Q_{i(n-1)1f}$ having a drain electrode connected to the first clock signal supply line CL1 through a first forward delay element $D_{i(n-1)1f}$ and a gate electrode connected to the forward output terminal of the bit-level cell $M_{i(n-2)}$ (illustration is omitted) through a second forward delay element $D_{i(n-1)2f}$; a second forward nMOS transistor $Q_{i(n-1)2f}$ having a drain electrode connected to a source electrode of the first forward nMOS transistor $Q_{i(n-1)1f}$, a gate electrode connected to the first clock signal supply line CL1, and a source electrode connected to the ground potential; and a forward capacitor $C_{i(n-1)f}$ configured to store the forward information/data of the cell $M_{i(n-1)}$, connected in parallel with the second forward nMOS transistor $Q_{(i(n-1)2f}$, wherein an output node connecting the source electrode of the first forward nMOS transistor $Q_{i(n-1)1f}$ and the drain electrode of the second forward nMOS transistor $Q_{i(n-1)2f}$ serves as a forward output terminal of the cell $M_{i(n-1)}$, configured to transfer the signal stored in the forward capacitor $C_{i(n-1)f}$ to the next bit-level cell $M_{in}$. The (n−1)-th bit-level cell $M_{i(n-1)}$ further encompasses a first backward nMOS transistor $Q_{i(n-1)1g}$ having a drain electrode connected to the second clock signal supply line CL2 through a first backward delay element $D_{i(n-1)1g}$ and a gate electrode connected to the backward output terminal of next bit-level cell $M_{in}$ through a second backward delay element $D_{i(n-1)2g}$; a second backward nMOS transistor $Q_{i(n-1)2g}$ having a drain electrode connected to a source electrode of the first backward nMOS transistor $Q_{i(n-1)1g}$, a gate electrode connected to the second clock signal supply line CL2, and a source electrode connected to the ground potential; and a backward capacitor $C_{i(n-1)g}$ configured to store the backward information/data of the cell $M_{i(n-1)}$, connected in parallel with the second backward nMOS transistor $Q_{i(n-1)2g}$, wherein an output node connecting the source electrode of the first backward nMOS transistor $Q_{i(n-1)1g}$ and the drain electrode of the second backward nMOS transistor $Q_{i(n-1)2g}$ serves as a backward output terminal of the cell $M_{i(n-1)}$, configured to transfer the signal stored in the backward capacitor $C_{i(n-1)g}$ to the next bit-level cell $M_{i(n-2)}$ (illustration is omitted).

A n-th bit-level cell $M_{in}$ allocated at the rightmost side on i-th row, encompasses a first forward nMOS transistor $Q_{in1f}$ having a drain electrode connected to the first clock signal supply line CL1 through a first forward delay element $D_{in1f}$ and a gate electrode connected to the forward output terminal of the bit-level cell $M_{i(n-1)}$ through a second forward delay element $D_{in2f}$; a second forward nMOS transistor $Q_{in2f}$ having a drain electrode connected to a source electrode of the first forward nMOS transistor $Q_{in1f}$, a gate electrode connected to the first clock signal supply line CL1, and a source electrode connected to the ground potential; and a forward capacitor $C_{inf}$ configured to store the forward information/data of the cell $M_{in}$, connected in parallel with the second forward nMOS transistor $Q_{in2f}$, wherein an output node connecting the source electrode of the first forward nMOS transistor $Q_{in1f}$ and the drain electrode of the second forward nMOS transistor $Q_{in2f}$ serves as a forward output terminal of the cell $M_{in}$, configured to transfer the signal stored in the forward capacitor $C_{inf}$ to the second I/O selector 513. The n-th bit-level cell $M_{in}$ further encompasses a first backward nMOS transistor $Q_{in1g}$ having a drain electrode connected to the second clock signal supply line CL2 through a first backward delay element $D_{in1g}$ and a gate electrode connected to the second I/O selector 513 through a second backward delay element $D_{in2g}$; a second backward nMOS transistor $Q_{in2g}$ having a drain electrode connected to a source electrode of the first backward nMOS transistor $Q_{in1g}$, a gate electrode connected to the second clock signal supply line CL2, and a source electrode connected to the ground potential; and a backward capacitor $C_{ing}$ configured to store the backward information/data of the cell $M_{in}$, connected in parallel with the second backward nMOS transistor $Q_{in2g}$, wherein an output node connecting the source electrode of the first backward nMOS transistor $Q_{in1g}$ and the drain electrode of the second backward nMOS transistor $Q_{in2g}$ serves as a backward output terminal of the cell $M_{in}$, configured to transfer the signal stored in the backward capacitor $C_{ing}$ to the next bit-level cell $M_{i(n-1)}$.

When the clock signal supplied from the first clock signal supply line CL1 becomes the logical level of "1", the second forward nMOS transistor $Q_{i12f}$ in the first memory unit $U_1$ begins to discharge the signal charge, which is already stored in the forward capacitor $C_{i1f}$ in the first memory unit $U_1$ at a previous clock cycle. After the clock signal of the logical level of "1", supplied from the first clock signal supply line CL1, is applied to the second forward nMOS transistor $Q_{i12f}$, and the signal charge stored in the forward capacitor $C_{i1f}$ is completely discharged to becomes the logical level of "0", the first forward nMOS transistor $Q_{i11f}$, becomes active as the transfer transistor, delayed by the delay time to determined by the first forward delay element $D_{i11f}$. Thereafter, when the information/data of bit level is entered from the first I/O selector 512 to the gate electrode of the first forward nMOS transistor $Q_{i11f}$, the first forward nMOS transistor $Q_{i11f}$ transfers the information/data to the forward capacitor $C_{i1f}$, delayed by the delay time $t_{d2}$ determined by the second forward delay element $D_{i12f}$. When the clock signal supplied from the first clock signal supply line CL1 becomes the logical level of "0" at a time when time proceeds $1/2TAU_{clock}$, the output node connecting the source electrode of the first forward nMOS transistor $Q_{i11f}$ and the drain electrode of the second forward nMOS transistor $Q_{i12f}$ cannot deliver the information/data, which is entered from the first I/O selector 512 to the gate electrode of the first forward nMOS transistor $Q_{i11f}$, further to the next bit-level cell $M_{i2}$, at a time when time proceeds $1/2TAU_{clock}$, as the information/data is blocked to be transferred to the gate electrode of the next first forward nMOS transistor $Q_{i21f}$ delayed by the delay time $t_{d2}=1/2TAU_{clock}$ determined by the second forward delay element $D_{i22f}$.

When the clock signal supplied from the second clock signal supply line CL2 becomes the logical level of "1", the second backward nMOS transistor $Q_{i12b}$ begins to discharge the signal charge, which is already stored in the backward capacitor $C_{i1b}$ at a previous clock cycle. After the clock signal of the logical level of "1", supplied from the second clock signal supply line CL2, is applied and the signal charge stored in the backward capacitor $C_{i1b}$ is completely discharged to becomes the logical level of "0", the first backward nMOS transistor $Q_{i11b}$ becomes active as the transfer transistor, delayed by the delay time to determined by the first backward delay element $D_{i11b}$. Thereafter, when the information/data is fed from the backward output terminal of the bit-level cell $M_{i2}$ to the gate electrode of the first backward nMOS transistor $Q_{i11b}$, the first backward nMOS transistor $Q_{i11b}$ transfers the information/data stored in the previous bit-level cell $M_{i2}$, further delayed by the delay time $t_{d2}$ determined by the second backward delay element $D_{i12b}$ to the backward capacitor $C_{i1b}$. The output node connecting the source electrode of the first backward nMOS transistor $Q_{i11b}$, and the drain electrode of the second backward nMOS transistor $Q_{i12b}$ delivers the information/data stored in the backward capacitor $C_{i1b}$ to the first I/O selector 512.

When the next clock signal supplied from the first clock signal supply line CL1 becomes the logical level of "1", the second forward nMOS transistor $Q_{i22f}$ in the second memory unit $U_2$ begin to discharge the signal charge, which is already stored in the forward capacitor $C_{i2f}$ in the second memory unit $U_2$ at the previous clock cycle. After the clock signal of the logical level of "1", supplied from the first clock signal supply line CL1, is applied to the second forward nMOS transistor $Q_{i22f}$, and the signal charge stored in the forward capacitor $C_{i2f}$ is completely discharged to becomes the logical level of "0", the first forward nMOS transistor $Q_{i2f1}$ becomes active as the transfer transistor, delayed by the delay time $t_{d1}$ determined by the first forward delay element $D_{i21f}$. Thereafter, when the information/data of bit level stored in the previous forward capacitor $C_{i1f}$ is fed to the gate electrode of the first forward nMOS transistor $Q_{i21f}$, the first forward nMOS transistor $Q_{i21f}$ transfers the information/data, delayed by the delay time $t_{d2}$ determined by the second forward delay element $D_{i22f}$ to the forward capacitor $C_{i2f}$. When the clock signal supplied from the first clock signal supply line CL1 becomes the logical level of "0" at a time when time proceeds $1/2TAU_{clock}$, the output node connecting the source electrode of the first forward nMOS transistor $Q_{i21f}$ and the drain electrode of the second forward nMOS transistor $Q_{i22f}$ cannot deliver the information/data, which is entered to the gate electrode of the first forward nMOS transistor $Q_{i21f}$, further to the next bit-level cell $M_{i3}$, at a time when time proceeds $1/2TAU_{clock}$, as the information/data is blocked to be transferred to the gate electrode of the next first forward nMOS transistor $Q_{i31f}$ delayed by the delay time $t_{d2}=1/2TAU_{clock}$ determined by the second forward delay element $D_{i32f}$.

When the clock signal supplied from the second clock signal supply line CL2 becomes the logical level of "1", the second backward nMOS transistor $Q_{i22b}$ begins to discharge the signal charge, which is already stored in the backward capacitor $C_{i2b}$ at a previous clock cycle. After the clock signal supplied from the second clock signal supply line CL2 of the logical level of "1" is applied and the signal charge stored in the backward capacitor $C_{i2b}$ is completely discharged to becomes the logical level of "0", the first backward nMOS transistor $Q_{i21b}$ becomes active as the transfer transistor, delayed by the delay time $t_{d1}$ determined by the first backward delay element $D_{i21b}$. Thereafter, when the information/data is fed from the backward output terminal of the bit-level cell $M_{i3}$ to the gate electrode of the first backward nMOS transistor $Q_{i21b}$, the first backward nMOS transistor $Q_{i21b}$ transfers the information/data stored in the previous bit-level cell $M_{i3}$, further delayed by the delay time $t_{d2}$ determined by the second backward delay element $D_{i22b}$ to the backward capacitor $C_{i2b}$. When the clock signal supplied from the second clock signal supply line CL2 becomes the logical level of "0" at a time when time proceeds $1/2TAU_{clock}$, the output node connecting the source electrode of the first backward nMOS transistor $Q_{i21b}$ and the drain electrode of the second backward nMOS transistor $Q_{i22b}$ cannot deliver the information/data, which is entered to the gate electrode of the first backward nMOS transistor $Q_{i21b}$, further to the next bit-level cell $M_{i1}$, at a time when time proceeds $1/2TAU_{clock}$, as the information/data is blocked to be transferred to the gate electrode of the next first backward nMOS transistor $Q_{i11b}$ delayed by the delay time $t_{d2}=1/2TAU_{clock}$ determined by the second backward delay element $D_{i12b}$.

When the next clock signal supplied from the first clock signal supply line CL1 becomes the logical level of "1", the second forward nMOS transistor $Q_{i32f}$ in the third memory unit $U_3$ begin to discharge the signal charge, which is already stored in the forward capacitor $C_{i3f}$ in the third memory unit $U_3$ at the previous clock cycle. After the clock signal of the logical level of "1", supplied from the first clock signal supply line CL1, is applied to the second forward nMOS transistor $Q_{i32f}$, and the signal charge stored in the forward capacitor $C_{i3f}$ is completely discharged to becomes the logical level of "0", the first forward nMOS transistor $Q_{i31f}$ becomes active as the transfer transistor, delayed by the delay time $t_{d1}$ determined by the first forward delay element $D_{i31f}$. When the information/data stored in the previous forward capacitor $C_{i2f}$ is fed to the gate electrode of the first forward nMOS transistor $Q_{i31f}$, the first forward nMOS transistor $Q_{i31f}$ transfers the information/data, delayed by the delay time $t_{d2}$ determined by the second forward delay element $D_{i32f}$ to the forward capacitor $C_{i3f}$. When the clock signal supplied from the first clock signal supply line CL1 becomes the logical level of "0" at a time when time proceeds $1/2TAU_{clock}$, the output node connecting the source electrode of the first forward nMOS transistor $Q_{i31f}$ and the drain electrode of the second forward nMOS transistor $Q_{i32f}$ cannot deliver the information/data, which is entered to the gate electrode of the first forward nMOS transistor $Q_{i31f}$, further to the next bit-level cell $M_{i4}$ (illustration is omitted), at a time when time proceeds $1/2TAU_{clock}$, as the information/data is blocked to be transferred to the gate electrode of the next first forward nMOS transistor $Q_{i41f}$ (illustration is omitted) delayed by the delay time $t_{d2}=1/2TAU_{clock}$ determined by the second forward delay element $D_{i42f}$ (illustration is omitted).

When the clock signal supplied from the second clock signal supply line CL2 becomes the logical level of "1", the second backward nMOS transistor $Q_{i32b}$ begins to discharge the signal charge, which is already stored in the backward capacitor $C_{i3b}$ at a previous clock cycle. After the clock signal supplied from the second clock signal supply line CL2 of the logical level of "1" is applied and the signal charge stored in the backward capacitor $C_{i3b}$ is completely discharged to becomes the logical level of "0", the first backward nMOS transistor $Q_{i31b}$ becomes active as the transfer transistor, delayed by the delay time to determined by the first backward delay element $D_{i31b}$. When the information/data is fed from the backward output terminal of the bit-level cell $M_{i3}$ to the gate electrode of the first backward nMOS transistor $Q_{i31b}$, the first backward nMOS transistor $Q_{i31b}$ transfers the information/data stored in the previous bit-level cell $M_{i3}$, further delayed by the delay time $t_{d2}$ determined by the second backward delay element $D_{i32b}$ on to the backward capacitor $C_{i3b}$. When the clock signal supplied from the second clock signal supply line CL2 becomes the logical level of "0" at a time when time proceeds $1/2TAU_{clock}$, the output node connecting the source electrode of the first backward nMOS transistor $Q_{i31b}$ and the drain electrode of the second backward nMOS transistor $Q_{i32b}$ cannot deliver the information/data, which is entered to the gate electrode of the first backward nMOS transistor $Q_{i31b}$, further to the next bit-level cell $M_{i2}$, at a time when time proceeds $1/2TAU_{clock}$, as the information/data is blocked to be transferred to the gate electrode of the next first backward nMOS transistor $Q_{i21b}$ delayed by the delay time $t_{d2}=1/2TAU_{clock}$ determined by the second backward delay element $D_{i22b}$.

When the next clock signal supplied from the first clock signal supply line CL1 becomes the logical level of "1", the second forward nMOS transistor $Q_{i(n-1)2f}$ in (n−1)-th memory unit $U_{(n-1)}$ begin to discharge the signal charge, which is already stored in the forward capacitor $C_{i(n-1)f}$ in (n−1)-th memory unit $U_{(n-1)}$ at the previous clock cycle. And, after the clock signal of the logical level of "1", supplied from the first clock signal supply line CL1, is applied to the second forward nMOS transistor $Q_{i(n-1)2f}$, and the signal charge stored in the forward capacitor $C_{i(n-1)f}$ is completely discharged to becomes the logical level of "0", the first forward nMOS transistor $Q_{i(n-1)1f}$ becomes active as the transfer transistor, delayed by the delay time to determined by the first forward delay element $D_{i(n-1)1f}$. When the information/data stored in the previous forward capacitor $C_{i2f}$ is fed to the gate electrode of the first forward nMOS transistor $Q_{i(n-1)1f}$, the first forward nMOS transistor $Q_{i(n-1)1f}$ transfers the information/data, delayed by the delay time to determined by the second forward delay element $D_{i(n-1)2f}$ to the forward capacitor $C_{i(n-1)f}$. When the clock signal supplied from the first clock signal supply line CL1 becomes the logical level of "0" at a time when time proceeds $1/2TAU_{clock}$, the output node connecting the source electrode of the first forward nMOS transistor $Q_{i(n-1)1f}$ and the drain electrode of the second forward nMOS transistor $Q_{i(n-1)2f}$ cannot deliver the information/data, which is entered to the gate electrode of the first forward nMOS transistor $Q_{i(n-1)1f}$, further to the next bit-level cell $M_{in}$, at a time when time proceeds $1/2TAU_{clock}$, as the information/data is blocked to be transferred to the gate electrode of the next first forward nMOS transistor $Q_{in1f}$ delayed by the delay time $t_{d2}=1/2TAU_{clock}$ determined by the second forward delay element $D_{in2f}$.

When the clock signal supplied from the second clock signal supply line CL2 becomes the logical level of "1", the second backward nMOS transistor $Q_{i(n-1)2b}$ begins to discharge the signal charge, which is already stored in the backward capacitor $C_{i(n-1)b}$ at a previous clock cycle. After the clock signal supplied from the second clock signal supply line CL2 of the logical level of "1" is applied and the signal charge stored in the backward capacitor $C_{i(n-1)b}$ is completely discharged to becomes the logical level of "0", the first backward nMOS transistor $Q_{i(n-1)1b}$ becomes active as the transfer transistor, delayed by the delay time to determined by the first backward delay element $D_{i(n-1)1b}$. Thereafter, when the information/data is fed from the backward output terminal of the bit-level cell $M_{i(n-1)}$ to the gate electrode of the first backward nMOS transistor $Q_{i(n-1)1b}$, the first backward nMOS transistor $Q_{i(n-1)1b}$ transfers the information/data stored in the previous bit-level cell $M_{i(n-1)}$, further delayed by the delay time $t_{d2}$ determined by the second backward delay element $D_{i(n-1)2b}$ to the backward capacitor $C_{i(n-1)b}$. When the clock signal supplied from the second clock signal supply line CL2 becomes the logical level of "0" at a time when time proceeds $1/2TAU_{clock}$, the output node connecting the source electrode of the first backward nMOS transistor $Q_{i(n-1)1b}$ and the drain electrode of the second backward nMOS transistor $Q_{i(n-1)2b}$ cannot deliver the information/data, which is entered to the gate electrode of the first backward nMOS transistor $Q_{i(n-1)1b}$, further to the next bit-level cell $M_{i(n-2)}$ (illustration is omitted), at a time when time proceeds $1/2TAU_{clock}$, as the information/data is blocked to be transferred to the gate electrode of the next first backward nMOS transistor $Q_{i(n-2)1b}$ (illustration is omitted)delayed by the delay time $t_{d2}=1/2TAU_{clock}$ determined by the second backward delay element $D_{i(n-2)2b}$ (illustration is omitted).

When the next clock signal supplied from the first clock signal supply line CL1 becomes the logical level of "1", the second forward nMOS transistor $Q_{in2f}$ in n-th memory unit $U_n$ begin to discharge the signal charge, which is already stored in the forward capacitor $C_{inf}$ in n-th memory unit $U_n$ at the previous clock cycle. After the clock signal of the logical level of "1", supplied from the first clock signal supply line CL1, is applied to the second forward nMOS transistor $Q_{in2f}$, and the signal charge stored in the forward capacitor $C_{inf}$ is completely discharged to becomes the logical level of "0", the first forward nMOS transistor $Q_{in1f}$ becomes active as the transfer transistor, delayed by the delay time to determined by the first forward delay element $D_{in1f}$. When the information/data stored in the previous forward capacitor $C_{i2f}$ is fed to the gate electrode of the first forward nMOS transistor $Q_{in1f}$, the first forward nMOS transistor $Q_{in1f}$ transfers the information/data, delayed by the delay time $t_{d2}$ determined by the second forward delay element $D_{in2f}$ to the forward capacitor $C_{inf}$. The output node connecting the source electrode of the first forward nMOS transistor $Q_{in1f}$ and the drain electrode of the second forward nMOS transistor $Q_{in2f}$ delivers the information/data, which is entered to the gate electrode of the first forward nMOS transistor $Q_{in1f}$ to the second I/O selector 513.

When the clock signal supplied from the second clock signal supply line CL2 becomes the logical level of "1", the second backward nMOS transistor $Q_{in2b}$ begins to discharge the signal charge, which is already stored in the backward capacitor $C_{inb}$ at a previous clock cycle. After the clock signal supplied from the second clock signal supply line CL2 of the logical level of "1" is applied and the signal charge stored in the backward capacitor $C_{inb}$ is completely discharged to becomes the logical level of "0", the first backward nMOS transistor $Q_{in1b}$ becomes active as the transfer transistor, delayed by the delay time to determined by the first backward delay element $D_{in1b}$. Thereafter, when the information/data is fed from the second I/O selector 513 to the gate electrode of the first backward nMOS transistor $Q_{in1b}$, the first backward nMOS transistor $Q_{in1b}$ transfers the information/data received from the second I/O selector 513, further delayed by the delay time $t_{d2}$ determined by the second backward delay element $D_{in2b}$ to the backward capacitor $C_{inb}$. When the clock signal supplied from the second clock signal supply line CL2 becomes the logical level of "0" at a time when time proceeds $1/2TAU_{clock}$, the output node connecting the source electrode of the first backward nMOS transistor $Q_{in1b}$ and the drain electrode of the second backward nMOS transistor $Q_{in2b}$ cannot deliver the information/data, which is entered to the gate electrode of the first backward nMOS transistor $Q_{in1b}$, further to the next bit-level cell $M_{i(n-2)}$ (illustration is omitted), at a time when time proceeds $1/2TAU_{clock}$, as the information/data is blocked to be transferred to the gate electrode of the next first backward nMOS transistor $Q_{i(n-2)1b}$ (illustration is omitted)delayed by the delay time $t_{d2}=1/2TAU_{clock}$ determined by the second backward delay element $D_{i(n-2)2b}$ (illustration is omitted).

In the bidirectional marching main memory shown in FIG. 32, each of the cells $M_{i1}$, $M_{i2}$, $M_{i3}$, . . . , $M_{i,(n-1)}$, $M_{i,n}$ on the i-th row of the bidirectional marching main memory stores the information/data, and transfers bi-directionally the information/data, synchronously with the clock signals supplied respectively from the first clock signal supply line CL1 and the second clock signal supply line CL2, step by step, between the first I/O selector 512 and the second I/O selector 513. As explained about, since each of the cells $M_{i1}$, $M_{i2}$, $M_{i3}$, . . . , $M_{i,n-1}$, $M_{i,n}$ assigned in memory unit $U_1$, $U_2$, $U_3$, . . . , $U_{n-1}$, $U_n$, respectively, and the memory units $U_2$, $U_3$, . . . , $U_{n-1}$, $U_n$ stores information of byte size or word size by the sequence of bit-level cells arrayed in the memory unit $U_2$, $U_3$, . . . , $U_{n-1}$, $U_n$, respectively, the bidirectional marching main memory 31 shown in FIG. 32 stores the information/data of byte size or word size in each of cells $U_1$, $U_2$, $U_3$, . . . , $U_{n-1}$, $U_n$ and transfers bi-directionally the information/data of byte size or word size synchronously with the clock signal, pari passu, in the forward direction and/or reverse direction (backward direction) between a first I/O selector 512 and a second I/O selector 513, so as to provide the processor 11 with the stored information/data of byte size or word size actively and sequentially so that the ALU 112 can execute the arithmetic and logic operations with the stored information/data.

As shown in FIG. 33, a forward isolation transistor $Q_{i23f}$ is provided so as to isolate the signal-storage state of the second bit-level cell $M_{i2}$ in the second memory unit $U_2$ from the signal-storage state of the first bit-level cell $M_{i1}$ in the first memory unit $U_1$, the forward isolation transistor $Q_{i23f}$ transfers forward a signal from the first bit-level cell $M_{i1}$ to the second bit-level cell $M_{i2}$ at a required timing determined by a clock signal, which is supplied through the first clock signal supply line CL1. A backward isolation transistor $Q_{i13}b$ is provided so as to isolate the signal-storage state of the first bit-level cell $M_{i1}$ in the first memory unit $U_1$ from the signal-storage state of the second bit-level cell $M_{i2}$ in the second memory unit $U_2$, the backward isolation transistor $Q_{i13b}$ transfers backward a signal from the second bit-level cell $M_{i2}$ to the first bit-level cell $M_{i1}$ at a required timing determined by a clock signal, which is supplied through the second clock signal supply line CL2. A sequence of the forward isolation transistors $Q_{i23f}$ (i=1 to m; "m" is integer corresponding the byte size or the word size) arrayed in parallel with the memory units $U_1$ and $U_2$ transfers forward the information of byte size or word size, controlled by the clock signal supplied through the clock signal supply line CL1 so that the information of byte size or word size can march along the forward direction, pari passu. A sequence of the backward isolation transistors $Q_{i13b}$ (i=1 to m) arrayed in parallel with the memory units $U_1$ and $U_2$ transfers backward the information of byte size or word size, controlled by the clock signal supplied through the clock signal supply line CL2 so that the information of byte size or word size can march along the backward direction, pari passu.

Similarly, a backward isolation transistor $Q_{i23b}$ is provided to isolate the signal-storage state of the signal-storage state of the second bit-level cell $M_{i2}$ in the second memory unit $U_2$ from the third bit-level cell $M_{i3}$ (the illustration is omitted) in the third memory unit $U_3$, the backward isolation transistor $Q_{i23b}$ transfers backward a signal from the third bit-level cell $M_{i3}$ to the second bit-level cell $M_{i2}$ at a required timing determined by a clock signal, which is supplied through the second clock signal supply line CL2. A sequence of the backward isolation transistors $Q_{i23b}$ (i=1 to m) arrayed in parallel with the memory units $U_2$ and $U_3$ transfers backward the information of byte size or word size, controlled by the clock signal supplied through the clock signal supply line CL2 so that the information of byte size or word size can march along the backward direction, pari passu.

As shown in FIG. 33, a forward isolation transistor $Q_{i(n-1)3f}$ is provided so as to isolate the signal-storage state of the (n−1)-th bit-level cell $M_{i(n-1)}$ in the (n−1)-th memory unit $U_{n-1}$ from the signal-storage state of the (n−2)-th bit-level cell $M_{i(n-2)}$ (the illustration is omitted) in the (n−2)-th memory unit $U_{n-2}$ (the illustration is omitted), the forward isolation transistor $Q_{i(n-1)3f}$ transfers forward a signal from the (n−2)-th bit-level cell $M_{i(n-2)}$ to the (n−1)-th bit-level cell $M_{i(n-1)}$ at a required timing determined by a clock signal, which is supplied through the first clock signal supply line CL1. A sequence of the forward isolation transistors $Q_{i(n-1)3f}$ (i=1 to m) arrayed in parallel with the memory units $U_{n-2}$ and $U_{n-1}$ transfers the information of byte size or word size, controlled by the clock signal supplied through the clock signal supply line CL1 so that the information of byte size or word size can march along the forward direction, pari passu.

A forward isolation transistor $Q_{in3f}$ is provided so as to isolate the signal-storage state of the n-th bit-level cell $M_{in}$ in the n-th memory unit $U_n$ from the signal-storage state of the (n−1)-th bit-level cell $M_{in-1}$ in the (n−1)-th memory unit $U_{n-1}$, the forward isolation transistor $Q_{in3f}$ transfers forward a signal from the (n−1)-th bit-level cell $M_{in-1}$ to the n-th bit-level cell $M_{in}$ at a required timing determined by a clock signal, which is supplied through the first clock signal supply line CL1. A backward isolation transistor $Q_{in3b}$ is provided so as to isolate the signal-storage state of the (n−1)-th bit-level cell $M_{in-1}$ in the (n−1)-th memory unit $U_{n-1}$ from the signal-storage state of n-th bit-level cell $M_{in}$ in the n-th memory unit $U_n$, the backward isolation transistor $Q_{in3b}$ transfers backward a signal from the n-th bit-level cell $M_{in}$ to the (n−1)-th bit-level cell $M_{in-1}$ at a required timing determined by a clock signal, which is supplied through the second clock signal supply line CL2. A sequence of the forward isolation transistors $Q_{in3f}$ (i=1 to m) arrayed in parallel with the memory units $U_{n-1}$ and $U_n$ transfers the information of byte size or word size, controlled by the clock signal supplied through the clock signal supply line CL1 so that the information of byte size or word size can march along the forward direction, pari passu. A sequence of the backward isolation transistors $Q_{in3b}$ (i=1 to m) arrayed in parallel with the memory units $U_{n-1}$ and $U_n$ transfers the information of byte size or word size, controlled by the clock signal supplied through the clock signal supply line CL2 so that the information of byte size or word size can march along the backward direction, pari passu.

In the bidirectional marching main memory shown in FIGS. 32 and 33, the forward capacitor $C_{ijf}$ and the backward capacitor $C_{ijb}$ are merged into a single common capacitor so as to implement random access mode with high locality. FIG. 34 shows an array of i-th row of the m*n matrix (here, "m" is an integer determined by word size) in a gate-level representation of the bidirectional marching main memory 31, which can achieve the random access mode in the bidirectional behavior shown in FIGS. 31(*a*)-(*c*).

As shown in FIG. 34, two kinds of marching AND-gates are assigned to each of the cells $M_{i1}, M_{i2}, M_{i3}, \ldots, M_{i,(n-1)}, M_{i,n}$ on the i-th row so as to establish a bidirectional transfer of information/data with random access mode. The bidirectional marching main memory 31 stores the information/data of bit level in each of cells $M_{i1}, M_{i2}, M_{i3}, \ldots, M_{i,n-1}, M_{i,n}$ and transfers bi-directionally the information/data synchronously with the clock signal, step by step in the forward direction and/or reverse direction (backward direction) between a first I/O selector 512 and a second I/O selector 513.

In the gate-level representation of cell array implementing the marching main memory 31 shown in FIG. 34, a first bit-level cell $M_{i1}$ allocated at the leftmost side on i-th row and connected to first I/O selector 512 encompasses a common capacitor $C_{i1}$ configured to store the information/data, and a forward marching AND-gate $G_{i1f}$ having one input terminal connected to the common capacitor $C_{i1}$, the other input supplied with the first clock signal supply line CL1, and an output terminal connected to one input terminal of the next forward marching AND-gate $G_{(i+1)1f}$ assigned to the adjacent second bit-level cell $M_{(i+1)1}$ on the i-th row, and a backward marching AND-gate $G_{i1b}$ having one input terminal connected to the common capacitor $C_{i1}$, the other input supplied with the second clock signal supply line CL2, and an output terminal connected to the first I/O selector 512.

The first clock signal supply line CL1, configured to drive the forward data-stream, and the second clock signal supply line CL2, configured to drive the backward data-stream, are respectively selected by a clock selector 511, and each of the first clock signal supply line CL1 and the second clock signal supply line CL2 has logical values of "1" and "0". When the logical values of "1" of the first clock signal supply line CL1 is fed to the other input terminal of the forward marching AND-gate $G_{i1}$, the information/data stored in the common capacitor $C_{i1}$ is transferred to a common capacitor $C_{i2}$, assigned to the adjacent second bit-level cell $M_{i2}$, and the common capacitor $C_{i2}$ stores the information/data.

The second bit-level cell $M_{i2}$ on the i-th row of the bidirectional marching main memory 31 encompasses the common capacitor $C_{i2}$ configured to store the information/data, a forward marching AND-gate $G_{i2f}$, which has one input terminal connected to the common capacitor $C_{i2}$, the other input supplied with the first clock signal supply line CL1, and an output terminal connected to one input terminal of the next forward marching AND-gate $G_{13f}$ assigned to the adjacent third bit-level cell $M_{i3}$ on the i-th row, and the backward marching AND-gate $G_{i2b}$ having one input terminal connected to the common capacitor $C_{i2}$, the other input supplied with the second clock signal supply line CL2, and an output terminal connected to one input terminal of the preceding backward marching AND-gate $G_{i1b}$.

Similarly, the third bit-level cell $M_{i3}$ on the i-th row encompasses a common capacitor $C_{i3}$ configured to store the information/data, a forward marching AND-gate $G_{i3f}$ having one input terminal connected to the common capacitor $C_{i3}$, the other input supplied with the first clock signal supply line CL1, and an output terminal connected to one input terminal of the next forward marching AND-gate assigned to the adjacent fourth cell, although the illustration of the fourth cell is omitted, and an backward marching AND-gate $G_{i3b}$ having one input terminal connected to the common capacitor $C_{i3}$, the other input supplied with the second clock signal supply line CL2, and an output terminal connected to one input terminal of the preceding backward marching AND-gate $G_{i2b}$ assigned to the adjacent second bit-level cell $M_{i2}$. When the logical values of "1" of the first clock signal supply line CL1 is fed to the other input terminal of the forward marching AND-gate $G_{i2f}$, the information/data stored in the common capacitor $C_{i2}$ is transferred to the common capacitor $C_{i3}$, assigned to the third bit-level cell $M_{i3}$, and the common capacitor $C_{i3}$ stores the information/data, and when the logical values of "1" of the first clock signal supply line CL1 is fed to the other input terminal of the forward marching AND-gate $G_{i3f}$, the information/data stored in the common capacitor $C_{i3}$ is transferred to the capacitor, assigned to the fourth cell.

An (n−1)-th bit-level cell $M_{i,(n-1)}$ on the i-th row encompasses a common capacitor $C_{i,(n-1)}$, configured to store the information/data, and a forward marching AND-gate $G_{i,(n-1)f}$ having one input terminal connected to the common capacitor $C_{i,(n-1)}$, the other input supplied with the first clock signal supply line CL1, and an output terminal connected to one input terminal of the next forward marching AND-gate $G_{i,nf}$ assigned to the adjacent n-th bit-level cell $M_{i,n}$, which is allocated at the rightmost side on the i-th row and connected to the second I/O selector 513, and an backward marching AND-gate $G_{i,(n-1)b}$, which has one input terminal connected to the common capacitor $C_{i,(n-1)}$, the other input supplied with the second clock signal supply line CL2, and an output terminal connected to one input terminal of the preceding backward marching AND-gate $G_{i,(n-2)b}$ assigned to the adjacent third bit-level cell $M_{i,(n-2)b}$ (illustration is omitted).

An n-th bit-level cell $M_{i,n}$ allocated at the rightmost side on the i-th row and connected to the second I/O selector 513 encompasses a common capacitor $C_{i,n}$ configured to store the information/data, a backward marching AND-gate $G_{inb}$ having one input terminal connected to the common capacitor $C_{in}$, the other input terminal configured to be supplied with the second clock signal supply line CL2, and an output terminal connected to one input terminal of the preceding backward marching AND-gate $G_{i(n-1)b}$ assigned to the adjacent (n−1)-th bit-level cell on the i-th row, and a forward marching AND-gate $G_{i,nf}$ having one input terminal connected to the common capacitor $C_{i,n}$, the other input terminal configured to be supplied with the first clock signal supply line CL1, and an output terminal connected to the second I/O selector 513.

When the logical values of "1" of the second clock signal supply line CL2 is fed to the other input terminal of the backward marching AND-gate $G_{inb}$, the information/data stored in the common capacitor $C_{in}$ is transferred to a common capacitor $C_{i,(n-1)}$, assigned to the adjacent (n−1)-th bit-level cell $M_{i,(n-1)}$ on the i-th row, and the common capacitor $C_{i,(n-1)}$ stores the information/data. Then, when the logical values of "1" of the second clock signal supply line CL2 is fed to the other input terminal of the backward marching AND-gate $G_{i3b}$, the information/data stored in the common capacitor $C_{i3}$ is transferred to the common capacitor $C_{i2}$, assigned to the second bit-level cell $M_{i2}$, and the common capacitor $C_{i2}$ stores the information/data. When the logical values of "1" of the second clock signal supply line CL2 is fed to the other input terminal of the backward marching AND-gate $G_{i2b}$, the information/data stored in the common capacitor $C_{i2}$ is transferred to the common capacitor $C_{i1}$, assigned to the second bit-level cell $M_{i1}$, and the common capacitor $C_{i1}$ stores the information/data, and when the logical values of "1" of the second clock signal supply line CL2 is fed to the other input terminal of the backward marching AND-gate $G_{i1b}$, the information/data stored in the common capacitor $C_{i1}$ is transferred to the first I/O selector 512.

Each of the cells $M_{i1}$, $M_{i2}$, $M_{i3}$, . . . , $M_{i,(n-1)}$, $M_{i,n}$ on the i-th row of the bidirectional marching main memory stores the information/data, and transfers bi-directionally the information/data, synchronously with the clock signals supplied respectively from the first clock signal supply line CL1 and the second clock signal supply line CL2, step by step, between the first I/O selector 512 and the second I/O selector 513. Because each of the cells $M_{i1}$, $M_{i2}$, $M_{i3}$, . . . , $M_{i,n-1}$, $M_{i,n}$ is assigned in memory unit $U_1$, $U_2$, $U_3$, . . . , $U_{n-1}$, $U_n$, respectively, and the memory units $U_2$, $U_3$, . . . , $U_{n-1}$, $U_n$ stores information of byte size or word size by the sequence of bit-level cells arrayed in the memory unit $U_2$, $U_3$, . . . , $U_{n-1}$, $U_n$, respectively, the bidirectional marching main memory 31 shown in FIG. 34 stores the information/data of byte size or word size in each of cells $U_1$, $U_2$, $U_3$, . . . , $U_{n-1}$, $U_n$ and transfers bi-directionally the information/data of byte size or word size synchronously with the clock signal, pari passu, in the forward direction and/or reverse direction (backward direction) between a first I/O selector 512 and a second I/O selector 513, so as to provide the processor 11 with the stored information/data of byte size or word size actively and sequentially so that the ALU 112 can execute the arithmetic and logic operations with the stored information/data.

Position Pointing Strategy

FIG. 35(*a*) shows a bidirectional transferring mode of instructions in a one-dimensional marching main memory adjacent to a processor, where the instructions moves toward the processor, and moves from/to the next memory. FIG. 35(*b*) shows a bidirectional transferring mode of scalar data in a one-dimensional marching main memory adjacent to an ALU 112, the scalar data moves toward the ALU and moves from/to the next memory. FIG. 35(*c*) shows a uni-directional transferring mode of vector/streaming data in a one-dimensional marching main memory adjacent to a pipeline 117, which will be explained in the following exemplary embodiment, the vector/streaming data moves toward the pipeline 117, and moves from the next memory.

An exemplary embodiment of the marching main memory 31 uses positioning to identify the starting point and ending point of a set of successive memory units $U_1, U_2, U_3, \ldots, U_{n-1}, U_n$ in vector/streaming data. On the other hand, for programs and scalar data, each item must have a position index similar to conventional address. FIG. 36(*a*) shows a configuration of conventional main memory, in which every memory units $U_1, U_2, U_3, \ldots, U_{n-1}, U_n$ in are labeled by addresses $A_1, A_2, A_3, \ldots, A_{n-1}, A_n$, FIG. 36(*b*) shows a configuration of one-dimensional marching main memory, in which the positioning of individual memory unit $U_1, U_2, U_3, \ldots, U_{n-1}, U_n$ is not always necessary, but the positioning of individual memory unit $U_1, U_2, U_3, \ldots, U_{n-1}, U_n$ is at least necessary to identify the starting point and ending point of a set of successive memory units in vector/streaming data.

FIG. 37(*a*) shows an inner configuration of present one-dimensional marching main memory, in which the position indexes like existing addresses are not necessary for scalar instruction $I_s$, but the positioning of individual memory unit is at least necessary to identify the starting point and ending point of a set of successive memory units in vector instruction $I_v$, as indicated by hatched circle. FIG. 37(*b*) shows an inner configuration of present one-dimensional marching main memory, in which the position indexes are not necessary for scalar data "b" and "a". However, as shown in FIG. 37(*c*), position indexes are at least necessary to identify the starting point and ending point of a set of successive memory units in vector/streaming data "o", "p", "q", "r", "s", "t", . . . as indicated by hatched circle.

In a marching memory family, which includes a marching-instruction register file 22*a* and a marching-data register file 22*b* connected to the ALU 112, and a marching-instruction cache memory 21*a* and a marching-data cache memory 21*b*, which will both be explained in the following exemplary embodiments, in addition to the marching main memory, the relation between the main memory, the register file and cache memory is such that each has their own position pointing strategy based on the property of locality of reference.

FIG. 38(*a*) shows schematically an example of an overall configuration of present marching main memory implemented by a plurality of pages $P_{i-1,j-1}$, $P_{i,j-1}$, $P_{i+1,j-1}$, $P_{i+2,j-1}$, $P_{i-1,j}$, $P_{i,j}$, $P_{i+1,j}$, $P_{i+2,j}$ for vector/streaming data case. FIG. 38(*b*) shows schematically an example of a configuration of the hatched page $P_{i,j}$, which is implemented by a plurality of files $F_1, F_2, F_3, F_4$ for vector/streaming data case, and each of the pages $P_{i-1,j-1}$, $P_{i,j-1}$, $P_{i+1,j-1}$, $P_{i+2,j-1}$, $P_{i-1,j}$, $P_{i,j}$, $P_{i+1,j}$, $P_{i+2,j}$ can be used for marching cache memories 21*a* and 21*b* in the exemplary embodiment. FIG. 38(*c*) shows schematically an example of a configuration of the hatched file $F_3$, each of the files $F_1, F_2, F_3, F_4$ is implemented by a plurality of memory units $U_1, U_2, U_3, \ldots, U_{n-1}, U_n$ for vector/streaming data case, and each of the files $F_1, F_2, F_3, F_4$ can be used for marching register files 22*a* and 22*b* in the exemplary embodiment.

Similarly, FIG. 39(*a*) shows schematically an example of an overall configuration of present marching main memory implemented by a plurality of pages $P_{r-1,s-1}$, $P_{r,s-1}$, $P_{r+1,s-1}$, $P_{r+2,s-1}$, $P_{r-1,s}$, $P_{r,s}$, $P_{r+1,s}$, $P_{r+2,s}$ for programs/scalar data case, where each pages has its own position index as an address. FIG. 39(*b*) shows schematically an example of a configuration of the hatched page $P_{r-1,s}$ and the driving positions of the page $P_{r-1,s}$, using digits in the binary system, each of the page $P_{r-1,s-1}$, $P_{r,s-1}$, $P_{r+1,s-1}$, $P_{r+2,s-1}$, $P_{r-1,s}$, $P_{r,s}$, $P_{r+1,s}$, $P_{r+1,s}$ is implemented by a plurality of files $F_1, F_2, F_3, F_4$ for programs/scalar data case. Each of the page $P_{r-1,s-1}$, $P_{r,s-1}$, $P_{r+1,s-1}$, $P_{r+2,s-1}$, $P_{r-1,s}$, $P_{r,s}$, $P_{r+1,s}$, $P_{r+2,s}$ can be used for marching cache memories 21*a* and 21*b* in the exemplary embodiment, where each of the files $F_1, F_2, F_3, F_4$ has its own position index as address. FIG. 39(*c*) shows schematically an example of a configuration of the hatched file $F_3$ and the driving positions of the file $F_3$, using digits 0, 1, 2, 3 in the binary system, each of the files $F_1, F_2, F_3, F_4$ is implemented by a plurality of memory units $U_1, U_2, U_3, \ldots, U_n$, $U_{n+1}$, $U_{n+2}$, $U_{n+3}$, $U_{n+4}$, $U_{n+5}$ for programs/scalar data case. Each of the files $F_1, F_2, F_3, F_4$ can be used for a marching register files 22*a* and 22*b* in the exemplary embodiment, where each memory units $U_1, U_2, U_3, \ldots, U_n, U_{n+1}, U_{n+2}, U_{n+3}, U_{n+4}, U_{n+5}$ has its own position index n+4, n+3, n+2, . . . , 5, 4, 3, 2, 1, 0 as address. FIG. 39(*c*) represents position pointing strategy for all of the cases by digits in the binary system.

As shown in FIG. 39(*c*), the n binary digits identify a single memory unit among $2^n$ memory units, respectively, in a memory structure having an equivalent size corresponding to the size of a marching register file. And, as shown in FIG. 39(*b*), the structure of one page has an equivalent size corresponding to the size of a marching cache memory, which is represented by two digits which identify four files $F_1, F_2, F_3, F_4$, while the structure of one marching main memory is represented by three digits which identify eight pages $P_{r-1,s-1}$, $P_{r,s-1}$, $P_{r+1,s-1}$, $P_{r+2,s-1}$, $P_{r-1,s}$, $P_{r,s}$, $P_{r+1,s}$, $P_{r+2,s}$ in the marching main memory as shown in FIG. 39(*a*).

Speed/Capability

The speed gap between memory access time and the CPU cycle time in a conventional computer system is, for example, 1:100. However, the speed of the marching memory access time is equal to the CPU cycle time in the computer system of the exemplary embodiment. FIG. 40 compares the speed/capability of the conventional computer system without cache with that of the marching main memory 31. That is, FIG. 40(*b*) shows schematically the speed/capability of the marching main memory 31, implemented by one hundred of memory units $U_1, U_2, U_3, \ldots, U_{100}$, and compares with the speed/capability of the existing memory shown in FIG. 40(*a*). We can also support 99 additional simultaneous memory units of the marching main memory 31, on the condition that necessary processing units are available to use the data from the marching main memory 31. Therefore, one memory unit time $T_{mue}$ in the conventional computer system is estimated to be equal to one hundred of the memory unit streaming time $T_{mus}$ of the marching main memory 31.

FIG. 41 compares the speed/capability of the worst case of the existing memory for scalar data or program instructions with that of the marching main memory 31. The hatched portion of FIG. 41(*b*) shows schematically the speed/capability of the marching main memory 31, implemented by one hundred of memory units $U_1, U_2, U_3, \ldots, U_{100}$, and compares with the speed/capability of the worst case of the existing memory shown in FIG. 41(*a*). In a worst case, 99 memory units of the marching main memory 31 can be read, but they are not available due to a scalar program's requirement.

FIG. 42 compares the speed/capability of conventional memory for scalar data or program instructions with that of the marching main memory 31. FIG. 42(*b*) shows schematically the speed/capability of the marching main memory 31, implemented by one hundred of memory units $U_1, U_2, U_3, \ldots, U_{100}$, and compares with the speed/capability of the typical case of the existing memory shown in FIG. 42(*a*). In the typical case, 99 memory units can be read but only several memory units are available, as shown by hatched memory units in the existing memory, by speculative data preparation in a scalar program.

FIG. 43 compares the speed/capability of the conventional case of the existing memory for scalar data case with that of the marching main memory 31. FIG. 43(*b*) shows schematically the speed/capability of the marching main memory 31, implemented by one hundred of memory units $U_1, U_2, U_3, \ldots, U_{100}$, and compares with the speed/capability of the existing memory shown in FIG. 43(*a*). Similar to the case shown in FIGS. 34(*a*)-(*b*), in the conventional case, 99 memory units can be read but only several memory units are available, as shown by hatched memory units in the existing memory, by speculative data preparation in a scalar data or program instructions in multi-thread parallel processing.

FIG. 44 compares the speed/capability of the best case of the conventional memory for streaming data, vector data or program instructions case with that of the marching main memory 31. That is, FIG. 44(*b*) shows schematically the speed/capability of the marching main memory 31, implemented by one hundred of memory units $U_1, U_2, U_3, \ldots, U_{100}$, and compares with the speed/capability of the best case of the conventional memory shown in FIG. 44(*a*). In the best case, one hundred memory units of the marching main memory 31 are usable for streaming data and data parallel.

Two-Dimensional Marching Main Memory

The memory units can be arranged two-dimensionally on a chip as shown in FIGS. 45-51 so that various modes of operation can be achieved without a switch/network. According to the two-dimensional marching main memory 31 of the exemplary embodiment shown in FIGS. 45-51, the memory units $U_{11}, U_{12}, U_{13}, \ldots, U_{1,v-1}, U_{1v}; U_{21}, U_{22}, U_{23}, U_{2,v-2}, U_{2v}; \ldots; U_{u1}, U_{u2}, U_{u3}, \ldots, U_{u,v-1}, U_{uv}$ are not required of the refreshment, because all of the memory units $U_{11}, U_{12}, U_{13}, \ldots, U_{1,v-1}, U_{1v}; U_{22}, U_{22}, U_{23}, \ldots, U_{2,v-2}, U_{2v}; \ldots; U_{u1}, U_{u2}, U_{u3}, \ldots, U_{u,v-1}, U_{uv}$ are usually refreshed automatically due to the information-moving scheme (information-marching scheme). And then addressing to each of memory units $U_{11}, U_{12}, U_{13}, \ldots, U_{1,v-1}, U_{1v}; U_{22}, U_{22}, U_{23}, \ldots, U_{2,v-2}, U_{2v}; \ldots; U_{u1}, U_{u2}, U_{u3}, \ldots, U_{u,v-1}, U_{uv}$ disappears and required information is heading for its destination unit connected to the edge of the memory. The mechanism of accessing the two-dimensional marching main memory 31 of the exemplary embodiment is unique compared to existing memory schemes that are starting from the addressing mode to read/write information in the conventional computer system. Therefore, according to the two-dimensional marching main memory 31 of the exemplary embodiment, the memory-accessing process without addressing mode in the computer system of the exemplary embodiment is simpler than existing memory schemes of the conventional computer system.

Energy Consumption

To clarify the improvement of architecture, design and implementation of the computer system having the above discussed embodiments, the improvement in energy consumption will be explained. FIG. 52(*a*) shows that the energy consumption in microprocessors can be decomposed into static power consumption and dynamic power consumption. In the dynamic power consumption shown in FIG. 52(*a*), net and overhead of the power consumption are shown in FIG. 52(*b*). As shown in FIG. 52(*c*), only the net energy portions are practically necessary to operate a given job in a computer system, so these pure energy parts require the lowest level of energy consumption to perform the computer system. This means the shortest processing time is achieved by the net energy consumed shown in FIG. 52(*c*).

Even though some efforts are introduced into architecting, designing and implementing processors, there are bottlenecks in the conventional architecture as shown in FIG. 1. In the conventional architecture, there are various issues in the von Neumann computer, as follows:

1) Programs are stored like data in memory;
2) All processing is basically sequential in a uni-processor;
3) The operation of programs is the sequential execution of instructions;
4) Vector data is sequentially processed by the CPU with vector instructions;
5) Streaming data is sequentially processed with threads;
6) Programs then threads are arranged sequentially;
7) Data parallel consists of an arrangement of data as a vector: and
8) Streaming data is a flow of data From the properties of a conventional computer, the storage of programs and data follow sequential arrangements, meaning the regular arrangement of instructions exists in a program and the corresponding data.

In the computer system of the present invention shown in FIG. 2, the access of instructions in the marching main memory 31 is not necessary, because instructions are actively accessed directly be the processor 11. Similarly, the access of data in the marching main memory 31 is not necessary, because data is actively accessed directly by the processor 11.

FIG. 53 shows an actual energy consumption distribution over a processor including registers and caches in the conventional architecture, estimated by William J. Dally, et al., in "Efficient Embedded Computing", Computer, vol. 41, no. 7, 2008, pp. 27-32. In FIG. 53, an estimation of the power consumption distribution on only the whole chip, except for wires between chips is disclosed. The instruction supply power consumption is estimated to be 42%, the data supply power consumption is estimated to be 28%, the clock and control logic power consumption is estimated to be 24%, and the arithmetic power consumption is estimated to be 6%. Therefore, the instruction supply and data supply power consumptions are relatively larger than of the clock/control logic power consumption and the arithmetic power consumption, which is ascribable to the inefficiency of cache/register accessing with lots of wires and some software overhead due to access ways of these caches and registers in addition to non-refreshment of all the memories, caches and registers.

Since the ratio of the instruction supply power consumption to the data supply power consumption is 3:2, and the ratio of the clock and control logic power consumption to the arithmetic power consumption is 4:1, by using the computer system shown in FIG. 2, data supply power consumption can be reduced up to 20% by using the marching main memory 31 at least partly so that the instruction supply power consumption becomes 30%, while the arithmetic power consumption can be increased to 10% so that the clock and control logic power consumption become 40%, which means that the sum of the instruction supply power consumption and the data supply power consumption can be made 50%, and the sum of the clock and control logic power consumption and the arithmetic power consumption can be made 50%.

If the data supply power consumption is reduced to 10%, the instruction supply power consumption becomes 15%, and if the arithmetic power consumption is increased to 15%, the clock and control logic power consumption will become 60%, which means that the sum of the instruction supply power consumption and the data supply power consumption can be made 35%, while the sum of the clock and control logic power consumption and the arithmetic power consumption can be made 75%.

The conventional computer system dissipates energy, as shown in the FIG. 54(*a*),with a relatively large average active time for addressing and read/writing memory units, accompanied by wire delay time. The present computer system dissipates smaller energy as shown in the FIG. 54(*b*), because the present computer system has a shorter average active smooth time through marching memory, and the same data can be processed faster than the conventional computer system with less energy.

Additional Embodiments

As shown in FIG. 55, an exemplary embodiment of a computer system includes a processor 11 and a marching main memory 31. The processor 11 includes a control unit 111 having a clock generator 113 configured to generate a clock signal, an arithmetic logic unit (ALU) 112 configured to execute arithmetic and logic operations synchronized with the clock signal, a marching-instruction register file (RF) 22*a* connected to the control unit 111 and a marching-data register file (RF) 22*b* connected to the ALU 112.

Although the illustration is omitted, very similar to the marching main memory 31 shown in FIGS. 3-24, 25(*a*), 25(*b*), 26 and 45-51, the marching-instruction register file 22*a* has an array of instruction register units, instruction-register input terminals of the third array configured to receive the stored instruction from the marching main memory 31, and instruction-register output terminals of the third array, configured to store instruction in each of instruction register units and to transfer successively and periodically the stored instruction in each of instruction register units to an adjacent instruction register unit being synchronized with the clock signal from the instruction register units adjacent to the instruction-register input terminals toward the instruction register units adjacent to the instruction-register output terminals, so as to provide actively and sequentially instruction implemented by the stored instruction to the control unit 111 through the instruction-register output terminals so that the control unit 111 can execute operations with the instruction.

Further similar to the marching main memory 31 shown in FIGS. 3-24, 25(*a*), 25(*b*), 26 and 45-51, the marching-data register file 22*b* has an array of data register units, data-register input terminals of the fourth array configured to receive the stored data from the marching main memory 31, and data-register output terminals of the fourth array, configured to store data in each of data register units and to transfer successively and periodically the stored data in each of data register units to an adjacent data register unit being synchronized with the clock signal from the data register units adjacent to the data-register input terminals toward the data register units adjacent to the data-register output terminals, so as to provide actively and sequentially the data to the ALU 112 through the data-register output terminals so that the ALU 112 can execute operations with the data, although the detailed illustration of, the marching-data register file 22*b* is omitted.

As shown in FIG. 55, a portion of the marching main memory 31 and the marching-instruction register file 22*a* are electrically connected by a plurality of joint members 54, and remaining portion of the marching main memory 31 and the marching-data register file 22*b* are electrically connected by another plurality of joint members 54.

The resultant data of the processing in the ALU 112 are sent out to the marching-data register file 22*b*. Therefore, as represented by bidirectional arrow $PHI(Greek-letter)_{24}$, data are transferred bi-directionally between the marching-data register file 22*b* and the ALU 112. Furthermore, the data stored in the marching-data register file 22*b* are sent out to the marching main memory 31 through the joint members 54. Therefore, as represented by bidirectional arrow $PHI_{23}$, data are transferred bi-directionally between the marching main memory 31 and the marching-data register file 22*b* through the joint members 54.

On the contrary, as represented by uni-directional arrows $ETA(Greek-letter)_{22}$ and $ETA_{23}$, as to the instructions movement, there is only one way of instruction-flow from the marching main memory 31 to the marching-instruction register file 22*a*, and from the marching-instruction register file 22*a* to the control unit 111.

In the exemplary embodiment of the computer system shown in FIG. 55, there are no buses consisting of the data bus and address bus because the whole computer system has no wires, even in any data exchange between the marching main memory 31 and the marching-instruction register file 22*a*, between the marching main memory 31 and the marching-data register file 22*b*, between the marching-instruction register file 22*a* and the control unit 111 and between the marching-data register file 22*b* and the ALU 112, while the wires or the buses implement the bottleneck in the conventional computer system. As there are no global wires, which generate time delay and stray capacitances between these wires, the computer system of the exemplary embodiment can achieve much higher processing speed and lower power consumption.

Since other functions, configurations, and ways of operation of the computer system pertaining to the exemplary embodiment are substantially similar to the functions, configurations, way of operation already explained in the exemplary embodiment, overlapping or redundant description may be omitted.

As shown in FIG. 56, another exemplary embodiment of a computer system a processor 11, a marching-cache memory (21*a*, 21*b*) and a marching main memory 31. Similar to the above exemplary embodiments, the processor 11 includes a control unit 111 having a clock generator 113 configured to generate a clock signal, an arithmetic logic unit (ALU) 112 configured to execute arithmetic and logic operations synchronized with the clock signal, a marching-instruction register file (RF) 22*a* connected to the control unit 111 and a marching-data register file (RF) 22*b* connected to the ALU 112.

The marching-cache memory (21*a*, 21*b*) embraces a marching-instruction cache memory 21*a* and a marching-data cache memory 21*b*. Although the illustration is omitted, very similar to the marching main memory 31 shown in FIGS. 3-24, 25(*a*), 25(*b*), 26 and 45-51, each of the marching-instruction cache memory 21*a* and the marching-data cache memory 21*b* has an array of cache memory units at locations corresponding to a unit of information, cache input terminals of the array configured to receive the stored information from the marching main memory 31, and cache output terminals of the array, configured to store information in each of cache memory units and to transfer, synchronously with the clock signal, step by step, the information each to an adjacent cache memory unit, so as to provide actively and sequentially the stored information to the processor 11 so that the ALU 112 can execute the arithmetic and logic operations with the stored information.

As shown in FIG. 56, a portion of the marching main memory 31 and the marching-instruction cache memory 21*a* are electrically connected by a plurality of joint members 52, and remaining portion of the marching main memory 31 and the marching-data cache memory 21*b* are electrically connected by another plurality of joint members 52. Furthermore, the marching-instruction cache memory 21*a* and the marching-instruction register file 22*a* are electrically connected by a plurality of joint members 51, and the marching-data cache memory 21*b* and the marching-data register file 22*b* are electrically connected by another plurality of joint members 51.

The resultant data of the processing in the ALU 112 are sent out to the marching-data register file 22*b*, and, as represented by bidirectional arrow PHI(Greek-letter)$_{34}$, data are transferred bi-directionally between the marching-data register file 22*b* and the ALU 112. Furthermore, the data stored in the marching-data register file 22*b* are sent out to the marching-data cache memory 21*b* through the joint members 51, and, as represented by bidirectional arrow PHI$_{33}$, data are transferred bi-directionally between the marching-data cache memory 21*b* and the marching-data register file 22*b* through the joint members 51. Furthermore, the data stored in the marching-data cache memory 21*b* are sent out to the marching main memory 31 through the joint members 52, and, as represented by bidirectional arrow PHI$_{32}$, data are transferred bi-directionally between the marching main memory 31 and the marching-data cache memory 21*b* through the joint members 52.

On the contrary, as represented by uni-directional arrows ETA(Greek-letter)$_{31}$, eta$_{32}$ and eta$_{33}$, as to the instructions movement, there is only one way of instruction-flow from the marching main memory 31 to the marching-instruction cache memory 21*a*, from the marching-instruction cache memory 21*a* to the marching-instruction register file 22*a*, and from the marching-instruction register file 22*a* to the control unit 111.

In the exemplary embodiment of the computer system shown in FIG. 56, there are no buses consisting of the data bus and address bus because the whole computer system has no global wires even in any data exchange between the marching main memory 31 and the marching-instruction cache memory 21*a*, between the marching-instruction cache memory 21*a* and the marching-instruction register file 22*a*, between the marching main memory 31 and the marching-data cache memory 21*b*, between the marching-data cache memory 21*b* and the marching-data register file 22*b*, between the marching-instruction register file 22*a* and the control unit 111 and between the marching-data register file 22*b* and the ALU 112, while the wires or the buses implement the bottleneck in the conventional computer system. As there are no global wires, which generate time delay and stray capacitances between these wires, this exemplary embodiment of the computer system can achieve much higher processing speed and lower power consumption.

Since other functions, configurations, way of operation of the computer system pertaining to the exemplary embodiment are substantially similar to the functions, configurations, way of operation already explained in the first and second embodiments, overlapping or redundant description may be omitted.

As shown in FIG. 57(*a*), the ALU 112 in the exemplary embodiment of the computer system may includes a plurality of arithmetic pipelines $P_1, P_2, P_3, \ldots, P_n$ configured to receive the stored information through marching register units $R_{11}, R_{12}, R_{13}, \ldots, R_{1n}; R_{21}, R_{22}, R_{23}, \ldots, R_{2n}$, in which data move in parallel with the alignment direction of the arithmetic pipelines $P_1, P_2, P_3, \ldots, P_n$. In case that vector data are stored, marching-vector register units $R_{11}, R_{12}, R_{13}, \ldots, R_{1n}; R_{21}, R_{22}, R_{23}, \ldots, R_{2n}$ can be used.

Furthermore, as shown in FIG. 57(*b*), a plurality of marching cache units $C_{11}, C_{12}, C_{13}, \ldots, C_{1n}; C_{21}, C_{22}, C_{23}, \ldots, C_{2n}; C_{31}, C_{32}, C_{33}, \ldots, C_{3n}$ can be aligned in parallel.

As shown in FIG. 58, the ALU 112 in the exemplary embodiment of the computer system may include a single processor core 116, and as represented by cross-directional arrows, the information can moves from the marching-cache memory 21 to the marching-register file 22, and from the marching-register file 22 to the processor core 116. The resultant data of the processing in the processor core 116 are sent out to the marching-register file 22 so that data are transferred bi-directionally between the marching-register file 22 and the processor core 116. Furthermore, the data stored in the marching-register file 22 are sent out to the marching-cache memory 21 so that data are transferred bi-directionally between the marching-cache memory 21 and the marching-register file 22. In case of instructions movement, there is no flow along the opposite direction of the information to be processed.

As shown in FIG. 59, the ALU 112 in the exemplary embodiment of the computer system may include a single arithmetic pipeline 117, and as represented by cross-directional arrows, the information can moves from the marching-cache memory 21 to the marching-vector register file 22*v*, and from the marching-vector register file 22*v* to the arithmetic pipeline 117. The resultant data of the processing in the arithmetic pipeline 117 are sent out to the marching-vector register file 22*v* so that data are transferred bi-directionally between the marching-vector register file 22*v* and the arithmetic pipeline 117. Furthermore, the data stored in the marching-vector register file 22*v* are sent out to the marching-cache memory 21 so that data are transferred bi-directionally between the marching-cache memory 21 and the marching-vector register file 22*v*. In case of instructions movement, there is no flow along the opposite direction of the information to be processed.

As shown in FIG. 60, the ALU 112 in the exemplary embodiment of the computer system may include a plurality of processor cores $116_{-1}, 116_{-2}, 116_{-3}, 116_{-4}, \ldots, 116_{-m}$, and as represented by cross-directional arrows, the information can moves from the marching-cache memory 21 to the marching-register file 22, and from the marching-register file 22 to the processor cores $116_{-1}$, $116_{-2}$, $116_{-3}$, $116_{-4}$, . . . , $116_{-m}$. The resultant data of the processing in the processor cores $116_{-1}$, $116_{-2}$, $116_{-3}$, $116_{-4}$, . . . , $116_{-m}$ are sent out to the marching-register file 22 so that data are transferred bi-directionally between the marching-register file 22 and the processor cores $116_{-1}$, $116_{-2}$, $116_{-3}$, $116_{-4}$, . . . , $116_{-m}$. Furthermore, the data stored in the marching-register file 22 are sent out to the marching-cache memory 21 so that data are transferred bi-directionally between the marching-cache memory 21 and the marching-register file 22. In case of instructions movement, there is no flow along the opposite direction of the information to be processed.

As shown in FIG. 61, the ALU 112 in the exemplary embodiment of the computer system may include a plurality of arithmetic pipelines $117_{-1}$, $117_{-2}$, $117_{-3}$, $117_{-4}$, . . . , $117_{-m}$, and as represented by cross-directional arrows, the information can moves from the marching-cache memory 21 to the marching-vector register file 22*v*, and from the marching-vector register file 22*v* to the arithmetic pipelines $117_{-1}$, $117_{-2}$, $117_{-3}$, $117_{-4}$, . . . , $117_{-m}$. The resultant data of the processing in the arithmetic pipelines $117_{-1}$, $117_{-2}$, $117_{-3}$, $117_{-4}$, . . . , $117_{-m}$ are sent out to the marching-vector register file 22*v* so that data are transferred bi-directionally between the marching-vector register file 22*v* and the arithmetic pipelines $117_{-1}$, $117_{-2}$, $117_{-3}$, $117_{-4}$, . . . , $117_{-m}$. Furthermore, the data stored in the marching-vector register file 22*v* are sent out to the marching-cache memory 21 so that data are transferred bi-directionally between the marching-cache memory 21 and the marching-vector register file 22*v*. In case of instructions movement, there is no flow along the opposite direction of the information to be processed.

As shown in FIG. 62(*b*), the ALU 112 in the exemplary embodiment of the computer system may include a plurality of arithmetic pipelines $117_{-1}$, $117_{-2}$, $117_{-3}$, $117_{-4}$, . . . , $117_{-m}$, and a plurality of marching cache memories $21_{-1}$, $21_{-2}$, $21_{-3}$, $21_{-4}$, . . . , $21_{-m}$ are electrically connected to the marching main memory 31. Here, a first marching-vector register file $22v_{-1}$ is connected to the first marching-cache memory 214, and a first arithmetic pipeline $117_{-1}$ is connected to the first marching-vector register file $22v_{-1}$. A second marching-vector register file $22v_{-2}$ is connected to the second marching-cache memory $21_{-2}$, and a second arithmetic pipelines $117_{-2}$ is connected to the second marching-vector register file $22v_{-2}$; a third marching-vector register file $22v_{-3}$ is connected to the third marching-cache memory $21_{-3}$, and a third arithmetic pipelines $117_{-3}$ is connected to the third marching-vector register file $22v_{-3}$; . . . ; and a m-th marching-vector register file $22v_{-m}$ is connected to the m-th marching-cache memory $21_{-m}$, and a m-th arithmetic pipelines $117_{-m}$ is connected to the m-th marching-vector register file $22v_{-m}$.

The information moves from the marching main memory 31 to the marching cache memories $21_{-1}$, $21_{-2}$, $21_{-3}$, $21_{-4}$, . . . , $21_{-m}$ in parallel, from marching cache memories $21_{-1}$, $21_{-2}$, $21_{-3}$, $21_{-4}$, . . . , $21_{-m}$ to the marching-vector register files $22v_{-1}$, $22v_{-2}$, $22v_{-3}$, $22v_{-4}$, . . . , $22v_{-m}$ in parallel, and from the marching-vector register files $22v_{-1}$, $22v_{-2}$, $22v_{-3}$, $22v_{-4}$, . . . , $22v_{-m}$ to the arithmetic pipelines $117_{-1}$, $117_{-2}$, $117_{-3}$, $117_{-4}$, . . . , $117_{-m}$ in parallel. The resultant data of the processing in the arithmetic pipelines $117_{-1}$, $117_{-2}$, $117_{-3}$, $117_{-4}$, . . . , $117_{-m}$ are sent out to the marching-vector register files $22v_{-1}$, $22v_{-2}$, $22v_{-3}$, $22v_{-4}$, . . . , $22v_{-m}$ so that data are transferred bi-directionally between the marching-vector register files $22v_{-1}$, $22v_{-2}$, $22v_{-3}$, $22v_{-4}$, . . . , $22v_{-m}$ and the arithmetic pipelines $117_{-1}$, $117_{-2}$, $117_{-3}$, $117_{-4}$, . . . , $117_{-m}$. Furthermore, the data stored in the marching-vector register files $22v_{-1}$, $22v_{-2}$, $22v_{-3}$, $22v_{-4}$, . . . , $22v_{-m}$ are sent out to the marching cache memories $21_{-1}$, $21_{-2}$, $21_{-3}$, $21_{-4}$, . . . , $21_{-m}$ so that data are transferred bi-directionally between the marching cache memories $21_{-1}$, $21_{-2}$, $21_{-3}$, $21_{-4}$, . . . , $21_{-m}$ and the marching-vector register files $22v_{-1}$, $22v_{-2}$, $22v_{-3}$, $22v_{-4}$, . . . , $22v_{-m}$, and the data stored in the marching cache memories $21_{-1}$, $21_{-2}$, $21_{-3}$, $21_{-4}$, . . . , $21_{-m}$ are sent out to the marching main memory 31 so that data are transferred bi-directionally between the marching main memory 31 and the marching cache memories $21_{-1}$, $21_{-2}$, $21_{-3}$, $21_{-4}$, . . . , $21_{-m}$. In case of instructions movement, there is no flow along the opposite direction of the information to be processed.

On the contrary, as shown FIG. 62(*a*), in the ALU 112 of the conventional computer system including a plurality of arithmetic pipelines $117_{-1}$, $117_{-2}$, $117_{-3}$, $117_{-4}$, . . . , $117_{-m}$, a plurality of conventional cache memories $321_{-1}$, $321_{-2}$, $321_{-3}$, $321_{-4}$, . . . , $321_{-m}$ are electrically connected to the conventional main memory 331 through wires and/or buses which implement von Neumann bottleneck 325. Information moves from the conventional main memory 331 to the conventional cache memories $321_{-1}$, $321_{-2}$, $321_{-3}$, $321_{-4}$, . . . , $321_{-m}$ in parallel through von Neumann bottleneck 325, from conventional cache memories $321_{-1}$, $321_{-2}$, $321_{-3}$, $321_{-4}$, . . . , $321_{-m}$ to the conventional-vector register files (RFs) $322v_{-1}$, $322v_{-2}$, $322v_{-3}$, $322v_{-4}$, . . . , $322v_{-m}$ in parallel, and from the conventional-vector register files $322v_{-1}$, $322v_{-2}$, $322v_{-3}$, $322v_{-4}$, . . . , $322v_{-m}$ to the arithmetic pipelines $117_{-1}$, $117_{-2}$, $117_{-3}$, $117_{-4}$, . . . , $117_{-m}$ in parallel.

In the exemplary embodiment of the computer system shown in FIG. 62(*b*), there are no buses consisting of the data bus and address bus because the whole system has no global wires even in any data exchange between the arithmetic pipelines $117_{-1}$, $117_{-2}$, $117_{-3}$, $117_{-4}$, . . . , $117_{-m}$ and the marching main memory 31, while the wires or the buses implement the bottleneck in the conventional computer system as shown in FIG. 62(*a*). As there are no global wires, which generate time delay and stray capacitances between these wires, the computer system shown in FIG. 62(*b*) can achieve much higher processing speed and lower power consumption.

As shown in FIG. 63, another exemplary embodiment of the computer system includes a conventional main memory 31*s*, a mother marching main memory $31_{-0}$ connected to the conventional main memory 31*s*, and a plurality of processing units $12_{-1}$, $12_{-2}$, $12_{-3}$, . . . , configured to communicate with mother marching main memory $31_{-0}$ so as to implement a high performance computing (HPC) system, which can be used for graphics processing unit (GPU)-based general-purpose computing. Although the illustration is omitted, the HPC system of the exemplary embodiment further includes a control unit 111 having a clock generator 113 configured to generate a clock signal, and a field programmable gate array (FPGA) configured to switch-control operations of the plurality of processing units $12_{-1}$, $12_{-2}$, $12_{-3}$, . . . , optimizing the flow of crunching calculations by running parallel, constructing to help manage and organize bandwidth consumption. FPGA is, in essence, a computer chip that can rewire itself for a given task. FPGA can be programmed with hardware description languages such as VHDL or Verilog.

The first processing unit $12_{-1}$ encompasses a first branched-marching main memory $31_{-1}$, a plurality of first marching cache memories $21_{-11}$, $21_{-12}$, . . . , $21_{-1p}$ electrically connected respectively to the first branched-marching main memory 31$_{-1}$, a plurality of first marching-vector register files 22*v*$_{-11}$, 22*v*$_{-12}$, . . . , 22*v*$_{-1p}$ electrically connected respectively to the first marching cache memories 21$_{-11}$, 21$_{-12}$, . . . , 21$_{-1p}$, a plurality of first arithmetic pipelines 117$_{-11}$, 117$_{-12}$, . . . , 117$_{-1p}$ electrically connected respectively to the first marching-vector register files 22*v*$_{-11}$, 22*v*$_{-12}$, . . . , 22*v*$_{-1p}$.

Similar to the configurations shown in FIGS. 3-24, 25(*a*), 25(*b*), 26 and 45-51 etc., each of the mother marching main memory 31$_{-0}$, the first branched-marching main memory 31$_{-1}$, the first marching cache memories 21$_{-11}$, 21$_{-12}$, . . . , 21$_{-1p}$, and the first marching-vector register files 22*v*$_{-11}$, 22*v*$_{-12}$, . . . , 22*v*$_{-1p}$ encompasses an array of memory units, input terminals of the array and output terminals of the array, configured to store information in each of memory units and to transfer synchronously with the clock signal, step by step, from a side of input terminals toward the output terminals.

Because the operations of the mother marching main memory 31$_{-0}$, the first branched-marching main memory 31$_{-1}$, the first marching cache memories 21$_{-11}$, 21$_{-12}$, . . . , 21$_{-1p}$, and the first marching-vector register files 22*v*$_{-11}$, 22*v*$_{-12}$, . . . , 22*v*$_{-1p}$ are controlled by FPGA, the information moves from the mother marching main memory 31$_{-0}$ to the first branched-marching main memory 31$_{-1}$, from the first branched-marching main memory 31$_{-1}$ to the first marching cache memories 21$_{-11}$, 21$_{-12}$, . . . , 21$_{-1p}$ in parallel, from first marching cache memories 21$_{-11}$, 21$_{-12}$, . . . , 21$_{-1p}$ to the first marching-vector register files 22*v*$_{-11}$, 22*v*$_{-12}$, . . . , 22*v*$_{-1p}$ in parallel, and from the first marching-vector register files 22*v*$_{-1}$, 22*v*$_{-12}$, . . . , 22*v*$_{-1p}$ to the first arithmetic pipelines 117$_{-11}$, 117$_{-12}$, . . . , 117$_{-1p}$ in parallel. The resultant data of the processing in the first arithmetic pipelines 117$_{-11}$, 117$_{-12}$, . . . , 117$_{-1p}$ are sent out to the first marching-vector register files 22*v*$_{-11}$, 22*v*$_{-12}$, . . . , 22*v*$_{-1p}$ so that data are transferred bi-directionally between the first marching-vector register files 22*v*$_{-11}$, 22*v*$_{-12}$, . . . , 22*v*$_{-1p}$ and the first arithmetic pipelines 117$_{-11}$, 117$_{-12}$, . . . , 117$_{-1p}$. Furthermore, the data stored in the first marching-vector register files 22*v*$_{-11}$, 22*v*$_{-12}$, . . . , 22*v*$_{-1p}$ are sent out to the first marching cache memories 21$_{-11}$, 21$_{-12}$, . . . , 21$_{-1p}$ so that data are transferred bi-directionally between the first marching cache memories 21$_{-11}$, 21$_{-12}$, . . . , 21$_{-1p}$ and the first marching-vector register files 22*v*$_{-11}$, 22*v*$_{-12}$, . . . , 22*v*$_{-1p}$, and the data stored in the first marching cache memories 21$_{-11}$, 21$_{-12}$, . . . , 21$_{-1p}$ are sent out to the first branched-marching main memory 31$_{-1}$ so that data are transferred bi-directionally between the first branched-marching main memory 31$_{-1}$ and the first marching cache memories 21$_{-11}$, 21$_{-12}$, . . . , 21$_{-1p}$. However, the FPGA controls the movement of instructions such that there is no flow along the opposite direction of the information to be processed in the first processing unit 12$_{-1}$.

The second processing unit 12$_{-2}$ encompasses a second branched-marching main memory 31$_{-2}$, a plurality of second marching cache memories 21$_{-21}$, 21$_{-22}$, . . . , 21$_{-2p}$ electrically connected respectively to the second branched-marching main memory 31$_{-2}$, a plurality of second marching-vector register files 22*v*$_{-21}$, 22*v*$_{-22}$, . . . , 22*v*$_{-2q}$ electrically connected respectively to the second marching cache memories 21$_{-21}$, 21$_{-22}$, . . . , 21$_{-2p}$, a plurality of second arithmetic pipelines 117$_{-21}$, 117$_{-22}$, . . . , 117$_{-2p}$ electrically connected respectively to the second marching-vector register files 22*v*$_{-21}$, 22*v*$_{-22}$, . . . , 22*v*$_{-2q}$. Similar to the first processing unit 124, each of the mother marching main memory 31$_{-0}$, the second branched-marching main memory 31$_{-2}$, the second marching cache memories 21$_{-21}$, 21$_{-22}$, . . . , 21$_{-2p}$, and the second marching-vector register files 22*v*$_{-21}$, 22*v*$_{-22}$, . . . , 22*v*$_{-2p}$ encompasses an array of memory units, input terminals of the array and output terminals of the array, configured to store information in each of memory units and to transfer synchronously with the clock signal, step by step, from a side of input terminals toward the output terminals. Because the operations of the mother marching main memory 31$_{-0}$, the second branched-marching main memory 31$_{-2}$, the second marching cache memories 21$_{-21}$, 21$_{-22}$, . . . , 21$_{-2p}$, and the second marching-vector register files 22*v*$_{-21}$, 22*v*$_{-22}$, . . . , 22*v*$_{-2p}$ are controlled by the FPGA, the information moves from the mother marching main memory 31$_{-0}$ to the second branched-marching main memory 31$_{-2}$, from the second branched-marching main memory 31$_{-2}$ to the second marching cache memories 21$_{-21}$, 21$_{-22}$, . . . , 21$_{-2q}$ in parallel, from second marching cache memories 21$_{-21}$, 21$_{-22}$, . . . , 21$_{-2q}$ to the second marching-vector register files 22*v*$_{-21}$, 22*v*$_{-22}$, . . . , 22*v*$_{-2q}$ in parallel, and from the second marching-vector register files 22*v*$_{-21}$, 22*v*$_{-2}$, . . . , 22*v*$_{-2q}$ to the second arithmetic pipelines 117$_{-21}$, 117$_{-22}$, . . . , 117$_{-2q}$ in parallel. The resultant data of the processing in the second arithmetic pipelines 117$_{-21}$, 117$_{-22}$, . . . , 117$_{-2q}$ are sent out to the second marching-vector register files 22*v*$_{-21}$, 22*v*$_{-22}$, . . . , 22*v*$_{-2q}$ so that data are transferred bi-directionally between the second marching-vector register files 22*v*$_{-21}$, 22*v*$_{-2}$, . . . , 22*v*$_{-2q}$ and the second arithmetic pipelines 117$_{-21}$, 117$_{-22}$, . . . , 117$_{-2q}$. Furthermore, the data stored in the second marching-vector register files 22*v*$_{-21}$, 22*v*$_{-22}$, . . . , 22*v*$_{-2q}$ are sent out to the second marching cache memories 21$_{-21}$, 21$_{-22}$, . . . , 21$_{-2q}$ so that data are transferred bi-directionally between the second marching cache memories 21$_{-21}$, 21$_{-22}$, . . . , 21$_{-2q}$ and the second marching-vector register files 22*v*$_{-21}$, 22*v*$_{-22}$, . . . , 22*v*$_{-2q}$, and the data stored in the second marching cache memories 21$_{-21}$, 21$_{-22}$, . . . , 21$_{-2q}$ are sent out to the second branched-marching main memory 31$_{-2}$ so that data are transferred bi-directionally between the second branched-marching main memory 31$_{-2}$ and the second marching cache memories 21$_{-21}$, 21$_{-2}$, . . . , 21$_{-2q}$. However, the FPGA controls the movement of instructions such that there is no flow along the opposite direction of the information to be processed in the second processing unit 12$_{-2}$.

For example, vector instructions generated from loops in a source program are transferred from the mother marching main memory 31$_{-0}$ to the first processing unit 12$_{-1}$, the second processing unit 12$_{-2}$, the third processing unit 12$_{-3}$, in parallel, so that parallel processing of these vector instructions can be executed by arithmetic pipelines 117$_{-11}$, 117$_{-12}$, . . . , 117$_{-1p}$, 117$_{-21}$, 117$_{-22}$, . . . , 117$_{-2q}$, in each of the first processing unit 12$_{-1}$, the second processing unit 12$_{-2}$, the third processing unit 12$_{-3}$, . . . .

Although the current FPGA-controlled HPC system requires a large amount of wiring resources, which generate time delay and stray capacitances between these wires and contributing to the bottleneck, in the HPC system of the exemplary embodiment shown in FIG. 63, because there are no buses such as data bus and address bus for any data exchange between the first marching-vector register files 22*v*$_{-11}$, 22*v*$_{-12}$, . . . , 22*v*$_{-1p}$ and the first arithmetic pipelines 117$_{-11}$, 117$_{-12}$, . . . , 117$_{-1p}$, between the first marching cache memories 21$_{-11}$, 21$_{-12}$, . . . , 21$_{-1p}$ and the first marching-vector register files 22*v*$_{-11}$, 22*v*$_{-12}$, . . . , 22*v*$_{-1p}$, between the first branched-marching main memory 31$_{-1}$ and the first marching cache memories 214$_{-11}$, 21$_{-12}$, . . . , 21$_{-1p}$, between the second marching-vector register files 22*v*$_{-21}$, 22*v*$_{-22}$, . . . , 22*v*$_{-2q}$ and the second arithmetic pipelines

117$_{-21}$, 117$_{-22}$, . . . , 117$_{-2q}$, between the second marching cache memories 21$_{-21}$, 21$_{-22}$, . . . , 21$_{-2q}$ and the second marching-vector register files 22*v*$_{-21}$, 22*v*$_{-22}$, . . . , 22*v*$_{-2q}$, between the second branched-marching main memory 31$_{-2}$ and the second marching cache memories 21$_{-21}$, 21$_{-22}$, . . . , 21$_{-2q}$, between the mother marching main memory 31$_{-0}$ and the first branched-marching main memory 31$_{-1}$, and between the mother marching main memory 31$_{-0}$ and the second branched-marching main memory 31$_{-2}$, the FPGA-controlled HPC system shown in FIG. 63 can achieve much higher processing speed and lower power consumption than the current FPGA-controlled HPC system. By increasing the number of processing units 12$_{-1}$, 12$_{-2}$, 12$_{-3}$, . . . , the FPGA-controlled HPC system pertaining to the exemplary embodiment can execute, for example, thousands of threads or more simultaneously at very high speed, enabling high computational throughput across large amounts of data.

As shown in FIG. 64, yet another exemplary embodiment of the computer system includes a processor 11, a stack of marching-register files 22$_{-1}$, 22$_{-2}$, 22$_{-3}$, . . . , implementing a three-dimensional marching-register file connected to the processor 11, a stack of marching-cache memories 21$_{-1}$, 21$_{-2}$, 21$_{-3}$, . . . , implementing a three-dimensional marching-cache memory connected to the three-dimensional marching-register file (22$_{-1}$, 22$_{-2}$, 22$_{-3}$, . . . ), and a stack of marching main memories 31$_{-1}$, 31$_{-2}$, 31$_{-3}$, . . . , implementing a three-dimensional marching main memory connected to the three-dimensional marching-cache (21$_{-1}$, 21$_{-2}$, 21$_{-3}$, . . . ). The processor 11 includes a control unit 111 having a clock generator 113 configured to generate a clock signal, an arithmetic logic unit (ALU) 112 configured to execute arithmetic and logic operations synchronized with the clock signal.

In the three-dimensional marching-register file (22$_{-1}$, 22$_{-2}$, 22$_{-3}$, . . . ), a first marching-register file 22$_{-1}$ includes a first marching-instruction register file 22*a*$_{-1}$ connected to the control unit 111 and a first marching-data register file 22*b*$_{-1}$ connected to the ALU 112, a second marching-register file 22$_{-2}$ includes a second marching-instruction register file connected to the control unit 111 and a second marching-data register file connected to the ALU 112, a third marching-register file 22$_{-3}$ includes a third marching-instruction register file connected to the control unit 111 and a third marching-data register file connected to the ALU 112, and, In the three-dimensional marching-cache (21$_{-1}$, 21$_{-2}$, 21$_{-3}$, . . . ), the first marching-cache memory 21$_{-1}$ includes a first marching-instruction cache memory 21*a*$_{-1}$ and a first marching-data cache memory 21*b*$_{-1}$, the second marching-cache memory 21$_{-2}$ includes a second marching-instruction cache memory and a second marching-data cache memory, the third marching-cache memory 21$_{-3}$ includes a third marching-instruction cache memory and a third marching-data cache memory, and . . . . .

Although the illustration is omitted, very similar to the marching main memory 31 shown in FIGS. 45-51, each of the marching main memories 31$_{-1}$, 31$_{-2}$, 31$_{-3}$, . . . , has a two-dimensional array of memory units each having a unit of information, input terminals of the main memory array and output terminals of the main memory array, each of the marching main memories 31$_{-1}$, 31$_{-2}$, 31$_{-3}$, . . . , stores the information in each of memory units and to transfer synchronously with the clock signal, step by step, toward the output terminals of the main memory array, so as to provide the three-dimensional marching-cache (21$_{-1}$, 21$_{-2}$, 21$_{-3}$, . . . ) with the stored information actively and sequentially, each of the marching-cache memories 21$_{-1}$, 21$_{-2}$, 21$_{-3}$, . . . , has a two-dimensional array of cache memory units, cache input terminals of the marching-cache array configured to receive the stored information from the three-dimensional marching main memory (31$_{-1}$, 31$_{-2}$, 31$_{-3}$, . . . ), and cache output terminals of the marching-cache array, each of the marching-cache memories 21$_{-1}$, 21$_{-2}$, 21$_{-3}$, . . . , stores the information in each of cache memory units and to transfer, synchronously with the clock signal, step by step, the information to an adjacent cache memory unit, so as to provide actively and sequentially the stored information to the three-dimensional marching-register file (22$_{-1}$, 22$_{-2}$, 22$_{-3}$, . . . ), and each of the marching-register files 22$_{-1}$, 22$_{-2}$, 22$_{-3}$, . . . , has a two-dimensional array of register units each having a unit of information, input terminals of the register array configured to receive the stored information from the three-dimensional marching-cache (21$_{-1}$, 21$_{-2}$, 21$_{-3}$, . . . ), and output terminals of the register array, each of the marching-register files 22$_{-1}$, 22$_{-2}$, 22$_{-3}$, . . . , stores the information in each of register units and to transfer synchronously with the clock signal, step by step, toward the output terminals of the register array, so as to provide the processor 11 with the stored information actively and sequentially so that the processor 11 can execute the arithmetic and logic operations with the stored information.

Each of the marching main memories 31$_{-1}$, 31$_{-2}$, 31$_{-3}$, . . . , is implemented by the two-dimensional array of memory units delineated at a surface of a semiconductor chip, and a plurality of the semiconductor chips are stacked vertically as shown in 27A, sandwiching heat dissipating plates 58*m*$_{-1}$, 58*m*$_{-2}$, 58*m*$_{-3}$, . . . between the plurality of the semiconductor chips so as to implement the three-dimensional marching main memory (31$_{-1}$, 31$_{-2}$, 31$_{-3}$, . . . ). IN an exemplary embodiment, the heat dissipating plates 58*m*$_{-1}$, 58*m*$_{-2}$, 58*m*$_{-3}$, . . . , are made of materials having high thermal conductivity such as diamond. Similarly, each of the marching-cache memories 21$_{-1}$, 21$_{-2}$, 21$_{-3}$, . . . , is implemented by the two-dimensional array of memory units delineated at a surface of a semiconductor chip, and a plurality of the semiconductor chips are stacked vertically as shown in 27B, sandwiching heat dissipating plates 58*c*$_{-1}$, 58*c*$_{-2}$, 58*c*$_{-3}$, . . . , between the plurality of the semiconductor chips so as to implement the three-dimensional marching-cache (21$_{-1}$, 21$_{-2}$, 21$_{-3}$, . . . ), and each of the marching-register files 22$_{-1}$, 22$_{-2}$, 22$_{-3}$, . . . , is implemented by the two-dimensional array of memory units delineated at a surface of a semiconductor chip, and a plurality of the semiconductor chips are stacked vertically as shown in 27C, sandwiching heat dissipating plates 58*r*$_{-1}$, 58*r*$_{-2}$, 58*r*$_{-3}$, . . . , between the plurality of the semiconductor chips so as to implement the three-dimensional marching-register file (22$_{-1}$, 22$_{-2}$, 22$_{-3}$, . . . ). In an exemplary embodiment, the heat dissipating plates 58*c*$_{-1}$, 58*c*$_{-2}$, 58*c*$_{-3}$, . . . , 58*r*$_{-1}$, 58*r*$_{-2}$, 58*r*$_{-3}$, . . . , are made of materials having high thermal conductivity such as diamond. Because there are no interconnects inside the surfaces of the semiconductor chips in the three-dimensional configuration shown in FIGS. 65(*a*)-(*c*) and 66, it is easy to insert the heat dissipating plates 58*c*$_{-1}$, 58*c*$_{-2}$, 58*c*$_{-3}$, . . . , 58*r*$_{-1}$, 58*r*$_{-2}$, 58*r*$_{-3}$, . . . , between the semiconductor chips, the configuration shown in FIGS. 65(*a*)-(*c*) and 66 is expandable to stacking structures with any number of the semiconductor chips. In the conventional architecture, basically there is a limit of the number of stacked semiconductor chips in terms of thermal issues when the conventional semiconductor chips are directly stacked. In the computer system of the exemplary embodiment, the sandwich structure shown in FIGS. 65(*a*)-(*c*) and 66 is suitable for establishing the thermal flow from active computing semiconductor chips through the heat dissipating plates $\mathbf{58}c_{-1}$, $\mathbf{58}c_{-2}$, $\mathbf{58}c_{-3}$, . . . , $\mathbf{58}r_{-1}$, $\mathbf{58}r_{-2}$, $\mathbf{58}r_{-3}$, . . . , to outside the system more effectively. Therefore, in the computer system of the exemplary embodiment, these semiconductor chips can be stacked proportionally to the scale of the system, and as shown in FIGS. 65(*a*)-(*c*) and 66, because a plurality of the semiconductor chips merging the marching main memories $\mathbf{31}_{-1}$, $\mathbf{31}_{-2}$, $\mathbf{31}_{-3}$, . . . , the marching-cache memories $\mathbf{21}_{-1}$, $\mathbf{21}_{-2}$, $\mathbf{21}_{-3}$, . . . , and the marching-register files $\mathbf{22}_{-1}$, $\mathbf{22}_{-2}$, $\mathbf{22}_{-3}$, . . . , could easily be stacked to implement the three-dimensional configuration, a scalable computer systems can be easily organized, thereby keeping the temperature of the system cooler.

Although the illustration is omitted, the three-dimensional marching main memory ($\mathbf{31}_{-1}$, $\mathbf{31}_{-2}$, $\mathbf{31}_{-3}$, . . . ) and the three-dimensional marching-cache ($\mathbf{21}_{-1}$, $\mathbf{21}_{-2}$, $\mathbf{21}_{-3}$, . . . ) are electrically connected by a plurality of joint members, the three-dimensional marching-cache ($\mathbf{21}_{-1}$, $\mathbf{21}_{-2}$, $\mathbf{21}_{-3}$, . . . ) and the three-dimensional marching-register file ($\mathbf{22}_{-1}$, $\mathbf{22}_{-2}$, $\mathbf{22}_{-3}$, . . . ) are electrically connected by a plurality of joint members, and the three-dimensional marching-register file ($\mathbf{22}_{-1}$, $\mathbf{22}_{-2}$, $\mathbf{22}_{-3}$, . . . ) and processor 11 are electrically connected by another plurality of joint members.

The resultant data of the processing in the ALU 112 are sent out to the three-dimensional marching-register file ($\mathbf{22}_{-1}$, $\mathbf{22}_{-2}$, $\mathbf{22}_{-3}$, . . . ) through the joint members so that data are transferred bi-directionally between the three-dimensional marching-register file ($\mathbf{22}_{-1}$, $\mathbf{22}_{-2}$, $\mathbf{22}_{-3}$, . . . ) and the ALU 112. Furthermore, the data stored in the three-dimensional marching-register file ($\mathbf{22}_{-1}$, $\mathbf{22}_{-2}$, $\mathbf{22}_{-3}$, . . . ) are sent out to the three-dimensional marching-cache ($\mathbf{21}_{-1}$, $\mathbf{21}_{-2}$, $\mathbf{21}_{-3}$, . . . ) through the joint members so that data are transferred bi-directionally between the three-dimensional marching-cache ($\mathbf{21}_{-1}$, $\mathbf{21}_{-2}$, $\mathbf{21}_{-3}$, . . . ) and the three-dimensional marching-register file ($\mathbf{22}_{-1}$, $\mathbf{22}_{-2}$, $\mathbf{22}_{-3}$, . . . ). Furthermore, the data stored in the three-dimensional marching-cache ($\mathbf{21}_{-1}$, $\mathbf{21}_{-2}$, $\mathbf{21}_{-3}$, . . . ) are sent out to the three-dimensional marching main memory ($\mathbf{31}_{-}$, $\mathbf{31}_{-2}$, $\mathbf{31}_{-3}$, . . . ) through the joint members so that data are transferred bi-directionally between the three-dimensional marching main memory ($\mathbf{31}_{-1}$, $\mathbf{31}_{-2}$, $\mathbf{31}_{-3}$, . . . ) and the three-dimensional marching-cache ($\mathbf{21}_{-1}$, $\mathbf{21}_{-2}$, $\mathbf{21}_{-3}$, . . . ).

There is only one way of instruction-flow from the three-dimensional marching main memory ($\mathbf{31}_{-1}$, $\mathbf{31}_{-2}$, $\mathbf{31}_{-3}$, . . . ) to the three-dimensional marching-cache ($\mathbf{21}_{-}$, $\mathbf{21}_{-2}$, $\mathbf{21}_{-3}$, . . . ), from the three-dimensional marching-cache ($\mathbf{21}_{-1}$, $\mathbf{21}_{-2}$, $\mathbf{21}_{-3}$, . . . ) to the three-dimensional marching-register file ($\mathbf{22}_{-1}$, $\mathbf{22}_{-2}$, $\mathbf{22}_{-3}$, . . . ), and from the three-dimensional marching-register file ($\mathbf{22}_{-1}$, $\mathbf{22}_{-2}$, $\mathbf{22}_{-3}$, . . . ) to the control unit 111. For example, vector instructions generated from loops in a source program are transferred from the three-dimensional marching main memory ($\mathbf{31}_{-1}$, $\mathbf{31}_{-2}$, $\mathbf{31}_{-3}$, . . . ) to the control unit 111 through the three-dimensional marching-cache ($\mathbf{21}_{-1}$, $\mathbf{21}_{-2}$, $\mathbf{21}_{-3}$, . . . ) and the three-dimensional marching-register file ($\mathbf{22}_{-1}$, $\mathbf{22}_{-2}$, $\mathbf{22}_{-3}$, . . . ) so that each of these vector instructions can be executed by arithmetic pipelines in the control unit 111.

In the exemplary embodiment of the computer system shown in FIG. 64, there are no buses such as the data bus and address bus in any data exchange between the three-dimensional marching main memory ($\mathbf{31}_{-1}$, $\mathbf{31}_{-2}$, $\mathbf{31}_{-3}$, . . . ) and the three-dimensional marching-cache ($\mathbf{21}_{-1}$, $\mathbf{21}_{-2}$, $\mathbf{21}_{-3}$, . . . ), between the three-dimensional marching-cache ($\mathbf{21}_{-1}$, $\mathbf{21}_{-2}$, $\mathbf{21}_{-3}$, . . . ) and the three-dimensional marching-register file ($\mathbf{22}_{-1}$, $\mathbf{22}_{-2}$, $\mathbf{22}_{-3}$, . . . ), and between the three-dimensional marching-register file ($\mathbf{22}_{-1}$, $\mathbf{22}_{-2}$, $\mathbf{22}_{-3}$, . . . ) and the processor 11. This is in contrast to the wires or the buses contributing to the bottleneck in the conventional computer system. As there are no global wires, which generate time delay and stray capacitances between these wires, the exemplary embodiment of the computer system can achieve much higher processing speed and lower power consumption than the conventional computer system, keeping the temperature of the computer system at lower temperature than the conventional computer system so as to establish "a cool computer", by employing the heat dissipating plates $\mathbf{58}c_{-1}$, $\mathbf{58}c_{-2}$, $\mathbf{58}c_{-3}$, . . . , $\mathbf{58}r_{-1}$, $\mathbf{58}r_{-2}$, $\mathbf{58}r_{-3}$, . . . , which are made of materials having high thermal conductivity such as diamond and disposed between the semiconductor chips. The cool computer pertaining to the exemplary embodiment is different from existing computers because the cool computer is purposely architected and designed with an average of 30% less energy consumption and 10000% less size to obtain 100 times higher speed, for example.

Since other functions, configurations, way of operation of the computer system pertaining to the exemplary embodiment are substantially similar to the functions, configurations, way of operation already explained in the first to third embodiments, overlapping or redundant description may be omitted.

Three-Dimensional Configurations

The three-dimensional configurations shown in FIGS. 64, 65(*a*), 65(*b*) and 65(*c*) are exemplary embodiments, and there are various ways and combinations of how to implement three-dimensional configurations so as to facilitate the organization of a scalable computer system.

For example, as shown in FIG. 66, a first chip (top chip) merging a plurality of arithmetic pipelines 117 and a plurality of marching-register files 22, a second chip (middle chip) merging a marching-cache memory 21 and a third chip (bottom chip) merging a marching main memory 31 can be stacked vertically. Each of the arithmetic pipelines 117 may include a vector-processing unit, and each of the marching-register files 22 may include marching-vector registers. Between the first and second chips, a plurality of joint members 55*a* are inserted, and between the second and third chips, a plurality of joint members 55*b* are inserted. For example, each of joint members 55*a* and 55*b* may be implemented by an electrical conductive bump such as a solder ball, a gold (Au) bump, a silver (Ag) bump, a copper (Cu) bump, a nickel-gold (Ni—Au) alloy bump or a nickel-gold-indium (Ni—Au—In) alloy bump. Although the illustration is omitted, heat-dissipating plates can be inserted between the first and second chips and between the second and third chips so as to achieve "cool chips", similar to the configuration shown in FIGS. 65(*a*)-(*c*) and 66.

Alternatively, as shown in FIGS. 67 and 68, a first three-dimensional (3D)-stack embracing a first top chip, a first middle chip and first bottom chip and a second 3D-stack embracing a second top chip, a second middle chip and second bottom chip may be disposed two dimensionally on a same substrate or a same circuit board so as to implement a parallel computing with multiple processors, in which the first 3D-stack and the second 3D-stack are connected by bridges 59*a* and 59*b*.

In the first 3D-stack, a first top chip merging a plurality of first arithmetic pipelines $\mathbf{117}_{-1}$ and a plurality of first marching-register files $\mathbf{22}_{-1}$, a first middle chip merging a first marching-cache memory $\mathbf{21}_{-1}$ and a first bottom chip merging a first marching main memory $31_{-1}$ are 3D-stacked vertically. Each of the first arithmetic pipelines $117_{-1}$ may include a vector-processing unit, and each of the first marching-cache files $22_{-1}$ may include marching-vector registers. Between the first top and first middle chips, a plurality of joint members $55a_{-1}$ are inserted, and between the first middle and first bottom chips, a plurality of joint members $55b_{-1}$ are inserted. For example, each of joint members $55a_{-1}$ and $55b_{-1}$ may be implemented by an electrical conductive bump such as a solder ball, a gold (Au) bump, a silver (Ag) bump, a copper (Cu) bump, a nickel-gold (Ni—Au) alloy bump or a nickel-gold-indium (Ni—Au—In) alloy bump. Similarly, in the second 3D-stack, a second top chip merging a plurality of second arithmetic pipelines $117_{-2}$ and a plurality of second marching-register files $22_{-2}$, a second middle chip merging a second marching-cache memory $21_{-2}$ and a second bottom chip merging a second marching main memory $31_{-2}$ are 3D-stacked vertically. Each of the second arithmetic pipelines $117_{-2}$ may include a vector-processing unit, and each of the second marching-cache files $22_{-2}$ may include marching-vector registers. Between the second top and second middle chips, a plurality of joint members $55a_{-2}$ are inserted, and between the second middle and second bottom chips, a plurality of members $55b_{-2}$ are inserted. For example, each ofjoint members $55a_{-2}$ and $55b_{-2}$ may be implemented by an electrical conductive bump such as a solder ball, a gold (Au) bump, a silver (Ag) bump, a copper (Cu) bump, a nickel-gold (Ni—Au) alloy bump or a nickel-gold-indium (Ni—Au—In) alloy bump. Although the illustration is omitted, heat-dissipating plates can be inserted between the first top and first middle chips, between the first middle and first bottom chips, between the second top and second middle chips and between the second middle and second bottom chips similar to the configuration shown in FIGS. 65(*a*)-(*c*) and 66 so as to achieve "cool chips".

Similar to the exemplary embodiments of the computer system a field programmable gate array (FPGA) may switch-control the operations of the first and second 3D-stacks, by traveling a thread or chaining of vector processing on the first arithmetic pipelines $117_{-1}$ and the second arithmetic pipelines $117_{-2}$, implementing a HPC system, which can be used for GPU-based general-purpose computing.

As shown in FIG. 69, a further exemplary embodiment includes a first chip (top chip) merging a plurality of arithmetic pipelines 117, a second chip merging a plurality of marching-register files 22, a third chip merging a marching-cache memory 21, a fourth chip merging a first marching main memory $31_{-1}$, a fifth chip merging a marching main memory $31_{-2}$ and a sixth chip (bottom chip) merging a third marching main memory $31_{-3}$ can be stacked vertically. Each of the arithmetic pipelines 117 may include a vector-processing unit, and each of the marching-register files 22 may include marching-vector registers so that vector instructions generated from loops in a source program can be executed in the vector-processing unit. A first heat dissipating plate $58_{-1}$ is inserted between the first and second chips, a second heat dissipating plate $58_{-2}$ is between the second and third chips, a third heat dissipating plate $58_{-3}$ is between the third and fourth chips, a fourth heat dissipating plate $58_{-4}$ is between the fourth and fifth chips, and a fifth heat dissipating plate $58_{-5}$ is between the fifth and sixth chips so as to achieve "cool chips". Since there are no interconnects inside the surfaces of these cool chips in the three-dimensional configuration shown in FIG. 69, it is easy to insert the heat dissipating plates $58_{-1}$, $58_{-2}$, $58_{-3}$, $58_{-4}$, $58_{-5}$ such as diamond chips between these six chips alternately.

The cool-chip configuration shown in FIG. 69 is not limited to embodiments of six chips, but is also expandable to embodiments of three-dimensional stacking structures with any number of chips, because the sandwich structure shown in FIG. 69 is suitable for establishing the thermal flow from active computing chips through the heat dissipating plates $58_{-1}$, $58_{-2}$, $58_{-3}$, $58_{-4}$, $58_{-5}$ to outside of the cool computer system more effectively. Therefore, the number of cool chips in the exemplary embodiment of the computer system can be increased in proportion to the scale of the computer system.

FIGS. 70-72 show various exemplary embodiments of the three-dimensional (3D) stack, implementing a part of fundamental cores of the exemplary embodiment of the computer systems, each of the 3D-stacks includes cooling technology with heat dissipating plate 58 such as diamond plate inserted between the semiconductor memory chips 3*a* and 3*b*, in which at least one of the marching memory classified in the marching memory family is merged. The term of "the marching memory family" includes the marching-instruction register file 22*a* and the marching-data register file 22*b* connected to the ALU 112, the marching-instruction cache memory 21*a* and the marching-data cache memory 21*b*, and the marching main memory 31 explained above in the exemplary embodiments of the present invention.

As shown in FIG. 70, a 3D-stack, implementing a part of the fundamental core of the exemplary embodiments of the computer system, includes a first semiconductor memory chip 3*a* merging at least one of the marching memory in the marching memory family, a heat dissipating plate 58 disposed under the first semiconductor memory chip 3*a*, a second semiconductor memory chip 3*b* disposed under the heat dissipating plate 58, which merges at least one of the marching memory in the marching memory family, and a processor 11 disposed at a side of the heat dissipating plate 58. In FIG. 70, because the location of the processor 11 is shown as one of the examples, the processor 11 can be disposed at any required or appropriate site in the configuration of the 3D-stack or external of the 3D-stack, depending on the design choice of the 3D-stack. For example, the processor 11 can be allocated at the same horizontal level of the first semiconductor memory chip 3*a* or at the level of the second semiconductor memory chip 3*b*. The marching memory merged on the first semiconductor memory chip 3*a* and the marching memory merged on the second semiconductor memory chip 3*b* stores program instruction, respectively. In the 3D configuration shown in FIG. 70, in which the first semiconductor memory chip 3*a*, the heat dissipating plate 58 and the second semiconductor memory chip 3*b* are stacked vertically, a first control path is provided between the first semiconductor memory chip 3*a* and the processor 11, and a second control path is provided between the second semiconductor memory chip 3*b* and the processor 11 so as to facilitate the execution of the control processing with the processor 11. A further data-path may be provided between the first semiconductor memory chip 3*a* and the second semiconductor memory chip 3*b* so as to facilitate direct communication of the program instruction between the first semiconductor memory chip 3*a* and the second semiconductor memory chip 3*b*.

As shown in FIG. 71, another 3D-stack, implementing a part of the fundamental core of the exemplary embodiments of the computer system, embraces a first semiconductor memory chip 3*a* merging at least one of the marching memory in the marching memory family, a heat dissipating plate 58 disposed under the first semiconductor memory chip 3*a*, a second semiconductor memory chip 3*b* disposed under the heat dissipating plate 58, which merges at least one of the marching memory in the marching memory family, and a ALU 112 disposed at a side of the heat dissipating plate 58. The location of the ALU 112 is not limited to the site shown in FIG. 71, and the ALU 112 can be disposed at any required or appropriate site in the configuration of the 3D-stack or external of the 3D-stack, such as a site allocated at the same horizontal level of the first semiconductor memory chip 3*a* or at the level of the second semiconductor memory chip 3*b*, depending on the design choice of the 3D-stack. The marching memory merged on the first semiconductor memory chip 3*a* and the marching memory merged on the second semiconductor memory chip 3*b* read/write scalar data, respectively. In the 3D configuration shown in FIG. 71, in which the first semiconductor memory chip 3*a*, the heat dissipating plate 58 and the second semiconductor memory chip 3*b* are stacked vertically, a first data-path is provided between the first semiconductor memory chip 3*a* and the ALU 112, and a second data-path is provided between the second semiconductor memory chip 3*b* and the ALU 112 so as to facilitate the execution of the scalar data processing with the ALU 112. A further data-path may be provided between the first semiconductor memory chip 3*a* and the second semiconductor memory chip 3*b* so as to facilitate direct communication of the scalar data between the first semiconductor memory chip 3*a* and the second semiconductor memory chip 3*b*.

As shown in FIG. 72, a still another 3D-stack, implementing a part of the fundamental core of the exemplary embodiments of the computer system, includes a first semiconductor memory chip 3*a* merging at least one of the marching memory in the marching memory family, a heat dissipating plate 58 disposed under the first semiconductor memory chip 3*a*, a second semiconductor memory chip 3*b* disposed under the heat dissipating plate 58, which merges at least one of the marching memory in the marching memory family, and an arithmetic pipelines 117 disposed at a side of the heat dissipating plate 58. Similar to the topologies shown in FIGS. 62 and 63, the location of the arithmetic pipelines 117 is not limited to the site shown in FIG. 72, and the arithmetic pipelines 117 can be disposed at any required or appropriate site. The marching memory merged on the first semiconductor memory chip 3*a* and the marching memory merged on the second semiconductor memory chip 3*b* read/write vector/streaming data, respectively. In the 3D configuration shown in FIG. 72, in which the first semiconductor memory chip 3*a*, the heat dissipating plate 58 and the second semiconductor memory chip 3*b* are stacked vertically, a first data-path is provided between the first semiconductor memory chip 3*a* and the arithmetic pipelines 117, and a second data-path is provided between the second semiconductor memory chip 3*b* and the arithmetic pipelines 117 so as to facilitate the execution of the vector/streaming data processing with the arithmetic pipelines 117. A further data-path may be provided between the first semiconductor memory chip 3*a* and the second semiconductor memory chip 3*b* so as to facilitate direct communication of the vector/streaming data between the first semiconductor memory chip 3*a* and the second semiconductor memory chip 3*b*.

As shown in FIG. 73, the 3D hybrid exemplary embodiment of the computer system includes a first left chip (top left chip) $3p_{-1}$ merging at least one of the marching memory in the marching memory family, a second left chip $3p_{-2}$ merging at least one of the marching memory in the marching memory family, a third left chip $3p_{-3}$ merging at least one of the marching memory in the marching memory family, a fourth left chip $3p_{-4}$ merging at least one of the marching memory in the marching memory family, a fifth left chip $3p_{-5}$ merging at least one of the marching memory in the marching memory family and a sixth left chip (bottom left chip) $3p_{-6}$ merging at least one of the marching memory in the marching memory family, which are stacked vertically. A first left heat dissipating plate $58a_{-1}$ is inserted between the first left chip $3p_{-1}$ and second left chip $3p_{-2}$, a second left heat dissipating plate $58a_{-2}$ is inserted between the second left chip $3p_{-2}$ and third left chip $3p_{-3}$, a third left heat dissipating plate $58a_{-3}$ is inserted between the third left chip $3p_{-3}$ and fourth left chip $3p_{-4}$, a fourth left heat dissipating plate $58a_{-4}$ is inserted between the fourth left chip $3p_{-4}$ and fifth left chip $3p_{-5}$, and a fifth left heat dissipating plate $58a_{-5}$ is inserted between the fifth left chip $3p_{-5}$ and sixth left chip $3p_{-6}$ so as to achieve "cool left chips".

A first right chip (top right chip) $3q_{-1}$ merging at least one of the marching memory in the marching memory family, a second right chip $3q_{-2}$ merging at least one of the marching memory in the marching memory family, a third right chip $3q_{-3}$ merging at least one of the marching memory in the marching memory family, a fourth right chip $3q_{-4}$ merging at least one of the marching memory in the marching memory family, a fifth right chip $3q_{-5}$ merging at least one of the marching memory in the marching memory family and a sixth right chip (bottom right chip) $3q_{-6}$ merging at least one of the marching memory in the marching memory family are stacked vertically. A first right heat dissipating plate $58b_{-1}$ is inserted between the first right chip $3q_{-1}$ and second right chip $3q_{-2}$, a second right heat dissipating plate $58b_{-2}$ is inserted between the second right chip $3q_{-2}$ and third right chip $3q_{-3}$, a third right heat dissipating plate $58b_{-1}$ is inserted between the third right chip $3q_{-3}$ and fourth right chip $3q_{-4}$, a fourth right heat dissipating plate $58b_{-4}$ is inserted between the fourth right chip $3q_{-4}$ and fifth right chip $3q_{-5}$, and a fifth right heat dissipating plate $58b_{-5}$ is inserted between the fifth right chip $3q_{-5}$ and sixth right chip $3q_{-6}$ so as to achieve "cool right chips".

A first processing unit 11*a* is provided between the first left heat dissipating plate $58a_{-1}$ and the first right heat dissipating plate $58b_{-1}$, a second processing unit llb is provided between the third left heat dissipating plate $58a_{-3}$ and the third right heat dissipating plate $58b_{-3}$, and a third processing unit 11*c* is provided between the fifth left heat dissipating plate $58a_{-5}$ and the fifth right heat dissipating plate $58b_{-5}$, and pipelined ALUs are respectively included in the processing units 11*a*, 11*b*, 11*c*.

The scalar data-path and control path are established between the first left chip $3p_{-1}$ and second left chip $3p_{-2}$, the scalar data-path and control path are established between the second left chip $3p_{-2}$ and third left chip $3p_{-3}$, the scalar data-path and control path are established between the third left chip $3p_{-3}$ and fourth left chip $3p_{-4}$, the scalar data-path and control path are established between the fourth left chip $3p_{-4}$ and fifth left chip $3p_{-5}$, and the scalar data-path and control path are established between the fifth left chip $3p_{-5}$ and sixth left chip $3p_{-6}$, the scalar data-path and control path are established between the first right chip $3q_{-1}$ and second right chip $3q_{-2}$, the scalar data-path and control path are established between the second right chip $3q_{-2}$ and third right chip $3q_{-3}$, the scalar data-path and control path are established between the third right chip $3q_{-3}$ and fourth right chip $3q_{-4}$, the scalar data-path and control path are established between the fourth right chip $3q_{-4}$ and fifth right chip $3q_{-5}$, and the scalar data-path and control path are established between the fifth right chip $3q_{-5}$ and sixth right chip $3q_{-6}$. The 3D computer system shown in FIG. 73 can execute not only scalar data but also vector/streaming data through the combination of scalar data-path and control path for the computer system.

Because there are no interconnects inside the surfaces of these cool chips in the 3D configuration shown in FIG. 73, it is easy to insert the heat dissipating plates 58$a_{-1}$, 58$a_{-2}$, 58$a_{-3}$, 58$a_{-4}$, 58$a_{-5}$ such as diamond left chips between these six left chips alternately, and to insert the heat dissipating plates 58$b_{-1}$, 58$b_{-2}$, 58$b_{-3}$, 58$b_{-4}$, 58$b_{-5}$ such as diamond right chips between these six right chips alternately.

Other Embodiments

Various modifications will become possible for those skilled in the art after receiving the teaching of the present disclosure without departing from the scope thereof.

In FIGS. 4, 5, 6, 8, 11, 13, 16-20, 22, 25 and 32, although nMOS transistors are assigned respectively as the transfer-transistors and the reset-transistors in the transistor-level representations of the bit-level cells, because the illustration in FIGS. 4, 5, 6, 8, 11, 13, 16-20, 22, 25 and 32 are mere schematic examples, pMOS transistors can be used as the transfer-transistors and the reset-transistors, if the opposite polarity of the clock signal is employed. Furthermore, MIS transistors, or insulated-gate transistors having gate-insulation films made of silicon nitride film, ONO film, SrO film, $Al_2O_3$ film, MgO film, $Y_2O_3$ film, $HfO_2$ film, $ZrO_2$ film, $Ta_2O_5$ film, $Bi_2O_3$ film, HfAlO film, and others can be used for the transfer-transistors and the reset-transistors.

There are several different forms of parallel computing such as bit-level, instruction level, data, and task parallelism, and as well known as "Flynn's taxonomy", programs and computers are classified as to whether they were operating using a single set or multiple sets of instructions, whether or not those instructions were using a single or multiple sets of data.

For example, as shown in FIG. 74, a marching memory, which may include the marching-register file, the marching-cache memory, and the marching main memory already discussed in the exemplary embodiments can implement a bit-level parallel processing of scalar/vector data in a multiple-instruction-single-data (MISD) architecture, by which many independent instruction streams provided vertically to a first processor 11$_{-1}$, a second processor 11$_{-2}$, a third processor 11$_{-3}$, a fourth processor 11$_{-4}$, . . . , in parallel operate on a single horizontal stream of data at a time with a systolic array of processors 11$_{-1}$, 11$_{-2}$, 11$_{-3}$, 11$_{-4}$.

Alternatively, as shown in FIG. 75,arithmetic-level parallelism can be established by a marching memory, which may include the marching-register file, the marching-cache memory, and the marching main memory already discussed in the exemplary embodiments, with a single-instruction-multiple-data (SIMD) architecture, by which a single instruction stream is provided to a first processor 11$_{-1}$, a second processor 11$_{-2}$, a third processor 11$_{-3}$, and a fourth processor 11$_{-4}$, so that the single instruction stream can operate on multiple vertical streams of data ata time with the array of processors 11$_{-1}$, 11$_{-2}$, 11$_{-3}$, 11$_{-4}$.

Still alternatively, as shown in FIG. 76, a marching memory, which may include the marching-register file, the marching-cache memory, and the marching main memory already discussed in the exemplary embodiments, can implement a typical chaining in vector processing with a first processor 11$_{-1}$, a second processor 11$_{-2}$, a third processor 11$_{-3}$, and a fourth processor 11$_{-4}$ to which a first instruction $I_1$, a second instruction $I_2$, a third instruction $I_3$, and a fourth instruction $I_4$ are provided respectively.

Furthermore, as shown in FIG. 77, a marching memory, which may include the marching-register file, the marching-cache memory, and the marching main memory already discussed in the exemplary embodiments, can implement a parallel processing of a single horizontal stream of scalar/vector data in a MISD architecture with a first processor 11$_{-1}$, a second processor 11$_{-2}$, a third processor 11$_{-3}$, and a fourth processor 11$_{-4}$.

Furthermore, as shown in FIG. 78, a marching memory, which may include the marching-register file, the marching-cache memory, and the marching main memory already discussed in the exemplary embodiments, can implement a parallel processing of a single horizontal stream of scalar/vector data in a MISD architecture with a first processor 11$_{-1}$ configured execute multiplication, a second processor 11$_{-2}$ configured execute addition, a third processor 11$_{-3}$ configured execute multiplication, and a fourth processor 11$_{-4}$ configured execute addition.

Furthermore, as to process-level parallelism, a single-thread-stream and single-data-stream architecture, a single-thread-stream and multiple-data-streams architecture, a multiple-thread-streams and single-data-stream architecture, and a multiple-thread-streams and multiple-data-streams architecture can be achieved with a marching memory, which may include the marching-register file, the marching-cache memory, and the marching main memory already discussed in the exemplary embodiments.

Referring to FIG. 41, the hatched portion of FIG. 41(*b*) has shown schematically the speed/capability of the marching main memory 31, implemented by one hundred of memory units $U_1$, $U_2$, $U_3$, . . . , $U_{100}$, and compared with the speed/capability of the worst case of the existing memory shown in FIG. 41(*a*). With "a complex marching memory" scheme shown in FIG. 79(*b*), the speed/capability of the marching memory is improved for scalar data or program instructions, in which a plurality of marching memory blocks $MM_{11}$, $MM_{12}$, $MM_{13}$, . . . , $MM_{16}$; $MM_{21}$, $MM_{22}$, $MM_{23}$, . . . , $MM_{26}$; $MM_{31}$, $MM_{32}$, $MM_{33}$, . . . , $MM_{36}$; . . . ; $MM_{51}$, $MM_{52}$, $MM_{53}$, . . . , $MM_{56}$ are deployed two dimensionally and merged on a single semiconductor chip 66, and a specified marching memory block $MM_{ij}$ (i=1 to 5; j=1 to 6) can be randomly accessed from the plurality of marching memory blocks $MM_{11}$, $MM_{12}$, $MM_{13}$, . . . , $MM_{16}$; $MM_{21}$, $MM_{22}$, $MM_{23}$, . . . , $MM_{26}$; $MM_{31}$, $MM_{32}$, $MM_{33}$, . . . , $MM_{36}$; . . . ; $MM_{51}$, $MM_{52}$, $MM_{53}$, . . . , $MM_{56}$, similar to the random-access methodology employed in a dynamic random access memory (DRAM) architecture.

As shown in FIG. 79(*a*), a conventional DRAM has a memory array area 661, peripheral circuitry for a row decoder 662, peripheral circuitry for sense amplifiers 663, and peripheral circuitry for a column decoder 664 merged on a single semiconductor chip 66. A plurality of memory cells are arranged in an array of rows and columns in the memory array area 661 so that each row of memory cells share a common 'word' line, while each column of cells share a common 'bit' line, and the location of a memory cell in the array is determined as the intersection of its 'word' and 'bit' lines. During a 'write' operation, the data to be written ('1' or '0') is provided at the 'bit' line from the column decoder 664, while the 'word line' is asserted from the row decoder 662, so as to turn on the access transistor of the memory cell and allows the capacitor to charge up or discharge, depending on the state of the bit line. During a 'read' operation, the 'word' line is also asserted from the row decoder 662, which turns on the access transistor. The enabled transistor allows the voltage on the capacitor to be read by a sense amplifier 663 through the 'bit' line. The sense amplifier 663 can determine whether a '1' or '0' is stored in the memory cell by comparing the sensed capacitor voltage against a threshold.

Although 6*5=30 marching memory blocks $MM_{11}$, $MM_{12}$, $MM_{13}$, . . . , $MM_{16}$; $MM_{21}$, $MM_{22}$, $MM_{23}$, . . . , $MM_{26}$; $MM_{31}$, $MM_{32}$, $MM_{33}$, . . . , $MM_{36}$; . . . ; $MM_{51}$, $MM_{52}$, $MM_{53}$, . . . , $MM_{56}$ are deployed on the semiconductor chip 66 for avoiding cluttering up the drawings, the illustration is schematic, and actually one thousand marching memory blocks $MM_{ij}$ (i=1 to s; j=1 to t; and s*t=1000) with 256 kbits capacity can be deployed on the same semiconductor chip 66, if unidirectional marching memories are arrayed, and if 512 Mbits DRAM chip technology is assumed as the manufacturing technology of the complex marching memory scheme shown in FIG. 79(*b*). As an area for monolithically integrating each of the marching memory blocks $MM_{ij}$ having 256 kbits capacity on a semiconductor chip 66, an equivalent area for 512 kbits DRAM block is required, because, as shown in FIGS. 4-6, each of unidirectional marching memory blocks is implemented by a bit-level cell consisting of two transistors and one capacitor, while the DRAM memory cell consists of only a single transistor that is paired with a capacitor. Alternatively, as to an array of bidirectional marching memories, one thousand marching memory blocks $MM_{ij}$ with 128 kbits capacity can be deployed on the same semiconductor chip 66 for the 512 Mbits DRAM chip. As an area for monolithically integrating each of the marching memory blocks $MM_{ij}$ having 128 kbits capacity, an equivalent area for the 512 kbits DRAM block is required, because, as shown in FIG. 32, a bidirectional marching memory block is implemented by a bit-level cell consisting of four transistors and two capacitors, while the DRAM memory cell consists of only a single transistor and a single capacitor. If one Gbit DRAM chip technology is assumed, one thousand bidirectional marching memory blocks $MM_{ij}$ with 256 kbits capacity can be deployed on the same DRAM chip 66 so as to implement a 256 Mbits marching memory chip.

Therefore, one thousand of marching memory blocks $MM_{ij}$, or one thousand of marching memory cores can be monolithically integrated on the semiconductor chip 66, as shown in FIG. 79(*b*). A single marching memory block $MM_{ij}$, or "a single marching memory core" may encompass, for example, one thousand of marching memory columns, or one thousand of marching memory units $U_k$ (k=1 to 1000), which have 1000*32 byte-based addresses, where one memory unit $U_k$ has 256 bit-level cells. With a complex marching memory chip having one thousand of marching memory blocks $MM_{ij}$, one thousand of marching memory units $U_k$ (k=1 to 1000) of 32 bytes (or 256 bits) are allowable to access within one cycle of the conventional DRAM access.

FIGS. 80(*a*) and (*b*) show an example of a single 256 kbits marching memory blocks $MM_{ij}$, which has one thousand of marching memory units $U_k$ (k=1 to n; n=1000) of 32 bytes (or 256 bits). In the complex marching memory schemes, as shown in FIG. 80(*b*), position indexes $T_k$ (k=1 to 1000) or position tags are labeled, respectively, on each of the marching memory units $U_k$ as the token of each of the columns $U_k$ that means the first address of the column bytes. In FIG. 80(*b*), the clock period (the clock cycle time) TAU(Greek-letter)$_{clock}$, shown in FIG. 7C, is recited as "the marching memory's memory cycle $t_M$".

In the light of above discussions stated in the exemplary embodiments, since the large speed difference between the conventional DRAM and the marching memory, as shown in FIG. 80(*c*), can be used with the conventional DRAM's memory cycle $t_C$ for writing in or reading out the content of the conventional DRAM's one memory element, $t_C$ can be estimated as:

$$t_C=1000t_M \quad (1).$$

Therefore, with the complex marching memory scheme shown in FIG. 79(*b*), the speed/capability of the marching memory can be improved for scalar data or program instructions, by which a specified marching memory block $MM_{ij}$ (i=1 to s; j=1 to t; and s*t=1000) can be randomly accessed from one thousand of marching memory blocks, similar to the random-access methodology employed in the DRAM architecture.

Although the illustration is omitted in FIG. 79(*b*), the plurality of 256 kbits marching memory blocks $MM_{ij}$ may be arranged in the two dimensional matrix form on the semiconductor chip 66 so that each horizontal array of the marching memory blocks $MM_{ij}$ share a common horizontal-core line, while each vertical array of marching memory blocks $MM_{ij}$ share a common vertical-core line, and a location of a specified marching memory block $MM_{ij}$ in the two dimensional matrix is accessed as the intersection of its horizontal-core line and vertical-core line, with double-level hierarchy. In the double-level hierarchy, every column of a subject marching memory block $MM_{ij}$ is accessed with an address at the lower level, and every marching memory block $MM_{ij}$ are directly accessed with its own address for each marching memory block $MM_{ij}$ at the higher level.

Alternatively, a virtual storage mechanism can be used for the access methodology of the complex marching memory. In the virtual storage mechanism, the marching memory blocks $MM_{ij}$ (i=1 to s; j=1 to t), or the marching memory cores to be used are scheduled just like pages in a virtual memory. The scheduling is decided at compilation run if any. For example, in the multi-level caches architecture, the multi-level caches generally operate by checking the smallest Level 1 (L1) cache first, and if the L1 cache hits, the processor proceeds at high speed. If the smaller L1 cache misses, the next larger cache (L2) is checked, and so on, before external memory is checked. For the access methodology of the complex marching memory, the L2 cache-like memory can support the virtual indexing mechanism, because the size of L2 cache corresponds to the size of the complex marching memory, and the size of a marching memory block $MM_{ij}$ corresponds to the size of smallest L1 cache.

Since the achievement of the complex marching memory encompassing one thousand of marching memory blocks, or one thousand of cores is relatively easy as stated above, and in the complex marching memory, the access of any column is basically available at the CPU's clock rate, even at the worst case, the speed of the complex marching memory keeps the speed of the conventional DRAM.

Furthermore, a plurality of complex marching memory chips, or a plurality of macro complex marching memory blocks $MMM_1$, $MMM_2$, . . . , $MMM_k$, can be mounted on a first circuit board having external-connection pins $P_1$, $P_2$, . . . , $P_{s-1}$, $P_s$ ("s" may be any integer determined by unit of byte, or word size) so as to implement a multichip module of the complex marching memory, or "a complex marching memory module" as shown in FIG. 81, although the illustration of the circuit board is omitted. In the hybrid assembly of macro complex marching memory blocks $MMM_1$, $MMM_2$, . . . , $MMM_k$, the first macro complex marching memory block $MMM_1$ may monolithically integrate one thousand of marching memory blocks $MM_{111}$, $MM_{121}$, $MM_{131}$, . . . , $MM_{1(t-1)1}$, $MM_{1t1}$; $MM_{211}$, . . . , ; $MM_{(s-1)11}$ . . . ; $MM_{s11}$, $MM_{s21}$, . . . , $MM_{s(t-1)1}$, $MM_{st1}$ on a first semiconductor chip, the second macro complex marching memory block $MMM_2$ may monolithically integrate one thousand of marching memory blocks $MM_{112}$, $MM_{122}$, $MM_{132}$, . . . , $MM_{1(t-1)2}$, $MM_{1t2}$; $MM_{212}$, . . . ; $MM_{(s-1)12}$ . . . ; $MM_{s12}$, $MM_{s22}$, . . . , $MM_{s(t-1)2}$, $MM_{st2}$ on a second semiconductor chip, . . . , and the k-th macro complex marching memory block $MMM_k$ may monolithically integrate one thousand of marching memory blocks $MM_{11k}$, $MM_{12k}$, $MM_{13k}$, . . . , $MM_{1(t-1)k}$, $MM_{1tk}$; $MM_{21k}$, . . . , ; $MM_{(s-1)1k}$ . . . ; $MM_{s1k}$, $MM_{s2k}$, . . . , $MM_{s(t-1)k}$, $MM_{stk}$ on a k-th semiconductor chip, for example. And the first complex marching memory module hybridly assembling the macro complex marching memory blocks $MMM_1$, $MMM_2$, . . . , $MMM_k$ can be connected to a second complex marching memory module hybridly assembling the macro complex marching memory block $MMM_{k+1}$ and others on a second circuit board through the external-connection pins $P_1$, $P_2$, . . . , $P_{s-1}$, $P_s$. Here, the macro complex marching memory block $MMM_{k+1}$ may monolithically integrate one thousand of marching memory blocks $MM_{11(k+1)}$, $MM_{12(k+1)}$, $MM_{13(k+1)}$, . . . , $MM_{1(t-1)(k+1)}$, $MM_{1t(k+1)}$; $MM_{21(k+1)}$; . . . , $MM_{(s-1)1(k+1)}$ . . . ; $MM_{s1(k+1)}$, $MM_{s2(k+1)}$, . . . , $MM_{s(t-1)(k+1)}$, $MM_{st(k+1)}$ on a semiconductor chip, for example. In addition, if dual lines of the hybrid assembly of macro complex marching memory blocks are implemented, a dual in-line module of complex marching memory can be established.

In the configuration of the complex marching memory modules shown in FIG. 81, by using triple-level hierarchy, every column of a subject marching memory block $MM_{iju}$ (u=1 to k; "k" is any integer greater than or equal to two) is accessed with an address at the lowest level, every marching memory block $MM_{iju}$ are accessed with its own address for each marching memory block $MM_{iju}$ at the middle level, and every macro marching memory block $MMM_u$ (u=1 to k) may be directly accessed with its own address at the highest level, which facilitate accessing to a remote column of the marching memory for scalar data or program instructions.

Alternatively, very similar to DRAM rank architecture encompassing a set of DRAM chips that operate in lockstep fashion to command in a memory, in which the DRAM chips inside the same rank are accessed simultaneously, the plurality of macro complex marching memory blocks $MMM_1$, $MMM_2$, . . . , $MMM_k$, can be random accessed simultaneously, and with the above-mentioned double-level hierarchy methodology, every column of a subject marching memory block $MM_{iju}$ (u=1 to k) is accessed with an address at the lower level, and every marching memory block $MM_{iju}$ are directly accessed with its own address for each marching memory block $MM_{iju}$ at the higher level.

Still alternatively, a virtual storage mechanism can be used for the access methodology of the complex marching memory, in which the marching memory cores to be used are scheduled just like pages in the virtual memory. The scheduling can be decided at compilation run if any.

Since the data transfer between the marching main memory 31 and the processor 11 is achieved at a very high speed, the cache memory employed in the conventional computer system is not required, and the cache memory can be omitted. However, similar to the organization shown in FIG. 56, a marching-data cache memory 21*b* implemented by the complex marching memory scheme can be used with more smaller size of marching memory blocks, or more smaller size of marching memory cores. For example, a plurality of marching memory cores with 1 kbits, 512 bits, or 256 bits capacity can be deployed on a semiconductor chip so as to implement the marching-data cache memory 21*b*, while a plurality of marching memory cores $MM_{ij}$ (i=1 to s; j=1 to t; and s*t=1000) with 256 kbits capacity are deployed on the semiconductor chip 66 so as to implement marching main memory 31. For example, with the virtual storage mechanism, each of the marching memory cores can be randomly accessed.

Alternatively, one-dimensional array of marching memory blocks, or marching memory cores, being deployed vertically on a semiconductor chip, can implement a marching cache memory. Each of the marching memory cores includes a single horizontal array of memory units, and the number of memory units deployed horizontally is smaller than the number of memory units employed in the marching memory cores for the marching main memory 31. For example, with the virtual storage mechanism, each of the marching memory cores can be randomly accessed.

Furthermore, a plurality of marching memory blocks, or a plurality of marching memory cores can be deployed vertically on a semiconductor chip, each of the marching memory blocks consist of a single memory units, each of the memory units having a sequence of bit-level cells configured to store information of byte size or word size so as to implement a marching register file by the complex marching memory scheme.

In the further case of scaling the marching memory core, a plurality of marching memory cores with minimized size, or one bit capacity can be deployed on a semiconductor chip by the complex marching memory scheme, which may correspond to the structure of conventional SRAM. Therefore, marching-data register file 22*b* implemented by one-bit marching memory cores can be connected to the ALU 112, similar to the organizations shown in FIGS. 55 and 56. Similar to the operation of SRAM, each of the one-bit marching memory cores can be randomly accessed.

The present invention includes various exemplary embodiments and modifications and the like, which are not detailed above. Therefore, the scope of the present invention will be defined in the following claims.

What is claimed is:

1. A marching memory, comprising:

an array of memory units deployed along a row direction, each memory unit having a sequence of bit-level cells aligned in a column direction perpendicular to the row direction, configured to operate with a power supplied by a single clock signal supply line, each bit-level cell having:

a transfer-transistor having a first main-electrode connected to the clock signal supply line serving as an oscillating power supply line through a first R-C delay element, which makes a first exponential transient response, potentials of the power supply line swinging periodically between the logical levels of "0" and "1", a second main-electrode opposing to the first main-electrode, and a control-electrode configured to control a current flowing between the first and the second-main electrodes, connected to an output terminal of a first neighboring bit-level cell positioned at an input side of the array of the memory units along the row direction, through a second R-C delay element, which makes a second exponential transient response;

a reset-transistor having
a first main-electrode connected to the second main-electrode of the transfer-transistor,
a control-electrode connected to the clock signal supply line, and
a second main-electrode connected to the ground potential; and
a capacitor configured to store signal charge as information of the bit-level cell, connected in parallel with the reset-transistor,
wherein an output node connecting the second main-electrode of the transfer-transistor and the first main-electrode of the reset-transistor serves as an output terminal of the bit-level cell, and the output terminal of the bit-level cell delivers the signal charge stored in the capacitor to a second neighboring bit-level cell disposed at output side of the array of the memory units along the row direction.

2. The marching memory of claim 1, wherein in each of the bit-level cells, when a clock signal is applied to the control-electrode of the reset-transistor, the reset-transistor discharges the signal charge stored in the capacitor.

3. The marching memory of claim 1, wherein in each of the bit-level cells, after the signal charge stored in the capacitor has been discharged, the transfer-transistor becomes active delayed by a first delay time determined by the first R-C delay element, and when the signal charge stored in the first neighboring bit-level cell is fed to the control-electrode of the transfer-transistor, the transfer-transistor transfers the signal charge stored in the first neighboring bit-level cell, further delayed by a second delay time determined by the second R-C delay element to the capacitor.

4. The marching memory of claim 3, wherein the first delay time is a quarter of clock period of the clock signal, and the second delay time is a half of the clock period.

5. The marching memory of claim 1, wherein in the transfer-transistor, the control-electrode controls the current flowing between the first main-electrode and the second main-electrode electro-statically.

6. The marching memory of claim 1, wherein in the reset-transistor, the control-electrode controls the current flowing between the first main-electrode and the second main-electrode electro-statically.

7. The marching memory of claim 1, wherein the transfer-transistor and the reset-transistor are made of an insulated-gate transistor, including a MOS transistor, a MIS transistor and a high electron mobility transistor.

8. The marching memory of claim 7, wherein the transfer-transistor and the reset-transistor are made of a nMOS transistor, and the clock signal of positively high-level is applied to the control electrode of the nMOS transistor to achieve a conductive state.

9. The marching memory of claim 7, wherein the transfer-transistor and the reset-transistor are made of a pMOS transistor, and the clock signal of negatively high-level is applied to the control electrode of the pMOS transistor to achieve a conductive state.

10. A complex marching memory, comprising:
a plurality of marching memory blocks being deployed spatially in a two dimensional matrix such that each horizontal array of the marching memory blocks shares a common horizontal-core line, while each vertical array of marching memory blocks shares a common vertical-core line, each of the marching memory blocks including an array of memory units deployed along a row direction in each of the marching memory blocks, each of the memory units having a sequence of bit-level cells aligned in a column direction perpendicular to the row direction for storing information of byte size or word size defined in the column direction,
wherein each of the bit-level cells operates with a power supplied by a single clock signal supply line, and each of the memory units transfers synchronously with a clock signal, step by step, toward an output side of a corresponding marching memory block from an input side of the corresponding marching memory block, and each of the marching memory blocks is randomly accessed at a desired intersection of the horizontal-core line and the vertical-core line.

11. The complex marching memory of claim 10, wherein each of the bit-level cells comprises:
a transfer-transistor having
a first main-electrode connected to a clock signal supply line, configured to supply the clock signal through a first R-C delay element, and
a control-electrode connected to an output terminal of a first neighboring bit-level cell disposed at input side of the array of memory units along the row direction, through a second R-C delay element;
a reset-transistor having
a first main-electrode connected to a second main-electrode of the transfer-transistor,
a control-electrode connected to the clock signal supply line, and
a second main-electrode connected to the ground potential; and
a capacitor configured to store a signal charge as information of the bit-level cell, connected in parallel with the reset-transistor,
wherein an output node connecting the second main-electrode of the transfer-transistor and the first main-electrode of the reset-transistor serves as an output terminal of the bit-level cell, and the output terminal of the bit-level cell delivers the signal charge stored in the capacitor to a second neighboring bit-level cell disposed at output side of the array of memory units along the row direction.

12. The complex marching memory of claim 11, wherein in each of the bit-level cells, when the clock signal is applied to the control-electrode of the reset-transistor, the reset-transistor discharges the signal charge stored in the capacitor.

13. The complex marching memory of claim 11, wherein in each of the bit-level cells, after the signal charge stored in the capacitor has been discharged, the transfer-transistor becomes active delayed by a first delay time determined by the first delay element, and when the signal charge stored in the first neighboring bit-level cell is fed to the control-electrode of the transfer-transistor, the transfer-transistor transfers the signal charge stored in the first neighboring bit-level cell, further delayed by a second delay time determined by the second delay element to the capacitor.

14. A complex marching memory, comprising:
a plurality of marching memory blocks being deployed spatially in a two dimensional matrix such that each horizontal array of the marching memory blocks shares a common horizontal-core line, while each vertical array of marching memory blocks shares a common vertical-core line, each of the marching memory blocks including an array of memory units deployed along a row direction in each of the marching memory blocks, each of the memory units having a sequence of bit-level cells aligned in a column direction perpendicular to the row direction for storing information of byte size or word size defined in the column direction, wherein each of the bit-level cells operates with a power supplied by a single clock signal supply line, and each of the memory units transfers synchronously with a first clock signal, step by step, toward a first edge side of corresponding marching memory block from a second edge side of the corresponding marching memory block opposing to the first edge side, and further, each of the memory units transfers synchronously with a second clock signal, step by step, toward the second edge side from the first edge side, and each of the marching memory blocks is randomly accessed at a desired intersection of the horizontal-core line and the vertical-core line.

15. A computer system, comprising a processor; and a marching main memory, configured to provide the processor with stored information actively and sequentially so that the processor can execute arithmetic and logic operations with the stored information, in addition results of processing in the processor are sent out to the marching main memory, except that in case of instructions movement, there is only one way of instructions flow from the marching main memory to the processor, the marching main memory includes an array of memory units deployed along a row direction, each of the memory units having a sequence of bit-level cells aligned in a column direction perpendicular to the row direction, configured to operate with a power supplied by a single clock signal supply line, each of the bit-level cells comprising:

a transfer-transistor having a first main-electrode connected to the clock signal supply line serving as an oscillating power supply line through a first R-C delay element, which makes a first exponential transient response, potentials of the power supply line swinging periodically between the logical levels of "0" and "1", a second main-electrode opposing to the first main-electrode, and a control-electrode configured to control a current flowing between the first and the second-main electrodes, connected to an output terminal of a first neighboring bit-level cell disposed at input side of the array of the memory units along the row direction through a second R-C delay element, which makes a second exponential transient response;

a reset-transistor having a first main-electrode connected to a second main-electrode of the transfer-transistor, a control-electrode connected to the clock signal supply line, and a second main-electrode connected to the ground potential; and a capacitor configured to store a signal charge as information of the bit-level cell, connected in parallel with the reset-transistor;

wherein an output node connecting the second main-electrode of the transfer-transistor and the first main-electrode of the reset-transistor serves as an output terminal of the bit-level cell, and the output terminal of the bit-level cell delivers the signal charge stored in the capacitor to a second neighboring bit-level cell disposed at output side of the array of the memory units along the row direction.

16. A computer system, comprising:

a processor; and a marching main memory configured to provide the processor with stored information actively and sequentially so that the processor can execute arithmetic and logic operations with the stored information, in addition results of processing in the processor are sent out to the marching main memory, except that in case of instructions movement, there is only one way of instructions flow from the marching main memory to the processor, the marching main memory comprising a plurality of marching memory blocks being deployed spatially in a two dimensional matrix such that each horizontal array of the marching memory blocks shares a common horizontal-core line, while each vertical array of marching memory blocks shares a common vertical-core line, each of the marching memory blocks having an array of memory units deployed along a row direction, each of the memory units having a sequence of bit-level cells aligned in a column direction perpendicular to the row direction so as to store information of byte size or word size defined in the column direction, wherein each of the bit-level cells operates with a power supplied by a single clock signal supply line, and each of the marching memory blocks is randomly accessed at a desired intersection of the horizontal-core line and the vertical-core line.

17. The computer system of claim 16, wherein each of the bit-level cells comprises:

a transfer-transistor having a first main-electrode connected to a clock signal supply line through a first R-C delay element, and a control-electrode connected to an output terminal of a first neighboring bit-level cell disposed at input side of the array of memory units along the row direction through a second R-C delay element;

a reset-transistor having a first main-electrode connected to a second main-electrode of the transfer-transistor, a control-electrode connected to the clock signal supply line, and a second main-electrode connected to the ground potential; and a capacitor configured to store a signal charge as information of the bit-level cell and connected in parallel with the reset-transistor, wherein an output node connecting the second main-electrode of the transfer-transistor and the first main-electrode of the reset-transistor serves as an output terminal of the bit-level cell, and the output terminal of the bit-level cell delivers the signal charge stored in the capacitor to a second neighboring bit-level cell disposed at output side of the array of memory units along the row direction.

18. A computer system, comprising:

a processor; and a bidirectional marching main memory configured to provide the processor with stored information actively and sequentially so that the processor can execute arithmetic and logic operations with the stored information, in addition results of processing in the processor are sent out to the bidirectional marching main memory, except that in case of instructions movement, there is only one way of instructions flow from the bidirectional marching main memory to the processor, the bidirectional marching main memory comprising a plurality of bidirectional marching memory blocks being deployed spatially in a two dimensional matrix such that each horizontal array of the marching memory blocks shares a common horizontal-core line, while each vertical array of marching memory blocks shares a common vertical-core line, each of the bidirectional marching memory blocks having an array of memory units deployed along a row direction in each of the bidirectional marching memory blocks, each of the memory units having a sequence of bit-level cells arranged in a column direction perpendicular to the row direction so as to store information of byte size or word size defined in the column direction, wherein each of the memory units transfers synchronously with a first clock signal, step by step, toward a first edge side of corresponding marching memory block from a second edge side of the corresponding marching memory block opposing to the first edge side, and further, each of the memory units transfers synchronously with a second clock signal, step by step, toward the second edge side from the first edge side, and each of the marching memory blocks is randomly accessed at a desired intersection of the horizontal-core line and the vertical-core line.

* * * * *